US010244421B2

(12) United States Patent
Rawlins

(10) Patent No.: US 10,244,421 B2
(45) Date of Patent: Mar. 26, 2019

(54) MOMENTUM TRANSFER COMMUNICATION

(71) Applicant: ParkerVision, Inc., Jacksonville, FL (US)

(72) Inventor: Gregory S. Rawlins, Chuluota, FL (US)

(73) Assignee: ParkerVision, Inc., Jacksonville, FL (US)

( * ) Notice: Subject to any disclaimer, the term of this patent is extended or adjusted under 35 U.S.C. 154(b) by 499 days.

(21) Appl. No.: 14/749,463

(22) Filed: Jun. 24, 2015

(65) Prior Publication Data

US 2016/0150438 A1 May 26, 2016

Related U.S. Application Data

(63) Continuation of application No. 14/679,928, filed on Apr. 6, 2015.

(60) Provisional application No. 62/115,911, filed on Feb. 13, 2015, provisional application No. 62/016,944, filed on Jun. 25, 2014, provisional application No. 61/975,077, filed on Apr. 4, 2014.

(51) Int. Cl.
*G09G 5/10* (2006.01)
*H04H 40/00* (2009.01)
*H04W 28/02* (2009.01)
*G06F 17/50* (2006.01)
*H04W 84/12* (2009.01)

(52) U.S. Cl.
CPC .... *H04W 28/0221* (2013.01); *G06F 17/5009* (2013.01); *H04W 84/12* (2013.01)

(58) Field of Classification Search
CPC .. H04W 52/027; H04L 7/008; H04L 25/4923; G01B 5/008; G08C 19/16
See application file for complete search history.

(56) References Cited

U.S. PATENT DOCUMENTS

| | | | | |
|---|---|---|---|---|
| 9,711,041 B2 * | 7/2017 | Wiley | G08C 19/16 | |
| 2005/0220232 A1 * | 10/2005 | Kunnari | H04L 25/4923 | 375/353 |
| 2009/0244087 A1 * | 10/2009 | Okano | H04W 52/027 | 345/589 |
| 2011/0178764 A1 * | 7/2011 | York | G01B 5/008 | 702/152 |
| 2015/0295701 A1 * | 10/2015 | Sengoku | H04L 7/0008 | 375/355 |

* cited by examiner

*Primary Examiner* — Kandasamy Thangavelu
(74) *Attorney, Agent, or Firm* — Sterne, Kessler, Goldstein & Fox PLLC

(57) ABSTRACT

The present disclosure relates to momentum transfer communication systems. An apparatus comprises at least one of a single-ended encoding circuit or a differential encoding circuit and a controller configured to control the at least one of the single-ended encoding circuit or the differential encoding circuit to encode a received signal into an encoded signal using momentum transfer encoding techniques.

1 Claim, 114 Drawing Sheets

100

Extended Channel

Extended Channel

200

Location of Message $m_i$ in Hyperspace

500

600

Peak Particle Velocity vs. Time

700

Peak Particle Velocity vs. Position

800

Gaussian Velocity pdf

1000 pdf of Velocity $\vec{v}_\alpha$ as a Function of Radial Position for a Particle in Motion, Restricted to a Single Dimension and Maximum Instantaneous Power, $P_m$, Peak to Average Energy Ratio ($PAER = 4$), $P_m = 10\ J/s$, $v_{max} = \sqrt{10}\ m/s$, $\Delta t = 1$, $R_s = (\Delta t(v_{max}/3))$, $m = 1kg$

1100

Probability of Velocity

1200

Probability of Velocity given q (Top View)

1300

1400

Normalized Autocorrelation of a Maximum Velocity Pulse

1500

Normalized Fourier Transform of Maximum Velocity Pulse Autocorrelation

1600

Normalized Fourier Transform of Maximum Velocity Pulse Autocorrelation

Fourier Transform of the Rectangular Pulse Autocorrelation

1800

Forming a Rectangular Pulse from the Integration of Delta Functions

1900

Model for a Force Doublet Generating a Maximum Velocity Pulse

2000

Max. Velocity Pulse Impulse Response for Transmitter Model with $P_{max}$ Constraint, (m=1)

2100

2200

2300

Autocorrelation for Power limited Gaussian Momentum (m=1)

2400

Maximum Velocity Pulse Compared to Main Lobe Cardinal Velocity Pulse

2500

Kinetic Energy vs. Time for Velocity and Cardinal Pulses

2600

Max. Velocity Pulse and Main Lobe Cardinal Velocity Pulse with .4 dB "Backoff"

2700

Comparison of Max. Nonlinear Velocity Pulse and Max. Cardinal Velocity Pulse

2800

Max. Cardinal Vel. Pulse, Associated Force Function and Work Function

Parallel Observations for Momentum Ensemble

3000

Three Sample Functions from a Momentum Ensemble

3100

Three sample Functions from a Momentum Ensemble

3200

Velocity and Position for a Sample Function ($R_S \approx 1$)

3300

3350

Three Particle Samples in Phase Space along the $\alpha$ axis

3400

Three Gaussian pdf's for Three Sample RVs

3500

Three Configuration Ensemble Sample Functions

3600

Momentum and Position Related by an Integral of Motion

3700

Joint pdf of Momentum and Position 1

3800

Joint pdf of Momentum and Position 2

3900

Joint pdf of Momentum and Position 3

4000

Extended Channel

4100

Global Phase Space

4200

Maximum Cardinal Pulse Profile in a Receiver Phase Space along with a Random Particle Trajectory

4300

Capacity in Nats/s vs. $\overline{SNR}$ for a D dimensional link with a maximum velocity pulse profile, Capacity in nats/s vs. given the following parameters, $PAER$=10, $P_m = 1$ J/s, m=1 kg, $f_s = 1$

4400

Capacity in bits/s vs. (SNR)‾ for a D dimensional link given the following parameters, PAER=10, P_m=1 J/s, m=1 kg, f_s=1 samp./s , B=.5 Hz, D=1,2,3,4, 8

4500

Extended Encoding Phase Space

4600

Desired Information Bearing Momentum

4700

Actual Momentum of a Target Particle

4800

Encoding Particle Motion on the $x_1$ axis via Momentum Exchange

Momentum Exchange Diagram

Encoding Particle Stream Impulses, $t_{\varepsilon} = 0$

Encoding Particle Stream Impulses with Timing Skew, $t_\varepsilon \neq 0$

5200

Particle Encoding Simulation Block Diagram for Canonical Offset Model

5300

Simulation Waveforms and Signals

Simulation Waveforms and Signals

5500

Simulation Waveforms and Signals

5600

Encoded Output and Encoded Input

5700

Momentum Change, Integrated Momentum Exchange, Analytic Filtered Result

5800

Zero Offset Open System Canonical Simulation Model

Simulation Results for Open System Zero Offset Model

6000

Relative Particle Motion Prior to Exchange

6100

Relative Particle Motion after an Exchange

6200

Capacity ratio for truncated Gaussian distributions vs. *PAPR* for large SNR

Efficiency vs. Capacity ratio
for Truncated Gaussian Distributions & Large SNR

6400

Canonical Offset Encoding Efficiency

6500

Capacity vs. Dissipative Efficiency

6600

Momentum Exchange Through Radiated Field

6700

$$\underbrace{\frac{1}{c^2}\frac{\partial}{\partial t}\int_{volume}\mathbf{s}_{\alpha}{}^{(\infty)}dV}_{\text{forces on particles in specified volume}} + \underbrace{\oint_{surface}-\mathfrak{S}_{\alpha\beta}{}^{(\infty)}df}_{\text{particle flux through surface bounding volume}} = \underbrace{\frac{-1}{c^2}\frac{\partial}{\partial t}\int_{volume}\mathbf{s}_{\alpha}{}^{(8)}dV}_{\text{rate of change of field momentum in specified volume}} - \underbrace{\oint_{surface}-\mathfrak{S}_{\alpha\beta}{}^{(8)}df}_{\text{flux of field momentum through surface bounding specified volume}}$$

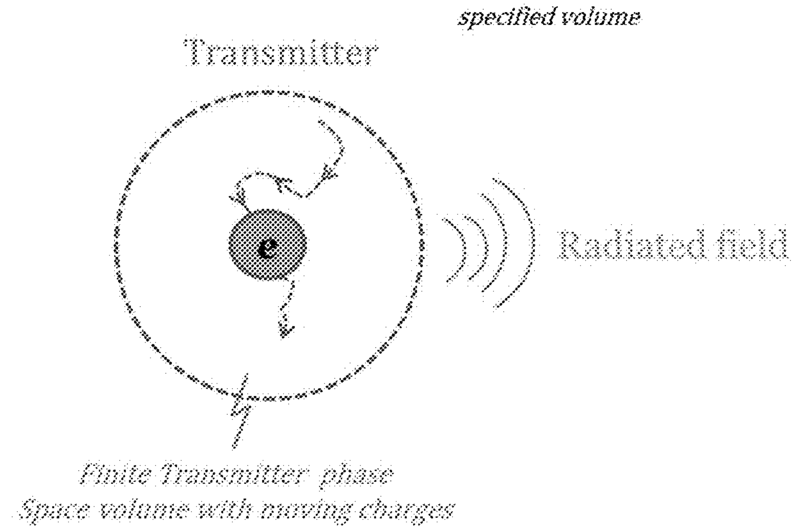

Conservation Equation for a Radiated Field

Energy Momentum Tensor

6900

Summing Random Signals

7000

Gaussian pdf Formed with Composite Sub Densities

7100

Complex RF Modulator

7200

Complex Signal Constellation for a WCDMA Signal

Differential and Single Ended Type 1 Series Modulator/Encoder

7400

Measured and Theoretical Efficiency of a Type 1 Modulator

7500

Gaussian pdf for Output Voltage Voltage, $V_L$, with $V_s = 2, \langle V_L \rangle = V_s/4 = (4V)$, and $\sigma = .15$

7600 pdf for $\breve{\eta}$ given Gaussian pdf for Output Voltage, $V_L$, with $V_s = 2$, $\langle V_L \rangle = V_s/4(.5V)$, and $\sigma = .15(\eta) = .34$ Gaussian pdf for Output Voltage, $V_L$,
with $V_S = 2, \langle V_L \rangle = V_S/4(.5V)$, and σ= .15, 3 Separate Domains

7800

Three Domain Type 1 Series Modulator

7900

Relative Efficiency Increase as a Function of the Number of Optimised Domains

8000

Relative Frequency of Output Load Voltage Measurements

8100

Probability density of load voltage for zero offset case

Type 1 differentially sourced modulator

8300

Thermodynamic efficiency
for a given number of optimized domains

8400

Measured Thermodynamic efficiency for a given number of optimized domains (4, 6, 8)

8500

Thermodynamic efficiency
for a given number of optimized domains

8600

Optimized Efficiency Performance vs. ζ for (Standards Cases)

8700

Noise Power vs. Frequency

8800

Binary Particle Encoding

8900

Peak Particle Velocity vs. Position for Motion

9000

Between Sample Uncertainty
For a Phase Space Reference Trajectory

9100

Sampling of Two Sine Waves at Different Frequencies

Sampling of Two Sine Waves at Different Frequencies

9300

Kinetic Energy vs. Time for Maximum Acceleration

9400

Convolution Calculation Domain

9500

Convolution Calculation Domain

9600

Convolution Calculation Domain

9700

Normalized Autocorrelation for Maximum Velocity Pulse

9800

9900

Maximum Non-Linear and Cardinal Velocity Pulse Profiles

10000

Solution for $P_{m\_card}$ is approx. .843 @ $(t/T_s) \approx -.42$.
$v_{max\_card}$ is unity for this case.

10100

Sine Integral Response

10200

Maximum Non-Linear and Cardinal Pulse Profiles

10300

Type 1 Encoder/Modulator

10400

Modulated Information pdf

10500 pdf of Instantaneous Efficiency

10600

Non Central Gamma pdf

10700

Simulation of type 1 Modulator Output Power Histogram

10800

Histogram for Pont $V_S V_L$

10900 pdf for Offset Canonical Case

Comparison of Gaussian and Continuous Uniformly Distributed pdf's

11100

Testing Apparatus Schematic

11200

Potentiometer GUI 1

11300

Potentiometer GUI 2

11400

Potentiometer GUI 3

MOMENTUM TRANSFER COMMUNICATION

CROSS REFERENCE TO RELATED APPLICATIONS

This application is a continuation of U.S. Nonprovisional patent application Ser. No. 14/679,928, filed Apr. 6, 2015, titled "An Optimization of Thermodynamic Efficiency vs. Capacity for Communications Systems," which claims the benefit of U.S. Provisional Patent Application No. 61/975,077, filed Apr. 4, 2014, titled "Thermodynamic Efficiency vs. Capacity for a Communications System," U.S. Provisional Patent Application No. 62/016,944, filed Jun. 25, 2014, titled "Momentum Transfer Communication," and U.S. Provisional Patent Application No. 62/115,911, filed Feb. 13, 2015, titled "Optimization of Thermodynamic Efficiency Versus Capacity for Communications Systems," all of which are hereby incorporated herein by reference in its entireties.

BACKGROUND

Field

Embodiments of the present invention are related to momentum transfer communication systems. Specifically, embodiments of the present invention are directed to encoding or decoding a received signal using momentum transfer encoding and/or decoding techniques.

Background

The proliferation of mobile communications platforms is challenging capacity of networks largely because of the ever increasing data rate at each node. This places significant power management demands on power consuming devices, such as personal computing devices, as well as on cellular and WLAN terminals, or any other device that utilizes power or energy stored in a power storage device. The increased data throughput translates to shorter meantime between battery charging cycles and increased thermal footprint.

SUMMARY

A need exists to address drawbacks in conventional mobile communications platforms designs.

In an embodiment, an apparatus comprises at least one of a single-ended encoding circuit or a differential encoding circuit and a controller configured to control the at least one of the single-ended encoding circuit or the differential encoding circuit to encode a received signal into an encoded signal using momentum transfer encoding techniques.

Further features and advantages of the embodiments disclosed herein, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to a person skilled in the relevant art based on the teachings contained herein.

BRIEF DESCRIPTION OF THE FIGURES

The accompanying drawings, which are incorporated herein and form a part of the specification, illustrate embodiments of the present invention and, together with the description, further serve to explain the embodiments and to enable a person skilled in the relevant art to make and use the invention.

FIG. 67 is an illustration of a diagram including a conversation equation for a radiated field, in accordance with one or more embodiments.

Figure 1:
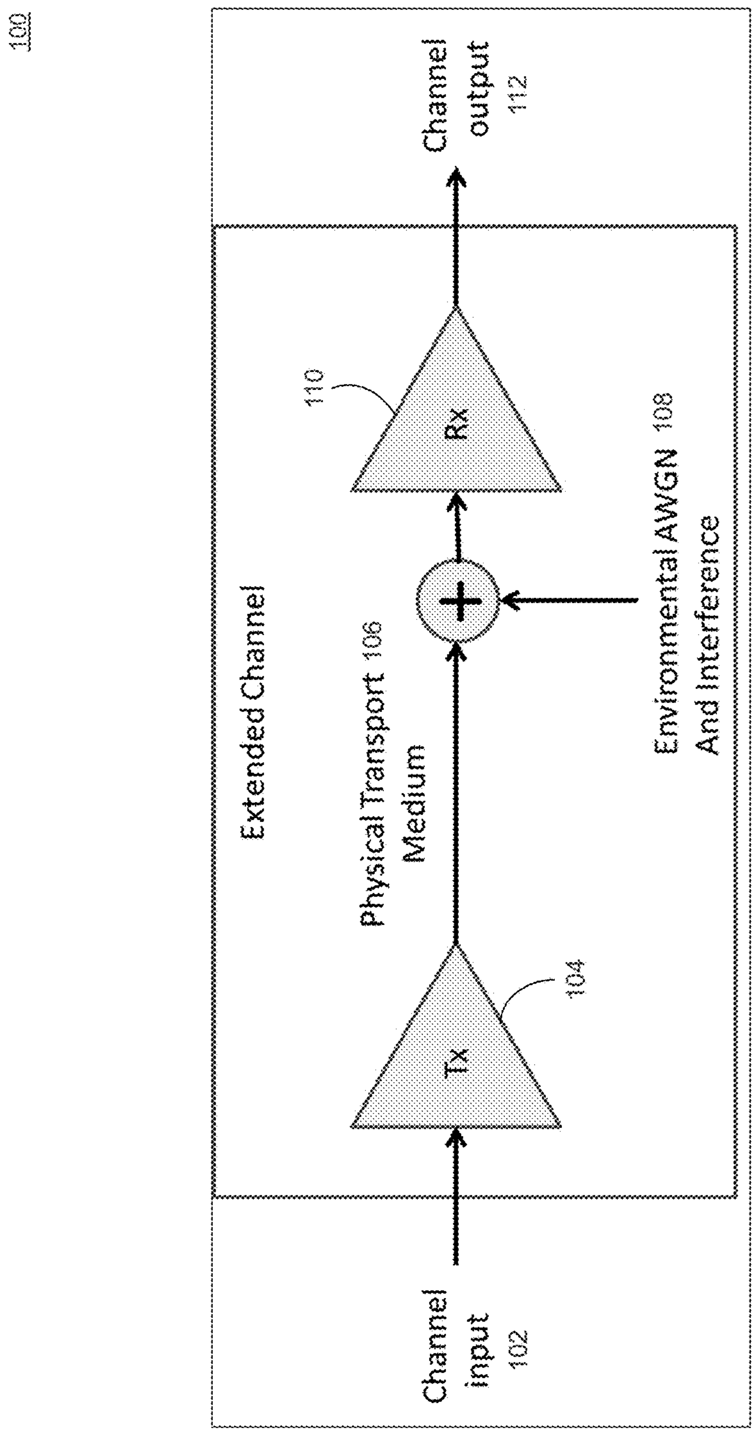
FIG. 1 is an illustration of an extended channel model, in accordance with one or more embodiments.

Embodiments will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

Embodiments herein disclose improvements in power efficiency of communications processes, along with a method for efficiency enhancement. Shannon's work is helpful for analyzing information capacity of a communications system, but his formulation does not predict an efficiency relationship suitable for calculating the power consumption of a system, particularly for practical signals which may only approach the capacity limit.

Verification shows that embodiments of the present invention result in enhanced power efficiency. Hardware was constructed to measure the efficiency of a prototypical Gaussian signal prior to efficiency enhancement. After an optimization was performed, the efficiency of the encoding apparatus increased from 3.125% to greater than 86% for a manageable investment of resources. Likewise, several telecommunications standards based waveforms were also tested on the same hardware. The results reveal that the developed physical theories extrapolate in a very accurate manner to an electronics application, predicting the efficiency of single ended and differential encoding circuits before and after optimization.

Table of Contents

| | |
|---|---|
| 1 | INTRODUCTION |
| 1.1 | Capacity and Efficiency |
| 1.2 | Additional Communications Comments |
| 2 | CAPACITY EQUATIONS |
| 2.1 | The Uncertainty Function |
| 2.2 | Physical Considerations |
| 3 | A PARTICLE THEORY OF COMMUNICATION |
| 3.1 | Transmitter |
| 3.1.1 | Phase Space Coordinates, and Uncertainty |
| 3.1.2 | Transmitter Phase Space, Boundary Conditions and Metrics |
| 3.1.3 | Momentum Probability |
| 3.1.4 | Correlation of Motion, and Statistical Independence |
| 3.1.5 | Autocorrelations and Spectra for Independent Maximum Velocity Pulses |
| 3.1.6 | Characteristic Response |
| 3.1.7 | Sampling Bound Qualification |
| 3.1.8 | Interpolation for Physically Analytic Motion |
| 3.1.9 | Statistical Description of the Process |
| 3.1.10 | Configuration Position Coordinate Time Averages |
| 3.1.11 | Statistical Behavior of the Particle Based Communications Process Model |
| 3.2 | Comments Concerning Receiver and Channel |
| 4 | UNCERTAINTY AND INFORMATION CAPACITY |
| 4.1 | Uncertainty |
| 4.2 | Capacity |
| 4.2.1 | Classical Capacity |
| 4.3 | Multi-Particle Capacity |
| 5 | COMMUNICATIONS PROCESS ENERGY EFFICIENCY |
| 5.1 | Average Thermodynamic Efficiency for a Canonical Model |
| 5.1.1 | Comments Concerning Power Source |
| 5.1.2 | Momentum Conservation and Efficiency |
| 5.1.3 | A Theoretical Limit |
| 5.2 | Capacity vs. Efficiency Given Encoding Losses |
| 5.3 | Capacity vs. Efficiency Given Directly Dissipative Losses |
| 5.4 | Capacity vs. Total Efficiency |
| 5.4.1 | Effective Angle for Momentum Exchange |
| 5.5 | Momentum Transfer via an EM Field |
| 6 | INCREASING $\eta$mod AN OPTIMIZATION APPROACH |
| 6.1 | Sum of Independent RVs |
| 6.2 | Composite Processing |
| 7 | MODULATOR EFFICIENCY AND OPTIMIZATION |
| 7.1 | Modulator |
| 7.2 | Modulator Efficiency Enhancement for Fixed $\zeta$ |
| 7.3 | Optimization for Type 1 Modulator, $\zeta = 3$ Case |
| 7.4 | Ideal Modulation domains |
| 7.5 | Sufficient Number of domains, $\zeta$ |
| 7.6 | Zero Offset Gaussian Case |
| 7.7 | Results for Standards Based Modulations |
| 8 | MISCELLANEOUS TOPICS |
| 8.1 | Encoding Rate, Some Limits, and Relation to Landauer's Principle |
| 8.2 | Time Variant Uncertainty |
| 8.3 | A Perspective of Gabor's Uncertainty |
| 9 | CONCLUSIONS |
| 10 | OTHER TOPICS |

-continued

Table of Contents

| | |
|---|---|
| 10.1 | ISOPERIMETRIC BOUND APPLIED TO SHANNON'S UNCERTAINTY (ENTROPY) FUNCTION AND RELATED COMMENTS CONCERNING PHASESPACE HYPER SPHERE |
| 10.2 | DERIVATION FOR MAXIMUM VELOCITY PROFILE |
| 10.3 | MAXIMUM VELOCITY PULSE AUTO CORRELATION |
| 10.4 | DIFFERENTIAL ENTROPY CALCULATION |
| 10.5 | MINIMUM MEAN SQUARE ERROR (MMSE) AND CORRELATION FUNCTION FOR VELOCITY BASED ON SAMPLED AND INTERPOLATED VALUES |
| 10.6 | MAX CARDINAL VS. MAX NL. VELOCITY PULSE |
| 10.7 | CARDINAL TE RELATION |
| 10.8 | RELATION BETWEEN INSTANTANEOUS EFFICIENCY AND THERMODYNAMIC EFFICIENCY |
| 10.9 | RELATION BETWEEN WAVEFORM EFFICIENCY AND THERMODYNAMIC OR SIGNAL EFFICIENCY AND INSTANTANEOUS WAVEFORM EFFICIENCY |
| 10.10 | COMPARISON OF GAUSSIAN AND CONTINUOUS UNIFORM DENSITIES |
| 10.11 | ENTROFY RATE AND WORK RATE |
| 10.12 | OPTIMIZED EFFICIENCY FOR AN 802.11a 16 QAM CASE |

1. Introduction

Glossary

1st Law of Thermodynamics: The first law is often formulated by stating that the change in the internal energy of a closed system is equal to the amount of heat supplied to the system, minus the amount of work done by the system on its surroundings. Other forms of energy (including electrical) may be substituted for heat energy in an extension of the first law formulation. The first law of thermodynamics is an energy conservation law with an implication that energy cannot be created or destroyed. Energy may be transformed or transported but a numerical calculation of the sum total of energy inputs to an isolated process or system will equal the total of the energy stored in the process or system plus the energy output from the process or system. The law of conservation of energy states that the total energy of an isolated system is constant. The first law of thermodynamics is referenced occasionally as simply the first law.

2nd Law of Thermodynamics: The second law is a basic postulate defining the concept of thermodynamic entropy, applicable to any system involving measurable energy transfer (classically heat energy transfer). In statistical mechanics information entropy is defined from information theory using Shannon's entropy. In the language of statistical mechanics, entropy is a measure of the number of alternative microscopic configurations or states of a system corresponding to a single macroscopic state of the system. One consequence of the second law is that practical physical systems may never achieve 100% thermodynamic efficiency. Also, the entropy of an isolated system will always possess an ever increasing entropy up to the point equilibrium is achieved. The second law of thermodynamics is referred to as simply the second law.

ACPR: Adjacent Channel Power Ratio usually measured in decibels (dB) as the ratio of an "out of band" power per unit bandwidth to an "in band" signal power per unit bandwidth. This measurement is usually accomplished in the frequency domain. Out of band power is typically unwanted.

A.C.: An alternating current which corresponds to a change in the direction of charge transport and/or the electromagnetic fields associated with moving charge through a circuit. One direction of current flow is usually labeled as positive and the opposite direction of current flow is labeled as negative and direction of current flow will change back and forth between positive and negative over time.

Access: Obtain examine or retrieve; ability to use; freedom or ability to obtain or make use of something.

Account: Record, summarize; keeping a record of reporting or describing an existence of.

A.C. Coupled: A circuit or system module is A.C. coupled at is interfaced to another circuit or system/module if D.C, current cannot pass through the interface but A.C. current or signal or waveform can pass through the interface.

A.C.L.R.: Adjacent channel leakage ratio is a measure of how much signal from a specific channel allocation leaks to an adjacent channel. In this case channel refers to a band of frequencies. Leakage from one band or one channel to another band or channel occurs when signals are processed by nonlinear systems.

A/D: Analog to digital conversion.

Adapt: Modify or adjust or reconstruct for utilization.

Adjust: Alter or change or arrange for a desired result or outcome.

Algorithm: A set of steps that are followed in some sequence to solve a mathematical problem or to complete a process or operation such as (for example) generating signals according to FLUTTER™.

Align: Arrange in a desired formation; adjust a position relative to another object, article or item, or adjust a quality/characteristic of objects, articles or items in a relative sense.

Allocate: Assign, distribute, designate or apportion.

Amplitude: A scalar value which may vary with time. Amplitude can be associated as a value of a function according to its argument relative to the value zero. Amplitude may be used to increase or attenuate the value of a signal by multiplying a constant by the function. A larger constant multiplier increases amplitude while a smaller relative constant decreases amplitude. Amplitude may assume both positive and negative values.

Annihilation of Information: Transfer of information entropy into non-information bearing degrees of freedom no longer accessible to the information bearing degrees of freedom of the system and therefore lost in a practical sense even if an imprint is transferred to the environment through a corresponding increase in thermodynamic entropy.

Apparatus: Any system or systematic organization of activities, algorithms, functions, modules, processes, collectively directed toward a set of goals and/or requirements: An electronic apparatus consists of algorithms, software, functions, modules, and circuits in a suitable combination depending on application which collectively fulfill a requirement. A set of materials or equipment or modules designed for a particular use.

Application Phase Space: Application phase space is a higher level of abstraction than phase space. Application phase space consists of one or more of the attributes of phase space organized at a macroscopic level with modules and functions within the apparatus. Phase space may account for the state of matter at the microscopic (molecular) level but application phase space includes consideration of bulk statistics for the state of matter where the bulks are associated with a module function, or degree of freedom for the apparatus.

Approximate: Approximate: almost correct or exact; close in value or amount but not completely precise; nearly correct or exact.

apriori: What can be known based on inference from common knowledge derived through prior experience, observation, characterization and/or measurement. Formed or conceived beforehand; relating to what can be known through an understanding of how certain things work rather than by observation; presupposed by experience. Sometimes separated as a priori.

Articulating: Manipulation of multiple degrees of freedom utilizing multiple facilities of an apparatus in a deliberate fashion to accomplish a function or process.

Associate: To be in relation to another object or thing; linked together in some fashion or degree.

Auto Correlation: Method of comparing a signal with or waveform itself. For example, Time-Auto Correlation function compares a time shifted version of a signal or waveform with itself. The comparison is by means of correlation.

Auto Covariance: Method of comparing a signal or waveform with itself once the average value of the signal/or waveform is removed. For example, a time auto covariance function compares a signal or waveform with a time shifted version of said signal or waveform.

Bandwidth: Frequency span over which a substantial portion of a signal is restricted or distributed according to some desired performance metric. Often a 3 dB power metric is allocated for the upper and lower band (span) edge to facilitate the definition. However, sometimes a differing frequency span vs. power metric, or frequency span vs. phase metric, or frequency span vs. time metric, is allocated/specified. Frequency span may also be referred to on occasion as band, or bandwidth depending on context.

Baseband: Range of frequencies near to zero Hz. and including zero Hz.

Bin: A subset of values or span of values within some range or domain.

Bit: Unit of information measure (binary digit) calculated using numbers with a base 2.

Blended Controls: A set of dynamic distributed control signals generated as part of the FLUTTER™ algorithm, used to program, configure, and dynamically manipulate the information encoding and modulation facilities of a communications apparatus.

Blended Control Function: Set of dynamic and configurable controls which are distributed to an apparatus according to an optimization algorithm which accounts for H(x), the input information entropy, the waveform standard, significant hardware variables and operational parameters. Blended control functions are represented by $\tilde{\Im}\{H(x)_{v,i}\}$ where v+i is the total number of degrees of freedom for the apparatus which is being controlled. BLENDED CONTROL BY PARKERVISION™ is a registered trademark of ParkerVision, Inc., Jacksonville, Fla.

Branch: A path within a circuit or algorithm or architecture.

Bus: One or more than one interconnecting structure such as wires or signal lines which may interface between circuits or modules and transport digital or analog information or both.

C: An abbreviation for coulomb, which is a quantity of charge.

Calculate: Solve; probe the meaning of to obtain the general idea about something; to determine by a process. Solve a mathematical problem or equation.

Capacity: The maximum possible rate for information transfer through a communications channel, while maintaining a specified quality metric. Capacity may also be designated (abbreviated) as C, or C with possibly a subscript, depending on context. It should not be confused with Coulomb, a quantity of charge. On occasion capacity is qualified by some restrictive characteristics of the channel.

Cascading: Transferring or representing a quantity or multiple quantities sequentially. Transferring a quantity or multiple quantities sequentially.

Cascoding: Using a power source connection configuration to increase potential energy.

Causal: A causal system means that a system's output response (as a function of time) cannot precede its input stimulus.

CDF or cdf: Cumulative Distribution Function in probability theory and statistics, the cumulative distribution function (CDF), describes the probability that a real-valued random variable X with a given probability distribution will be found at a value less than or equal to x. Cumulative distribution functions are also used to specify the distribution of multivariate random variables. A cdf may be obtained through an integration or accumulation over a relevant pdf domain.

Characterization: Describing the qualities or attributes of something. The process of determining the qualities or attributes of an object, or system.

Channel Frequency: The center frequency for a channel. The center frequency for a range or span of frequencies allocated to a channel.

Charge: Fundamental unit in coulombs associated with an electron or proton, $\sim\pm 1.602\times10^{-19}$ C., or an integral multiplicity thereof.

Code: A combination of symbols which collectively possess an information entropy.

Communication: Transfer of information through space and time.

Communications Channel: Any path possessing a material and/or spatial quality that facilitates the transport of a signal.

Communications Sink: Targeted load for a communications signal or an apparatus that utilizes a communication signal. Load in this circumstance refers to a termination which consumes the application signal and dissipates energy.

Complex Correlation: The variables which are compared are represented by complex numbers. The resulting metric may have a complex number result.

Complex Number: A number which has two components; a real part and an imaginary part. The imaginary part is usually associated with a multiplicative symbol i) or j) which has a value $\sqrt{-1}$. The numbers are used to represent values on two different number lines and operations or calculations with these numbers require the use of complex arithmetic. Complex arithmetic and the associated numbers are used often in the study signals, mathematical spaces, physics and many branches of science and engineering.

Complex Signal Envelope: A mathematical description of a signal, x(t), suitable for RF as well as other applications. The various quantities and relationships that follow may be derived from one another using vector analysis and trigonometry as well as complex arithmetic.

$$x(t) = a(t)e^{j(\omega_c t\_+\phi(t))}$$

$$x(t) = a_I(t)\cos(\omega_c t + \phi(t)) - a_Q(t)\sin(\omega_c t + \phi(t))$$

$$\omega_c \equiv \text{Carrier Frequency}$$

$$\phi(t) \equiv \text{Phase Information vs. Time}$$

$$a(t) \equiv \text{Amplitude Information vs. Time}$$

-continued $$|a(t)| = \sqrt{a_I^2(t) + a_Q^2(t)}$$

$$\phi(t) = \arctan\left[\frac{a_Q(t)}{a_I(t)}\right][\text{sign}]$$

[sign]≡A function which accounts for the quadrant of $\phi(t)$ in the complex signal/waveform plane. Sometimes referred to as complex envelope or simply envelope.

Compositing: The mapping of one or more constituent signals or portions of one or more constituent signals to domains and their subordinate functions and arguments according to a FLUTTER™ algorithm. Blended controls developed in the FLUTTER™ algorithm, regulate the distribution of information to each constituent signal. The composite statistic of the blended controls is determined by an information source with source entropy of H(x), the number of the available degrees of freedom for the apparatus, the efficiency of each degree of freedom, and the corresponding potential to distribute a specific signal rate, as well as information, in each degree of freedom.

Consideration: Use as a factor in making a determination.

Constellation: Set of coordinates in some coordinate system with an associated pattern.

Constellation Point: A single coordinate from a constellation.

Constituent Signal: A signal which is part of a parallel processing path in FLUTTER™ and used to form more complex signals through compositing or other operations.

Coordinate: A value which qualifies and/or quantifies position within a mathematical space. Also may possess the meaning; to manage a process.

Correlation: The measure by which the similarity of two or more variables may be compared. A measure of 1 implies they are equivalent and a measure of 0 implies the variables are completely dissimilar. A measure of (−1) implies the variables are opposite or inverse. Values between (−1) and (+1) other than zero also provide a relative similarity metric.

Covariance: This is a correlation operation between two different random variables for which the random variables have their expected values or average values extracted prior to performing correlation.

Create: To make or produce or cause to exist; to being about; to bring into existence. Synthesize, generate.

Cross-Correlations: Correlation between two different variables.

Cross-Covariance: Covariance between two different random variables.

Current: The flow of charge per unit time through a circuit.

D2P™: Direct to Power (Direct2Power™) a registered trademark of ParkerVision Inc., corresponding to a proprietary RF modulator and transmitter architecture and modulator device.

D/A: Digital to Analog conversion.

Data Rates: A rate of information flow per unit time.

D.C.: Direct Current referring to the average transfer of charge per unit time in a specific path through a circuit. This is juxtaposed to an AC current which may alternate directions along the circuit path over time. Generally a specific direction is assigned as being a positive direct current and the opposite direction of current flow through the circuit is negative.

D.C. Coupled: A circuit or system/module is D.C. coupled at its interface to another circuit or system/module if D.C. current or a constant waveform value may pass through the interface.

DCPS: Digitally Controlled Power or Energy Source

Decoding: Process of extracting information from an encoded signal.

Decoding Time: The time interval to accomplish a portion or all of decoding.

Degrees of Freedom: A subset of some space (for instance phase space) into which energy and/or information can individually or jointly be imparted and extracted according to qualified rules which may determine codependences. Such a space may be multi-dimensional and sponsor multiple degrees of freedom. A single dimension may also support multiple degrees of freedom. Degrees of freedom may possess any dependent relation to one another but are considered to be at least partially independent if they are partially or completely uncorrelated. Degrees of freedom also possess a corresponding realization in the information encoding and modulation functions of a communications apparatus. Different mechanisms for encoding information in the apparatus may be considered as degrees of freedom.

Delta Function: In mathematics, the Dirac delta function, or δ function, is a generalized function, or distribution, on the real number line that is zero everywhere except at the specified argument of the function, with an integral equal to the value one when integrated over the entire real line. A weighted delta function is a delta function multiplied by a constant or variable.

Density of States for Phase Space: Function of a set of relevant coordinates of some mathematical, geometrical space such as phase space which may be assigned a unique time and/or probability, and/or probability density. The probability densities may statistically characterize meaningful physical quantities that can be further represented by scalars, vectors and tensors.

Derived: Originating from a source in a manner which may be confirmed by measure, analysis, or inference.

Desired Degree of Freedom: A degree of freedom that is efficiently encoded with information. These degrees of freedom enhance information conservation and are energetically conservative to the greatest practical extent. They are also known as information bearing degrees of freedom. These degrees of freedom may be deliberately controlled or manipulated to affect the causal response of a system through, and application of, algorithm or function such as a blended control function enabled by a FLUTTER™ algorithm.

Dimension: A metric of a mathematical space. A single space may have one or more than one dimension. Often, dimensions are orthogonal. Ordinary space has 3-dimensions; length, width and depth. However, dimensions may include time metrics, code metrics, frequency metrics, phase metrics, space metrics and abstract metrics as well, in any suitable quantity or combination.

Domain: A range of values or functions of values relevant to mathematical or logical operations or calculations. Domains may encompass processes associated with one or more degrees of freedom and one or more dimensions and therefore bound hyper-geometric quantities. Domains may include real and imaginary numbers, and/or any set of logical and mathematical functions and their arguments.

Encoding: Process of imprinting information onto a waveform to create an information bearing function of time.

Encoding Time: Time interval to accomplish, a portion or all, encoding.

Energy: Capacity to accomplish work where work is defined as the amount of energy required to move an object or associated physical field (material or virtual) through space and time. Energy may be measured in units of Joules.

Energy Function: Any function that may be evaluated over its arguments to calculate the capacity to accomplish work, based on the function arguments. For instance, energy may be a function of time, frequency, phase, samples, etc. When energy is a function of time it may be referred to as instantaneous power or averaged power depending on the context and distribution of energy vs. some reference time interval. One may interchange the use of the term power and energy given implied or explicit knowledge of some reference interval of time over which the energy is distributed. Energy may be quantified in units of Joules.

Energy Partition: A function of a distinguishable gradient field, with the capacity to accomplish work. Partitions may be specified in terms of functions of energy, functions of power, functions of current, functions of voltage, or some combination of this list.

Energy partitions are distinguished by distinct ranges of variables which define them. For instance, out of i possible energy domains the $k^{th}$ energy domain may associate with a specific voltage range or current range or energy range or momentum range . . . etc.

Energy Source or Sources: A device or devices which supplies or supply energy from one or more access nodes of the source or sources to one or more apparatuses. One or more energy sources may supply a single apparatus. One or more energy sources may supply more than one apparatus.

Entropy: Entropy is an uncertainty metric proportional to the logarithm of the number of possible states in which a system may be found according to the probability weight of each state.

{For example: information entropy is the uncertainty of an information source based on all the possible symbols from the source and their respective probabilities.}

{For example: Physical entropy is the uncertainty of the states for a physical system with a number of degrees of freedom. Each degree of freedom may have some probability of energetic excitation.}

Equilibrium: Equilibrium is a state for a system in which entropy is stable, i.e., no longer changing.

Ergodic: Stochastic processes for which statistics derived from time samples of process variables correspond to the statistics of independent ensembles selected from the process. For ergodic ensemble, the average of a function of the random variables over the ensemble is equal with probability unity to the average over one or more possible time translations of a particular member function of the ensemble, except for a subset of representations of measure zero. Although processes may not be perfectly ergodic they may be suitably approximated as so under a variety of practical circumstances.

Ether: Electromagnetic transmission medium, usually ideal free space unless otherwise implied. It may be considered as an example of a physical channel.

EVM: Error Vector Magnitude applies to a sampled signal that is described in vector space. The ratio of power in the unwanted variance (or approximated variance) of the signal at the sample time to the root mean squared power expected for a proper signal.

Excited: A stimulated state or evidence of a stimulated state relative to some norm.

Feedback: The direction of signal flow from output to input of a circuit or module or apparatus. Present output values of such architectures or topologies are returned or "fed back" to portions of the circuit or module in a manner to influence future outputs using control loops. Sometimes this may be referred to as closed loop feed forward (CLFF) to indicate the presence of a control loop in the architecture.

Feed forward: The direction of signal flow from input to output of a circuit or module or apparatus. Present output values of such architectures or topologies are not returned or "fed back" to portions of the circuit or module in a manner to influence future outputs using control loops. Sometimes this may be referred to as open loop feed forward (OLFF) to indicate the absence of a control loop in the architecture.

FLUTTER™: Algorithm which manages one or more of the degrees of freedom of a system to efficiently distribute energy via blended control functions to functions/modules within a communications apparatus. FLUTTER™ is a registered trademark of ParkerVision, Inc. Jacksonville, Fla.

Frequency: (a) Number of regularly occurring particular distinguishable events per unit time, usually normalized to a per second basis. Number of cycles or completed alternations per unit time of a wave or oscillation, also given in Hertz (Hz) or radians per second (in this case cycles or alternations are considered events). The events may also be samples per unit time, pulses per unit time, etc. An average rate of events per unit time.

(b) In statistics and probability theory the term frequency relates to how often or how likely the occurrence of an event is relative to some total number of possible occurrences. The number of occurrences of a particular value or quality may be counted and compared to some total number to obtain a frequency.

Frequency Span: Range of frequency values. Band of frequency values. Channel.

Function of: $\Im\{\ \}$ or $\tilde{\Im}\{\ \}$ are used to indicate a "function of" the quantity or expression (also known as argument) in the bracket { }. The function may be a combination of mathematical and/or logical operation.

Harmonic: Possessing a repetitive or rhythmic quality, rhythm or frequency which may be assigned units of Hertz (Hz) or radians per second (rad/s) or integral multiples thereof. For instance a signal with a frequency of $f_c$ possesses a first harmonic of $1f_c$ Hz, a second harmonic of $2f_c$ Hz, a third harmonic of $3f_c$ Hz, so on and so forth. The frequency $1f_c$ Hz or simply $f_c$ Hz is known as the fundamental frequency.

Hyper-Geometric Manifold: Mathematical surface described in a space with 4 or more dimensions. Each dimension may also consist of complex quantities.

Impedance: A measure to the opposition of time varying current flow in a circuit. The impedance is represented by a complex number with a real part or component also called resistance and an imaginary part or component also called a reactance. The unit of measure is ohms.

Imprint: The process of replicating information, signals, patterns, or set of objects. A replication of information, signals, patterns, or set of objects.

Information: A message (sequence of symbols) contains a quantity of information determined by the accumulation of the following; the logarithm of a symbol probability multiplied by the negative of the symbol probability, for one or more symbols of the message. In this case symbol refers to some character or representation from a source alphabet which is individually distinguishable and occurs with some probability in the context of the message. Information is therefore a measure of uncertainty in data, a message or the symbols composing the message. The calculation described above is an information entropy measure. The greater the entropy the greater the information content. Information can be assigned the units of bits or vats depending on the base of the logarithm.

In addition, for purpose of disclosure information will be associated with physical systems and processes, as an uncertainty of events from some known set of possibilities, which can affect the state of a dynamic system capable of interpreting the events. An event is a physical action or reaction which is instructed or controlled by the symbols from a message.

Information Bearing: Able to support the encoding of information. For example, information bearing degrees of freedom are degrees of freedom which may be encoded with information.

Information Bearing Function: Any set of information samples which may be indexed.

Information Bearing Function of Time: Any waveform, that has been encoded with information and therefore becomes a signal. Related indexed values may be assigned in terms of some variable encoded with information vs. time.

Information Entropy: H(p(x)) is also given the abbreviated notation H(x) and refers to the entropy of a source alphabet with probability density p(x), or the uncertainty associated with the occurrence of symbols (x) from a source alphabet. The metric H(x) may have units of bits or bits/per second depending on context but is defined by $$H(x)\sum_i -p(x_i)\log_b(p(x_i))$$

in the case where $p(x)_i$ is a discrete random variable. If p(x) is a continuous random variable then:

$$H(x) = -\int p(x)\log_b \frac{p(x)dx}{m(x)}$$

Using mixed probability densities, mixed random variables, both discrete and continuous entropy functions may apply with a normalized probability space of measure 1. Whenever b=2 the information is measured in bits. If b=e then the information is given in vats. H(x) may often be used to quantity an information source. (On occasion H(x), $H_x$ or its other representations may be referred to as "information", "information uncertainty" or "uncertainty". It is understood that a quantity of information, its entropy or uncertainty is inherent in such a shorthand reference.

Information Stream: A sequence of symbols or samples possessing an information metric. For instance, a code is an example of an information stream. A message is an example of an information stream.

Input Sample: An acquired quantity or value of a signal, waveform or data stream at the input to a function, module, apparatus, or system.

Instantaneous; Done, occurring, or acting without any perceptible duration of time; Accomplished without any delay being purposely introduced; occurring or present at a particular instant.

Instantaneous Efficiency: This is a time variant efficiency obtained from the ratio of the instantaneous output power divided by the instantaneous input power of an apparatus, accounting for statistical correlations between input and output. The ratio of output to input powers may be averaged.

Integrate: This term can mean to perform the mathematical operation of integration or to put together some number of constituents or parts to form a whole.

Interface: A place or area where different objects or modules or circuits, meet and communicate or interact with each other or values or attributes or quantities are exchanged.

Intermodulation Distortion: Distortion arising from non-linearities of a system. These distortions may corrupt a particular desired signal as it is processed through the system.

Iterative: Involving repetition. Involving repetition while incrementing values, or changing attributes.

$k_B$: (See Boltzmann's Constant)

Line: A geometrical object which exists in two or more dimensions of a referenced coordinate system. A line possesses a continuous specific sequence of coordinates within the reference coordinate system and also possesses a finite derivative at every coordinate (point) along its length. A line may be partially described by its arc length and radius of curvature. The radius of curvature is greater than zero at all points along its length. A curved line may also be described by the tip of a position vector which accesses each point along the line for a prescribed continuous phase function and prescribed continuous magnitude function describing the vector in a desired coordinate system.

Line Segment: A portion of a line with a starting coordinate and an ending coordinate.

Linear: Pertaining to a quality of a system to convey inputs of a system to the output of the system. A linear system obeys the principle of superposition.

Linear Operation: Any operation of a module system or apparatus which obeys the principle of superposition.

LO: Local Oscillator

Logic: A particular mode of reasoning viewed as valid or faulty, a system of rules which are predictable and consistent.

Logic Function: A circuit, module, system or processor which applies some rules of logic to produce an output from one or more inputs.

Macroscopic Degrees of Freedom: The unique portions of application phase space possessing separable probability densities that may be manipulated by unique physical controls derivable from the function $\tilde{\Im}\{H(x)_{v_i}\}$ and/or $\tilde{\Im}\{H(x)_{v,i}\}$ sometimes referred to as blended controls or blended control signals. This function takes into consideration, or accounts for, desired degrees of freedom and undesired degrees of freedom for the system. These degrees of freedom (undesired and desired) can be a function of system variables and may be characterized by prior knowledge of the apparatus a priori information.

Magnitude: A numerical quantitative measurement or value proportional to the square root of a squared vector amplitude.

Manifold: A surface in 3 or more dimensions which may be closed:

Manipulate: To move or control; to process using a processing device or algorithm:

Mathematical Description: Set of equations, functions and rules based on principles of mathematics characterizing the object being described.

Message: A sequence of symbols which possess a desired meaning or quantity and quality of information.

Metrics: A standard of measurement; a quantitative standard or representation; a basis for comparing two or more quantities. For example, a quantity or value may be compared to some reference quantity or value.

Microscopic Degrees of Freedom: Microscopic degrees of freedom are spontaneously excited due to undesirable modes within the degrees of freedom. These may include, for example, unwanted. Joule heating, microphonics, photon emission, electromagnetic (EM) field emission and a variety of correlated and uncorrelated signal degradations.

MIMO: Multiple input multiple output system architecture.

MISO: Multiple input single output operator.

Mixture: A combination of two or more elements; a portion formed by two or more components or constituents in varying proportions. The mixture may cause the components or constituents to retain their individual properties or change the individual properties of the components or constituents.

Mixed Partition: Partition consisting of scalars, vectors tensors with real or imaginary number representation in any combination.

MMSE: Minimum Mean Square Error. Minimizing the quantity $\langle(\tilde{X}-X)^2\rangle$ where $\tilde{X}$ is the estimate of X, a random variable. $\tilde{X}$ is usually an observable from measurement or may be derived from an observable measurement, or implied by the assumption of one or more statistics.

Modes: The manner in which energy distributes into degrees of freedom. For instance, kinetic energy may be found in vibrational, rotational and translation forms or modes. Within each of these modes may exist one or more than one degree of freedom. In the case of signals for example, the mode may be frequency, or phase or amplitude, etc. Within each of these signal manifestations or modes may exist one or more than one degree of freedom.

Modify: To change some or all of the parts of something.

Modulation: A change in a waveform, encoded according to information, transforming the waveform to a signal.

Modulation Architecture: A system topology consisting of modules and/or functions which enable modulation.

Modulated Carrier Signal: A sine wave waveform of some physical quantity (such as current or voltage) with changing phase and/or changing amplitude and/or changing frequency where the change in phase and amplitude are in proportion to some information encoded onto the phase and amplitude. In addition, the frequency may also be encoded with information and therefore change as a consequence of modulation.

Module: A processing related entity, either hardware, software, or a combination of hardware and software, or software in execution. For example, a module may be, but is not limited to being, a process running on a processor or microprocessor, an object, an executable, a thread of execution, a program, and/or a computer. One or more modules may reside within a process and/or thread of execution and a module may be localized on one chip or processor and/or distributed between two or more chips or processors. The term "module" also means software code, machine language or assembly language, an electronic medium that may store an algorithm or algorithms or a processing unit that is adapted to execute program code or other stored instructions. A module may also consist of analog, or digital and/or software functions in some combination or separately. For example an operational amplifier may be considered as an analog module.

Multiplicity: The quality or state of being plural or various.

Nat: Unit of information measure calculated using numbers with a natural logarithm base.

Node: A point of analysis, calculation, measure, reference, input or output, related to procedure, algorithm, schematic, block diagram or other hierarchical object. Objects, functions, circuits or modules attached to a node of a schematic or block diagram access the same signal and/or function of signal common to that that node.

Non Central: As pertains to signals or statistical quantities; the signals or statistical quantities are characterized by nonzero mean random processes or random variables.

Non-Excited: The antithesis of excited. (see unexcited)

Non-Linear: Not obeying the principle of super position. A system or function which does not obey the superposition principle.

Non-Linear Operation: Function of an apparatus, module, or system which does not obey superposition principles for inputs conveyed through the system to the output.

Nyquist Rate: A rate which is 2 times the maximum frequency of a signal to be reproduced by sampling.

Nyquist—Shannon Criteria: Also called the Nyquist-Shannon sampling criteria; requires that the sample rate for reconstructing a signal or acquiring/sampling a signal be at least twice the bandwidth of the signal (usually associated as an implication of Shannon's work). Under certain conditions the requirement may become more restrictive in that the required sample rate may be defined to be twice the frequency of the greatest frequency of the signal being sampled, acquired or reconstructed (usually attributed to Nyquist). At baseband, both interpretations apply equivalently. At pass band it is theoretically conceivable to use the first interpretation, which affords the lowest sample rate.

Object: Some thing, function, process, description, characterization or operation. An object may be abstract or material, of mathematical nature, an item or a representation depending on the context of use.

Obtain: To gain or acquire.

"on the fly": This term refers to a substantially real time operation which implements an operation or process with minimal delay maintaining a continuous time line for the process or operation. The response to each step of the operation, or procedure organizing the operation, responds in a manner substantially unperceived by an observer compared to some acceptable norm.

Operation: Performance of a practical work or of something involving the practical application of principles or processes or procedure; any of various mathematical or logical processes of deriving one entity from others according to a rule. May be executed by one or more processors or processing modules or facilities functioning in concert or independently.

Operational State: Quantities which define or characterize an algorithm, module, system or processor a specific instant.

Operatively Coupled: Modules or Processors which depend on their mutual interactions.

Optimize: Maximize or Minimize one or more quantities and/or metrics of features subject to a set of constraints.

PAER: Peak to Average Energy Ratio which can be measured in dB if desired. It may also be considered as a statistic or statistical quantity for the purpose of this disclosure. It is obtained by dividing the peak energy for a signal or waveform by its average energy.

PAPR: Peak to Average Power Ratio which can be measured in dB if desired. For instance PAPR is the peak to average power of a signal or waveform determined by dividing the instantaneous peak power excursion for the signal or waveform by its average power value. It may also be considered as a statistic or statistical quantity for the purpose of this disclosure.

Peak to Average Power Ratio which can be measured in dB if desired. For instance $PAPR_{sig}$ is the peak to average power of a signal determined by dividing the instantaneous peak power excursion for the signal by its average power value. It may also be considered as a statistic or statistical quantity for the purpose of this disclosure Parallel Paths: A multiplicity of paths or branches possessing the attribute of a common direction of signal or process flow through a module, circuit, system or algorithm. In a simple case parallel paths may possess a comment source terminal or node and a common ending node or terminus. Each path or branch may implement unique processor or similar processes.

Parameter: A value or specification which defines a characteristic of a system, module, apparatus, process, signal or waveform. Parameters may change.

Parsing: The act of dividing, sub dividing, distributing or partitioning.

Partial: Less than the whole.

Partitions: Boundaries within phase space that enclose points, lines, areas and volumes. They may possess physical or abstract description, and relate to physical or abstract quantities. Partitions may overlap one or more other partitions. Partitions may be described using scalars, vectors, tensors, real or imaginary numbers along with boundary constraints. Partitioning is the act of creating partitions.

Pass band: Range of frequencies with a substantially defined range or channel not possessing DC response or zero Hz frequency content.

Patches: A geometrical structure used as a building block to approximate a surface rendering from one or more patches.

PDF or Probability Distribution: Probability Distribution Function is a mathematical function relating a value from a probability space to another space characterized by random variables.

pdf or Probability Density: Probability Density Function is the probability that a random variable or joint random variables possess versus their argument values. The pdf may be normalized so that the accumulated values of the probability space possesses a measure of the CDF.

Phase Space: A conceptual space that may be composed of real physical dimensions as well as abstract mathematical dimensions, and described by the language and methods of physics, probability theory and geometry. In general, the phase space contemplates the state of matter within the phase space boundary, including the momentum and position for material of the apparatus.

Plane: Two dimensional geometrical object which, is defined by two straight lines.

Point: One dimensional mathematical or geometrical object, a single coordinate of a coordinate system.

Portion: Less than or equal to the whole.

Possess: To have, or to exhibit the traits of what is possessed.

Power Differential: Comparison of a power level to a reference power level by calculating the difference between the two.

Power Function: Energy function per unit time or the partial derivative of an energy function with respect to time. If the function is averaged it is an average power. If the function is not averaged it may be referred to as an instantaneous power. It has units of energy per unit time and so each coordinate of a power function has an associated energy which occurs at an associated time. A power function does not alter or change the units of its time distributed resource (i.e. energy in Joules).

Power Level: A quantity with the metric of Joules per second.

Power Source or Sources: An energy source or sources which is/are described by a power function or power functions. It may possess a single voltage and/or current or multiple voltages and/or currents deliverable to an apparatus or a load. A power source may also be referred to as power supply.

Probability: Frequency of occurrence for some event or events which may be measured or predicted from some inferred statistic.

Processing: The execution of a set of operations to implement a process or procedure.

Processing Paths: Sequential flow of functions, modules, and operations in an apparatus, algorithm, or system to implement a process or procedure.

Provide: Make available, to prepare.

Pseudo-Phase Space: to representation of phase space or application phase space which utilizes variables common to the definition of the apparatus such as voltage, current, signal, complex signal, amplitude, phase, frequency, etc. These variables are used to construct a mathematical space related to the phase space. That is, there is a known correspondence in change for the pseudo-phase space for a change in phase space and vice versa.

Q Components: Quadrature phase of a complex signal also called the complex part of the signal.

Radial Difference: Difference in length along a straight line segment or vector which extends along the radial of a spherical or a cylindrical coordinate system Radio Frequency (RF): Typically a rate of oscillation in the range of about 3 kHz to 300 GHz, which corresponds to the frequency of radio waves, and the alternating currents (AC), which carry radio signals. RF usually refers to electrical rather than mechanical oscillations, although mechanical RF systems do exist.

Random: Not deterministic or predictable.

Random Process: An uncountable, infinite, time ordered continuum of statistically independent random variables. A random process may also be approximated as a maximally dense time ordered continuum of substantially statistically independent random variables.

Random Variable: Variable quantity which is non-deterministic, or at least partially so, but may be statistically characterized. Random variables may be real or complex quantities.

Range: A set of values or coordinates from some mathematical space specified by a minimum and a maximum for the set Rate: Frequency of an event or action.

Real Component: The real portion/component of a complex number sometimes associated with the in-phase or real portion/component of a signal, current or voltage. Sometimes associated with the resistance portion/component of an impedance.

Related: Pertaining to, associated with.

Reconstituted: A desired result formed from one or more than one operation and multiple contributing portions.

Relaxation Time: A time interval for a process to achieve a relatively stable state or a relative equilibrium compared to some reference event or variable state reference process. For instance a mug of coffee heated in a microwave eventually cools down to assume a temperature nearly equal to its surroundings. This cooling time is a relaxation time differentiating the heated state of the coffee and the relatively cool state of the coffee?

Rendered: Synthesized, generated or constructed or the result of a process, procedure, algorithm or function.

Rendered Signal: A signal which has been generated as an intermediate result or a final result depending on context. For instance, a desired final RF modulated output can be referred to as a rendered signal.

Rendering Bandwidth: Bandwidth available for generating a signal or waveform.

Rendering Parameters: Parameters which enable the rendering process or procedure.

Representation: A characterization or description for an object, or entity. This may be for example, a mathematical characterization, graphical representation, model, . . . etc.

Rotational Energy: Kinetic energy associated with circular or spherical motions.

Response: Reaction to an action or stimulus.

Sample: An acquired quantity or value. A generated quantity or value.

Sample Functions: Set of functions which consist of arguments to be measured or analyzed or evaluated. For instance, multiple segments of a waveform or signal could be acquired or generated ("sampled") and the average, power, or correlation to some other waveform, estimated from the sample functions.

Sample Regions: Distinct spans, areas, or volumes of mathematical spaces which can contain, represent and accommodate a coordinate system for locating and quantifying the metrics for samples contained within the region.

Scalar Partition: Any partition consisting of scalar values.

Set: A collection, an aggregate, a class, or a family of any objects.

Signal: An example of an information bearing function of time, also referred to as information bearing energetic function of time and space that enables communication.

Signal Constellation: Set or pattern of signal coordinates in the complex plane with values determined from $a_I(t)$ and $a_Q(t)$ and plotted graphically with $a_I(t)$ versus $a_Q(t)$ or vice versa. It may also apply to a set or pattern of coordinates within a phase space. $a_I(t)$ and $a_Q(t)$ are in phase and quadrature phase signal amplitudes respectively. $a_I(t)$ and $a_Q(t)$ are functions of time obtained from the complex envelope representation for a signal.

Signal Efficiency: Thermodynamic efficiency of a system accounting only for the desired output average signal power divided by the total input power to the system on the average.

Signal Ensemble: Set of signals or set of signal samples or set of signal sample functions.

Signal Envelope Magnitude: This quantity is obtained from $(a_I^2+a_Q^2)^{1/2}$ where $a_I$ is the in phase component of a complex signal and $a_Q$ is the quadrature phase component of a complex signal. $a_I$ and $a_Q$ may be functions of time.

Signal of Interest: Desired signal. Signal which is the targeted result of some operation, function, module or algorithm.

Signal Phase: The angle of a complex signal or phase portion of $a(t)e^{-j\omega_c t+\phi}$ where $\phi$ can be obtained from $$\phi = (\text{sign})\tan^{-1}\frac{a_Q}{a_I}$$

and the sign function is determined from the signs of $a_Q$, $a_I$ to account for the repetition of modulo tan $a_Q/a_I$.

$a_I(t)$ and $a_Q(t)$ are in phase and quadrature phase signal amplitudes respectively. $a_I(t)$ and $a_Q(t)$ are functions of time obtained from the complex envelope representation for a signal.

Signal Partition: A signal or signals may be allocated to separate domains of a FLUTTER™ processing algorithm. Within a domain a signal may possess one or more partitions. The signal partitions are distinct ranges of amplitude, phase, frequency and/or encoded waveform information. The signal partitions are distinguishable by some number of up to and including ν degrees of freedom they associate with where that number is less than or equal to the number of degrees of freedom for a domain or domains to which a signal partition belongs.

Sources: Origination of some quantity such as information, power, energy, voltage or current.

Space: A region characterized by span or volume which may be assigned one or more dimensional attributes. Space may be a physical or mathematical construct or representation. Space possesses a quality of dimension or dimensions with associated number lines or indexing strategies suitable for locating objects assigned to the space their relative positions as well as providing a metric for obtaining characteristics of the assigned objects. Space may be otherwise defined by an extent of continuous or discrete coordinates which may be accessed. Space may be homogeneous or nonhomogeneous. A nonhomogeneous space has continuous and discrete coordinate regions or properties for calculations of metrics within the space which change from some domain or region within the space to another domain or region within the space. A homogeneous space possesses either a continuum of coordinates or a discrete set of coordinates and the rules for calculating metrics do not change as a function of location within the space. Space may possess one or more than one dimension.

Spawn: Create, generate, synthesize.

Spectral Distribution: Statistical characterization of a power spectral density.

Spurious Energy: Energy distributed in unwanted degrees of freedom which may be unstable, unpredictable, etc.

Statistic: A measure calculated from sample functions of a random variable.

Statistical Dependence: The degree to which the values of random variables depend on one another or provide information concerning their respective values.

Statistical Parameter: Quantity which affects or perhaps biases a random variable and therefore its statistic.

Statistical Partition: Any partition with mathematical values or structures, i.e., scalars, vectors, tensors, etc., characterized statistically.

Stimulus: An input for a system or apparatus which elicits a response by the system or apparatus.

Storage Module: A module which may store information, data, or sample values for future use or processing.

Subset: A portion of a set. A portion of a set of objects.

Sub-Surfaces: A portion of a larger surface.

Sub-system: A portion of a system at a lower level of hierarchy compared to a system.

Subordinate: A lower ranking of hierarchy or dependent on a higher priority process, module, function or operation.

Substantially: An amount or quantity which reflects acceptable approximation to some limit.

Suitable: Acceptable, desirable, compliant to some requirement, specification, or standard.

Superposition: A principle which may be given a mathematical and systems formulation. For n given inputs ($x_1, x_2, \ldots, x_n$) to a system the output y of the system may be obtained from either of the following equations if the principle of superposition holds;

$$\Im\{x_1+x_2+\ldots x_n\}=y \text{ or } \Im\{x_1\}+\Im\{x_2\}+\ldots \Im\{x_n\}=y$$

That is, the function $\Im\{\ \}$ may be applied to the sum of one or more inputs or to each input separately then, summed to obtain an equivalent result in either case. When this condition holds then the operation described by $\Im\{\ \}$, for instance a system description or an equation, is also said to be linear.

Switch or Switched: A discrete change in a values and/or processing path, depending on context. A change of functions may also be accomplished by switching between functions.

Symbol: A segment of a signal (analog or digital), usually associated with some minimum integer information assignment in bits, or nats.

System Response: A causal reaction of a system to a stimulus.

Tensor: A mathematical object formed from vectors and arrays of values. Tensors are geometric objects that describe linear relations between vectors, scalars, and other tensors. Elementary examples of such relations include the dot product, the cross product and linear maps. Vectors and scalars themselves are also tensors. A tensor can be represented as a multi-dimensional array of numerical values Tensor Partition: Any partition qualified or characterized by tensors.

Thermal Characteristics: The description or manner in which heat distributes in the various degrees of freedom for an apparatus.

Thermodynamic Efficiency: Usually represented by the symbol η or $\tilde{\eta}$ and may be accounted for by application of the $1^{st}$ and $2^{nd}$ Laws of Thermodynamics.

$$\eta \equiv \frac{P_{out}}{P_{in}}$$

where $P_{out}$ is the power in a proper signal intended for the communication sink, load or channel, $P_{in}$ is measured as the power supplied to the communications apparatus while performing it's function. Likewise, $E_{out}$ corresponds to the proper energy out of an apparatus intended for communication sink, load or channel, while $E_{in}$ is the energy supplied to the apparatus.

$$\eta \equiv \frac{E_{out}}{E_{in}}$$

Thermodynamic Entropy: probability measure for the distribution of energy amongst one or more degrees of freedom for a system. The greatest entropy for a system occurs at equilibrium by definition. It is often represented with the symbol S. Equilibrium is determined when $$\frac{dS_{tot}}{dt} \to 0.$$

"→" in this case means "tends toward the value of".

Thermodynamic Entropy Flux: A concept related to the study of transitory and non-equilibrium thermodynamics. In this theory entropy may evolve according to probabilities associated with random processes or deterministic processes based on certain system gradients. After a long period, usually referred to as the relaxation time, the entropy flux dissipates and the final system entropy becomes the approximate equilibrium entropy of classical thermodynamics, or classical statistical physics.

Thermodynamics: A physical science that accounts for variables of state associated with the interaction of energy and matter. It encompasses a body of knowledge based on 4 fundamental laws that explain the transformation, distribution and transport of energy in a general manner.

Transformation: Changing from one form to another.

Transition: Changing between states or conditions.

Translational Energy: Kinetic energy associated with motion along a path or trajectory.

Uncertainty: Lack of knowledge or a metric represented by H(x), also Shannon's uncertainty.

Undesired Degree of Freedom: A subset of degrees of freedom that give rise to system inefficiencies such as energy loss or the non-conservation of energy and/or information loss and non-conservation of information with respect to a defined system boundary. Loss refers to energy that is unusable for its original targeted purpose.

Unexcited State: A state that is not excited compared to some relative norm defining excited. A state that is unexcited is evidence that the state is not stimulated. An indication that a physical state is unexcited is the lack of a quantity of energy in that state compared to some threshold value.

Utilize: Make use of.

Variable: A representation of a quantity that may change.

Variable Energy Source: An energy source which may change values, with or without the assist of auxiliary functions, in a discrete or continuous or hybrid manner.

Variable Power Supply: A power source which may change values, with or without the assist of auxiliary functions, in a discrete or continuous or hybrid manner.

Variance: In probability theory and statistics, variance measures how far a set of numbers is spread out. A variance of zero indicates that one or more of the values are identical. Variance is always non-negative: a small variance indicates that the data points tend to be very close to the mean (expected value) and hence to each other, while a high variance indicates that the data points are very spread out around the mean and from each other.

The variance of a random variable X is its second central moment, the expected value of the squared deviation from the mean $\mu=E[X]$:

$$\mathrm{Var}(X)=E[(X-\mu)^2].$$

This definition encompasses random variables that are discrete, continuous, neither, or mixed. The variance can also be thought of as the covariance of a random variable with itself:

$$\mathrm{Var}(X)=\mathrm{Cov}(X,X).$$

The variance is also equivalent to the second cumulant of the probability distribution for X. The variance is typically designated as Var(X), $\sigma^2_X$, or simply $\sigma^2$ (pronounced "sigma squared"). The expression for the variance can be expanded:

$$\begin{aligned}\mathrm{Var}(X) &= E[(X-E[X])^2]\\ &= E[X^2-2XE[X]+(E[X])^2]\\ &= E[X^2]-2E[X]E[X]+(E[X])^2\\ &= E[X^2]-(E[X])^2\end{aligned}$$

A mnemonic for the above expression is "mean of square minus square of mean".

If the random variable X is continuous with probability density function $f(x)$, then the variance is given by;

$$\mathrm{Var}(X)=\sigma^2=\int(x-\mu)^2 f(x)dx=\int x^2 f(x)dx-\mu^2$$

where $\mu$ is the expected value, $$\mu=\int x f(x)dx$$

and where the integrals are definite integrals taken for x ranging over the range of the random variable X.

Vector Partition: Any partition consisting of or characterized by vector values.

Vibrational Energy: Kinetic energy contained in the motions of matter which rhythmically or randomly vary about some reference origin of a coordinate system.

Voltage: Electrical potential difference, electric tension or electric pressure (measured in units of electric potential: volts, or joules per coulomb) is the electric potential difference between two points, or the difference in electric potential energy of a unit charge transported between two points. Voltage is equal to the work done per unit charge against a static electric field to move the charge between two points in space. A voltage may represent either a source of energy (electromotive force), or lost, used, or stored energy (potential drop). Usually a voltage is measured with respect to some reference point or node in a system referred to a system reference voltage or commonly a ground potential. In many systems a ground potential is zero volts though this is not necessarily required.

Voltage Domain: A domain possessing functions of voltage.

Voltage Domain Differential: Differences between voltages within a domain.

Waveform Efficiency: This efficiency is calculated from the average waveform output power of an apparatus divided by its averaged waveform input power.

Work: Energy exchanged between the apparatus and its communications sink, load, or channel as well as its environment, and between functions and modules internal to the apparatus. The energy is exchanged by the motions of charges, molecules, atoms, virtual particles and through electromagnetic fields as well as gradients of temperature. The units of work may be Joules. The evidence of work is measured by a change in energy.

$\because\cdot$: A symbol (typically 3 dots or more) used occasionally in equations, drawings and text to indicate an extension of a list of items, symbols, functions, objects, values, etc. . . . as required by the context. For example the notation $\nu_1, \nu_2 \ldots \nu_n$ indicates the variable $\nu_1$, the variable $\nu_2$, and all variables up to and including $\nu_n$, where n is a suitable integer appropriate for the context. The sequence of dots may also appear in other orientations such as vertical column or semicircle configuration.

$\nu$+i: This is the total of the number of desirable degrees of freedom of a FLUTTER™ based system also known as the blended control Span, composed of some distinct number of degrees of freedom $\nu$ and some number of energy partitions i. $\nu$ and i are suitable integer values.

$\nu_i$: $\nu_i$ is the $i^{th}$ subset of $\nu$ degrees of freedom. Each $\nu_1, \nu_2, \ldots \nu_i$ of the set may represent a unique number and combination of the $\nu$ distinct degrees of freedom. The subscript i indicates an association with the $i^{th}$ energy partition. $\nu_i$ is sometimes utilized as a subscript for FLUTTER™ system variables and/or blended control functions $\nu$.i: This represents a joint set of values which may be assigned or incremented as required depending on context. The set values $\nu$, i are typically utilized as an index for blended control enumeration. For example $\tilde{\Im}\{H(x)_{\nu,i}\}$ has the meaning; The $\nu^{th}$, $i^{th}$ function of system information entropy H(x), or some subset of these functions. $H(x)_{\nu,i}$ may represent some portion of the system entropy H(x) depending on the values assumed by ν,i.

x→y; The arrow (→) between two representative symbols or variables means that the value on the left approaches the value on the right, for instance, x→y means x becomes a value substantially the same as y or the variable x is approximately the same as y. In addition, x and y can be equations or logical relationships.

$\tilde{\Im}\{H(x)_{\nu,i}\}$: This notation is generally associated with blended controls. It has several related meanings including;
a) A function of the $\nu^{th}$, $i^{th}$ Information Entropy Function parsed from H(x).
b) A subset of blended controls for which ν, i may assume appropriate integer values.
c) An expanded set in matrix form $$\tilde{\Im}\begin{vmatrix} H(x)_{1,1,} & H(x)_{1,2} & \dots & H(x)_{1,i} \\ \vdots & \ddots & & \\ H(x)_{\nu,1} & H(x)_{\nu,2} & \dots & H(x)_{\nu,i} \end{vmatrix}$$

The meaning of $\tilde{\Im}\{H(x)_{\nu,i}\}$ from the definitions a), b), c) depends on the context of discussion.

+ or +/−: The value or symbol or variable following this ± may assume positive or negative values. For instance, $+/-V_s$ means that $V_s$ may be positive or negative.

∓ or −/+: The value or symbol or variable following this ∓ may assume negative or positive values. For instance, $-/+V_s$ means that $V_s$ may be negative or positive.

$\int_{ll}^{ul} f(x)dx$: Integration is a mathematical operation based on the calculus of Newton and Leibnitz which obtains a value for the area of a curve under the function of variable x, ƒ(x) between the function limits of ll a lower limit value and ul the upper limit value.

$\Sigma_n x_n$: Summation is a mathematical operation which sums together all $x_n = x_1, x_2, \ldots$ of a set of values over the index n which may take on integer values.

⟨ ⟩: The brackets indicate a time domain average of the quantity enclosed by the bracket.

Shannon created the standard by which communications systems are measured. His information capacity theorems are universally recognized and routinely applied by communications systems engineers. Shannon's theorems provide a way of calculating information transfer per unit time for given signal and noise power, yet there is no explicit connection of these concepts to power consumption. This disclosure provides that connection. Power efficiency is an increasingly important topic due to the proliferation of mobile communications and mobile computing. Battery life and heat dissipation versus the bandwidth and quality of service are driving market concerns for mobile communications.

In an embodiment, the preferred power efficiency metric is the thermodynamic efficiency η defined as the effective power output of a system for a given invested input power. $P_e$ is the effective power delivered by the system and $P_w$ is the waste power so that efficiency is given by:

$$\eta = \frac{P_e}{P_e + P_w}$$

In a communications system, the effective output power is defined as the power delivered to the communications load or sink and exclusively associated with the information bearing content of a signal. The waste energy is associated with non-information bearing degrees of freedom within the communications system which siphon some portion of the available input power. Though $P_w$ can take many intermediate forms of expression, it is ultimately dissipated as heat in the environment.

The principles presented herein can be applied to any communications process, whether it be mechanical, electrical, or optical by nature. The classical laws of motion, first two laws of thermodynamics and Shannon's uncertainty function provide common frameworks for analysis and foundation for development of important models.

Shannon's approach is based on a mathematical model rather than physical insight. A particle based model is introduced to emphasize physical principles. At a high level of abstraction, the model retains the classical form used by Shannon, comprising transmitter (Tx), physical transport media and receiver (Rx). Collectively, these elements and supporting functions comprise the extended channel. FIG. 1 is an illustration of an extended channel model 100 and includes channel input 102, Tx 104, a physical transport medium 106, band width limited additive white Gaussian Noise (AWGN) 108, Rx 110, and channel output 112, in accordance with one or more embodiments.

Some principles reveal that the nature of the communications process are complementary to Shannon's approach. Momentum is a metric for analyzing the motion of material bodies and particles. The transfer of information using particle based models is accomplished through the exchange of momentum, imprinting the information expressed in the motion of one particle on another.

Momentum transfer principles are presented which can be used to analyze the efficiency of any communications subsystem or extended channel. The principles can be applied to any interface where information is transferred.

The capacity, C, of an extended communications channel which propagates a signal with average power, $\overline{P}$, in watts, and bandwidth B, in Hz, in the presence of band limited AWGN with average power $\overline{N}$, is given by;

$$C = B\log_2\left(\frac{\overline{P}+\overline{N}}{\overline{N}}\right)\frac{\text{bits}}{\text{second}} \quad \text{Equation 1-1}$$

$B=2f_s$ Hz where $f_s$ is a Shannon-Nyquist sampling frequency required for signal construction.

In Section 3, $f_s$ is derived as the frequency of the forces required in an embodiment to impart momentum to a particle to encode it with information. The bandwidth B in a physical system is a direct consequence of the maximum available power $P_m$, to facilitate particle motion. $P_m$ plays the analogous role in an electronics apparatus when specifying the maximum limit of a power supply with average power $P_s$.

In Section 5, the efficiency η is studied in detail to establish the power resource required to generate the average signal power $\overline{P}$. From the basic definition of efficiency one can state:

$$\eta = \frac{\overline{P}}{P_s}$$

It is shown in Sections 3 and 5 that the average power supplied to a communications apparatus is $f_s\langle\varepsilon_{in}\rangle_s$ where $\langle \varepsilon_{in} \rangle \varepsilon_e$, is the average energy per sample of a communications process over time. Some of this energy, $\varepsilon_e$, is effectively used to generate and transfer a signal and some is waste, $\varepsilon_w$.

It is clear that for an efficiency of 100 percent that a given non zero and finite capacity in bits per second is attained with the lowest investment of power, $f_s \langle \varepsilon_{in} \rangle_s$. In some embodiments, η would be fixed for a given C. However, in other embodiments such as methods introduced in Sections 5, 6 and 7 permit improvement of η subject to an optimization procedure.

It is further shown in Section 5 that the efficiency of an information encoding process can be captured by the following simple equation:

$$\langle \eta \rangle = \frac{1}{k_{mod} PAPR + k_g}$$

which $k_{mod}$ and $k_\sigma$ are constants of implementation for the encoding apparatus and PAPR is defined as the peak to average power ratio of the encoded signal. The PAPR is defined for a non-dissipative system as:

$$PAPR = \frac{P_m}{\langle P_e \rangle}$$

The encoding also applies for decoding of information in a particle based model since imparted momentum is relative.

In some embodiments, communications processes should conserve information with maximum efficiency as a design goal. The fundamental principles which determine conserved momentum exchanges between particles or virtual particles are necessary and sufficient to satisfy the required information theory constraints and derive efficiency optimization relationships. In this manner the macroscopic observable, η which is regarded as a thermodynamic quantity, can be related to microscopic momentum exchanges.

1.1. Capacity and Efficiency

Shannon proved that the capacity of a system is achieved when the signal possesses a Gaussian statistic. However, this poses a dilemma because such signals are not finite. In the context of a physical model, the power resource $P_m$ would grow infinitely large and the efficiency of encoding a signal would correspondingly become zero. In addition, the duration of a signal would be infinite as shown in Section 2. These extremes are avoided by utilizing a prototypical Gaussian signal truncated to a 12 dB PAPR which preserves nearly all of the information encoded in the Gaussian signal.

A capacity equation is derived in Section 4 using the physical model developed in Section 3. This capacity equation is called the physical capacity equation and resembles the Shannon-Hartley equation with variations substantiated by physical principles. A notable differentiation is that for a given energy investment the capacity is twice that of the classical capacity equation per encoding dimension because information can be independently encoded in both position and momentum of a particle. Another difference is a modification to avoid an infinite capacity for the condition of zero degrees Kelvin. The quantities $f_s$, $P_m$, and PAPR play a prominent role in the equation along with the random variables, momentum and position.

In Section 5, the efficiency of the capacity based on the prototypical Gaussian signal with a 12 dB PAPR is obtained. This Gaussian signal possesses an entropy defined by Shannon (see Section 2) and Section 10.10 (Appendix J) which is given by $\sim\ln(\sqrt{2\pi e}\sigma)$ where σ is the standard deviation of the Gaussian signal. σ is approximately 1 for the prototypical Gaussian reference signal. The thermodynamic efficiency for encoding this signal is strongly inversely related to the PAPR yet can be improved by using techniques introduced in Sections 6 and 7. It is also shown that PAPR is a nonlinear monotonically increasing parameter of a signal as capacity increases up to the classical Gaussian limit. Thus, efficiency is strongly inversely proportional to capacity. Efficiency enhancement exploits this relationship. The procedures for efficiency enhancement are accompanied with an optimization procedure which is a numerical calculus of variations approach in Section 7.

In high SNR it is possible to estimate the performance bounds of other signals possessing non-Gaussian densities in a comparative manner by defining a normalized entropy ratio $H_r$ which compares the Shannon entropy of a signal of interest to the quantity $\ln(\sqrt{2\pi e}\sigma)$ in such a manner that the ratio $H_r \leq 1$.

It is shown in Section 5 that as $H_r$ becomes smaller, the information transfer of a channel becomes smaller but the efficiency can correspondingly increase. This is because the PAPR for such signals correspondingly decreases.

In some embodiments, it is of practical concern to design efficient systems which ever press Shannon's theoretical limit but do not achieve $H_r=1$. The methods for efficiency enhancement for the Gaussian prototype signal are shown to also apply to all signals. Thus, even if a signal is inherently more efficient than the Gaussian prototype, the efficiency may still be significantly improved. This improvement can be several fold for complexly encoded signals. This is of particular interest to those engaged in designs which use standards-based signals deployed by the telecommunications industry as well as wireless local area networks (WLAN).

There is a diminishing rate of return for the investment of resources to improve efficiency. This is evident in the theoretical calculations of Section 5 and verified with laboratory hardware in Section 7. Hardware was constructed to measure the efficiency of the prototypical Gaussian signal prior to efficiency enhancement and after an optimization was performed. Likewise, several standards-based waveforms were also tested on the same hardware. The results reveal that the particle based theories extrapolate in a very accurate manner to an electronics application. The theory is not restricted to Gaussian waveforms but enables prediction of the efficiency for any signal before and after optimization.

1.2. Additional Discussion of Communication

Communications is the Transfer of Information Through Space and Time.

It follows, that information transfer is based on physical processes.

In some embodiments, the essential assumptions are; that a transmitter and receiver cannot be collocated in the coordinates of space-time, and that information is transferred between unique coordinates in space-time. Instantaneous action at a distance is not permitted. Also, the discussion is restricted to classical speeds where it is assumed $v/c \ll 1$.

The measure for information is usually defined by Shannon's uncertainty metric H (p(x)), discussed in detail in the next section. Shannon's uncertainty function permits maximum deviation of a constituent random variable x, given its describing probability density ρ(x), on a per sample basis without physical restriction or impact. This disclosure introduces these restrictions through the joint entropy H(ρ(q,ρ)) where q is position and ρ is momentum. It should be noted that a practical form of the Shannon—Hartley capacity equation requires the insertion of the bandwidth B. The insertion of B limits the rate of change of the random signal x(t) through a Fourier transform. Since x(t) has a limited rate of change, the physical states of encoding evolve to realize full uncertainty over a specified phase space. The more rapid the evolution, the greater the investment of energy per unit time for a moving particle to access the full uncertainty of a phase space based on physical coordinates, q, ρ.

A Signal Shall be Defined as an Information Bearing Function of Space-Time.

It is assumed that continuous signals can be represented by discrete samples versus time through sampling theorems. In an embodiment, the discrete samples are associated as the position and momentum coordinates of particles comprising the signals.

2. Capacity Equations

Shannon proved the following capacity limit (Shannon-Hartley Equation) for information transfer through a bandwidth limited continuous AWGN channel based on mathematical reasoning and geometric arguments.

$$C = B\log_2\left(\frac{\overline{P}+\overline{N}}{\overline{N}}\right) \qquad \text{Equation 2-1}$$

Where C $\underline{\Delta}$ is channel capacity in bits/second, B $\underline{\Delta}$ is bandwidth of the entire channel in Hz, $\overline{P}$ $\underline{\Delta}$ is average power for the signal of interest in Joules/second (J/s), and $\overline{N}$ $\underline{\Delta}$ is average power for additive white Gaussian noise (AWGN) of the channel in Joules/second (J/s).

The definition for capacity is based on:

$$C = \lim_{T\to\infty}\frac{\log_2 M}{T} \qquad \text{Equation 2-2}$$

Where M is the number of unique signal functions or messages per time interval T which can be distinguished within a hyper geometric message space constraining the signal plus additive white Gaussian noise (AWGN). The noise does not remain white due to the influence of B yet does retain its Gaussian statistic. Shannon reasoned that each point in the hyperspace represents a single message signal of duration T and that there is no restriction on the number of such distinguishable points except for the influence of uncorrelated noise sharing the hyperspace.

Figure 2:
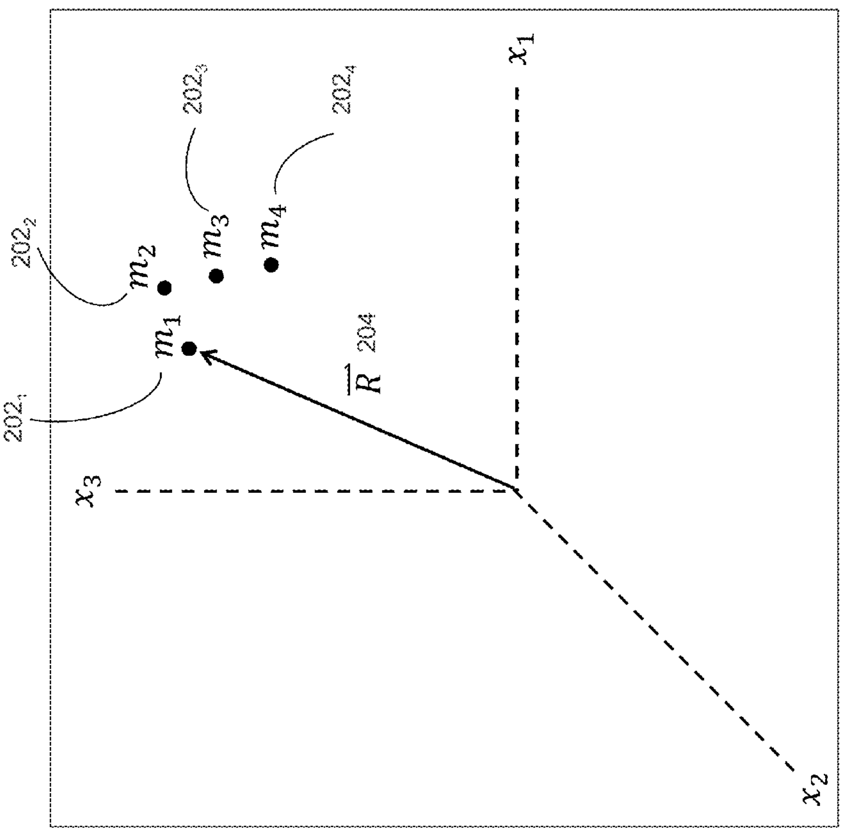
FIG. 2 is an illustration of a location of a message $m_i$ in hyperspace, in accordance with one or more embodiments.

FIG. 2 is an illustration of a location of a message $m_i$ in hyperspace 200, in accordance with one or more embodiments. Several points $202_1$, $202_2$, $202_3$, and $202_4$ (generally 202) are illustrated in Shannon's hypergeometric space, in this example case a 3-dimensional view. Shannon permits an infinite number of dimensions in his hyperspace. Time is collapsed at each point. The radial vector $\vec{R}$ 204 is a distance from the origin in this hyperspace and is related to the average power $\overline{P}_i$ of the $m_i^{th}$ message.

Figure 3A:
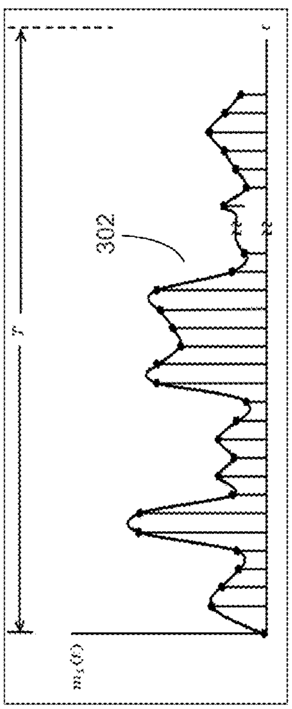
FIGS. 3A-3C are illustrations of sample message signals, in accordance with one or more embodiments.
Figure 3B:
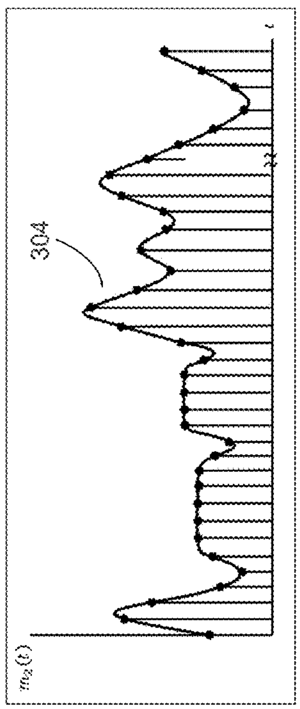
Figure 3C:
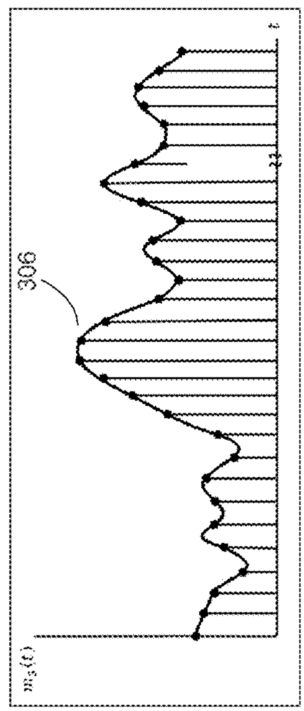

FIGS. 3A-3C are illustrations of sample message signals $m_i(t)$ 302, 304, and 306, each of Duration T in Seconds and Sampling Interval $T_s=(T/N_S)=(\frac{1}{2}B)$ where $N_S$ is the Number of Samples over T, $T_sN_s=T$, in accordance with one or more embodiments. Consider the following structure of time continuous sampled message signals with time on the horizontal. Each sample ordinate is marked with a vertical line punctuated by a dot.

Continuous waveforms can be precisely reproduced by interpolation of the samples using the Cardinal Series originally introduced by Whittaker and adopted by Shannon. The following series forms the basis for Shannon's sampling theorem.

$$m_i(t) = \sum_{n=-\infty}^{\infty} m_{i,n}\frac{\sin\pi(2Bt-n)}{\pi(2Bt-n)} \qquad \text{Equation 2-3}$$

If the samples are enumerated according to the principles of Nyquist and Shannon, equation 2-3 becomes:

$$m_i(t) = \sum_{n=1}^{2TN_S} m_{i,n}\frac{\sin\pi(2Bt-n)}{\pi(2Bt-n)} \qquad \text{Equation 2-4}$$

For regular sampling, the time between samples, $T_s$, is given by a constant ½B in seconds. This scheme permits faithful reproduction of each $m_i(t)$ message signals with discrete coordinates whose weights are $m_n$ for the $n^{th}$ sample.

Thus, Shannon conceives a hyperspace whose coordinates are message signals, statistically independent, and mutually orthogonal over T. He further proves that the magnitude of coordinate radial $\vec{R}_i$ is given by:

$$|R_i| = \sqrt{2BT\overline{P}_i} \qquad \text{Equation 2-5}$$

Where $\overline{P}_i$ is the average of 2BT sample energies per unit time obtained from the expected value of the squared message signals.

$$\overline{P}_i = \frac{1}{2BT}\sum_n m_{i,n}^2 \equiv E\{m_i^2\} \qquad \text{Equation 2-6}$$

Shannon focused on the conditions where T→∞. This also implies $N_s$→∞. If all messages permitted in the hyperspace are characterized by statistically independent and identically distributed (iid) random variables (RV) then the expected values of Equation 2-6 are identical. The independently averaged message signal energies are compressed to a relatively thin hyper shell at the nominal radius;

$$R = \sqrt{2BT\overline{P}} \qquad \text{Equation 2-7}$$

Having established the geometric view without noise, it is possible to introduce a noise process which possesses a Gaussian statistic. Each of the $m_i$ messages 302, 304, and 306 is corrupted by the noise. The noise on each message is also iid. It is implied that each of the potential $m_i$ messages 302, 304, and 306, or sub sequence of samples hereafter referred to as symbols, are known a priori and thus distinguishable through correlation methods at a receiver. The symbols are known to be from a standard alphabet. In some embodiments, however, the particular transmitted symbol from the alphabet is unknown until detected at the receiver. Hence, each coordinate in the hyper-space possesses an associated function which must be cross-correlated with the incoming messages and the largest correlation is declared as the message which is most likely communicated. Whenever averaged noise waveform, $\overline{n(t)}=0$, then the normalized correlation coefficient magnitude, $|\rho|=1$ for the correct message and zero for all other cross-correlation events. Whenever $\overline{n(t)}\neq 0$ there are partial correlations for all potential messages. Each sample illustrated in FIGS. 3A-3C would become perturbed by the noise process. Reconstruction of the sampled signals plus noise would reproduce the original message along with a superposition of the noise samples according to the sampling theorem. The effect that noise induces in the hyper geometric view can be understood by considering adjacent messages in the space when the message of interest is corrupted and the observation interval T is finite.

Figure 4:
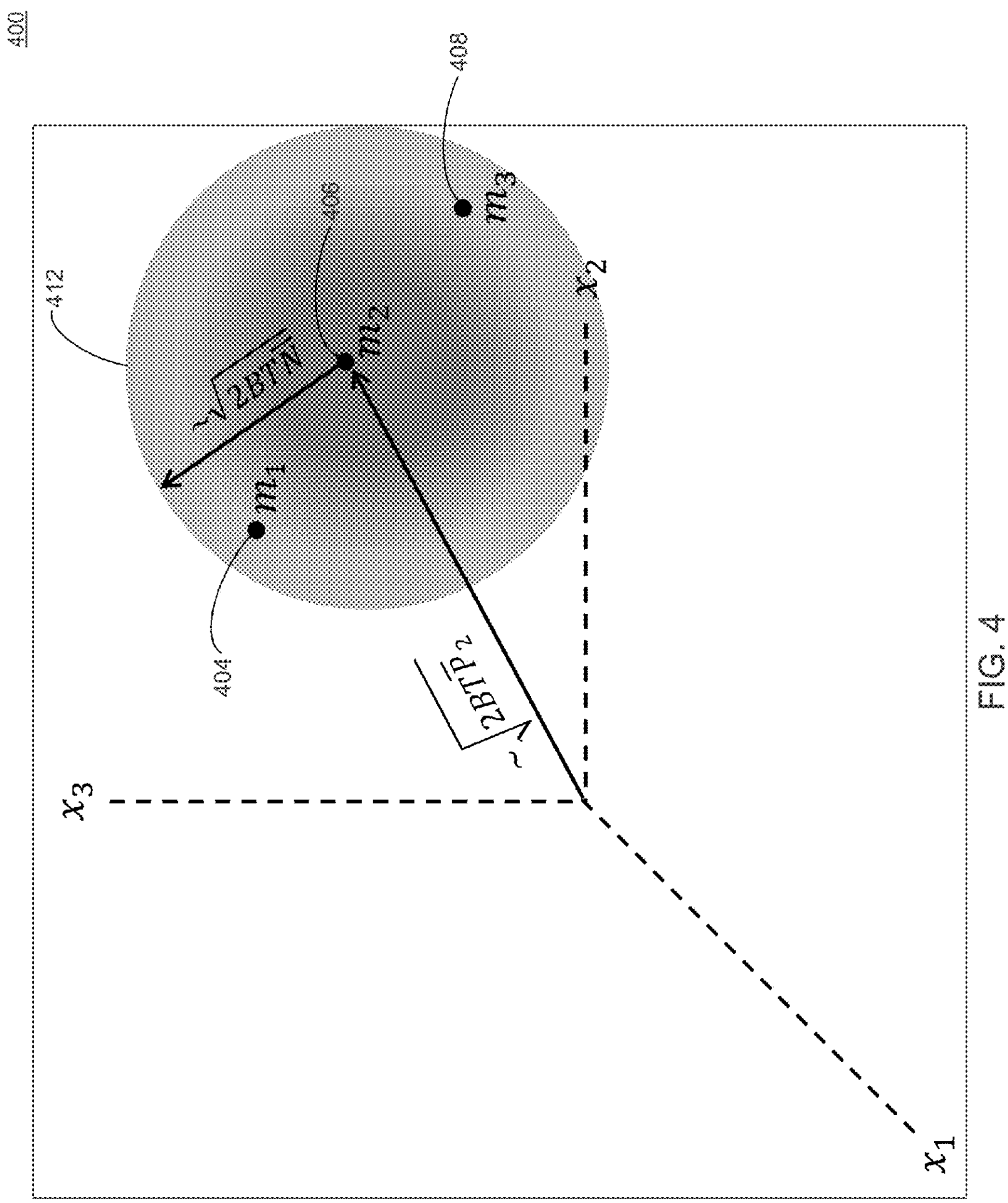
FIG. 4 is an illustration of the effect of AWGN on the probable coordinate displacement of a message, in accordance with one or more embodiments.

FIG. 4 is an illustration of the effect of AWGN on $m_2$ with average power $\overline{P}_2$ corrupted by AWGN of power $\overline{N}$ in a hyperspace 400 adjacent to message coordinates $m_1$ 404 and $m_3$ 408. FIG. 4 illustrates the effect of AWGN on the probable coordinate displacement 410 when labeled correlation is performed on $m_2$ 406 given that $m_2$ 406 was communicated. The cloud of points 412 surrounding the proper coordinate assigned to $m_2$ 406 illustrates the possible region for the un-normalized correlation result. The density of the cloud 412 is proportional to the probability of the correlation output associated with the perturbed coordinate system, with $m_2$ 406 as the most likely outcome since the multi-dimensional Gaussian noise possesses an unbiased statistic. However, it is important to notice that it is possible to mistake the correlation result as corresponding to messages $m_1$ 404 or $m_3$ 408 on occasion for $T<\infty$, because the resolved hyperspace coordinate, after processing, can be closer to a competing (noisy) result with some probability.

Finally, Shannon argues the requirements for capacity C which guarantees that the adjacent messages or any wrong message within the space will not be interpreted during the decoding process even for the case where the signals are corrupted by AWGN. The remarkable but intuitively satisfying result is that even for the case of AWGN, the perturbations can be averaged out over an interval $T\to\infty$ because the expected value of the noise is zero, yet the magnitude of normalized correlation for the message of interest approaches 1. Thus the correlation output is always correctly distinguishable. This infinite interval of averaging would have the effect of removing the cloud of uncertainty 412 around $m_2$ 406 in FIG. 4.

The additional geometrical reasoning to support his result comes from the idea that a hyper volume of radius R which comprises points weighted by signal plus noise energy per unit time $(\overline{P}_i+\overline{N})$, will occupy a larger volume than the case when noise only is present. The ratio of the two volumes must bound the number of possible messages M given in equation 2-8:

$$M \leq \frac{\frac{\pi^{BT}}{\Gamma(BT+1)}\left(\sqrt{2BT(\overline{P}+\overline{N})}\right)^{2BT}}{\frac{\pi^{BT}}{\Gamma(BT+1)}\left(\sqrt{2BT\overline{N}}\right)^{2BT}} = \left(\frac{\overline{P}+\overline{N}}{\overline{N}}\right)^{BT} \quad \text{Equation 2-8}$$

Hence, from Equations 2-8 and 2-2:

$$C = \lim_{T\to\infty}\frac{\log_2 M}{T} \leq B\log_2\left(\frac{\overline{P}+\overline{N}}{\overline{N}}\right) \quad \text{Equation 2-9}$$

2.1. The Uncertainty Function

Shannon's uncertainty function is given in both discrete and continuous forms:

$$H(\rho(x)) = -\sum_{\ell}\rho(x)_{\ell}\ell n\rho(x)_{\ell} \quad \text{Equation 2-10}$$

$$H(\rho(x)) = -\int_{-\infty}^{+\infty}\rho(x)\ell n\rho(x)\,dx \quad \text{Equation 2-11}$$

$\rho(x)_l$ is the $l^{th}$ probability of discrete samples from a message function in Equation 2-10 and $\rho(x)$ is the probability of a continuous random variable assigned to a message function in Equation 2-11. Equation 2-11 is also be referred to as the differential entropy. The choice of metric depends on the type of analysis and message signal. The cumulative metric considers the entire probability space with a normalized measure of 1. The units are given in nats for the natural logarithm kernel and bits whenever the logarithm is base 2. This uncertainty relationship is the same formula as that for thermodynamic entropy from statistical physics though they are not generally equivalent.

Jaynes and others have pointed out certain challenges concerning the continuous form which shall be avoided. An adjustment to Shannon's continuous form was proposed by Jaynes and one of the approaches taken in this work, which requires recognition of the limit for discrete probabilities as they become more densely allocated to a particular space. Equations 2-10 and 2-11 are not precisely what is needed moving forward but they provide an essential point of reference for a measure of information. In Shannon's case, x is a nondeterministic variable from some normalized probability space which encodes information. For instance, the random values m from the prior section could be represented by x. The nature of $H(\rho(x))$ is modified in subsequent discussion to accommodate rules for constraining x according to physical principles. In this context the definition for information is not altered from Shannon's, merely the manner in which the probability space is dynamically derived and defined. Hereafter $H(\rho(x))$ will be referred to as $H(x)$ on occasion, where the context of the probability density $\rho(x)$ is assumed.

Capacity is defined in terms of maximization of the channel data rate which in turn may be derived from the various uncertainties or Shannon entropies whenever they are assigned a rate in bits or flats per second. Each sample from the message functions, $m_i$, possess some uncertainty and therefore information entropy.

Using Shannon's notation, the following relationships illustrate how the capacity is obtained.

$$H(x)+H_x(y)=H(y)+H_y(x)$$

$$H(x)-H_y(x)=H(y)-H_x(y)$$

$$R \triangleq H(x)-H_y(x) \text{ per unit time}$$

$$C \triangleq \max\{R\} \quad \text{Equation 2 11}$$

Where H(x) is an uncertainty metric or information entropy of the source in bits, $H_x(y)$ is an uncertainty of the channel output given precise knowledge of the channel input, H(y) is an uncertainty metric for the channel output in bits, $H_y(x)$ is an uncertainty of the input given knowledge of the output observable (this quantity is also called equivocation), and R is a rate of the channel in bits/sec.

It is apparent that rates less than C are possible. Shannon's focus was to obtain C.

2.2. Physical Considerations

The prior sections presented the Shannon formulation based on mathematical and geometrical arguments. However, there are some important observations if one acknowledges physical limitations. These observations fail into the following general categories.

(a) An irreducible message error rate floor of zero is possible for the condition of maximum channel capacity only for the case of $T \rightarrow \infty$.

(b) There is no explicit energy cost for transitioning between samples within a message.

(c) There is no explicit energy cost for transitioning between messages.

(d) Capacities may approach infinity under certain conditions. This is counter to physical limitations since no source can supply infinite rates and no channel can sustain such rates.

(e) The messages $m_1, m_2, \ldots m_l$, may be arbitrarily close to one another within the hyper geometric signal space.

By collapsing the time variable associated with each message in Shannon's Hyper-space, (b) and (c) become obscured. We will expand the time variable. (d) and (e) can be addressed by acknowledging physical limits on the resolution of x(t). We introduce this resolution.

3. A Particle Theory of Communication

In this section, a physical model for communications is introduced in which particle dynamics are modeled by encoding information in the position and momentum coordinates of a phase space. In an embodiment, the formulation leverages some traditional characteristics of classical phase space inherited from statistical mechanics but also requires the conservation of particle information.

The subsequent discussions suppose that the transmitter, channel, receiver, and environment may be partitioned for analysis purposes and that each may be modeled as occupying some phase space which supports particle motion, as well as exchanged momentum and radiation. The analysis provides a characterization of trajectories of particles and their fluctuations through the phase space. In an embodiment, mean statistics are also necessary to discriminate the fluctuations and calculate average energy requirements. The characteristic intervals of communications processes are typically much shorter than thermal relaxation time constants for the system. This enables the most robust differentiation of information with respect to the environment for a given energy resource. The fundamental nature of communications involves extraction of information through these differentiations.

Section 3 will:

(a) Establish a model comprising a phase space with boundary conditions and a particle which encodes information in discrete samples from a nearly continuous random process.

(b) Obtain equations of motion for a single particle within phase space for item (a);

(c) Discover the nature of forces to move the particle and establish a physical sampling theorem along with the physical description of signal bandwidth;

(d) Derive the interpolation of sampled motion;

(e) Describe the statistic of motion consistent with a maximum uncertainty communications process; and (f) Discuss the circumstance for physically analytic behavior of the model The preliminaries of this section pave the way for obtaining channel capacity in Section 4 and deriving efficiency relations of Section 5. Particular emphasis is applied to items (c) and (e).

3.1. Transmitter

The transmitter generates sequences of states through a phase space for which a particle possesses a coordinate per state as well as specific trajectory between states. Although more than one particle can be modeled, analysis of a single particle will be discussed since the model may be extended by assuming non-interacting particles. The information entropy of the source is assigned a mathematical definition originated by Shannon, a form similar to the entropy function of statistical mechanics. Shannon's entropy is devoid of physical association, and that is its strength as well as limitation. Subsequent models provide a remedy for this omission by assigning a time and energy cost to information encoded by particle motion. Section 8 provides a more detailed investigation of a time evolving uncertainty function.

3.1.1. Phase Space Coordinates, and Uncertainty

The model for the transmitter consists of a hyper spherical phase space in which the information encoding process is related to an uncertainty function of the state of the system:

$$H=-\iint_{-\infty}^{\infty}\rho(\vec{q},\vec{p})\,d\vec{q}\,d\vec{p} \qquad \text{Figure 3-1}$$

Where $\vec{q}$, $\vec{p}$ are the vector position, in terms of generalized coordinates, and conjugate momenta of the particle respectively. In the case of a single particle system, one can choose to consider these quantities as an ordinary position and momentum pairing for the majority of subsequent discussion. A specific pair, $\vec{q}(t_l),\vec{p}(t_l)$ along with time derivatives $\dot{\vec{q}}(t_l)$, $\dot{\vec{p}}(t_l)$ also defines a state of the system at time $t_l$. H represents uncertainty or lack of knowledge concerning position of a particle in configuration space and momentum space, or jointly, phase space. Equation 3-1 is the differential form of Shannon's continuous entropy presented in Section 2. If state transitions are statistically independent, then uncertainty is maximized for a given distribution, $\rho(\vec{q},\vec{p})$.

$\{\dot{\vec{q}},\dot{\vec{p}}\}$ appear often in the study of mechanics and shall be occasionally referred to as the coordinate derivatives with respect to time, or conjugate derivative field. $\{\dot{\vec{q}},\dot{\vec{p}}\}$ are random variables.

In an embodiment, a transmitter, by practical specification, may be locally confined to a relatively small space within some reference frame even if that frame is in relative motion to the receiver. The dynamics of particles within a constrained volume therefore cause the particles to move in trajectories which can reverse course, or execute other randomized curvilinear maneuvers while navigating through states, such that the boundary of the transmitter phase space not be compromised. If a particle is aggressively accelerated, its inertia defies the change of its future course according to Newton's first law. A particle with significant momentum will have greater energy per unit time for path modification, compared to a relatively slow particle of the same mass which executes the same maneuver through configuration space. The probability of path modification per unit time is a function of the uncertainty H. The greater the uncertainty in instantaneous particle velocity and position, the greater the instantaneous energy requirement becomes to sustain its dynamic range.

3.1.2. Transmitter Phase Space, Boundary Conditions and Metrics

In an embodiment, another model feature is that particle motion may be restricted such that it will not energetically contact the transmitter phase space boundary in a manner changing its momentum. Such contact would alter the uncertainty of the particle in a manner which annihilates information.

An example is that of the Maestro's baton. It moves to and fro rhythmically, with its material points distributing information according to its dynamics. Yet, the motions cannot exist beyond the span of the Maestro's arm or exceed the speeds accommodated by his or her physique and the mass of the baton. In fact, the motions are contrived with these restrictions inherently enforced by physical laws and resource limitations. A velocity of zero is required at the extreme position (phase space boundary) of the Maestro's stroke and the maximum speed of the baton is limited by the rate of available energy per unit time. The essential features of this analogy apply to all communications processes.

Suppose that it is desirable to calculate the maximum possible rate of information encoding within the transmitter where information is related to the uncertainty of position and momentum of a particle. Both velocity and acceleration of the transitions between states should be considered in such a maximization. Speed of the transition is dependent on the rate at which the configuration q and momentum p random variables can change.

The following bound for the motions of ordinary matter, where velocity is well below the speed of light, is deduced from physical principles;

$$\lim_{v=v_{max}}\left(\dot{\vec{q}},\dot{\vec{p}}\right)=\left(v_{max},\frac{\max\{\dot{\varepsilon}_k\}}{v_{max}}\right)=\left(v_{max},\frac{P_{max}}{v_{max}}\right)\quad\text{Figure 3-2}$$

Where $v_{max}$ and $P_{max}$ are the maximum particle velocity and the maximum applied power respectively.

Equation 3-2 provides a regime of interest for engineer'ng applications, where forces and powers are finite for finite space-time transitions. Motions which are spawned by finite powers and forces will be considered as physically analytic.

It is most general to consider a model analyzing the available phase space of a hyper geometric spherical region around a single particle and the energy requirements to support a limiting case for motion. Section 10.1 (Appendix A) supports consideration of the hyper sphere.

Figure 5:
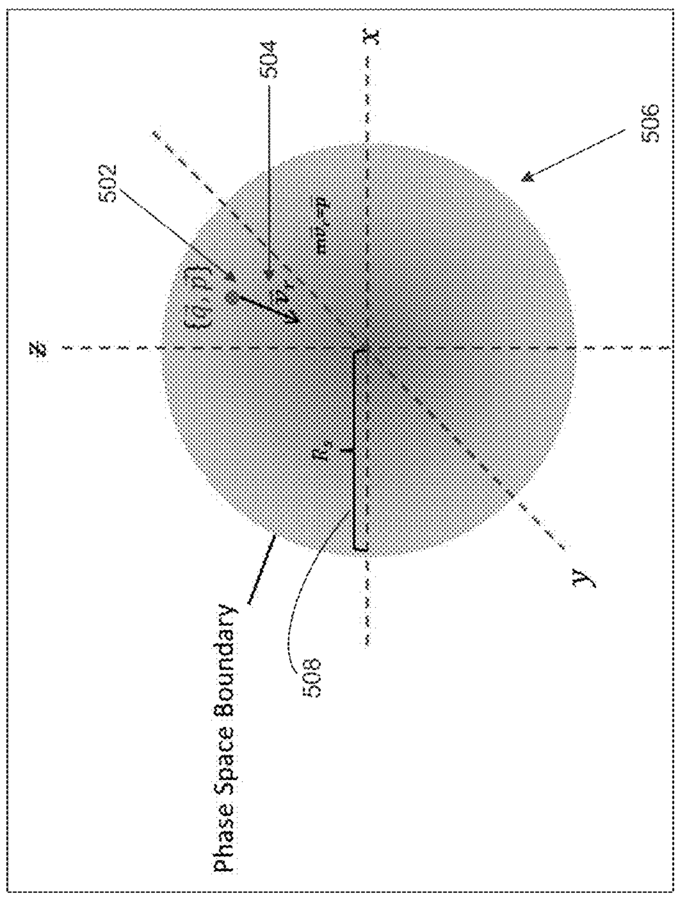
FIG. 5 is an illustration of a geometry of a model for a three-dimensional case, in accordance with one or more embodiments.

FIG. 5 illustrates the geometry of a model 500 for a three-dimensional case, a relevant model subset of interest, in accordance with one or more embodiments. A particle 502 with position and momentum $\{\vec{q},\vec{p}\}$ is illustrated. The velocity $\vec{v}$ 504 is also illustrated and the classical linear momentum is given by the particle mass times it's velocity.

The phase space volume 506 accessible to a particle in motion is a function of the maximum acceleration available for the particle to traverse the volume in a specified time, Δt. Maximum acceleration is a function of the available energy resource.

In an embodiment, an accessible particle coordinate at some future Δt must always be less than the physical span of the phase space configuration volume. Considering the transmitter boundary for the moment, the greatest length along a straight Euclidian path that a particle can travel under any condition is simply $2R_s$ where $R_s$ 508 is the sphere radius.

At least one force, associated with $\dot{\vec{p}}$, is required to move the particle between these limits. However, two forces are used to comply with the boundary conditions while stimulating motion. It is expedient to assign an interval between observations of particle motion at $t_{l+1},t_l$ and constrain the energy expenditure over $\Delta t=t_{l+1}-t_l$. Both starting and stopping the motion of the particle contribute to the allocation of energy. If a constraint is placed on $\dot{\varepsilon}_k$, the rate of kinetic energy expenditure to accelerate the particle, then the corresponding rate must be considered as the limit for decelerating the particle. The proposition is that the maximum constant rate $\max\{\dot{\varepsilon}_k\}=P_{max}=P_m$ bound acceleration and deceleration of the particle over equivalent portions Δt/2 of the interval Δt, and to be considered as a physical limiting resource for the apparatus. $P_m$ is regarded as a boundary condition.

Given this formulation, the maximum possible particle kinetic energy must occur for a position near the configuration space center. The prior statements imply that Δt/2 is the shortest time interval possible for an acceleration or deceleration cycle to traverse the sphere. The total transition energy expenditure may be calculated from adding the contributions of the maximum acceleration and deceleration cycles symmetrically;

$$2\int_{t_l}^{t_l+\Delta t/2}\max\{\dot{\varepsilon}_k dt\}=2\int_{t_l}^{t_l+\Delta t/2}\max\{\dot{\vec{p}}\cdot\dot{\vec{q}}\}dt=P_{max}\Delta t\quad\text{Figure 3-3}$$

Peak velocity versus time is calculated from $P_{max}$.

$$\vec{v}_p=\sqrt{2\frac{P_{max}(t-t_\ell)}{m}}\,\hat{a}_R,\ \text{for } t_\ell<t<\Delta t/2\quad\text{Figure 3-4}$$

$$\vec{v}_p=\left[\sqrt{\frac{2P_{max}}{m}}\left(\sqrt{(t_\ell+\Delta t)-t}\right)\right]\hat{a}_R,\ \text{for } t_\ell+\Delta t/2<t<t_\ell+\Delta t\quad\text{Figure 3-5}$$

Where $\hat{a}_R$ is the unit radial vector within the hypersphere.

The range, $R_s$, traveled by the particle in Δt/2 seconds from the boundary edge is;

$$R_s=\frac{2}{3}\sqrt{\frac{2P_{max}}{m}}(\Delta t/2)^{\frac{3}{2}}\quad\text{Figure 3-6}$$

The following equation summary and graphics provide the result for the one dimensional case along the $x_\alpha$ axis where the maximum power is applied to move the particle from boundary to boundary, along a maximum radial.

$$\max\{\dot{\varepsilon}_k\}=P_m\quad\text{Figure 3-7}$$

$$\varepsilon_k=P_m(t-t_\ell)\quad\text{Figure 3-8}$$

$$t_\ell\le t\le t_\ell+\frac{\Delta t}{2}$$

$$\varepsilon_k=P_m((t_\ell+\Delta t)-t)\quad\text{Figure 3-9}$$

$$t_\ell+\Delta t/2\le t\le(t_\ell+\Delta t)$$

Let $t_l$ equal zero for the following equations and graphical illustration of a particular maximum velocity trajectory.

$$\text{Positive Trajectory}\begin{cases} \vec{v}_p = \sqrt{\dfrac{2P_m t}{m}}\,\hat{a}_\alpha = \left(\dfrac{3P_m}{m}(q+R_s)\right)^{\frac{1}{3}}(\hat{a}_\alpha) & -R_s \le q \le 0; \\ & 0 \le t \le \dfrac{\Delta t}{2} \\ \vec{v}_p = \sqrt{\dfrac{2P_m(\Delta t - t)}{m}}\,\hat{a}_\alpha = \left(\dfrac{3P_m}{m}(q-R_s)\right)^{\frac{1}{3}}(-\hat{a}_\alpha) & 0 \le q \le R_s; \\ & \dfrac{\Delta t}{2} \le t \le \Delta t \end{cases}$$

Figure 3-10

$$\text{Negative Trajectory}\begin{cases} \vec{v}_p = -\sqrt{\dfrac{2P_m t}{m}}\,\hat{a}_\alpha = \left(\dfrac{3P_m}{m}(q-R_s)\right)^{\frac{1}{3}}(-\hat{a}_\alpha) & 0 \le q \le R_s; \\ & 0 \le t \le \dfrac{\Delta t}{2} \\ \vec{v}_p = -\sqrt{\dfrac{2P_m(\Delta t - t)}{m}}\,\hat{a}_\alpha = \left(\dfrac{3P_m}{m}(q+R_s)\right)^{\frac{1}{3}}(-\hat{a}_\alpha) & -R_s \le q \le 0; \\ & \dfrac{\Delta t}{2} \le t \le \Delta t \end{cases}$$

The characteristic radius and maximum velocity are solved using proper initial conditions applied to integrals of velocity and acceleration.

$$R_s = \frac{v_{max}\Delta t}{3} \qquad \text{Figure 3-11}$$

$$v_{max} = \sqrt{\frac{P_m \Delta t}{m}} \qquad \text{Figure 3-12}$$

Where $v_{max}$ is the greatest velocity magnitude along the trajectory, occurring at $$t = \frac{\Delta t}{2}.$$

More detail is provided for the derivation of equations 3-10, 3-11 and 3-12 in Section 10.2 (Appendix B).

Figure 6:
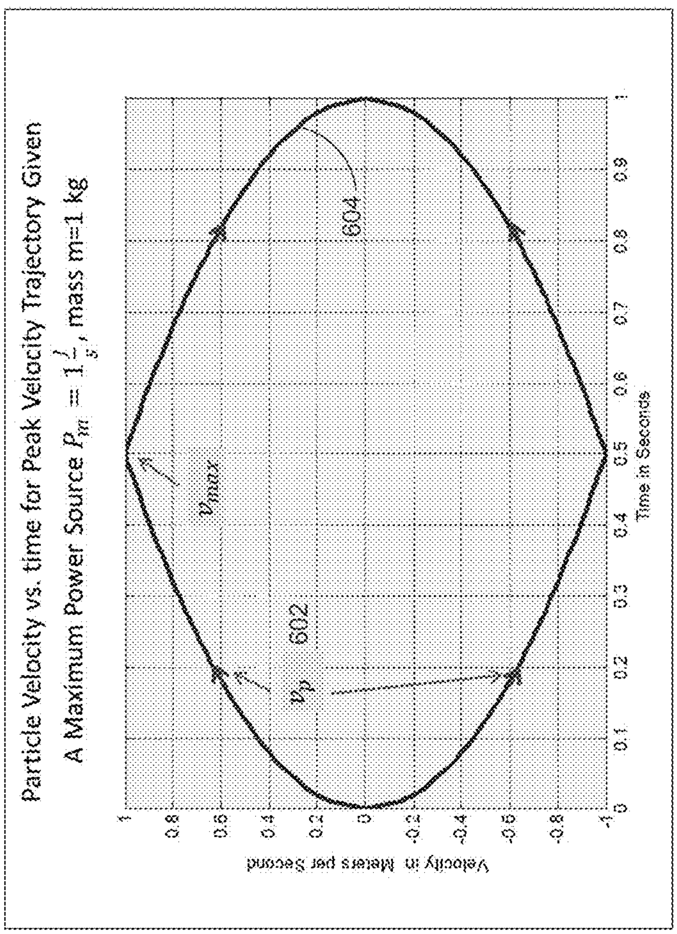
FIG. 6 is an illustration of a plot of peak velocity versus time, in accordance with one or more embodiments.

FIG. 6 is an illustration of a plot 600 of peak velocity versus time where the upper segment of the trajectory in the positive direction is a positive vector velocity 602, in accordance with one or more embodiments. The negative vector velocity 604 is a mirror image. Maximum absolute velocity, $v_{max}$, occurs at $$t = \frac{\Delta t}{2}.$$

Figure 7:
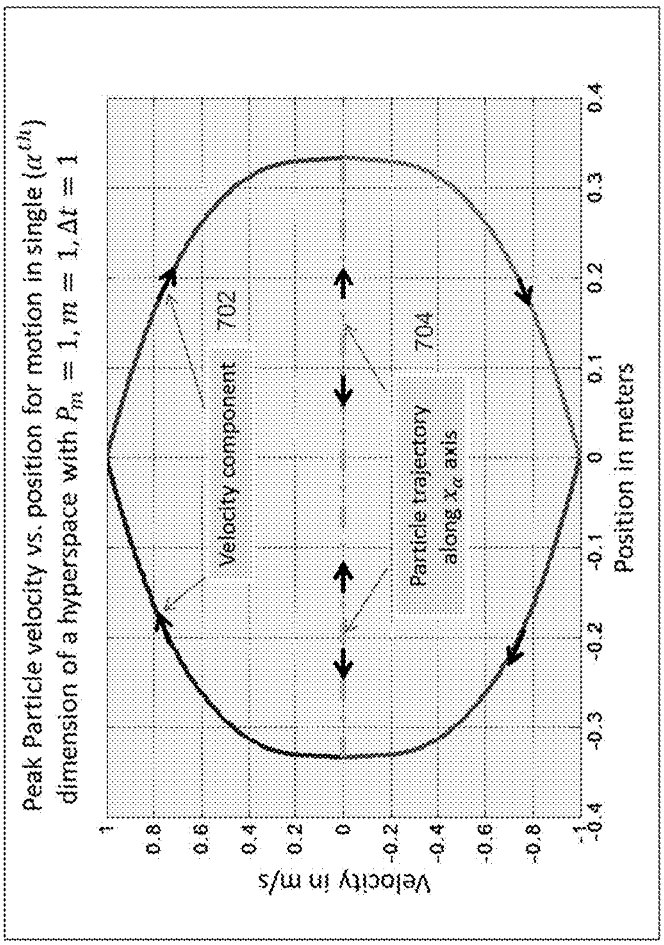
FIG. 7 is an illustration of a plot of peak velocity versus position, in accordance with one or more embodiments.

FIG. 7 illustrates a plot 700 of peak velocity versus position including a velocity component 702 and a particle trajectory 704 along an $x_\alpha$ axis, in accordance with one or more embodiments. FIG. 7 transforms the time coordinate of plot 600 to position along the $x_\alpha$ axis, where a is a dimension index from D possible dimensions. The maximum velocity occurs at q=0, the sphere center. This is the coordinate with a maximum distance, $R_s$, from the boundary. $R_s$ is the maximum configuration span over which positive acceleration occurs. Likewise, maximum deceleration is required over the same distance to satisfy proper boundary conditions. These representations are the extremes of velocity profile given $R_s$, and $P_m$ and will be referred to as the maximum velocity profile. In an embodiment, slower random velocity trajectories which fall within these boundaries are required to support general random motion.

3.1.3. Momentum Probability

Next, is a statistical description for velocity trajectories within the boundaries established in the prior section.

The vector $\vec{v}$ may be given a Gaussian distribution assignment based on a legacy solution obtained from the calculus of variations. An isoperimetric bound is applied to the uncertainty function. H can be maximized, subject to a simultaneous constraint on the variance of the velocity random variable, resulting in the Gaussian pdf. In this case, the variance of the velocity distribution is proportional to the average kinetic energy of the particle. It follows that this optimization extends to the multi-dimensional Gaussian case. This solution justifies replacement of the uniform distribution assumption often applied to maximize the uncertainty of a similar phase space from statistical mechanics. While the uniform distribution does maximize uncertainty, it comes at a greater energy cost compared to the Gaussian assignment. Hence, a Gaussian velocity distribution emphasizes energetic economy compared to the uniform density function. A derivation justifying the Gaussian assumption is provided in Section 10.1 for reference.

The Gaussian assignment is enigmatic because infinite probability tails for velocity invoke relativity considerations, with c (speed of light) as an absolute asymptotic limit. Therefore, in some embodiments, the value of the peak statistic is limited and approximated on the tail of the pdf to avoid relativistic concerns. The variance or average power can be another important statistic. The peak to average power or peak to average energy ratio of a communications signal can be an especially significant consideration for transmitter efficiency. The analog of this parameter can also be applied to the multidimensional model for the transmitter particle velocity and will be subsequently derived for calculating a peak to average power or peak to average kinetic energy ratio, hereafter PAPR and PAER, respectively.

Figure 8:
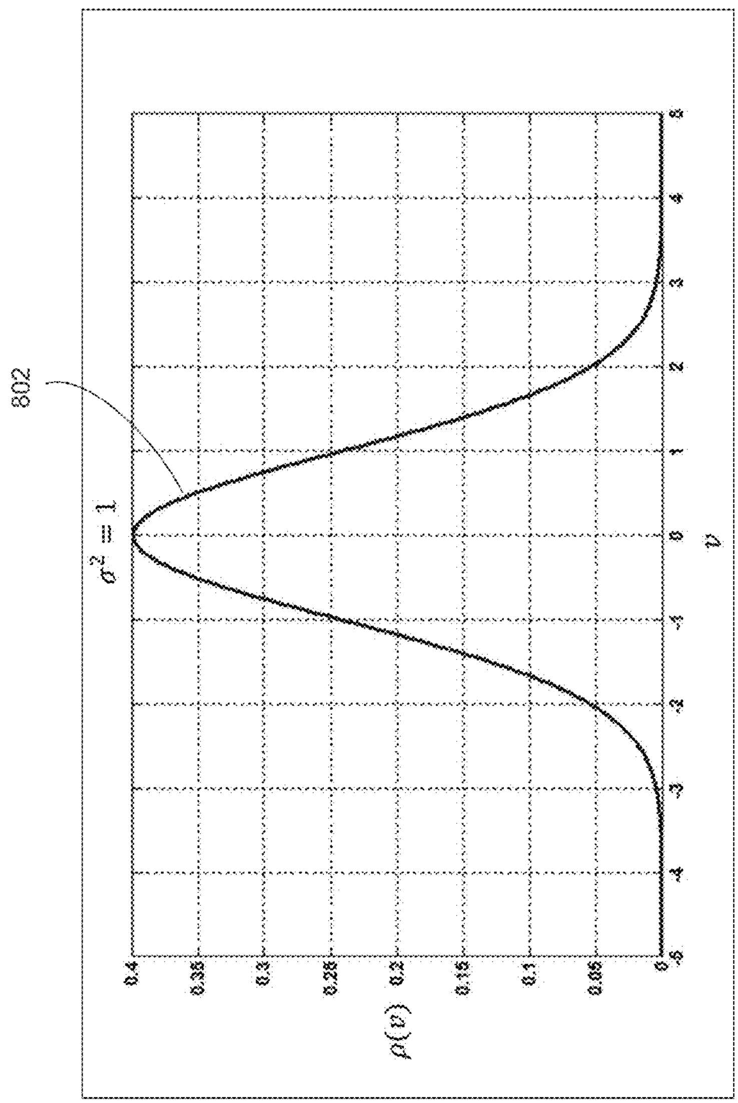
FIG. 8 is an illustration of a plot including a standard zero mean Gaussian velocity, in accordance with one or more embodiments.

FIG. 8 illustrates a plot 800 including a standard zero mean Gaussian velocity v RV 802 with $\sigma^2=1$, in accordance with one or more embodiments.

Whenever $\nu=4$ or greater for the pdf with variance $\sigma^{-2}=1$, the probability values are very small in a relative sense. If $\nu^2/2$ is directly proportional to the instantaneous kinetic energy, then a peak velocity excursion of 4 corresponds to an energy peak of 8. For the case of $\sigma^2=1$, a range of $\nu=\pm 2\sqrt{2}$ encompasses the majority (97.5%) of the probability space. Hence, PAER≥4 is a comprehensive domain for the momentum pdf with a normalized variance. In an embodiment, the PAER must always be greater than 1 by design because $\sigma^2 \to 0$ as PAER→1. One can always define a PAER provided $\sigma^2 \neq 0$. This is a fundamental restriction. As $\sigma^2 \to 0$, the pdf becomes a delta function with area 1 by definition. In the case of a zero mean Gaussian RV the average power becomes zero in the limit along with the peak excursions if the PAER approaches a value of 1.

The probability tails beyond the peak excursion values can simply be ignored (truncated) as insignificant or replaced with delta functions of appropriate weight. This approximation will be applied for the remainder of the discussion concerning velocities or momenta of particles. PAER is an important parameter and may be varied to tailor a design. PAER provides a suitable means for estimating the required energy of a communications system over significant dynamic range. It will be convenient to convert back and forth between power and energy from time to time. In general, PAPR is used whenever variance is given in units of Joules per second and PAER is used whenever units in joules, are preferred.

Maximum velocity and acceleration along the radial is bounded. At the volume center the probability model for motion is completely independent of θ,ø in spherical geometry. However, as the particle position coordinate q varies off volume center, the spread of possible velocities must correspondingly be modified. Either the particle must asymptotically halt, move tangentially at the boundary or otherwise maneuver away from the boundary avoiding collision. The angular distribution of the velocity vector changes as a function of offset radial with respect to the sphere center.

Momentum will be represented using orthogonal velocity distributions. This approach follows similar methods originated by Maxwell and Boltzmann. The subsequent analysis focuses on the statistical motion of a single particle in one configuration dimension. As one skilled in the art would appreciate, additional D dimensions are easily accommodated from extension of the 1-D solution.

The configuration coordinate may be identified at the tip of the position vector 4 given an orthonormal basis.

$$\vec{q} == q_1\hat{a}_{x_1} + q_2\hat{a}_{x_2} + \dots q_D\hat{a}_{x_D}, \quad \text{Equation 3-13}$$

Likewise the velocity is given by;

$$v = \dot{q}_1\hat{a}_{x_1} + \dot{q}_2\hat{a}_{x_2} + \dots \dot{q}_D\hat{a}_D \quad \text{Equation 3-14}$$

Distributions for each orthogonal direction are easily identified from the prior velocity profile calculations, definition of PAER, and Gaussian optimization for velocity distribution due to maximization of momentum uncertainty.

The generalized axes of the D dimensional space will be represented as $x_1, x_2, \dots x_D$ where D can be assigned for a specific discussion. Similarly, unit vectors in the $x_\alpha$ dimension are assumed a given assignment of $\hat{a}_\alpha$ as the defining unit vector. Velocity and position vectors are given by $\vec{v}_\alpha$ and $\vec{q}_\alpha$ respectively.

Figure 9:
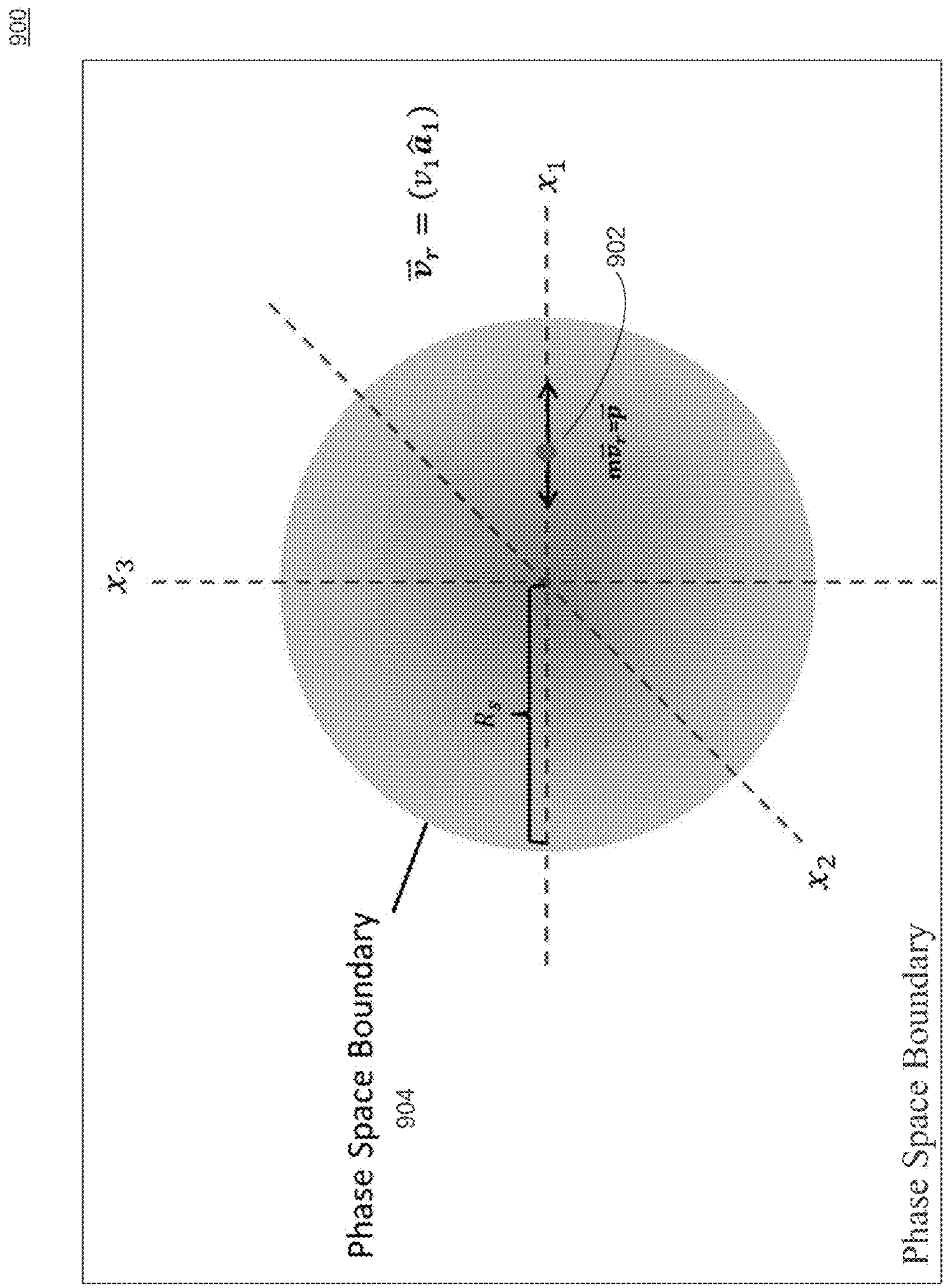
FIG. 9 is an illustration of a plot of particle motion, in accordance with one or more embodiments.

FIG. 9 illustrates a plot 900 of the particle 902 motion with one linear degree of freedom within a D=3 configuration space of interest including phase space boundary 904, in accordance with one or more embodiments.

The radial velocity $\vec{v}_r$ as illustrated is defined by $\vec{v}_r = v_\alpha \hat{a}_\alpha$ which is a convenient alignment moving forward. The equations for the peak velocity profile were given previously and are used to calculate the peak velocity versus radial offset coordinate along the x, axis. PAER may be specified at a desired value such as 4 (6 dB) for example and the pseudo Gaussian distribution of the velocities obtained as a function of $q_\alpha$.

The velocity probability density is written in two forms to illustrate the utility of specifying PAER.

$$\rho(\vec{v}_r) = \frac{1}{\sqrt{2\pi}\,\sigma_{v_r}} e^{-\frac{v_r 2}{2(\sigma_{v_r})^2}}, \quad \bar{\vec{v}}_r = \bar{\vec{v}}_\alpha = 0, \quad \sigma_{v_r}^2 = \sigma_{v_\alpha}^2 \quad \text{Equation 3-15}$$

$$\rho(\vec{v}_\alpha) \cong \frac{\sqrt{PAER}}{\sqrt{2\pi}\, v_{\alpha_{peak}}} e^{-\frac{(PAER)v_\alpha^2}{2(v_{\alpha_{peak}})}}, \quad PAER \equiv \left(\frac{v_{\alpha_{peak}}}{\sigma_{v_\alpha}}\right)^2 = \frac{\varepsilon_{kmax}}{\langle\varepsilon_k\rangle} \quad \text{Equation 3-16}$$

$\vec{v}_{\alpha\_peak}$ is the peak velocity profile as a function of $q_\alpha$ which will occasionally be referred to as $\vec{v}_p$ whenever convenient. In some embodiments, PAER is a constant. Therefore $\sigma_{v_\alpha}$ may be distinctly calculated for each value of $q_\alpha$ as well. The peak velocity bound versus $q_\alpha$ is illustrated in Error! Reference source not found. as obtained from Figure 3-10

Figure 10:
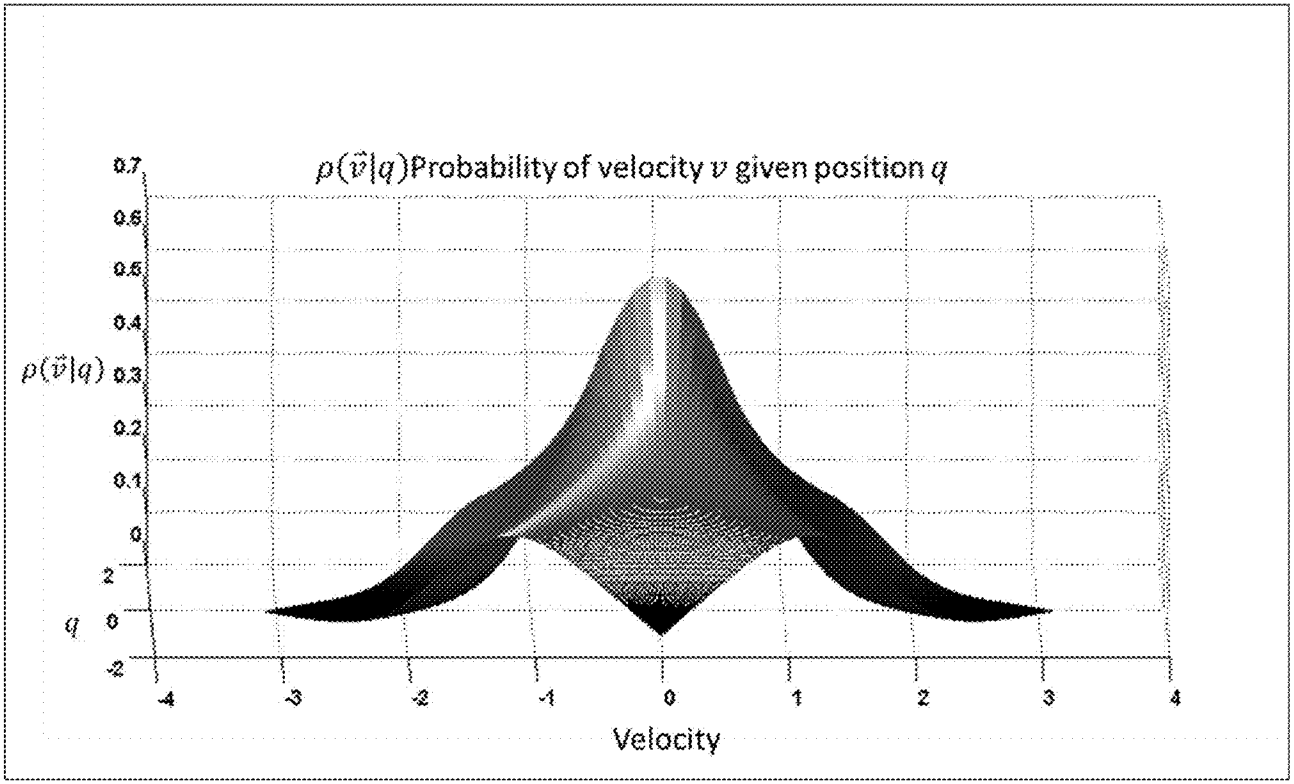
FIG. 10 is an illustration of a plot of a pdf of velocity as a function of radial position for a particle, in accordance with one or more embodiments.

Each value of $q_\alpha$ along the radial possesses a unique Gaussian random variable for velocity. The graphical illustration of this distribution follows;

FIG. 10 illustrates a plot 1000 of a pdf of velocity $\vec{v}_\alpha$ as a function of radial position for a particle in motion, restricted to a single dimension and maximum instantaneous power, in accordance with one or more embodiments. In the plot 1000, $P_m$, peak to average energy ratio (PAER)=4, $P_m$=10 J/s, $v_{max}=\sqrt{10}$ m/s, Δt=1, $R_s=(\Delta t(v_{max}/3))$, and m=1 kg.

In plot 1000, probability is given on the vertical axis. The probability of the vector velocity is maximum for zero velocity on the average at the phase space center, with equal probability of positive and negative velocities at a given q. The sign or direction of the trajectory corresponds to positive or negative velocity in the figure. The velocity probability of zero occurs at the extremes of $+/-R_s$, the phase space boundary. Correspondingly, the variances of the Gaussian profiles are minimum at the boundaries and maximum at the center.

A cross-sectional view from the perspective of the velocity axis of plot 1000 is Gaussian with variance that changes according to $q_\alpha$. In this case, a PAER of 4 is maintained for all $q_\alpha$ coordinates.

Figure 11:
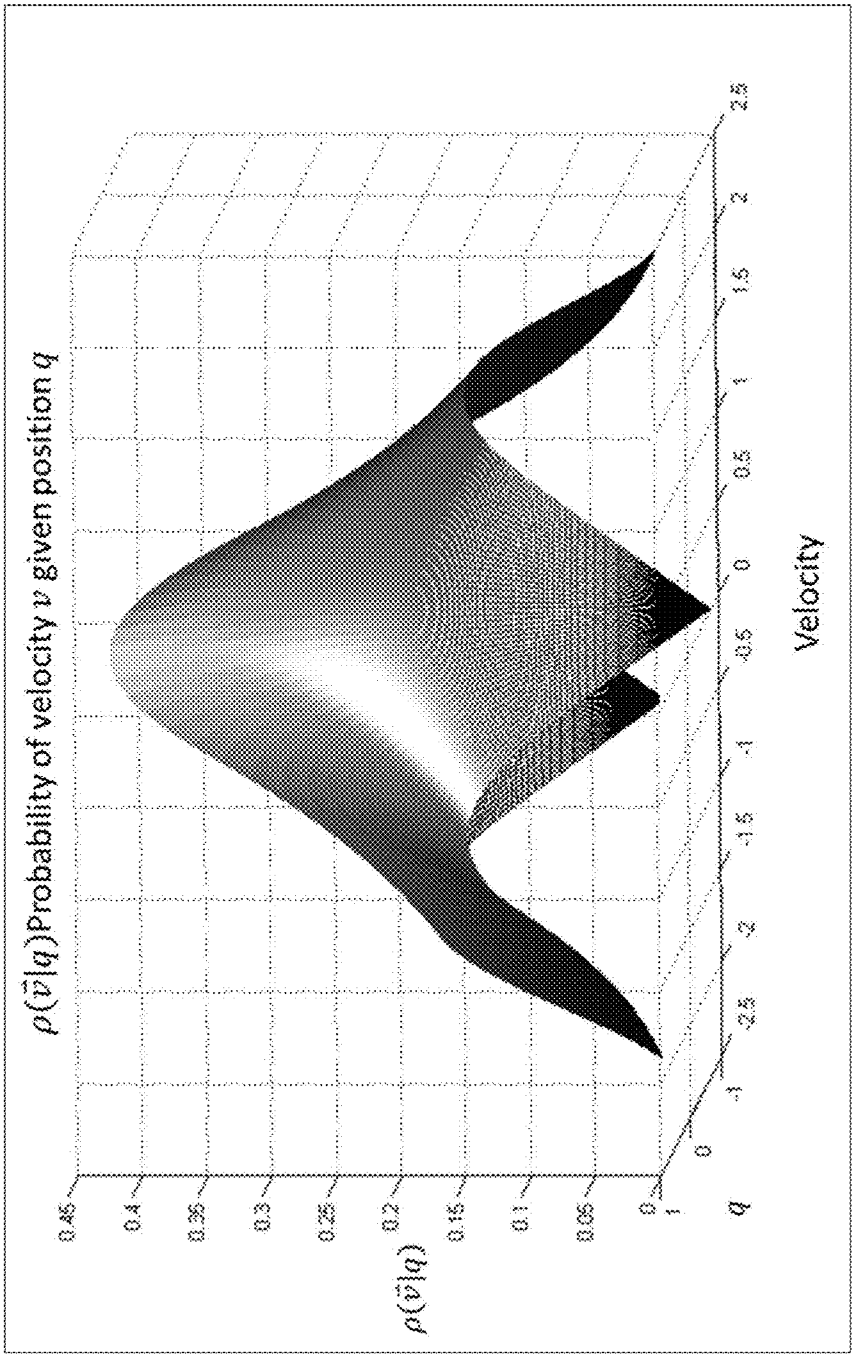
FIG. 11 is an illustration of a plot of a pdf of velocity as a function of radial position, in accordance with one or more embodiments.
Figure 12:
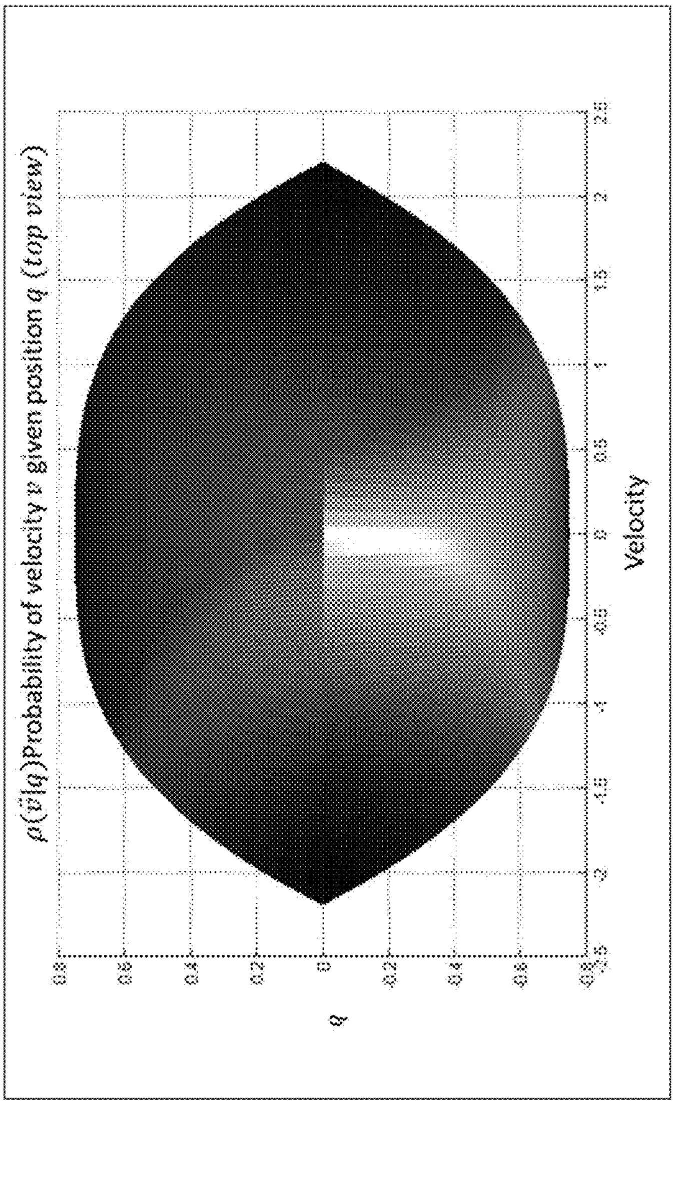
FIG. 12 is an illustration of a plat of a pdf of velocity as a function of radial position, in accordance with one or more embodiments.

Suppose $P_m$ decreases from 10 to 5 J/s. The corresponding scaling of phase space is illustrated in FIGS. 11 and 12. FIG. 11 illustrates a plot 1100 of a pdf of velocity as a function of radial position, in accordance with one or more embodiments. FIG. 12 illustrates a plot 1200 of a pdf of velocity as a function of radial position, in accordance with one or more embodiments. In some embodiments, the trade in phase space access is a fundamental theme illustrating the relationship between phase space volume and rate of energy expenditure.

In plots 1100 and 1200, the velocity dynamic range is decreased in comparison to the example shown in plot 1000 by the factor $\sqrt{P_{m\_new}/P_{m\_old}}$. $R_s$, the characteristic accessible radius of the sphere, must correspondingly reduce even though the PAER=4 is unchanged. Thus, the hyper-sphere volume decreases in both configuration and momentum space.

Now that the momentum conditional pdf is defined for one dimension, the extension to the other dimensions is straightforward given the assumption of orthogonal dimensions and statistically independent distributions. The distribution of interest is 3 dimensional Gaussian. This is similar to the classical Maxwell distribution except for the boundary conditions and the requirement for maintaining vector quantities. The distribution for the multivariate hyper-geometric case may easily be written in terms of the prior single dimensional case.

$$\rho(\vec{v}) = \prod_{\alpha=1}^{D} \rho(\vec{v}_\alpha) \quad \text{Equation 3-17}$$

$$\vec{v} = \sum_\alpha v_\alpha \hat{a}_\alpha$$

$$\sigma_{\vec{v}}^2 = \sum_\alpha \sigma_{v_\alpha}^2$$

$$\bar{\vec{v}} = \sum_\alpha \bar{\vec{v}}_\alpha = 0$$

Figure 13:
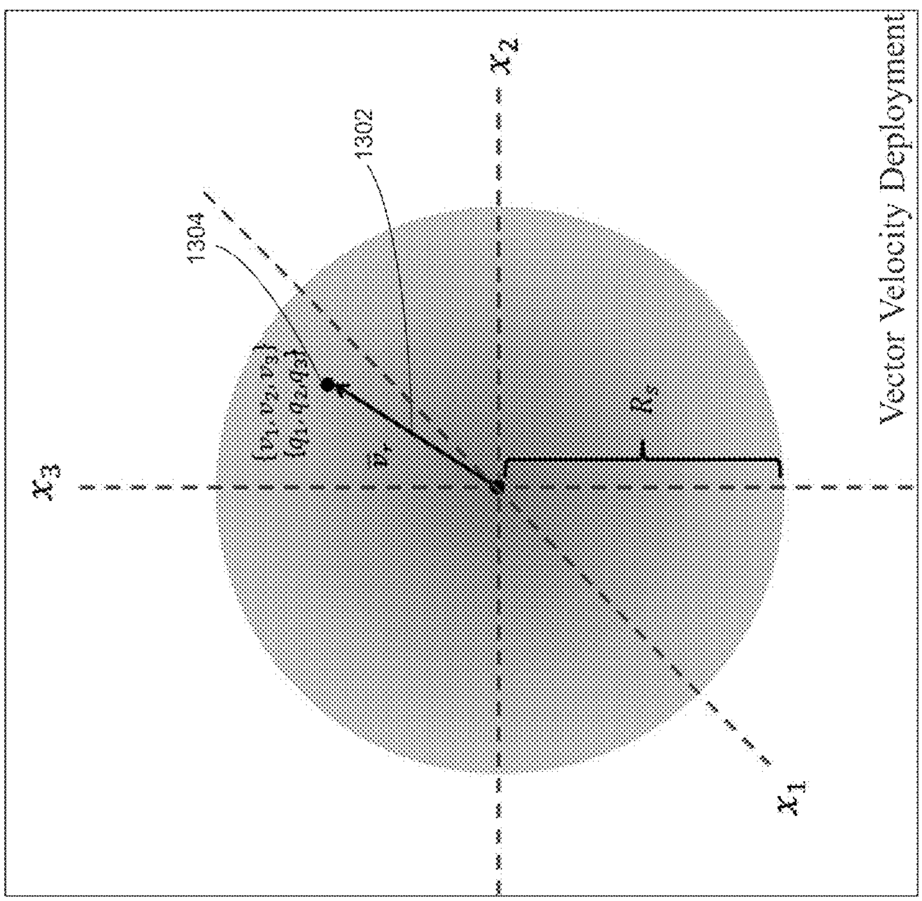
FIG. 13 is an illustration of vector velocity deployment, in accordance with one or more embodiments.

FIG. 13 illustrates the vector velocity deployment 1300 in terms of the velocity and configuration coordinates, in accordance with one or more embodiments. Vector velocity deployment 1300 includes vector 1302 and point 1304. The pdf for velocity is easily written in a general form. In this particular representation of FIG. 13, the vectors enumerated as α,β through subscripts, are considered to represent orthogonal dimensions for α≠β. This is an important distinction of the notation which will be assumed from this point forward except where otherwise noted.

The multidimensional pdf can be given as:

$$\rho(\vec{v}) = \frac{1}{\sqrt{(2\pi)^D |\Lambda|}} e^{\left[-\frac{1}{2}(v_\alpha - \bar{v}_\alpha)^T \Lambda^{-1}(v_\beta - \bar{v}_\beta)\right]} \quad \text{Equation 3-18}$$

$$[\Lambda] = \begin{bmatrix} \sigma_{v_1}^2 & \sigma_{12} & \dots & \sigma_{1D} \\ \sigma_{21} & \sigma_{v_2}^2 & \dots & \sigma_{2D} \\ \sigma_{D1} & \sigma_{D2} & \dots & \sigma_{v_D}^2 \end{bmatrix} \quad \text{Equation 3-19}$$

The covariance and normalized covariance are also given explicitly for reference:

$$\sigma_{\alpha,\beta} = \text{cov}\{v_\alpha, v_\beta\} = \int\int_{-\infty}^{+\infty} (v_\alpha - \bar{v}_\alpha)(v_\beta - \bar{v}_\beta)\rho(v_\alpha, v_\beta) dv_\alpha dv_\beta \quad \text{Equation 3-20}$$

-continued $$\Gamma_{norm(\alpha,\beta)} = \frac{\sigma_{\alpha,\beta}}{\sigma_\alpha \sigma_\beta} \quad \text{Equation 3-21}$$

$\Gamma_{norm(\alpha,\beta)}$ is also known as the normalized statistical covariance coefficient. The diagonal of Equation 3-19 will be referred to as the dimensional auto covariance and the off diagonals are dimensional cross-covariance terms. These statistical terms are distinguished from the corresponding forms which are intended for the time analysis of sample functions from an ensemble obtained from a random process. However, a correspondence between the statistical form above and the time domain counterpart is anticipated and discussed in later sections. Discussions proceed contemplating this correspondence.

In an embodiment, [Λ] permits flexibility for determining arbitrarily assigned vectors within the space. Statistically independent vectors are also orthogonal in this particular formulation over suitable intervals of time and space. Equation 3-18 can account for spatial correlations. In the case where state transitions possesses statistically independent origin and terminus, the off diagonal elements, (α≠β), will be zero.

In the Shannon uncertainty view, each statistically independent state is equally probable at a successive infinitesimal instant of time, i.e. (Δt/2)→0. More directly, time is not an explicit consideration of the uncertainty function. As will be shown in Section 8, this cannot be true independent of physical constraints such as $P_{max}$, and $R_s$. Statistically independent state transitions may only occur more rapidly for greater investments of energy per unit time.

3.1.3.1 Transmitter Configuration Space Statistics

In an embodiment, the configuration space statistic is a probability of a particle occupying coordinates $q_\alpha$. A general technique for obtaining this statistic is part of an overall strategy outlined in the following brief discussion.

A philosophy which has been applied to this point, and will be subsequently advanced, follows:

First, system resources are determined by the maximum rate of energy per unit time limit. This quantity is $P_m$. $P_m$ limits $\dot{\vec{p}}$ which considers acceleration. Secondly, information is encoded in the momentum of particle motion at a particular spatial location. Momentum is approximately a function of the velocity at non-relativistic speeds which in turn is an integral with respect to the acceleration. The momentum is constrained by the joint consideration of $P_m$ and maximum information conservation. Finally, the position is an integral with respect to the velocity which makes it a second integral with respect to the force and, in a sense, a subordinate variable of the analysis, though a necessary one.

The hierarchy of inter-dependencies is significant. Fortuitously, momentum couples configuration and force through integrals of motion. Since the momentum is Gaussian distributed it may be presented that the position is also Gaussian. That is, the integral or the derivative of a Gaussian process remains Gaussian.

The specific form of the configuration dependency is reserved for Section 3.1.10.1 where the joint density $\rho(\vec{q}, \vec{p})$ is fully developed.

3.1.4. Correlation of Motion, and Statistical Independence

Discussions in this section are related to correlation of motion. Since the RVs of interest are statistically independent zero mean Gaussian, they are also uncorrelated over sufficient intervals of time and space.

The mathematical statistical independence is presented here with the appropriate variable representation, preserving space-time indexing. Time indexing $t_l$ and $t_l+\tau$ is retained to acknowledge that the pdfs of interest may not evolve from strictly stationary processes.

$$\rho(v_\beta(t_\ell+\tau) \mid v_\alpha(t_\ell)) = \frac{\rho(v_\alpha(t_\ell), v_\beta(t_\ell+\tau))}{\rho(v_\alpha(t_\ell))} = \rho(v_\beta(t_\ell+\tau)) \quad \text{Equation 3-22}$$

$\rho(v_\beta(t_l+\tau)|v_\alpha(t_l))$ is the probability of the $(v_\beta, t_l+\tau)$ velocity vector given the $v_\alpha$ $(t_l)$ velocity vector. The following discusses the conditions enabling Equation 3-22.

Partial time correlation of Gaussian RVs characterizing physical phenomena is inevitable over relatively short time intervals when the RVs originate from processes subject to regulated energy per unit time. Bandwidth limited AWGN with spectral density $N_0$ is an excellent example of such a case where the infinite bandwidth process is characterized by a delta function time auto-correlation and the same strictly filtered process is characterized by a harmonic sins auto-correlation function with nulls occurring at intervals $\tau=\pm n(\frac{1}{2}B)$, where B is the filtering bandwidth and ±n are non-zero integers.

$$\mathfrak{R}_{n,n}(\tau) = N_0\delta(\tau), \quad B=\infty \quad \text{Equation 3-23}$$

$$\mathfrak{R}_{n,n}(\tau) = 2BN_0\frac{\sin(2\pi B\tau)}{2\pi B\pi}, \quad B<\infty \quad \text{Equation 3-24}$$

The nature of correlations at specific instants, or over extended intervals, can provide insight into various aspects of particle motions such as the work to implement those motions and the uncertainty of coordinates along the trajectory.

Λ was introduced to account for the inter-dimensional portions of momentum correlations. Whenever $v_\alpha$ and $v_\beta$ are not simultaneous in time, the desired expressions can be viewed as space and time cross-covariance. This is explicitly written for the $1^{th}$ and $(1^{th}+1)$ time instants in terms of the pdf as:

$$\Lambda_{\alpha,\beta} = \int\int_{-\infty}^{+\infty}(v_{\alpha,\ell})(v_{\beta,\ell+1})\rho(v_{\alpha,\ell})(v_{\beta,\ell+1})dv_{\alpha,\ell}dv_{\beta,\ell+1} = E\{v_{\alpha,\ell}v_{\beta,\ell+1}\} \quad \text{Equation 3-25}$$

This form accommodates a process which defines the random variables of interest but is not necessarily stationary. This mixed form is a bridge between the statistical and time domain notations of covariance and correlation. It acknowledges probability densities which may vary as a function of time offset and therefore q, as is the current case of interest.

The time cross correlation of the velocity for τ offset is;

$$\mathfrak{R}_{v_\alpha,v_\beta} = \langle\vec{v}_\alpha(t-t_\ell)\cdot\vec{v}_\beta(t-(t_\ell+\tau))\rangle = \lim_{T\to\infty}\frac{1}{2T}\int_{-T}^{T}(\vec{v}_{\alpha,(t_\ell)})\cdot(\vec{v}_{\beta,(t_\ell+\tau)})\,dt \quad \text{Equation 3-26}$$

If α=β then Figure 3-26 corresponds to a time autocorrelation function. This form is suitable for cases where the velocity samples are obtained from a random process with finite average power. Whenever α≠β, the vector velocities are uncorrelated because they correspond to orthogonal motions. Arbitrary motion is equally distributed among one or more dimensions over an interval 2T and compared to time shifted trajectories. Then, the resulting time based correlations over sub intervals may range from −1 to 1. In the case of independent Gaussian RV's, Equations 3-25 and 3-26 should approach the same result.

In the most general case the momentum, and therefore the velocity, can be decomposed into D orthogonal components. If such vectors are compared at $t=t_l$ and $t=t_l+\tau$ offsets, then a correlation operation can be decomposed into D kernels of the form given in Equation 3-25 where it is understood that the velocity vectors must permute over all indices of α and β to obtain comprehensive correlation scores. A weighted sum of orthogonal correlation scores determines a final score.

A metric for the velocity function similarity as the correlation space-time offset varies is found from the normalized correlation coefficient, which is the counterpart to the normalized covariance presented earlier. It is evaluated at a time offset.

$$\gamma_{v_\alpha,v_\beta} = \frac{\mathfrak{R}_{v_\alpha,v_\beta}(\tau)}{\langle\vec{v}_{\alpha,t_\ell}\cdot\vec{v}_{\beta,t_\ell+\tau}\rangle} \quad \text{Equation 3-27}$$

It is possible to target the space and time features for analysis by suitably selecting the values α,β,τ.

A finite energy, time autocorrelation is also of some value. Sometimes this can be a preferred form instead of the form in Equation 3-26. The energy signal auto and cross correlation can be found from:

$$\mathfrak{R}_{v_\alpha,v_\beta} = \langle\vec{v}_\alpha(t-t_\ell)\cdot\vec{v}_\beta(t-(t_\ell+\tau))\rangle = \lim_{T\to\infty}\int_{-T}^{T}(\vec{v}_{\alpha,(t_\ell)})\cdot(\vec{v}_{\beta,(t_\ell+\tau)})\,dt \quad \text{Equation 3-28}$$

Now the character of the time auto-correlation of the linear momentum over some characteristic time interval, such as $\Delta t=t_l-t_{l+1}$, is examined. In an embodiment, the correlation must become zero as the offset time $(t_l+\Delta t)$ is approached to obtain statistical independence outside that window. In that case, time domain de-correlation requires that:

$$\langle\vec{p}(t-t_l)\cdot\vec{p}(t-(t_l+\Delta t))\rangle=0; t\geq|(t_l+\Delta t)| \quad \text{Equation 3-29}$$

Similarly, the forces which impart momentum change must also decouple implying that:

$$\langle\dot{\text{p}}(t-t_l)\cdot\vec{p}(t-(t_l+\Delta t))\rangle=0; t\geq|(t_l+\Delta t)| \quad \text{Equation 3-30}$$

Suppose it is desired to de-correlate the motions of a rapidly moving particle and this operation is compared to the same particle moving at a diminutive relative velocity over an identical trajectory. Greater energy per unit time is helpful to generate the same uncorrelated motions for the fast particle over a common configuration coordinate trajectory. The controlling rate of change in momentum must increase corresponding to an increasing inertial force. Likewise, a proportional oppositional momentum variation is useful to establish equilibrium, thus arresting a particle's progress along some path.

Another consideration is whether or not the particle motion attains and sustains an orthogonal motion or briefly encounters such a circumstance along its path. Both cases are of interest. However, a brief orthogonal transition is sufficient to remove the memory of prior particle momentum altogether if the motions are distributed randomly through space and time.

A basic principle emerges from Equations 3-29 and 3-30. This principle is that successive particle momentum and force states must become individually zero, jointly zero or orthogonal, corresponding to the erasure of momentum memory beyond some characteristic interval Δt, assuming no other particle or boundary interactions.

If a particle stops while releasing all of its kinetic energy, or turns in an orthogonal direction, prior information encoded in its motion is lost. This is because evolving uncertainty is coupled to the particle memory through momentum. Extended single particle de-correlations outside of the interval ±Δt, with respect to $\mathfrak{R}_{v_\alpha, v_\beta}$@τ=0, are evidence of increasing statistical independence in those regimes.

Autocorrelations will be zero outside of the window (−Δt≤τ≤Δt) for the immediate analysis unless otherwise stated. The reason for this initial analysis restriction is to bound the maximum required energy resource for statistically independent motion beyond a characteristic interval. In other words, there is no information concerning the particle motion outside that interval of time.

The derivative $\dot{\varepsilon}_k$ is random up to a limit, $P_{max}$. $\dot{\varepsilon}_k$ is a function of the derivative field:

$$\dot{\varepsilon}_k = \vec{\dot{p}} \cdot \vec{\dot{q}} \quad \text{Equation 3-31}$$

This leads to a particular inter-variable cross-correlation expression:

$$\lim_{\tau\to\infty} \frac{1}{2T}\int_{-T}^{T} \vec{\dot{p}}(t-t_\ell)\cdot\vec{\dot{q}}(t-(t_\ell+\tau))dt = \left\langle \vec{\dot{p}}\cdot\vec{\dot{q}} \right\rangle \le P_{max} @ \tau = 0 \quad \text{Equation 3-32}$$

The kernel is a measure of the rate of work accomplished by the particle. It is useful as an instantaneous value or an accumulated average. This equation is identically zero only for the case where $\vec{\dot{p}}$ or $\vec{\dot{q}}$ are zero or for the case where the vector components of $\vec{\dot{p}}, \vec{\dot{q}}$ are mutually orthogonal. If the vector components of $\vec{\dot{p}}, \vec{\dot{q}}$ are orthogonal for all time, then there is no power consumed in the course of the executed motions. Thus, the assumption for statistical independence of momentum and force at relatively the same instant in time for the case where the instantaneous rate of work is zero. Whenever there is consumption of energy, force and velocity share some common nonzero directional component and will be statistically codependent to some extent. This bridges between randomly distributed coordinates of the phase space at successively fixed time intervals. If we restrict motions to an orthogonal maneuver within the derivative field, we collapse phase access and uncertainty of motion goes to zero along with the work performed on the particle.

3.1.5. Autocorrelations and Spectra for Independent Maximum Velocity Pulses

At this point it is convenient to introduce the concept of the velocity pulse. Particle memory, due to prior momentum, is erased moving beyond time Δt into the future for this analysis. Conversely, this implies a deterministic component in the momentum during the interval Δt. Such structure, where the interval is defined as beginning with zero momentum in the direction of interest and terminating with zero momentum in that same direction is referred to as a velocity pulse. For example, the maximum velocity profiles may be distinctly defined as pulses over Δt.

The maximum velocity pulse possesses a time autocorrelation that is analyzed in detail in Section 10.3 (Appendix C). The corresponding normalized autocorrelation, is plotted in the following graph with Δt=1.

Figure 14:
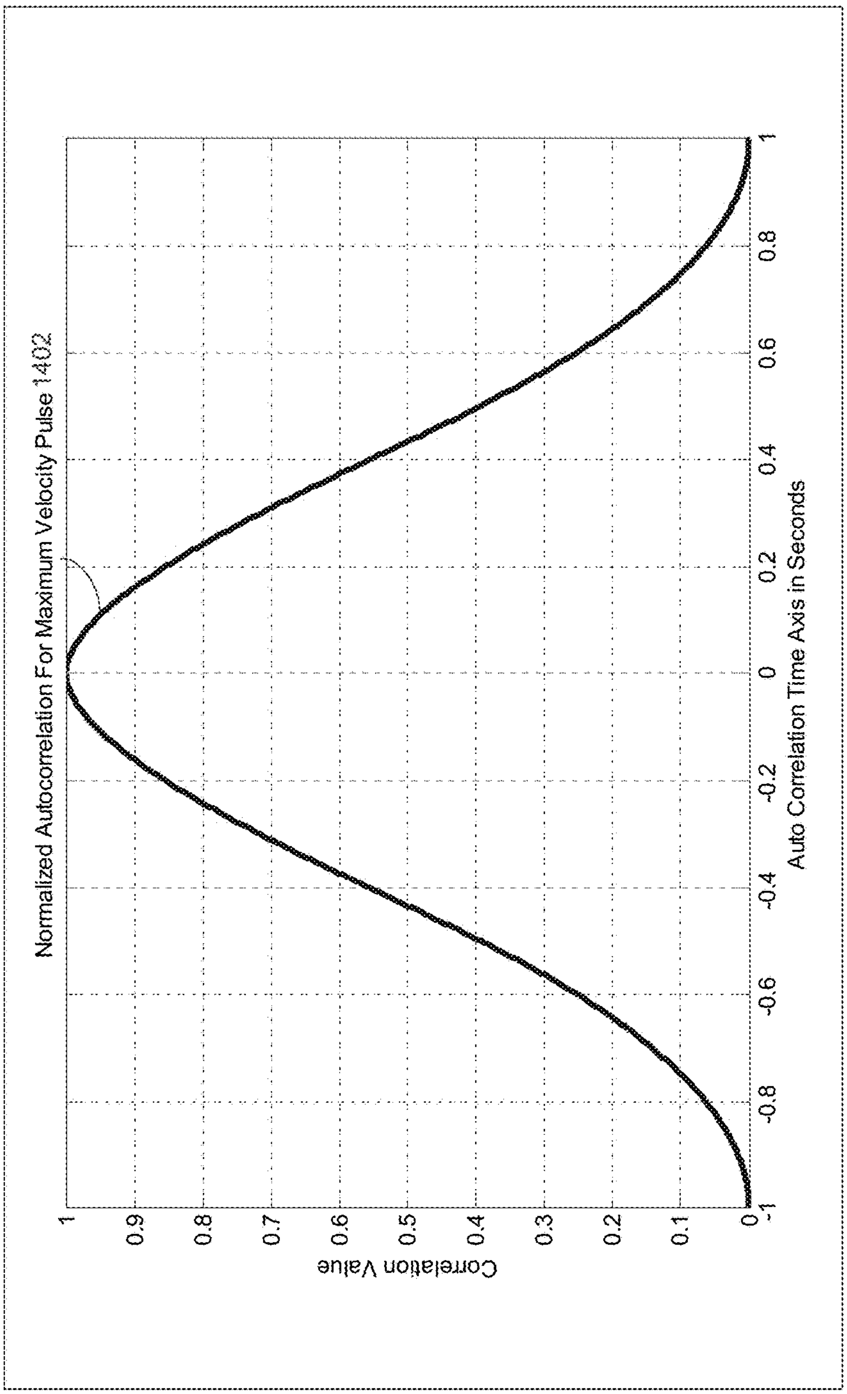
FIG. 14 is an illustration of a plot of a normalized autocorrelation, in accordance with one or more embodiments.

FIG. 14 illustrates a plot 1400 of a normalized autocorrelation 1402 of a maximum velocity pulse, in accordance with one or more embodiments. Normalized autocorrelation 1402 is the normalized autocorrelation for the pulse of the maximum velocity which spans the hyper sphere with a single degree of freedom. If it is further assumed that the orthogonal dimensions execute independent motions, it follows that the autocorrelations in the $x_1, x_2, \ldots x_D$ directions are of the same form. One feature is that the autocorrelation is zero for the extremums, ±Δt. This feature influences the Fourier transform response. The Fourier transform of the autocorrelation can be calculated from the Fourier response of the convolution of two functions by a change of variables. The transform of the convolution is given by:

$$\Im(g_1 * g_2) = \int_{-\infty}^{\infty}\left\{\int_{-\infty}^{\infty} g_1(t-\lambda)g_2(\lambda)d\lambda\right\}e^{-i\omega t}dt = G_1(\omega)G_2(\omega) \quad \text{Equation 3-33}$$

The transform of the correlation operation for real functions is given by:

$$\Im\{g_1 g_2\} = \int_{-\infty}^{\infty}\left\{\int_{-\infty}^{\infty} g_1(t'+\tau)g_2(t')dt'\right\}e^{-i\omega t}dt \quad \text{Equation 3-34}$$

If (t'−τ)→(t−λ), then the convolution is identical to the correlation which is precisely the case for symmetric functions of time. Hence, the Fourier transform of the autocorrelation can be obtained from the Fourier transform squared of the velocity pulse in this case.

$$\Im\left\{\int_{-\infty}^{\infty} v(t'+\tau)v(t')dt'\right\} = \int_{-\infty}^{\infty}\left\{\int_{-\infty}^{\infty} v(t'+\tau)v(t')dt'\right\}e^{-i\omega t}dt = V(\omega)V(\omega) \quad \text{Equation 3-35}$$

Figure 15:
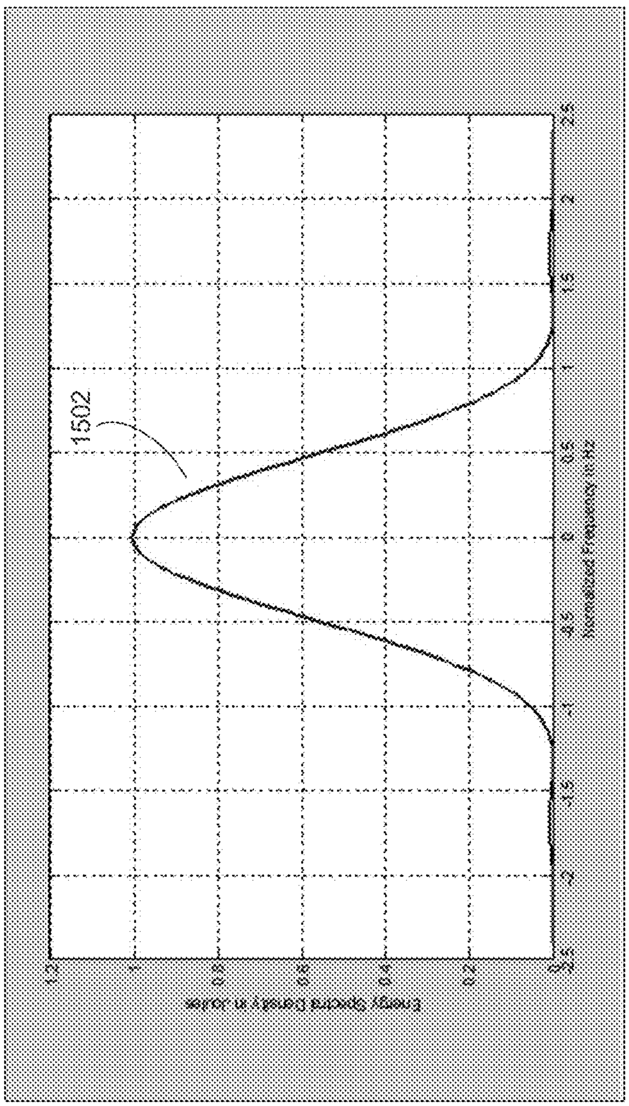
FIG. 15 is an illustration of a plot of a normalized Fourier transform, in accordance with one or more embodiments.
Figure 16:
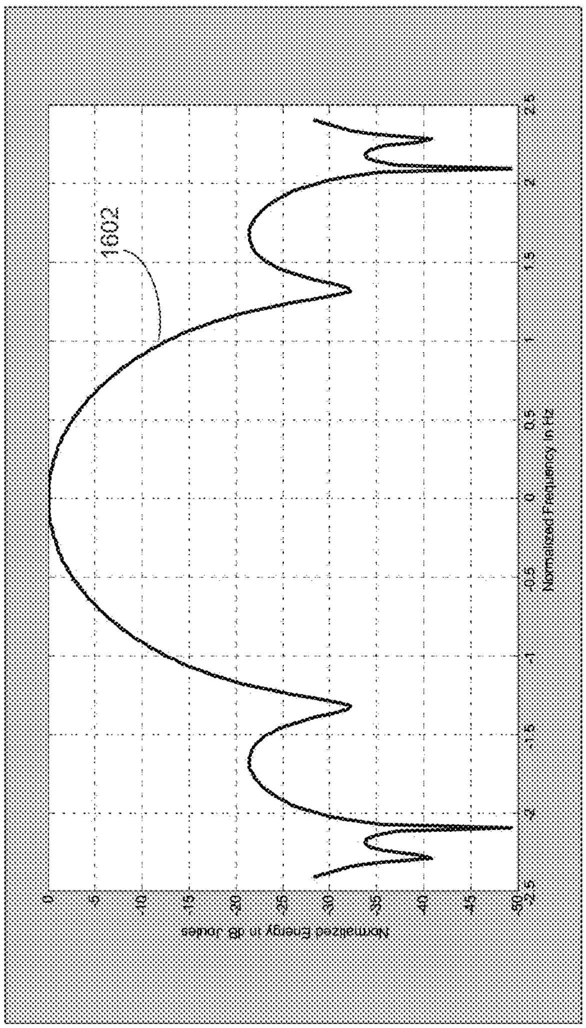
FIG. 16 is an illustration of a plot of a normalized Fourier transform, in accordance with one or more embodiments.

FIGS. 15 and 16 illustrate the magnitude response for the transform of the normalized maximum velocity pulse autocorrelation for linear and logarithmic scales, respectively. FIG. 15 shows plot 1500 including normalized Fourier transform of maximum velocity pulse autocorrelation 1502. FIG. 16 shows plot 1600 including normalized Fourier transform of maximum velocity pulse autocorrelation 1602.

FIGS. 15 and 16 represent the energy spectrum generated by the most radical particle maneuver within the phase space to insure de-correlation of motion beyond a time Δt into the future. The spectrum possesses frequency content which corresponds to the truncated time boundary conditions requiring zero momentum at those extremes.

The maximum velocity pulse functions given above are not specified except at the statistically rare boundary condition extreme. Whenever the transmitter is not pushed to an extreme dynamic range, the pulse function can assume a different form.

According to the Gaussian statistic, the maximum velocity pulse, and therefore its associated autocorrelation illustrated in FIGS. 15 and 16, would be weighted with a low probability asymptotically approaching zero for a large PAER parameter. General pulses will consume energy at a rate less than or equal to the maximum velocity pulse and possess spectrums well within the frequency extremes of the derived maximum velocity pulse energy spectrum 3.1.6. Characteristic Response Independent pulses of duration $\Delta t$ possess a characteristic autocorrelation response. In an embodiment, all spectral calculations based on this fundamental structure will have a main lobe with a frequency span which is at least on the order of or greater than $2(\Delta t)^{-1}$ according to the Fourier transform of the autocorrelation. This can be verified by Gabor's uncertainty relation.

Figure 17:
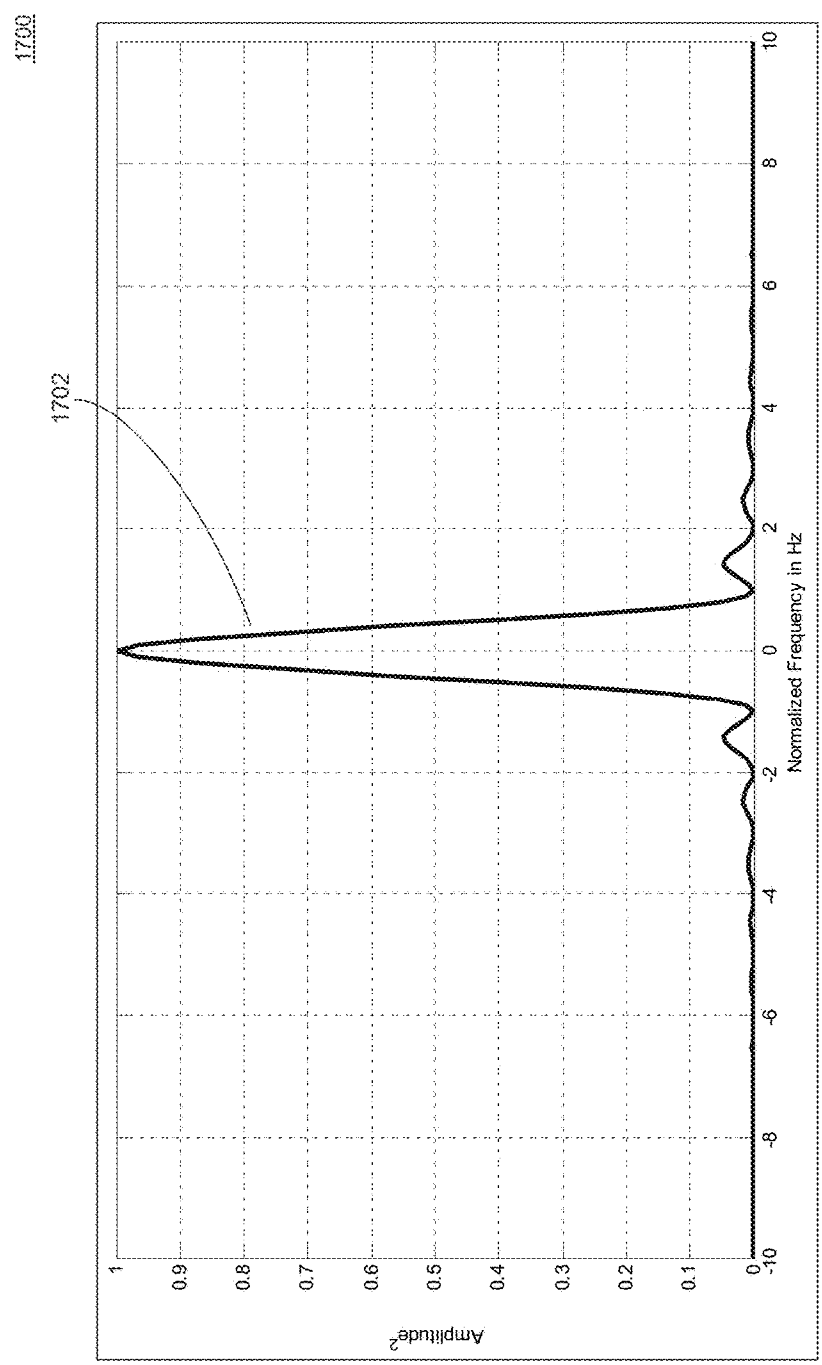
FIG. 17 is an illustration, of a plot of a Fourier transform of a rectangular pulse autocorrelation, in accordance with one or more embodiments.

FIG. 17 is an illustration of a plot 1700 of a Fourier transform 1702 of a rectangular pulse autocorrelation, in accordance with one or more embodiments. The pulse, $$\Pi\left(\frac{t}{\Delta t}\right),$$

can be formed from elementary operations which possess significant intuitive and physical relevance. Any finite rectangular pulse can be modeled with at least two impulses and corresponding integrators.

Figure 18:
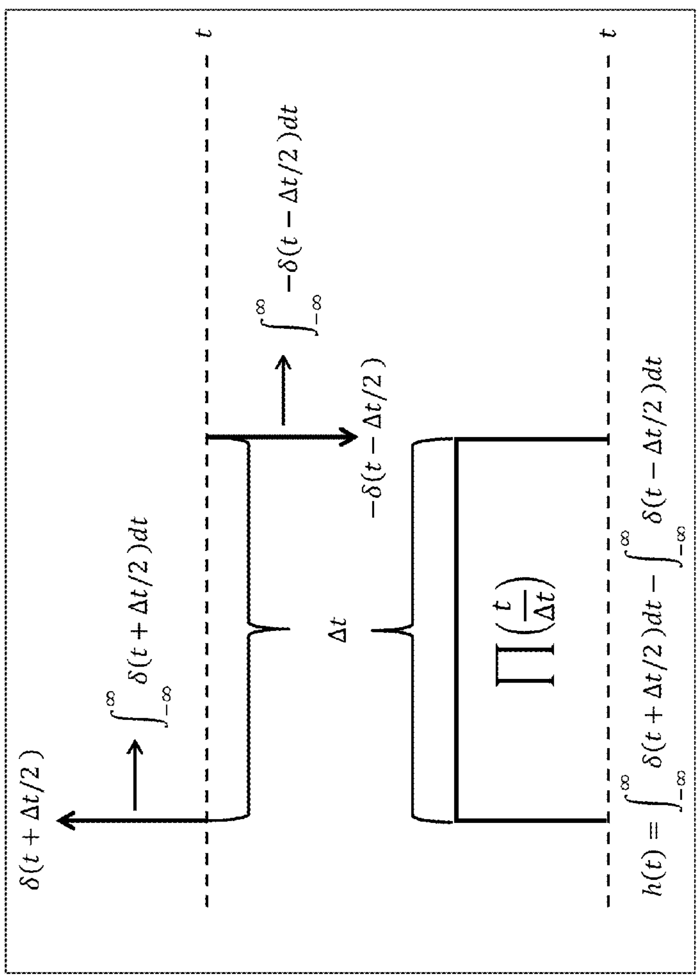
FIG. 18 is an illustration of a schematic for forming a finite rectangular pulse, in accordance with one or more embodiments.

FIG. 18 illustrates a schematic 1800 for forming a finite rectangular pulse from the integration of delta functions, in accordance with one or more embodiments. In FIG. 18, h(t) is the impulse response of the system which deploys two integrated delta function forces.

Supposing that the impulse functions are forces applied to a particle of mass m=1, to obtain particle velocity one can integrate the acceleration due to the force. The result of the given integration is the rectangular velocity pulse versus time. This is a circumstance without practical restrictions on the force functions $\delta(t\mp\Delta t/2)$, i.e. physically non-analytic, yet corresponds mathematically to Newton's laws of motion.

The result is accurate to within a constant of integration. Only the time variant portion of the motion can encode information so the constant of integration is not of immediate interest. Notice further that if the first integral were not opposed by the second, motion would be constant and change in momentum would not be possible after $t=-\Delta t/2$. Otherwise, uncertainty of motion would be extinguished after the first action. Thus, two forces are useful to alter the velocity in a prescribed manner to create a pulse of specific duration.

Recall the original maximum velocity pulse with one degree of freedom previously analyzed in detail. In that case at least two distinct forces are also used to create the velocity profile, which ensures statistical independence of motion outside the interval $\pm\Delta t/2$.

Figure 19:
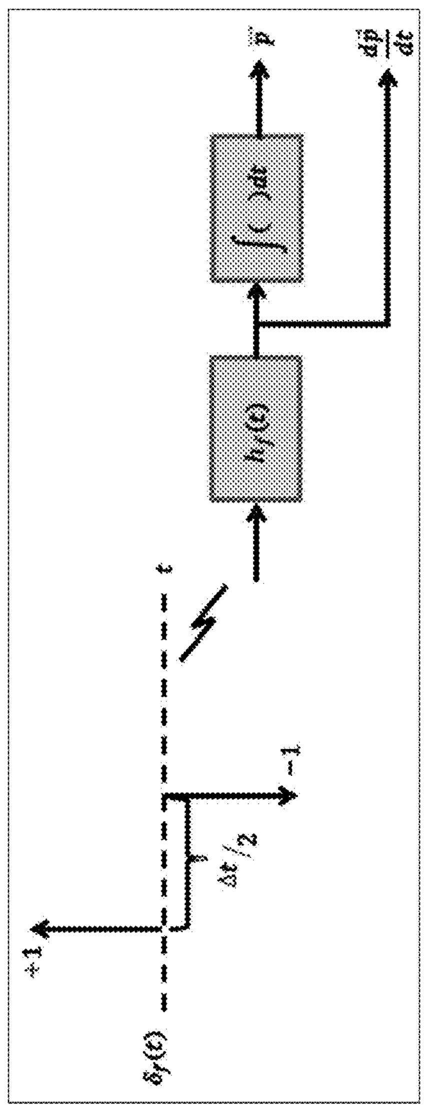
FIG. 19 is an illustration of a model for a force doublet generating maximum velocity pulse, in accordance with one or more embodiments.
Figure 20:
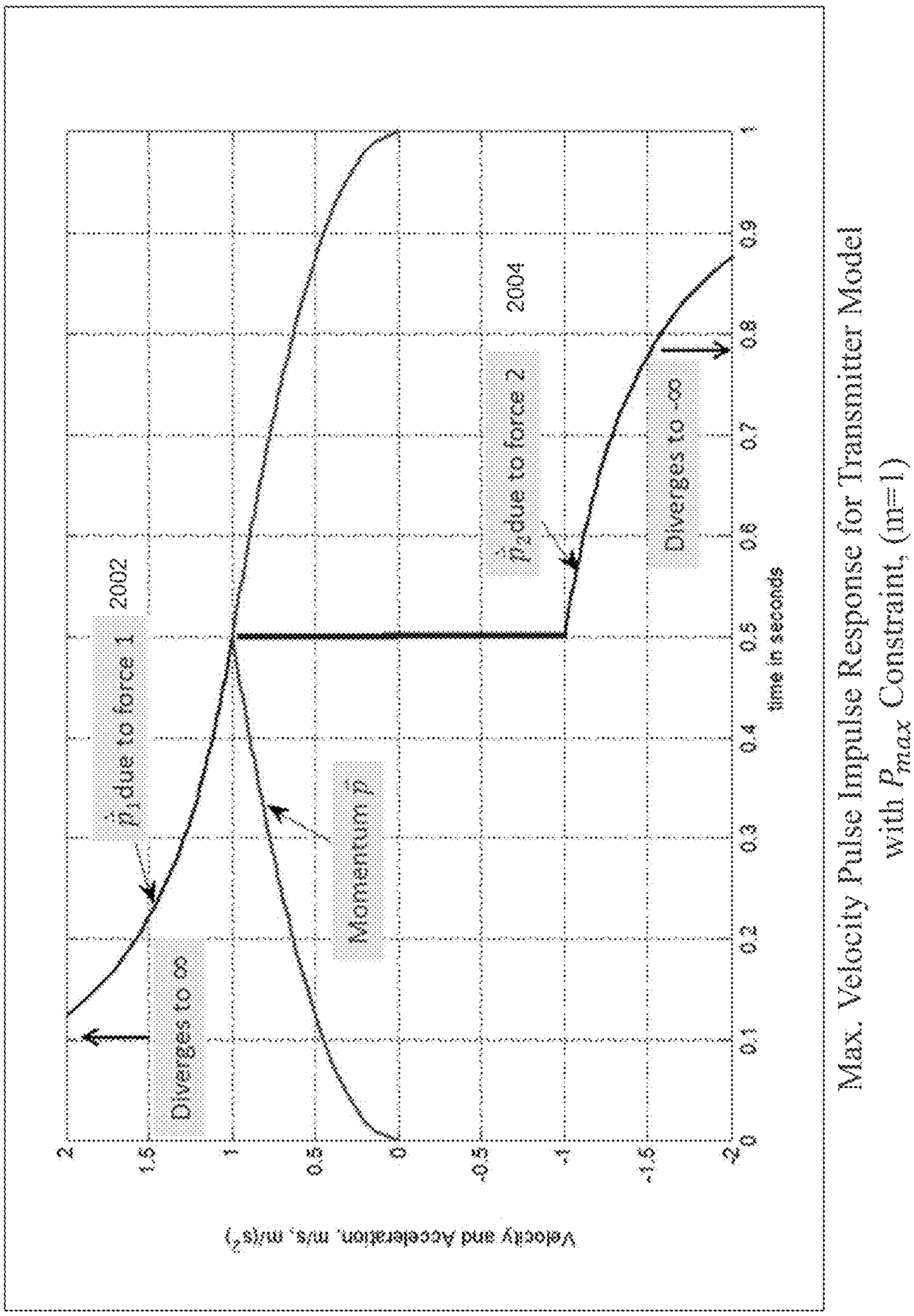
FIG. 20 is an illustration of a plot of a maximum velocity pulse impulse response, in accordance with one or more embodiments.

FIGS. 19 and 20 provide a comparison to the rectangular pulse example. $h_p(t)$ indicates that two distinct forces are used: one to first accelerate then one to decelerate the particle. The majority of pulses within the extreme velocity pulse bound can be physically analytic even though the maximum velocity pulse is not. Assume that $h_f(t)$ is the characteristic system impulse response function and * is a convolution operator. Then:

$$h_p(t) = [\delta(t) * h_f(t)] - \left[\delta\left(t - \frac{\Delta t}{2}\right) * h_f(t)\right] \quad \text{Equation 3-36}$$

FIG. 19 illustrates a model 1900 for a force doublet generating maximum velocity pulse, in accordance with one or more embodiments. FIG. 20 illustrates a plot 2000 of a maximum velocity pulse impulse response, for transmitter model with $P_{max}$ constraint, m=1, in accordance with one or more embodiments.

Information is encoded in the pulse amplitude. This level is dependent on the nature of the force over the interval $\Delta t$ and changes modulo $\Delta t$. Regardless of the specific function realized by the velocity pulse, at least two distinct forces permit independence of motion between succeeding pulse intervals. This property is also evident from energy conservation in the case where work is accomplished on the particle since:

$$\langle \vec{\dot{p}}_1 \cdot \vec{\dot{q}}_1 \rangle = \langle \vec{\dot{p}}_1, \vec{\dot{q}}_2 \rangle \Delta t_1 + \Delta t_2 = \Delta t \quad \text{Equation 3-37}$$

$$\varepsilon_1 = \varepsilon_2 \quad \text{Equation 3-38}$$

The left hand side of the equation is the average energy $\varepsilon_1$ over the interval $\Delta t_1$, the first half of the pulse. The right hand side is the analogous quantity for the second half of the pulse. If the average rate of work by the particle, $\langle \vec{\dot{p}}_1 \cdot \vec{\dot{q}}_1 \rangle$, increases, then $\Delta t_1$ may decrease in turn reducing $\Delta t$, the time to uniquely encode an uncorrelated motion spanning the phase space. The total kinetic energy expended for the first half of the pulse is equivalent to the energy expended in the second half given equivalent initial and final velocities. If the initial and final velocities in a particular direction are zero then the momentum memory for the particle is reset to zero in that direction, and prior encoded information is erased.

This theme is reinforced by $\dot{p}_1(t)$ 2002 and $\dot{p}_2(t)$ 2004 associated with forces $F_1$, $F_1$ illustrating the dynamics of a maximum velocity pulse in FIG. 20 and leads to the following principle: at least two unique forces are sufficient to encode information in the motion of a particle over an interval $\Delta t$. These forces occur at the average rate $f_s \geq 2\cdot(\Delta t)^{-1}$.

This is a physical form of a sampling theorem. Whether generating such motions or observing them, $f_{s\_min}=2(\Delta t)^{-1}$ is a useful consideration for the most extreme trajectory possible, which de-correlates particle motion in the shortest time given the limitation of finite energy per unit time. The justification has been provided for generating motions, but the analogous circumstance concerning observation of motion logically follows. Acquisition of the information encoded in an existing motion through deployment of forces, utilizes extracting momentum in the opposite sense. Encoding changes particle momentum in one direction and decoding extracts this momentum by an opposite relative action. In both cases the momentum imparted or extracted goes to the heart of information transfer and the efficiency concern to be discussed further in Section 5.

Shannon's Sampling Theorem; If a function contains no frequencies higher than W cps, it is completely determined by giving its ordinates at a series of points spaced $(2\text{ W})^{-1}$ seconds apart.

In the same paper, Shannon states, concerning the sample rate: "This is a fact which is common in the communications art." Furthermore, Shannon credits Whittaker, Nyquist and Gabor.

In the limiting case of a maximum velocity pulse, the pulse is symmetrical. The physical sampling theorem does not require this in general as is evident from the equation for averaged kinetic energy from the first half of a pulse over interval $\Delta t_1$ versus the second interval $\Delta t_2$. In the general circumstance, $\langle P_1 \rangle \neq \langle P_2 \rangle$ and $\Delta t_1 \neq \Delta t_2$. Thus, the pulse shape restriction is relaxed for the more general case when $\{P_1, P_2\} < P_m$. Since the sampling forces which occur at the rate $f_s$ are analyzed under the most extreme case, all other momentum exchanges are subordinate. The fastest pulse, the maximum velocity pulse, possesses just enough power $P_m$ to accomplish a comprehensive maneuver over the interval Δt, and this trajectory possesses only one derivative sign change. Slower velocity trajectories may possess multiple derivative sign changes over the characteristic configuration interval 2 $R_s$ but $f_s$ will be greater than or equal to twice the number of derivative sign changes of the velocity and also be greater than or equal to twice the transition rate between orthogonal dimensions.

In multiple dimensions the force is a diversely oriented vector but possess these specified sampling qualities when decomposed into orthogonal components and the resources spawning forces support the capability of maximum acceleration and deceleration over the interval Δt, even though these extreme forces are seldom required.

The calculations for the maximum work over the interval Δt/2 and the average kinetic energy limit of velocity pulses in general, based on the PAER metric and practical design constraints. Equation 3-41 is due to the physical sampling theorem.

$$\varepsilon_{k_{\Delta t/2}} = \varepsilon_{max} = P_m \frac{\Delta t}{2} \quad \text{Equation 3-39}$$

$$\frac{\Delta t}{2} P_m \geq \langle \varepsilon_k \rangle (PAER) \quad \text{Equation 3-40}$$

$$f_s \geq 2 \cdot (\Delta t)^{-1} \quad \text{Equation 3-41}$$

Equations 39, 40 and 41 may be combined and rearranged, noting that the average kinetic energy is less than or equal to the maximum kinetic energy. In other words, $P_m$ is a conservative upper bound and a logical design limit to enable conceivable actions. Therefore:

$$\frac{P_m}{\langle \varepsilon_k \rangle_s (PAER)} \leq f_s \quad \text{Eqaution 3-42}$$

The averaged energy $\langle \varepsilon_k \rangle_s$ is per sample. The total available energy $\varepsilon_{tot}$ is allocated amongst say 2N samples or force applications. The average energy per unique force application is therefore just $\varepsilon_{tot}/2N = \langle \varepsilon_k \rangle_s$. This is the quantity that should be used in the denominator of Equation 3-42 to calculate the proper force frequency $f_s$. Using Equation 3-42, another form of physical sampling theorem can be stated which contemplates extended intervals modulo $T/2N = T_s$:

The physical sampling rate for any communications process is greater than the maximum available power to invest in the process, divided by the average encoded particle kinetic energy per unique force (sample), times the peak to average energy ratio (PAER) for the particle motions over the duration of a signal.

The prior statement is best understood by considering single particle interactions but can be applied to bulk statistics as well. We will interpret $f_s$ as the number of unique force applications per unit time and $f_{s\_min}$, is the number of statistically independent momentum exchanges per unit time. This rate shall also be referred to hereafter, as the sampling frequency. Adjacent samples in time can be correlated. If the correlation is due to the limitation $P_m$, then the system is oversampled whenever more than 2 forces per characteristic interval Δt are deployed. Conversely, if only two forces are deployed per characteristic interval, then it is possible to make them independent (i.e., unique) given an adequate $P_m$. Therefore, the physical sampling theorem specifies a minimum sampling frequency $f_{s\_min}$, as well as an interval of time over which successive samples are deployed to generate or acquire a signal. By doing so, all frequencies of a signal up to the limit B are contemplated. The lowest frequency of the signal is given by $T^{-1}$.

More samples are useful when they are correlated because they impart or acquire smaller increments of momentum change per sample compared to the circumstance for which a minimum of two samples enable particle dynamics which span the phase space over the interval Δt.

Shannon's sampling theorem as stated is useful but not sufficient because it does not include a duration of time over which samples are deployed to capture both high frequency and low frequency components of a signal over the frequency span B, though his general analysis includes this concept. As Marks points out, Shannon's sampling number is a total of $2BT_s$ samples to characterize a signal. Consider a 1 kg mass which has a peak velocity limit of 1 m/s for a motion which is random and the peak to total average energy ratio for a message is limited to 4 to capture much of the statistically relevant motions (97.5% of the particle velocities for a Gaussian statistic). Let the power source possess a 10 Joule capacity, $\varepsilon_{tot}$. If the apparatus power available to the particle has a maximum energy delivery rate limit of $P_m$ equal to 1 joule per second and we wish to distribute the available energy source over 1 million force exchanges spaced equally in time to encode a message, then the frequency of force application is:

$$f_s = \frac{1}{\frac{10}{10^6}(4)} = 2.5 \times 10^4 \text{ forces per second}$$

If $f_s$ falls below this value, then the necessary maneuvers required to encode information in the particle motion cannot be faithfully executed, thereby eroding access to phase space, which in turn reduces uncertainty of motion and ultimately information loss. If $f_s$ increases above this rate then information encoding rates can be achieved or increased, trading the reduction in transmission time versus energy expenditure.

Capacity equations can be related to the physical sampling theorem and therefore related to the peak rate of energy expenditure, not just the average. The peak rate is a legitimate design metric, and the ratio of the peak to average is inversely related to efficiency, as will be shown. It is even possible to calculate capacity versus efficiency for non-maximum entropy channels by fairly convenient means, an exercise of considerable challenge according to Shannon. By characterizing sample rate in terms of its physical origin, access to the conceptual utility of other disciplines such as dynamics and thermodynamics and be gained and advanced toward the goal of trading capacity for efficiency.

3.1.7. Sampling Bound Qualification

Shannon's form of the sampling theorem contains a reference to frequency bandwidth limitation, W. It is of important to establish a connection with the physical sampling theorem. An intuitive connection can be stated simply by comparing two equations (where W is replaced by B):

$$f_s \geq \frac{P_m}{\langle \varepsilon_k \rangle_s PAER}, \quad \text{Equation 3-43}$$

$$f_s \geq 2B$$

B will be justified as the variable symbolizing Nyquist's bandwidth for the remainder of this disclosure and possesses the same meaning as the variable W used by Shannon. Although both the inequalities in equation 3-43 appear different, they possess the same units if one regards a force event (i.e. an exchange of force with a particle) to be defined as a sample.

The bound provided for the sampling rate in equations 3-43 and Shannon's theorem are obtained by two very different strategies. Equation 3-46 is based on physical laws while Shannon's restatement of the sampling rate proposed by Nyquist and Gabor is of mathematical origin and logic. The conditions under which the inequalities in equations 3-43 provide the most restrictive interpretation of $f_s$. are examined. This occurs as both equations in 3-43 approach the same value.

$$\frac{P_m}{\langle \varepsilon_k \rangle_s (PAER)} \to 2B \quad \text{Equation 3-44}$$

The arrow in the equation indicates "as the quantity on the left approaches the quantity on the right", We will investigate the circumstance for this to occur. It will be shown that when signal energy as calculated in a manner consistent with the method employed by Shannon is equated to the kinetic energy of a particle, the implied relation of equation 3-44 becomes an equality.

A direct approach can be illustrated from the Fourier transform pair of a sequence of samples from a message ensemble member. This technique depends on the definition for bandwidth. Shannon's definition requires zero energy outside of the frequency spectrum defined by bandwidth B. A parallel to Shannon's proof is provided for reference. Shannon employs a calculation in his proof of the inverse Fourier transform of the band limited spectrum for a sampled function of time, g (t), sampled at discrete instants $$\left(t - \frac{n}{2B}\right).$$

$$g\left(\frac{n}{2B}\right) = \frac{1}{2\pi} \int_{-2\pi B}^{2\pi B} G(\omega) e^{-i\omega \frac{n}{2B}} \, d\omega \quad \text{Equation 3-45}$$

This results in an infinite series expansion over n, the sample number.

Thus, with n treatment the kinetic energy of individual velocity samples for a dynamic particle are equated to the energy of signal samples so that:

$$\frac{1}{2} m \left( v\left(\frac{n}{2B}\right) \right)^2 = \left( g\left(\frac{n}{2B}\right) \right)^2 \quad \text{Equation 3-46}$$

When Equation 3-46 is true, then the right hand side of Equation 3-43 has a kinetic energy form and a signal energy form. Shannon's definition for signal energy will be used.

Consider the signal g(t) to be of finite power in a given Shannon bandwidth B:

$$\varepsilon_g = \sum_{n=-\infty}^{\infty} \left( g\left(\frac{n}{2B}\right) \right)^2 = \int_{-B}^{B} |G(f)|^2 \, df \quad \text{Equation 3-47}$$

Shannon requires the frequency span 2B to be a constant spectrum over G(ƒ). Since the approach is to discover how the particle kinetic energy limitations per unit time correspond to Shannon's bandwidth, a constant is substituted for G(ƒ) in Rayliegh's expression to obtain:

$$\varepsilon_g = 2B \langle \varepsilon_{g_{Hz}} \rangle = T \langle \tilde{\varepsilon}_g \rangle = 2N \langle \varepsilon_g \rangle \text{ Joules} \quad \text{Equation 3-48}$$

Both sides of Equations 3-47 and 3-48 have been multiplied by unit time to obtain energy. $\langle \varepsilon_{g_{Hz}} \rangle$ is given in terms of average Joules per Hz where $|G(f)|^2$ is the constant energy spectral density. $T=2NT_s$ is the duration of the signal g(t), 2N is the number of samples, $T_s$ is the time between samples, $\langle \varepsilon_g \rangle_s$ is the average energy per sample and $\langle \tilde{\varepsilon}_g \rangle$ is the average energy per unit time. Then:

$$\frac{\varepsilon_g}{\langle \varepsilon_{g_{Hz}} \rangle} = 2B \text{ Hz} \quad \text{Equation 3-49}$$

An alternate form of 3-44 may now be written;

$$\frac{P_m}{\langle \varepsilon_k \rangle_s (PAER)} \to \frac{\varepsilon_g}{\langle \varepsilon_{g_{Hz}} \rangle} \quad \text{Equation 3-50}$$

$$\frac{\varepsilon_g}{\langle \varepsilon_{g_{Hz}} \rangle} = \frac{\langle \tilde{\varepsilon}_g \rangle T}{\langle \varepsilon_{g_{Hz}} \rangle} = \frac{\varepsilon_{g_{pk}}}{\frac{\langle \varepsilon_{g_{Hz}} \rangle}{2NT_s} \frac{\varepsilon_{g_{pk}}}{\langle \tilde{\varepsilon}_g \rangle}} = \frac{T_s \varepsilon_{g_{pk}}}{\frac{\varepsilon_g}{2N} \frac{\varepsilon_{g_{pk}}}{\langle \tilde{\varepsilon}_g \rangle}} = \frac{P_{g_{max}}}{\langle \varepsilon_g \rangle_s PAER}; \quad \text{for } 2B = (T_s)^{-1} \quad \text{Equation 3-51}$$

$$\therefore \frac{P_m}{\langle \varepsilon_k \rangle (PAER)} = \frac{P_{g_{max}}}{\langle \varepsilon_g \rangle PAER}; \text{ for } \langle \varepsilon_k \rangle_s = \langle \varepsilon_g \rangle_s \quad \text{Equation 3-52}$$

Given equation 3-52 is now an equality, 3-44 may be employed as a suitable measure for bandwidth or sampling rate requirements. Thus, for a communications process modeled by particle motion which is peak power limited;

$$\frac{1}{T_s} \geq \frac{\max\left\{\frac{d\varepsilon_k}{dt}\right\}}{k_p \langle \varepsilon_k \rangle (PAER)} = \frac{\max\{\dot{\vec{q}} \cdot \dot{\vec{p}}\}}{k_p \langle \varepsilon_k \rangle (PAER)} \quad \text{Equation 3-53}$$

$$f_{s\_min} = \frac{\max\left\{\frac{d\varepsilon_k}{dt}\right\}}{k_p \langle \varepsilon_k \rangle_s (PAER)} = 2B$$

This equation and its variants shall be referred to as the sampled time-energy relationship or the TE relation. The TE relation may be applied for uniformly sampled motions of any statistic. If trajectories are conceived to deploy force rates which exceed $f_{s\_min}$, then B can also increase with a corresponding modification in phase space volume. In addition, the factor $k_p$ appears in the denominator. This constant accounts for any adjustment to the maximum velocity profile which is assigned to satisfy the momentum space maximum boundary condition. For the case of the nonlinear maximum velocity pulse, in the hyper sphere, $k_p \equiv 1$. This is one design extreme. Another design extreme occurs whenever the boundary velocity profile can also be physically analytic under all conditions. Finally, the appearance of the derivatives of the canonical variables, $\dot{\vec{q}},\dot{\vec{p}}$, in the numerator, illustrate the direct connection between the particle dynamics within phase space to a sampling theorem. In particular, these variables illustrate the increased work rate for encoding greater amounts of information per unit time. The quantity max $\{\dot{\vec{q}}\cdot\dot{\vec{p}}\}$ maximizes the rate of change of momentum per unit time over a configuration span.

An example illustrates the utility of Equation 3-53. Suppose a signal of 1 MHz bandwidth must be synthesized. Let the maximum power delivery for the apparatus be set to $$\max\left\{\frac{d\varepsilon_k}{dt}\right\} = 1 \text{ watt.}$$

Furthermore, the signal of interest is known to possess a 3 dB PAER statistic. From these specifications one calculates that the average energy rate per sample is 2.5e-7 Joules. If the communications apparatus is battery powered with a voltage of 3.3 V@1000 mAh rating, then the signal can sustain for 6.6 hours between recharge cycles of the battery, assuming the communications apparatus is otherwise 100% efficient.

3.1.8. Interpolation for Physically Analytic Motion

This section provides a derivation for the interpolation of sampled particle motion. The Cardinal series is derived from a perspective dependent on the limitations of available kinetic energy per unit time and the assumption of LTI operators for reconstructing a general particle trajectory from its impulse sample representation. A portion of the LTI operator is assumed to be inherent in the integrals of motion. Additional sculpting of motion is due to the impulse response of the apparatus. Together, these two effects constitute an aggregate impulse response which determines the form of the characteristic velocity pulse. The cardinal series is considered a sequence of such velocity pulses.

Up to this point, the physically analytic requirement for trajectory has not been strictly enforced at the boundary as is evident when reviewing FIG. 20 where the force associated with a maximum nonlinear velocity pulse diverges to infinity.

A remedy is now pursued which insures that all energy rates and forces are finite.

Suppose that there is a reservoir of potential energy $\varepsilon_\phi$ available for constructing a signal from scratch. At some phase coordinate $\{q_0,p_0\}$ at time $t_{0-}$, the infinitesimal instant of time prior to $t_0$, the quantity of energy allocated for encoding is;

$$\varepsilon_\phi(t-t_{0-}) \qquad \text{Equation 3-54}$$

The initial velocity and acceleration are zero and the position is arbitrarily assigned at the center of the configuration space. $\sigma_{k\_tot}^2$ is a variance which accounts for the energy to be distributed into all the degrees of freedom forming the signal. The total energy of the particle is:

$$\varepsilon_{tot}=\varepsilon_\phi(t)+\varepsilon_{k_{tot}}(t)+\varepsilon_{dis}(t)$$

$$\varepsilon_k(t-t_{0-})=0$$

$$\varepsilon_{dis}(t-t_{0-})=0 \qquad \text{Equation 3-55}$$

$\varepsilon_{tot}$ remains constant and $\varepsilon_{dis}(t)$ accounts for system losses. $\varepsilon_{k\_tot}(t)$, the evolving kinetic energy of the particle, will be focused on and dissipation will be ignored.

Signal evolution begins through dynamic distribution of $\varepsilon_{tot}$ which depletes $\varepsilon_\phi$ on a per sample basis when the motion is not conservative. Particle motion is considered to be physically analytic everywhere possessing at least two well behaved derivatives, $\dot{q},\ddot{q}$. Such motions may consist of suitably defined impulsive forces smoothed by the particle-apparatus impulse response.

Allocation of the energy proceeds according to a redistribution into multiple dimensions;

$$\langle\varepsilon_{k_{tot}}\rangle = \sigma_{k_{tot}}^2 = \sum_\alpha \overline{\sigma}_\alpha^2 \qquad \text{Equation 3-56}$$

All α=1, . . . D dimensional degrees of freedom for motion possess the same variance when observed over very long time intervals and thus the over bards retained to acknowledge a mean variance. In this case $\sigma_{k\_tot}^2$ is finite for the process and is allocated over a duration T for the signal.

The total available energy may be parsed to 2N samples of a message signal with normalized particle mass (m=1).

$$\sigma_{k_{tot}}^2 = \frac{1}{2}E\{v^2\}_{\Sigma\alpha,n} = \frac{1}{2}\sum_\alpha\sum_{n=-N}^{N} v_{\alpha,n}^2\delta(t-nT_s),\ N=\frac{T}{2T_s} \qquad \text{Equation 3-57}$$

The time window T/2 is an integral multiple of the sample time $T_s$. $NT_s\cdot\pm T/2$ may approach ±∞. The equation illustrates how the kinetic energy $\varepsilon_k$ is reassigned to specific instants in time via the delta function representation. The average energy per sample is simply;

$$\frac{1}{2}\left\langle\frac{1}{2N}\sum_n v^2(t-nT_s)\right\rangle = \frac{1}{2}\frac{E\{v^2\}_{\Sigma\alpha,n}}{2N} \qquad \text{Equation 3-58}$$

And the average power per sample is given as;

$$\langle P_{samp}\rangle = \frac{1}{2T}\sum_\alpha\sum_{n=-N}^{N} v_{\alpha,n}^2\delta(t-nT_s) \qquad \text{Equation 3-59}$$

The delta function weighting has a corresponding sifting notation;

$$v_{\alpha,n}(t-nT_s)=\int_{-\infty}^{+\infty}v_{\alpha,n}(t)\delta(t-nT_s)dt=v_\alpha(nT_s) \qquad \text{Equation 3-60}$$

A sampled velocity signal is also represented by a series of convolutions;

$$\tilde{v}_\alpha(t) = v_\alpha(t-nT_s)*h_t = \sum_{n=-N}^{N} v_\alpha(t)\delta(t-nT_s)*h_t \qquad \text{Equation 3-61}$$

Let $\tilde{v}_\alpha(t)=v_\alpha(t)\delta(t-nT_s)*h_t$ be a discretely encoded and interpolated approximation of a desired velocity for a dynamic particle. Obtaining an interpolation function for reconstitution of $v_\alpha(t)$ from the discrete representation is useful. It is logical to suppose that the interpolation trajectories will spawn from linear time invariant (LTI) operators given that the process is physically analytic. An error metric can be minimized to optimize the interpolation:

$$\frac{1}{2}\langle v_\varepsilon^2\rangle = \sigma_\varepsilon^2 = \frac{1}{4N}\left[\sum_n v_\alpha(t)(t) - v_\alpha(t)(t)\delta(t-nT_s)*h_t)\right]^2 \quad \text{Equation 3-62}$$

Minimizing the error variance $\sigma_\varepsilon^2$;

$$v_\alpha(t)-v_\alpha(t)\delta(t-nT_s)*h_t=0 \quad \text{Equation 3-63}$$

$h_t$ may be regarded as a filter impulse response where the associated integral of the time domain convolution operator is inherent in the laws of motion.

A schematic is a convenient way to capture the concept at a high level of abstraction.

Figure 21:
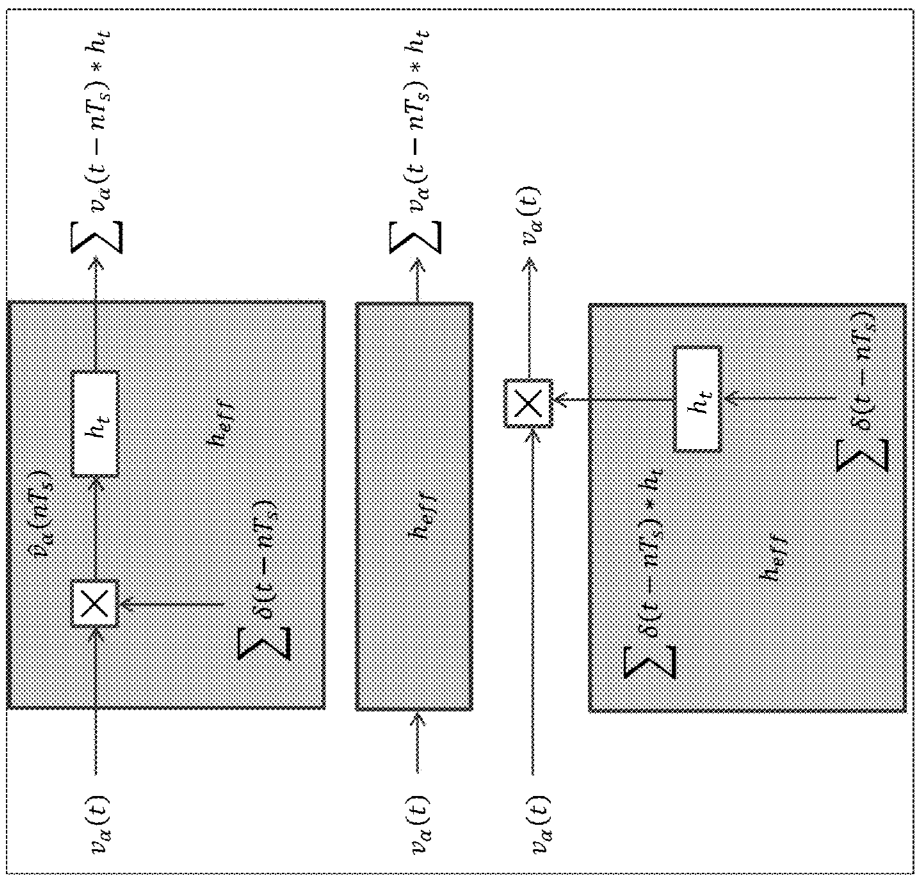
FIG. 21 is an illustration of a schematic of an $\alpha^{th}$ dimension sampled velocity and its interpolation, in accordance with one or more embodiments.

FIG. 21 illustrates a schematic 2100 of the $\alpha^{th}$ dimension sampled velocity and its interpolation, in accordance with one or more embodiments. Extension to D dimensions is straightforward.

An effective LTI impulse response $h_{eff}=1$ provides the solution which minimizes $\sigma_\varepsilon^2$. $h_t$ can be obtained from recognition that;

$$\sum_n h_t * \delta(t-nT_s) = h_{eff} = 1 \quad \text{Equation 3-64}$$

$$\therefore h_t * \delta(t-nT_s) = 1,\ @t = nT_s \quad \text{Equation 3-65}$$

Convolution is the flip side of the correlation coin under certain circumstances involving functions which possess symmetry. $h_t*\delta(t-nT_s)$ can be viewed as a particular cross correlation operation when $h_t$ is symmetric.

Correlation functions for the velocity and interpolated reconstructions are constrained by the TE relation. The circumstances for decoupling of velocity samples at the deferred instants $t-nT_s$ are discussed in Section 10.5 (Appendix E). The cross correlation of a reference velocity function with an ideal reconstruction at zero time shift results $$\text{R}_{\tau,nT_s}(0) = \langle\varepsilon_k\rangle = \sum n\frac{T_sP_m}{k_pPAPR} \quad \text{Equation 3-66}$$

Therefore;

$$\frac{1}{2}\left\langle\sum_{n=-N}^{N}(v_\alpha(t-nT_s)*h_t)^2\right\rangle = \frac{2NT_sP_m}{PAPRk_p} \quad \text{Equation 3-67}$$

where:

$$T_s = k_p\langle\varepsilon_k\rangle_s\frac{PAER}{P_m} \quad \text{Equation 3-68}$$

As Section 10.5 (Appendix E) also shows, the values of a correlation function are zero at offsets:

$$\tau = \mp nk_p\langle\varepsilon_k\rangle_s\frac{PAER}{P_m} \quad \text{Equation 3-69}$$

Equations 3-66 through 3-69 are helpful to identify the cardinal series because the correlation function parameters as given are not unique. However, equations 3-66 through 3-69 along with knowledge that the signal is based on a bandwidth limited AWGN process fit the cardinal series profile.

The effective Fourier transform for a sequence of decoupled unit sampled impulse responses may be represented as follows:

$$\Im\left\{\sum_n h_t(t-nT_s)\right\} = \frac{P_m}{k_p\langle\varepsilon_k\rangle_sPAER}\sum_n H_t(f-nf_s)e^{-j2\pi fn\frac{k_p\langle\varepsilon_k\rangle_sPAER}{P_m}} = \delta(f) = H_{eff} \quad \text{Equation 3-70}$$

The Fourier transform above is thus a series representation for the transform of the constant, unity. The response for $H_t(f)$ is symmetric for positive and negative frequencies. There are 2N such spectrums $H_t(f-nf_s)$ due to the recursive phase shifts induced by a multiplicity of delayed samples. The time dependency of the frequency kernel has been supplanted by the preferred TE metric.

Consider the operation;

$$v_\alpha(t)h_{eff}=\tilde{v}_\alpha(t)$$

Then the frequency domain representation is:

$$V(f)*H_{eff}=\tilde{V}(f) \quad \text{Equation 3-71}$$

The series expansion for $H_{eff}$ is now tailored to the target signal v(t). The spectrum of interest is simply:

$$V(f)H_{eff}(f) = V(f)*\frac{P_m}{k_p\langle\varepsilon_k\rangle_sPAER}\sum_n H_t(f-nf_s)e^{-j2\pi fn\frac{k_p\langle\varepsilon_k\rangle_sPAER}{P_m}} = V(f) \quad \text{Equation 3-72}$$

In this representation V(f) need not be constant over frequency contrary to Shannon's assumption.

It is evident from investigation of the magnitude response of $H_t(f-nf_s)*V(f)$ that $H_t(f)$ may not alter the magnitude response of the velocity spectrum V(f) over the relevant spectral domain, else encoded information is lost and energy not conserved. $H_t(f)$ should possess this quality over the spectral range of V(f), but not necessarily beyond it.

The magnitude of the complex exponential function is one. Also, the phase response is linear and repetitive over harmonic spectrums according to the frequency of the complex exponential. This is apparent when examining the spectral components of the original sampled signal.

$$\Im\{v(nT_s)\} = f_s\sum_n V(f-nfs) \quad \text{Equation 3-73}$$

From examination of LTI systems and the associated impulse response characteristics, $V(f-nf_s)$ possesses even magnitude symmetry and odd phase symmetry and this fundamental spectrum repeats every $f_s$ Hz. Thus $V_0(f)$ implements reconstruction strategy because a spectral instantiation contains encoded information (i.e. $V_0(f)=V_1(f)=V_2(f)= \ldots V_n(f)$). Reconstruction of an arbitrary combination of $V_n(f)$, beyond $V_0(f)$ spectrums, utilizes deployment of increased energy per unit time, violating the $P_m$ constraint of the TE relation. In other words, preservation of an unbounded number of identical spectrums also represents an unsupported and inefficient expansion of phase space (requiring ever increasing power).

From the TE relation, the unambiguous spectral content is limited by $\dot{\varepsilon}_k$ such that;

$$\frac{1}{2T_s} \geq \frac{P_m}{2k_p\langle\varepsilon_k\rangle_s(PAER)} = B \quad \text{Equation 3-74}$$

Thus, optimal filter impulse response can be obtained from;

$$h_t = \frac{P_m}{k_p\langle\varepsilon_k\rangle_s(PAER)}\mathfrak{I}^{-1}\left\{\sum_{n=0} H_t(f - nf_s)e^{-j2\pi fn\frac{k_p\langle\varepsilon_k\rangle_s PAER}{P_m}}\right\} = h_{eff}\,|_{n=0} \quad \text{Equation 3-75}$$

where the frequency domain of $H_t(f)$ corresponds to the frequency domain of $V_0(f)$ (the $0^{th}$ image in the infinite series), resulting in:

$$h_t = \frac{P_m}{k_p\langle\varepsilon_k\rangle_s(PAER)}\int_{-LL}^{UL}\sum_{0} e^{j2\pi ft}e^{-j2\pi fn\frac{k_p\langle\varepsilon_k\rangle_s(PAER)}{P_m}}\,df \quad \text{Equation 3-76}$$

$$LL = -\frac{P_m}{2k_p\langle\varepsilon_k\rangle_s(PAER)},\ UL = \frac{P_m}{2k_p\langle\varepsilon_k\rangle_s(PAER)} \quad \text{Equation 3-77}$$

LL and UL are limits imposed by the allocation of available energy per unit time, i.e. the TE relation. Therefore:

$$h_t = \left(\frac{k_p\langle\varepsilon_k\rangle_s(PAER)}{P_m}\right)\frac{\sin[f_s\pi t]}{\pi t} \quad \text{Equation 3-78}$$

$h_t$ is recognized as the unity weighted cardinal series kernel at n=0. This is the LTI operator which is recursively applied at the rate $f_s$ to obtain an optimal reconstruction of the velocity function $v_\alpha(t)$ from the discrete samples $v_\alpha(nT_s)$. That is;

$$v_\alpha(t) = \sum_n v_\alpha\delta(t - nT_s) * h_t = \sum_n v_\alpha(nT_s)\frac{T_s}{\pi}\frac{\sin[f_s\pi(t - nT_s)]}{(t - nT_s)} \quad \text{Equation 3-79}$$

The cardinal series is thus obtained;

In D dimensions the velocity is given by:

$$v(t) = \sum_\alpha^D v_\alpha(t) \quad \text{Equation 3-80}$$

Figure 22:
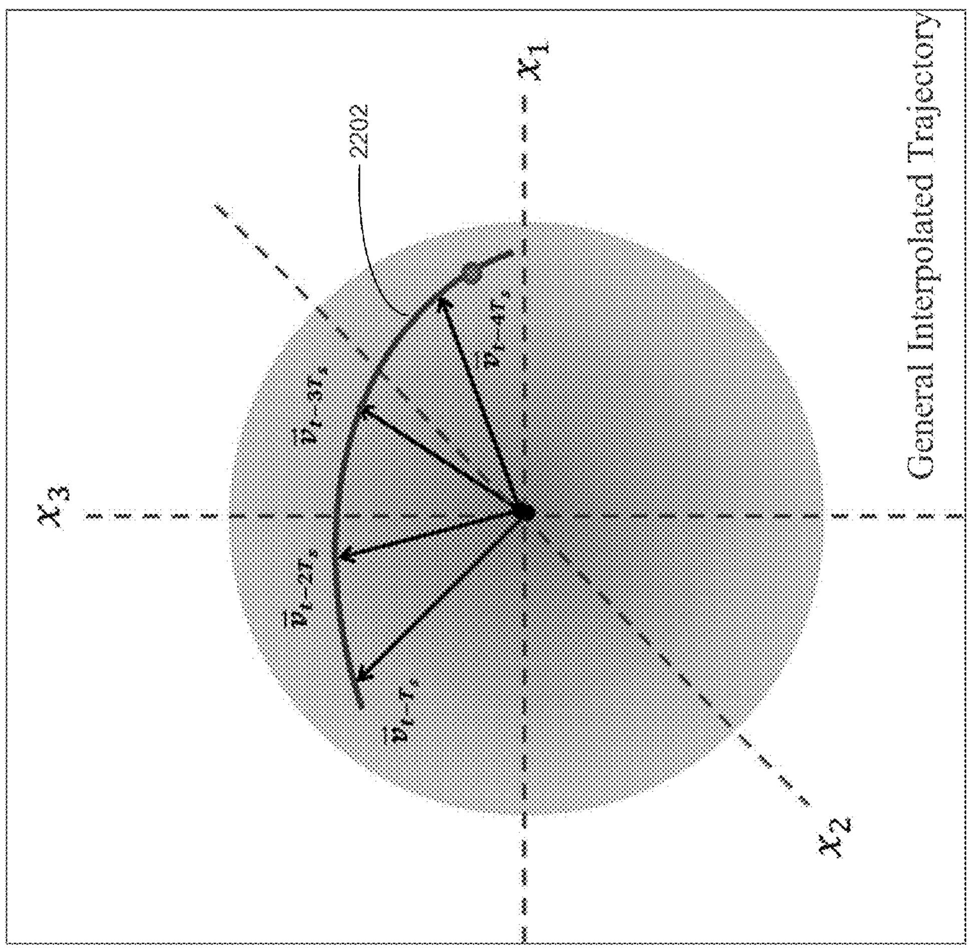
FIG. 22 is an illustration of a plot including a general interpolated trajectory, in accordance with one or more embodiments.

FIG. 22 illustrates a plot 2200 including a general interpolated trajectory 2202 for D=3 and several adjacent time samples, depicted by vectors coincident with impulsive forces within the phase space, in accordance with one or more embodiments. The trajectory is smooth with no derivative sign changes between samples and correspond to the cumulative character of $\delta(t-nT_s)*h_t$ dispersing the forces through time and space.

The derivation above is different from Shannon's approach in the following significant way. In contrast with Shannon's approach, general excitations of the system are contemplated herein with arbitrary response spectrums automatically accommodated even when the maximum uncertainty requirement for $\vec{q},\vec{p}$ is waived. Therefore, the result here is that the cardinal series is substantiated for all physically analytic motions, not just those which exhibit maximum uncertainty statistics.

By examining multiple derivatives that a cardinal pulse is physically analytic and therefore is a candidate pulse response up to and including phase space boundary conditions.

3.1.8.1. Cardinal Autocorrelation

The autocorrelation of a stationary $v_\alpha(t)$ process can be obtained from the Wiener-Kinchine theorem as the averaged time correlation for velocity;

$$\mathfrak{I}\{\mathfrak{R}_{v\alpha,v\alpha}\} = \mathfrak{I}\left\{\lim_{NT_s\to\infty}\frac{1}{2NT_s}\int_{-NT_s}^{NT_s} v_\alpha(t)v_\alpha(t+\tau)\,d\tau\right\} = [V(f)]^2 \quad \text{Equation 3-81}$$

When $v_\alpha$ has a maximum uncertainty ($\mathfrak{R}_{v}$, =0) associated with the time domain response at regular intervals, $NT_s$, the frequency domain representation of the process is also of maximum entropy form. The greatest possible uncertainty in its spectral expression will be due to uniform distribution. This can be verified through the calculus of variations. The result provides a basis for the discussions of Section 3.1.8 and the autocorrelation in general.

Taking the inverse transform for $[V(f)]^2$ reveals the autocorrelation for the finite power process which has maximum uncertainty in the frequency domain:

$$\mathfrak{R}(\tau)_{v\alpha,v\alpha} = \frac{P_m V^2}{k_p\langle\varepsilon_k\rangle_s(PAER)}\frac{\sin\left[\pi\frac{P_m}{k_p\langle\varepsilon_k\rangle_s(PAER)}\tau\right]}{\pi\frac{P_m}{k_p\langle\varepsilon_k\rangle_s(PAER)}\tau} \quad \text{Equation 3-82}$$

$$\mathfrak{R}(0)_{v\alpha,v\alpha} = \langle v^2\rangle = \int_{LL}^{UL} V^2\,df = \frac{P_m V^2}{k_p\langle\varepsilon_k\rangle_s(PAER)} \quad \text{Equation 3-83}$$

$$LL = -\frac{P_m}{2k_p\langle\varepsilon_k\rangle_s(PAER)},\ UL = \frac{P_m}{2k_p\langle\varepsilon_k\rangle_s(PAER)} \quad \text{Equation 3-84}$$

$V^2$ is in watts per Hz. Likewise, $v^2$ is in watts. $\mathfrak{R}(\tau)_{v_\alpha,v_\alpha}$ is the result for a bandwidth limited Gaussian process with a TE relation substitution.

Integration of any member of the cardinal series squared over the time interval ±00 will result in $v_\alpha^2(NT_s)$, a finite energy per sample.

Unique information is obtained by independent observation of random velocity samples at intervals separated by these correlation nulls located at modulo $\pm NT_s$ time offsets. The cardinal series distributes sampled momentum interference for the duration of a trajectory throughout phase space. Hence, each member of the cardinal series will constructively or destructively interfere with all other members except at intervals deduced from the correlation nulls. Eventually, at ±∞ time offset from a reference sample time, memory of sampled motion dissipates leaving no mutual information between such extremely separated observation points. This is due to the decaying momentum for each member of the cardinal series. Each member function of the cardinal series is instantiated through the allocation of some finite sample energy.

Figure 23:
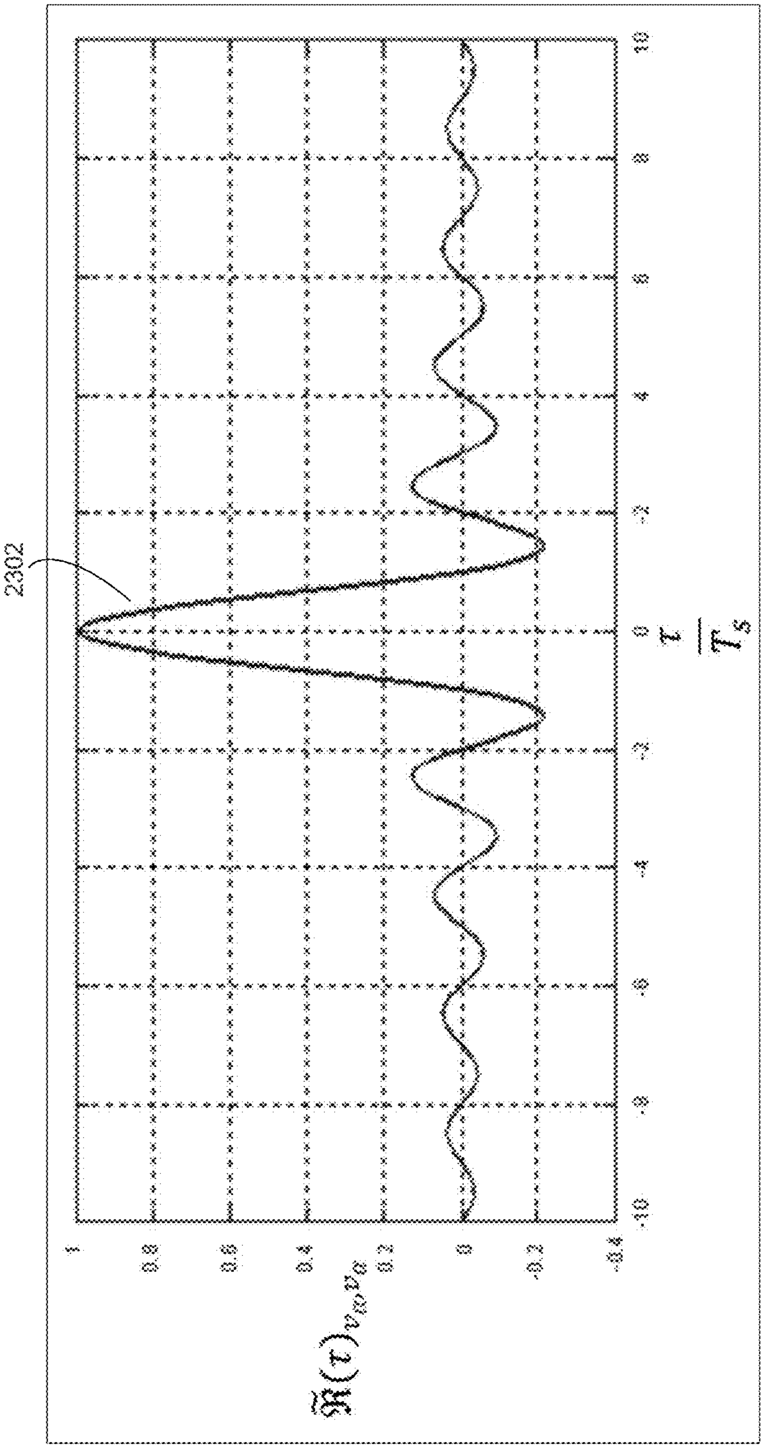
FIG. 23 is an illustration of a plot of the autocorrelation for a Gaussian distributed velocity, in accordance with one or more embodiments.

FIG. 23 illustrates a plot 2300 of the autocorrelation 2302 for a Gaussian distributed velocity for power limited Gaussian momentum (m=1), in accordance with one or more embodiments. Members of the cardinal series also possess this characteristic sinc response, so that the unit cardinal series can be regarded as an infinite sum of shifted correlation functions $\Sigma_N h_t * \delta(t-NT_s)$.

3.1.8.2. Maximum Nonlinear Velocity Pulse Versus Maximum Cardinal Pulse

Two pulses can be considered for boundary conditions. The maximum velocity pulse is not physically analytic but does define an extreme for the calculation of energy requirements per unit time to traverse the phase space. A cardinal pulse can also be used for the extreme if the boundary must be physically analytic as well, though $P_m$ has a different limiting value for the cardinal pulse option. This section discusses the tradeoff between the two pulse types in terms of trajectory, $P_m$, B, etc.

Figure 24:
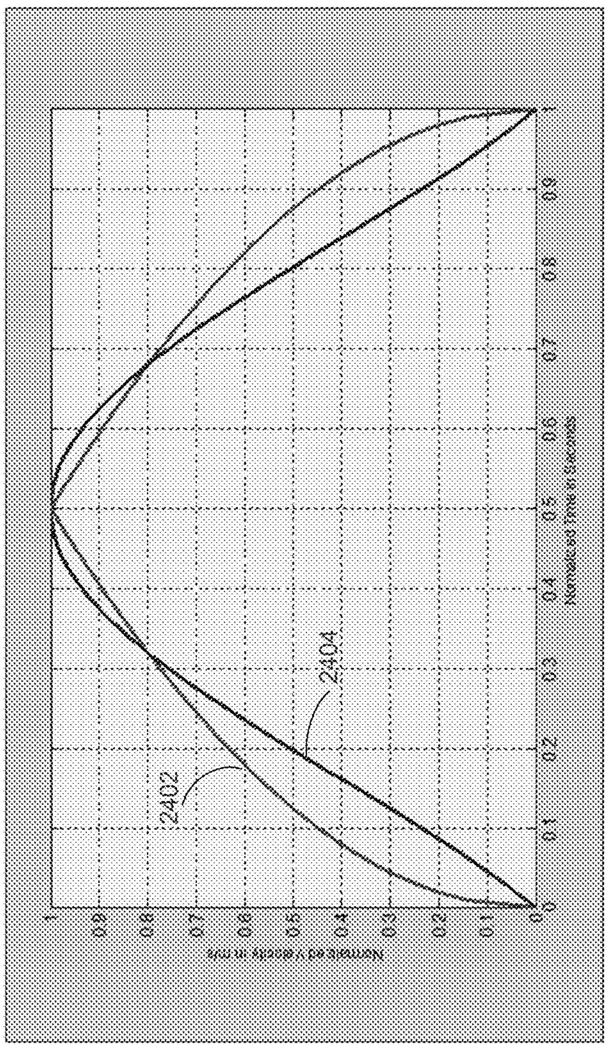
FIG. 24 is an illustration of a plot of a maximum velocity pulse compared to a main lobe cardinal velocity pulse, in accordance with one or more embodiments.

Comparison of both velocity types is provided in the FIG. 24 where the peak value is conserved. FIG. 24 illustrates a plot 2400 of a maximum velocity pulse 2402 compared to a main lobe cardinal velocity pulse 2404, in accordance with one or more embodiments. In this case, $k_p$=1.28 for the TE relation as can be verified through the equations of Sections 10.6 and 10.7.

Figure 25:
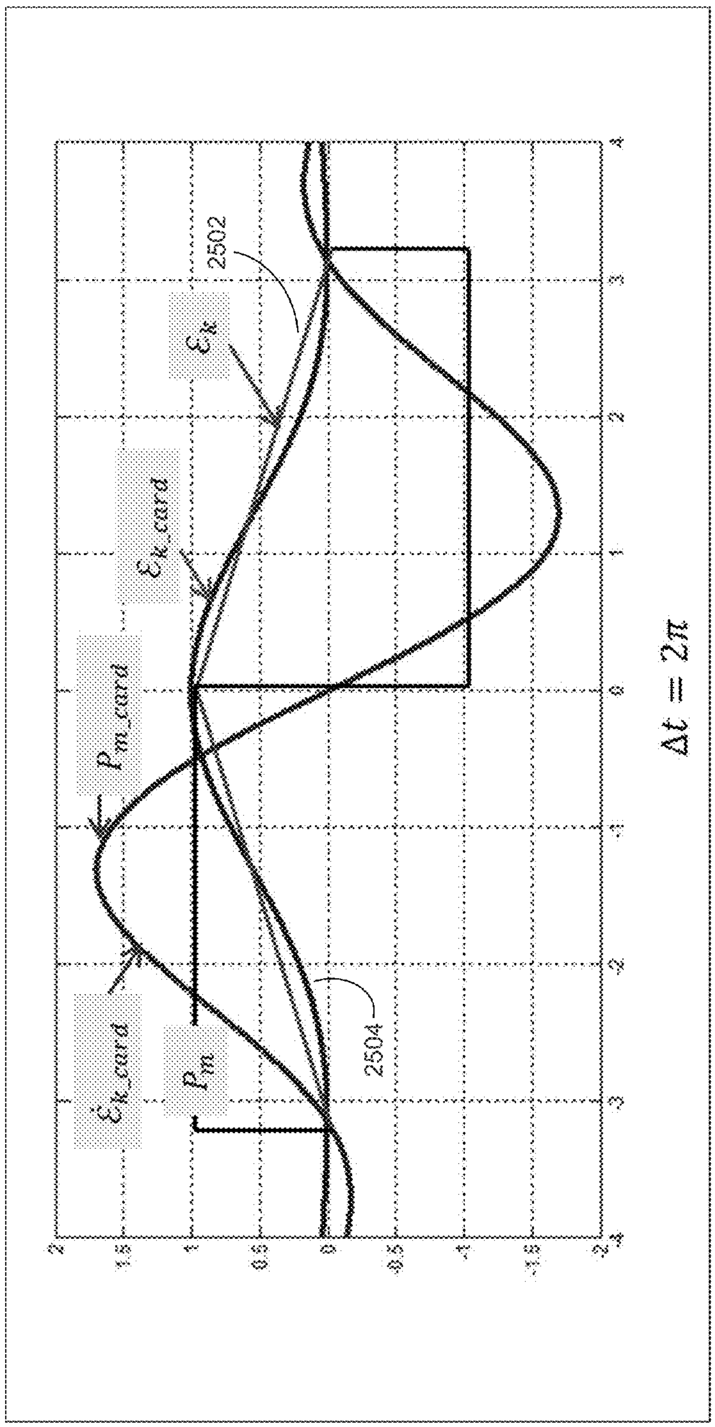
FIG. 25 is an illustration of a plot of the comparison of kinetic energy versus time and the derivatives of pulses, in accordance with one or more embodiments.

FIG. 25 illustrates a plot 2500 of the comparison of kinetic energy versus time and the derivatives for both velocity and cardinal pulse types with identical amplitudes, in accordance with one or more embodiments. FIG. 25 provides an alternate reference for comparing the two pulse types.

This analysis suggests that linear operating ranges can be established within the domain of the nonlinear maximum velocity pulse 2502 or classical cardinal pulse 2504 provided appropriate design margins are regarded.

Figure 26:
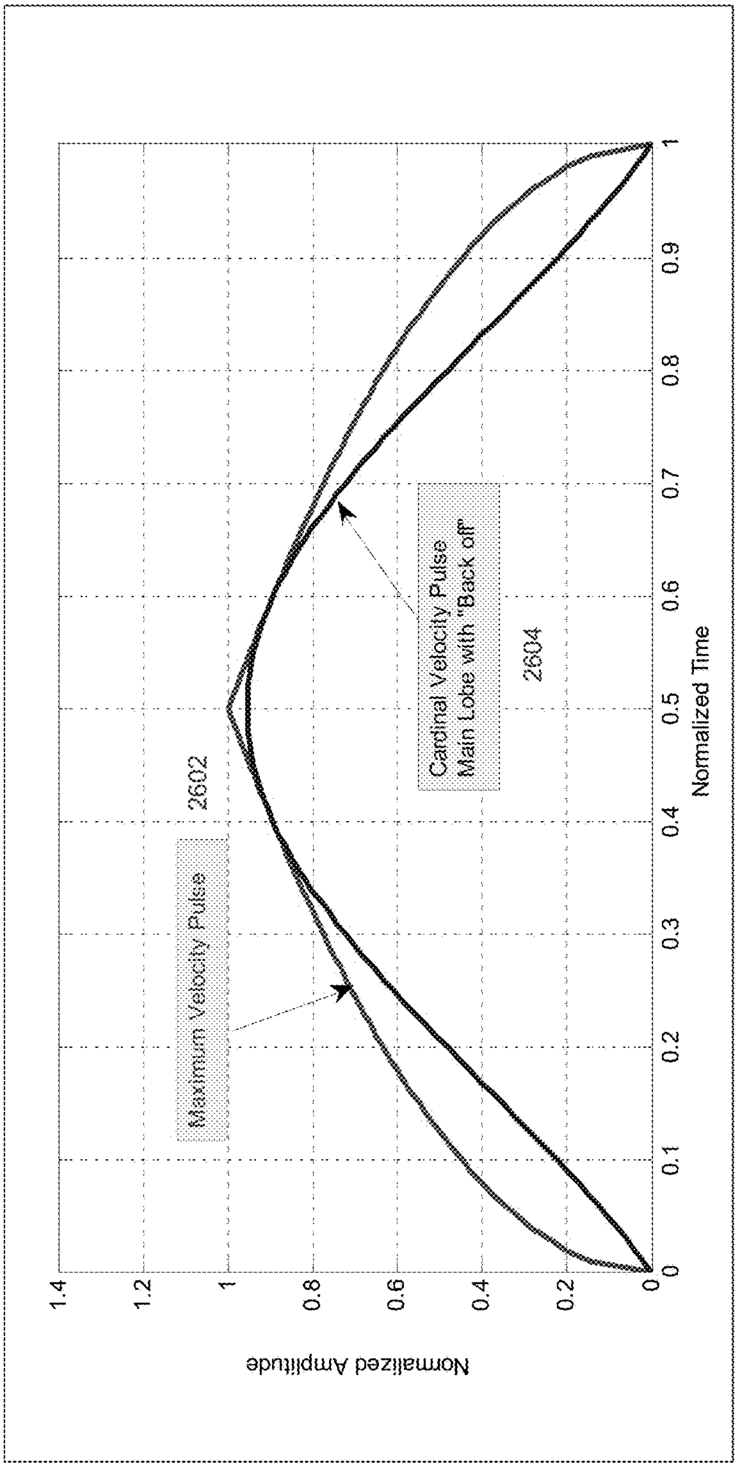
FIG. 26 is an illustration of a plot of the comparison of kinetic energy versus time of pulses, in accordance with one or more embodiments.

The maximum velocity pulse in the above figure could be exceeded by the generalized cardinal pulse near the time t=0.5±~0.07. A design "back off" can be implemented to eliminate this boundary conflict. FIG. 26 illustrates this concept with a 0.4 dB back off for the power associated with the peak pulse amplitude. FIG. 26 illustrates a plot 2600 of the comparison of kinetic energy versus time for both velocity and cardinal pulse types, in accordance with one or more embodiments. FIG. 26 includes maximum velocity pulse 2602 or classical cardinal pulse 2604.

Consider sustaining identical span of the phase space for both maximum pulse types, given fixed $\Delta t=2T_s$. Solving the position integrals for both pulse types and equating the span covered per characteristic interval results in the following equation (refer to Section 10.6 for additional detail):

$$\int_0^{T_s} v_p\,dt = \int_0^{T_s} v_{m_{card}} \frac{\sin\left(t\frac{\pi}{T_s}\right)}{t\frac{\pi}{T_s}}\,dth \qquad \text{Equation 3-85}$$

-continued $$v_{m_{card}} = \frac{2\pi}{3}\sqrt{\frac{2P_m T_s}{m}}\left(\frac{1}{\pi}\sum_{n=1}^{\infty}\frac{(2n+1)(2n+1)!}{(-1)^n (T_s)^{2n+1}}\right) \approx 1.6\sqrt{P_m}\,,$$

for $T_s = 1$, $m = 1$ $v_{m\_card}$ is the cardinal pulse amplitude to maintain a specific configuration space span. The relative velocity increase and peak kinetic energy increase, compared to the nonlinear maximum velocity pulse case, are:

$$\frac{v_{m_{card}}}{v_m} \cong 1.13$$

$$\frac{\varepsilon_{m_{card}}}{\varepsilon_m} \cong 1.28$$

This represents an increase in peak kinetic energy of roughly 1.07 dB. The relative increase for the maximum instantaneous power requirement is larger.

$$\frac{P_{m_{card}}}{P_m} \cong 2.158$$

Hence, there is a relative parameter to enhance the peak power source specification by 3.34 dB to maintain a physically analytic boundary condition utilizing the maximum cardinal velocity pulse profile. Another way to consider the result is that one may design an apparatus choosing $P_m$ using the nonlinear maximum velocity pulse equations and then expect perfectly linear trajectories up to ~0.68 $v_m$ where $v_m$, is the maximum velocity of the nonlinear maximum velocity pulse. Beyond that point velocity, excursions of the cardinal pulse begin to encounter nonlinearities due to the apparatus power limitations. Alternatively, one may use the appropriate scaling value for $k_p$ in the TE relation to guarantee linearity over the entire dynamic range.

Figure 27:
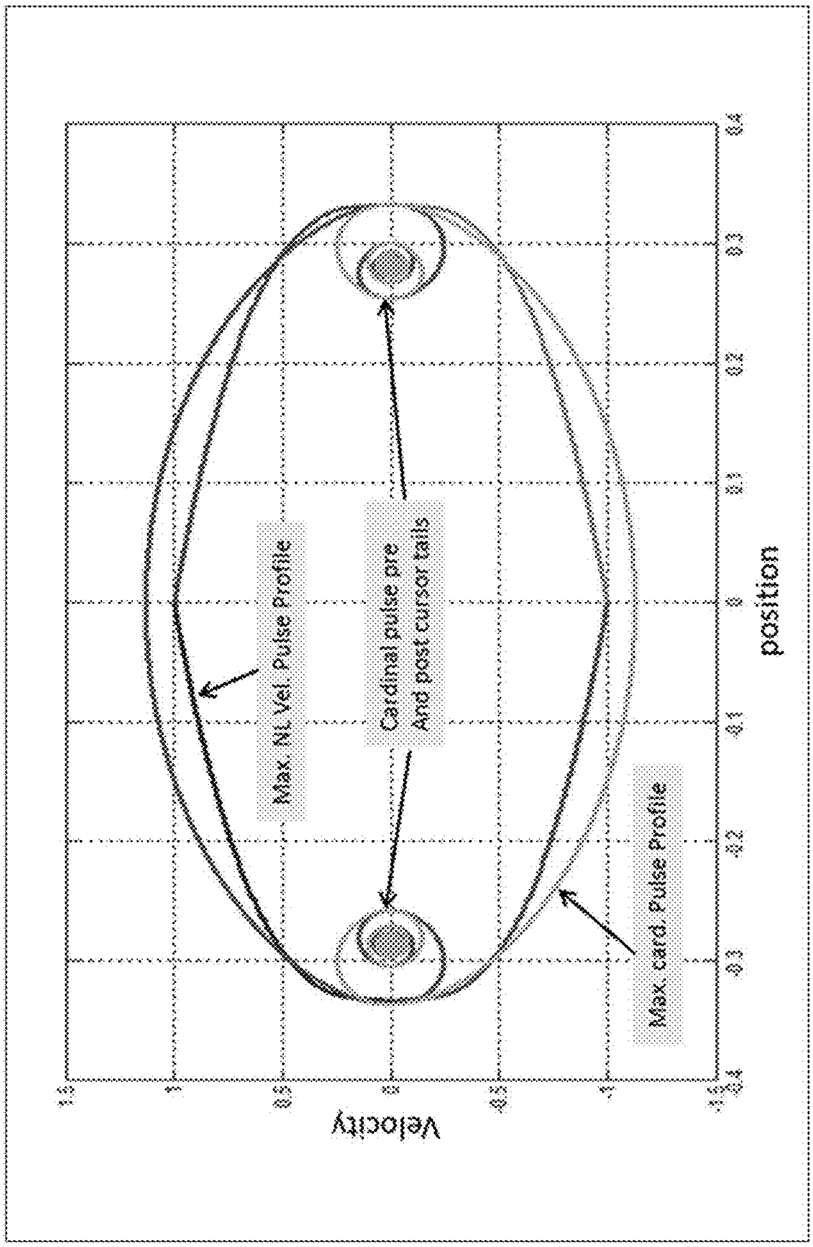
FIG. 27 is an illustration of a plot of velocity versus position where two velocities are compared, in accordance with one or more embodiments.

FIG. 27 illustrates a plot 2700 of velocity versus position for the circumstance where the two velocities are compared and span the same configuration space in the time Δt, in accordance with one or more embodiments. Positive and negative trajectories are illustrated for both maximum nonlinear velocity and maximum cardinal velocity pulse types. The precursor and post cursor tails for the maximum cardinal velocity pulse illustrate trajectories outside of the time window $-T_s \le t \le T_s$. Though the time span for a maximum cardinal pulse is without bound, the position converges to ±0.8459R, within the phase space. The first cardinal pulse nulls occur at the phase space boundaries (±$R_s$), and the derivatives of these reflection points are smooth unlike the maximum nonlinear velocity pulse derivatives.

In an alternate case, the value for $P_m$=1 and is fixed for both pulse types. In this case there are two separate time intervals permitted to span the same physical space. Let the time interval $T_{ref}$=1 apply to the sampling interval for the nonlinear maximum velocity pulse and $T_s$ apply to the sampling interval for the cardinal maximum velocity pulse. $T_s$ may be calculated from (refer to Section 10.6 for additional detail):

$$T_s \cong 1.179\,T_{ref} \qquad \text{Equation 3-86}$$

The bandwidth is then approximately 0.848 of the nonlinear maximum velocity case with $T_{ref}=1$. Another way to consider the result is that for a given $P_m$ in both cases, a physically analytic bandwidth 0.848 $(T_{ref})^{-1}$ is always guaranteed. As a dynamic particle challenges the boundary through greater peak power excursions, violations of the boundary occur and some information will begin to be lost in concert with undesirable spectral regrowth. In the scenario, where $P_m=P_{max\_card}$, instantaneous peak power and configuration span are conserved for both pulse types and $k_p=1.179$ for the TE relation.

Figure 28:
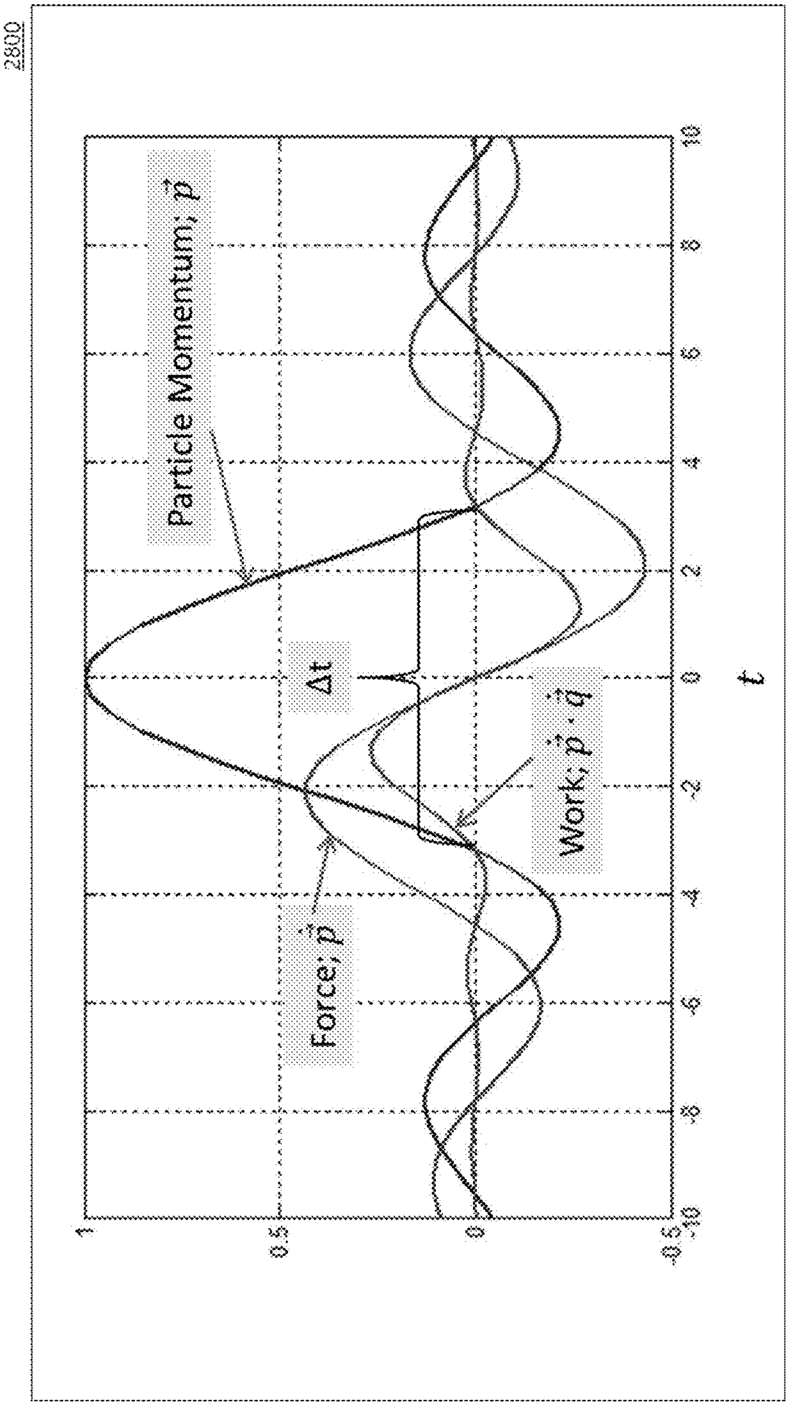
FIG. 28 is an illustration of a plot of a time variant force associated with a sinc momentum impulse response, in accordance with one or more embodiments.

The derivative illustrated in plot 2800 of FIG. 28 depicts a time variant force associated with a sinc momentum impulse response, in accordance with one or more embodiments. Although $\dot{p}$ appears as one continuous function, it identifies companion acceleration and deceleration cycles which restrict particle motion to the characteristic phase space radius. The continuous momentum function can be obtained from impulse forces redistributed via $h_r$. There are also two derivative sign changes in the force over the interval $\pm\Delta t/2=\pm\pi$. Moreover, the forces are finite. This verifies consistency with the physical sampling theorem and a desire to maintain physically analytic motion. In addition, the instantaneous work function is illustrated for the particle. The work function is also finite everywhere. The momentum response resembles the impulse response of an infinite Q filter without dissipative loss.

The tails of the sinc and its derivative extend in both directions of time to infinity. The sinc pulse will be a focus. Therefore, all extended physically analytic trajectories can be considered as a superposition of suitably weighted sinc like pulses.

Neither the nonlinear maximum velocity pulse nor the maximum cardinal pulse are required at the phase space boundary. They represent two logical extremes with constraints such as energy expenditure per unit time for the most expedient trajectory to span a space or this property in concert with physically analytic motion. There can be many logical constructions between these extremes which append other practical design considerations.

3.1.9. Statistical Description of the Process

This section establishes a framework for describing the characteristics of the model in terms of a stochastic processes. The more detailed discussion leverages certain conditional stationary properties of the model.

There are physical attributes attached to the random variables of interest with a corresponding timeline due to laws of motion. Each configuration coordinate has assigned to it a corresponding probability density for momentum of a particle, $\rho(\vec{p}|q)$ which is D dimensional Gaussian.

The following discussions assume that the continuous process can be approximated by a sampled process.

Even though the random variables associated with the process are Gaussian, the variance of momentum is dependent on the coordinate in space which in turn is a function of time. This is true whenever the samples of analysis are organized with an ordered time sequence, which is a desirable feature. On the other hand, statistical characterization may not require such organization. However, any statistical formulation which does not preserve time sequences resists spectral analysis.

It is possible to obtain the inverse Fourier transform for the general velocity pulse spectrum if the underlying process is stationary in the strict or wide sense. Such an analysis can prove valuable since working in both the time and frequency domain affords the greatest flexibility for understanding and specifying communications processes. However, sometimes the underlying process can evade fundamental assumptions which facilitate a routine Fourier analysis of the autocorrelation. Such is the case here.

A description is now provided of the stochastic process with an ensemble of functions possessing random values at regular time intervals separated by $T_s$.

As used herein, a random process refers to an uncountable infinite, time ordered continuum of statistically independent random variables. This tweak will be adopted for this definition to accommodate physically analytic processes which can adapt to classical or quantum scenarios;

As used herein, a random physical process refers to a time ordered set of statistically independent random variables which are maximally dense over their spatial domains.

In the following text, a time sampled or momentum ensemble view is discussed, as well as a reorganization of the time samples into configuration bins (configuration ensemble). The configuration bins are defined to collect samples which are maximum uncertainty Gaussian distributed for momentum, at respective positions q. Evolving time samples populate these configuration bins at random time intervals, modulo $T_s$.

A statistical treatment of the motions for particles within the phase space can be given when the ensemble members which are functions of time are sampled from the process. This is the procedure referred to here as a momentum ensemble. Consider the set of k sample functions extracted from the random process Ж(q,p) organized as the following momentum ensemble:

$$Ж(q,p)=\{[q(t),p(t)]_1,[q(t),p(t)]_2,[q(t),p(t)]_3, \ldots [q(t),p(t)]\}$$ Equation 3-87

If each sample function is evaluated (discretely sampled) at a certain time, $t_l$, then the collection of instantaneous values from the k sample functions also become random variables. This means that a large number of hypothetical experiments or observations could be performed independently and in parallel, given multiple indistinguishable instantiations of the phase space.

Figure 29:
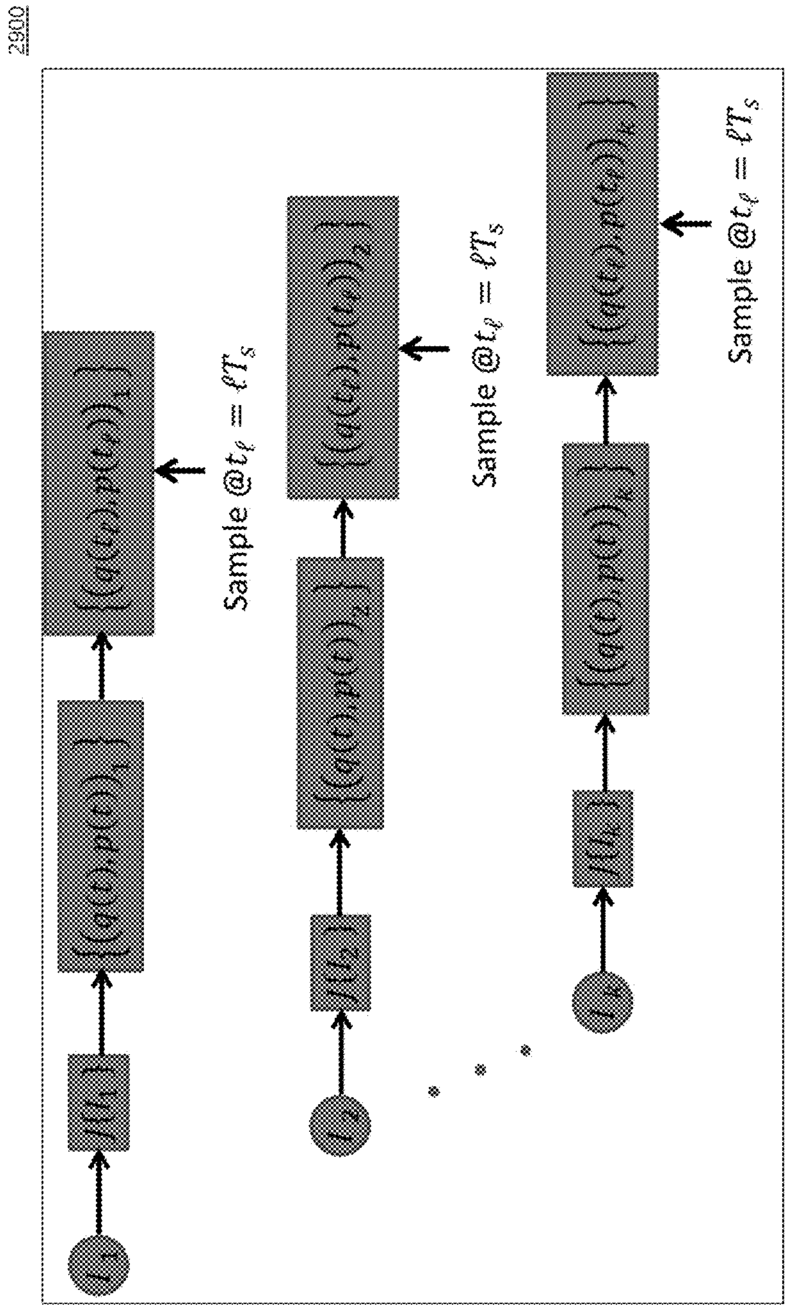
FIG. 29 is an illustration of parallel observations characterizing a momentum ensemble, in accordance with one or more embodiments.

FIG. 29 illustrates the parallel observations characterizing a momentum ensemble 2900 with k experiments, where each experiment may be mapped from the $I_k$ information sources through some linear operator J and sampled in time to obtain a record of each sample function, in accordance with one or more embodiments. If the time samples occurring at $t_l=t-lT_s$ are independent for sequential incremental integer values of l, then position and momenta appear as samples from a Gaussian RV. If the process is viewed with time ordering then the collection of sampled random variables is non-stationary because the momenta second moments change versus each unique position to accommodate boundary conditions. Even though variance of a trajectory's samples changes for each position, the total variance of a collective is bound by the cumulative sum of the independent sample variances, which is a stationary quantity.

Figure 30:
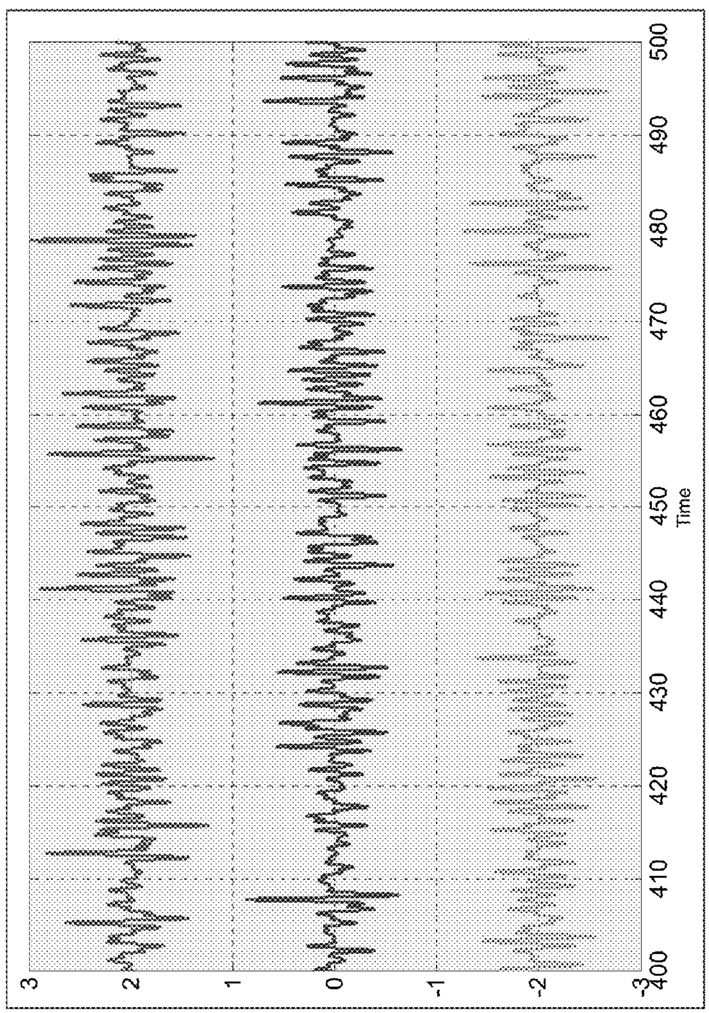
FIG. 30 is an illustration of a plot of three continuous sample functions from the momentum ensemble, in accordance with one or more embodiments.
Figure 31:
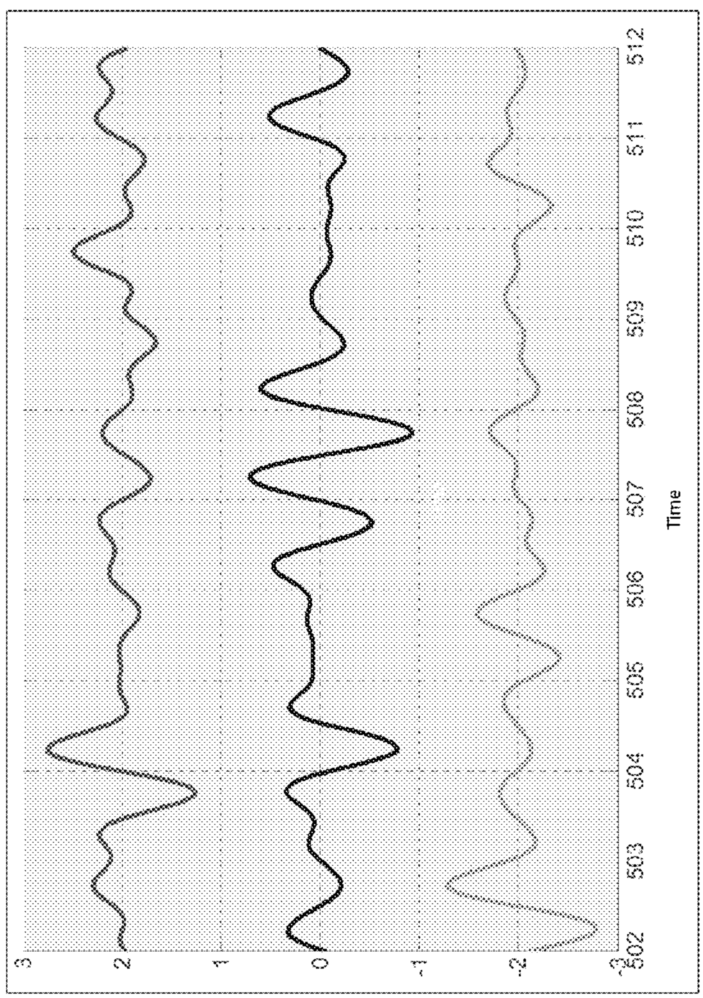
FIG. 31 is an illustration of a plot of three continuous sample functions from the momentum ensemble, in accordance with one or more embodiments.

FIGS. 30 and 31 illustrate plots 3000 and 3100 of three continuous sample functions from the momentum ensemble where the underlying process is of the type discussed here, in accordance with one or more embodiments. Two of the members have been provided with an artificially induced offset in the average for utility of inspection (all three sample functions are actually zero mean). FIG. 31 provides a closer inspection of the three continuous sample functions and illustrates the velocity with a bandwidth limit B of approximately 1 Hz.

Figure 32:
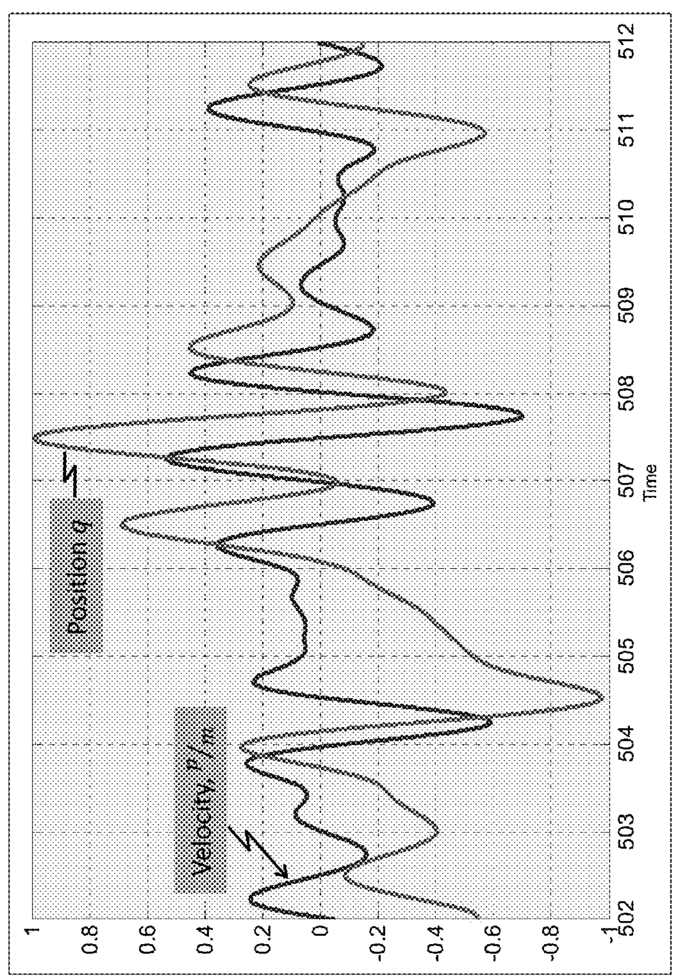
FIG. 32 is an illustration of a plot of the relation of continuous velocity to continuous position through an integral of motion for a sample function, in accordance with one or more embodiments.

FIG. 32 illustrates a plot 3200 of how continuous velocity is related to continuous position through an integral of motion for one of the sample functions shown in plots 3000 and 3100, in accordance with one or more embodiments.

FIGS. 30-32 illustrate a limited frequency response. This response however is not the result of a traditional filter, but is rather the result of the limit for the maximum rate of change of energy ($P_m$) available to the apparatus. Between samples, physical interpolation (such as that suggested in section 3.8.1) produces a smoothing effect which incorporates momentum memory between the independent samples. In the case of a maximum velocity pulse, the memory is finite while the maximum cardinal pulse distributes momentum over an infinite range of time albeit with a value of zero at multiples of the sampling interval.

A characterization of an ergodic process provides considerable utility, but it demands a process description which is stationary in the strict sense. The conditional stationary properties assumed by earlier discussions are explored here.

For an ergodic ensemble, the average of a function of the random variables over the ensemble is equal with probability unity to the average over all possible time translations of a particular member function of the ensemble, except for a subset of representations of measure zero.

It is clear from this definition that the process cannot be assumed ergodic from inspection.

The apparatus of each unique phase space (such as those depicted in FIG. 29) is causally subordinate to its own information source and no other. Each information source maps information (i.e. phase space coordinates {p,q}) to a physical function of the apparatus with consideration of boundary conditions.

Each of the unique iid Gaussian sources possess space-time dependent variances. Each Gaussian RV may not be considered stationary in the usual sense at a specific configuration coordinate q because a particle in motion does not remain at one location. The momentum or velocity samples, at a specific time $t_l$, come from differing configuration locations $q_{1,\ 2\ .\ .\ .\ k;l}$ in the separate experiments. The conditional momentum statistic, ρ(p|q), is determined by the frequency of observed sample values over many subsequent random and independent particle trajectory visits to a specific configuration coordinate. It is not obvious that statistics of the ensemble collective predict the time averaged moments of ensemble members when considered in this manner or vice-versa. A reorganization of the data will however confirm that this is the case with certain caveats.

The relevance of organizing the RVs in a particular manner can be illustrated by revisiting the peak momentum profile and considering 3 unique configuration coordinates $q_1,q_2,q_3$ located on the trajectory of a particle moving along the $\alpha^{th}$ axis in a hyper space. This concept is illustrated in plots 3300 and 3500 of both the maximum nonlinear and the maximum cardinal pulse velocity pulses of FIGS. 33A and 33B, respectively.

The extended tail response for the cardinal pulse is also illustrated in plot 3350 and reverberates on the $\alpha^{th}$ axis ad infinitum. In contrast, the maximum velocity pulse profile is extinguished at the phase space boundary at relative times $\pm T_s$ corresponding to $\pm R_s$.

Figure 33A:
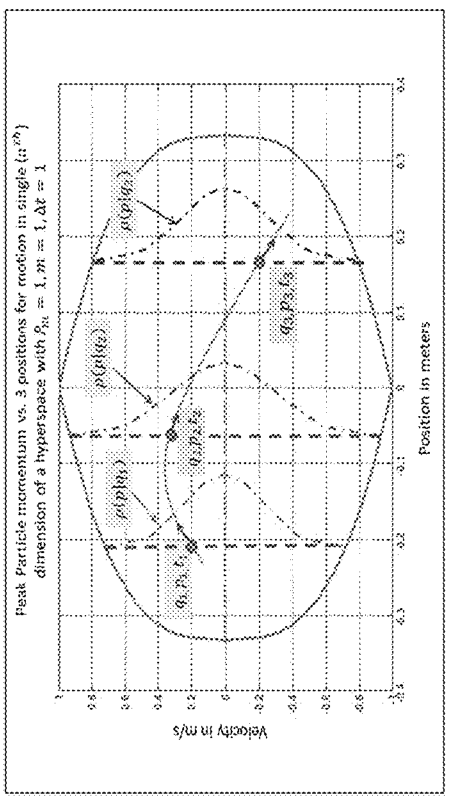
FIGS. 33A-B are illustrations of plots of maximum nonlinear and maximum cardinal pulse velocity pulses, in accordance with one or more embodiments.
Figure 33B:
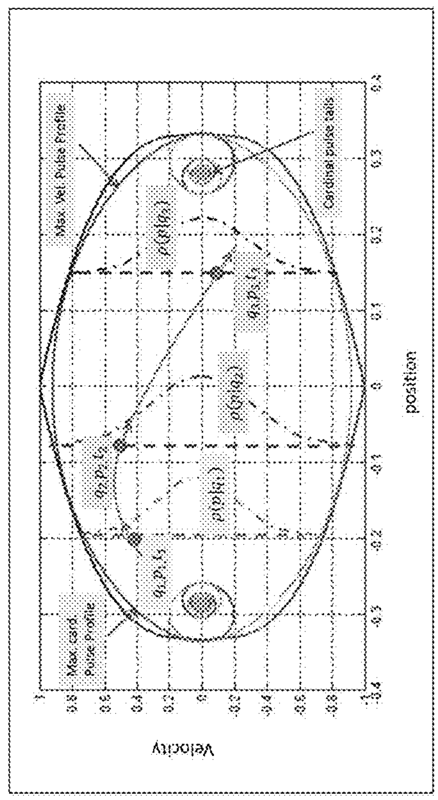
Figure 34:
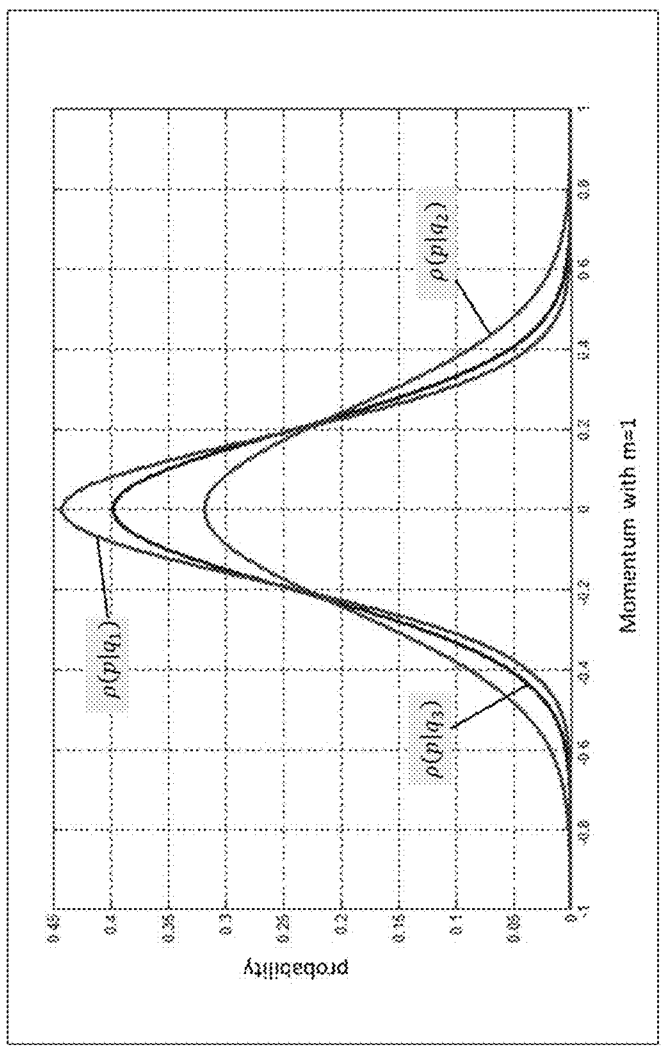
FIG. 34 is an illustration of a plot of three Gaussian pdfs for three sample RVs, in accordance with one or more embodiments.

Each position $q_1,q_2,q_3$ has an associated peak momentum on the Gaussian pdf tail illustrated by the associated pdf profiles of FIGS. 33A, 33B, and 34. FIG. 34 illustrates a plot 3400 of three Gaussian pdfs for three sample RVs, in accordance with one or more embodiments. The Gaussian RV at each location has its own variance although the PAER is constant and equivalent at each position. Momentum values of interest lie inside the peak velocity boundaries along the dashed lines of plots 3300 and 3350 and are statistically captured by the conditional probability densities for the 3 illustrated example configuration points in plot 3400.

Thus, samples at different times which intersect these position coordinates can be collected and organized to characterize the random variables. The collection of samples at a specific configuration coordinate rarely encounter a circumstance where the specific configuration coordinate occupies back to back time samples because this would imply a nearly stationary particle. Rather, the instants at which the coordinates $q_l$ are repeated are separated by random quantities of time samples. Nevertheless, the new collections of samples at each coordinate bin can still be ordered chronologically. These new ensembles possess discontinuous time records even though the time records are sequential and each sample is still independent. Such a collection is suitable for obtaining the frequency of occurrence for specific momenta given a particular configuration coordinate, i.e. a statistical counting with dependency. Each pdf at each coordinate possesses a stationary behavior. In contrast, a continuous time record comprises values each from the collection of such differing Gaussian variables at $T_s$ intervals. Each new RV in the time sampled momentum ensemble view is acquired through a time evolution governed by laws of motion. However, time sampled trajectories from the momentum ensemble do not represent a stationary set of samples because each sample comes from a pdf with a different second moment.

A new configuration bin arrangement for the random process can be written with the following representation; (the k-th ensemble member is followed by the set of all k members)

$$\tilde{Ж}(q,p)_k=\{(q_1,[p(t_{l_1})]);(q_2,[p(t_{l_2})])\ .\ .\ .\ (q_i,[p(t_{l_i})])\}_k\ \tilde{Ж}(q,p)=\{\tilde{Ж}(q,p)_1,\tilde{Ж}(q,p)_2,\ .\ .\ .\ \tilde{Ж}(q,p)_k\}$$

Figure 3-88

Each of the k members of a time continuous momentum ensemble is partitioned into sub-ensembles with i configuration centric members. Each sub ensemble is time ordered but also time discontinuous. The momenta are statistically characterized by pdf s like the examples in FIG. 34.

$(q_i,p(t_{l_i}))$ is a sample from the new process at the $i^{th}$ position along the $\alpha^{th}$ dimensional axis where each position is accompanied by a time ordered set of momenta $p(t_{l_i})$, with a random but sequential time index $t_{l_i}$. That is, $t_{l_i}$ is the sample time record for the $i^{th}$ configuration. $t_{l_i}$ is set of numbers extracted from the superset $(t-lT_s)$ only when those sample times correspond to an observed configuration bin location $q_i$ for the corresponding particle momentum. The bin can be defined to have a span $q_i\pm\varepsilon$, where ε is some suitably small increment of distance. In this configuration ensemble view, each configuration coordinate is associated with its own set of "time stamped" momenta, albeit separated by random intervals of $lT_s$. Furthermore, the time index sets for $t_{l_A}$ and $t_{l_B}$, where i=A≠B, do not permit coincident time samples allocated to two different configuration locations. None of the integer values from the time index $l_A$ can be shared by $l_B$. This is a statement of an exclusion principle for the case of a single particle. The particle cannot occupy two different locations in space at the same time. This is an approximation of a quantum view where the dominant probability for particle location is assigned a single unique particle coordinate, $q_i\pm\varepsilon$. In a multiple particle scenario, each particle includes a unique set of indices and also be subject to Pauli's exclusion principle as well.

Figure 35:
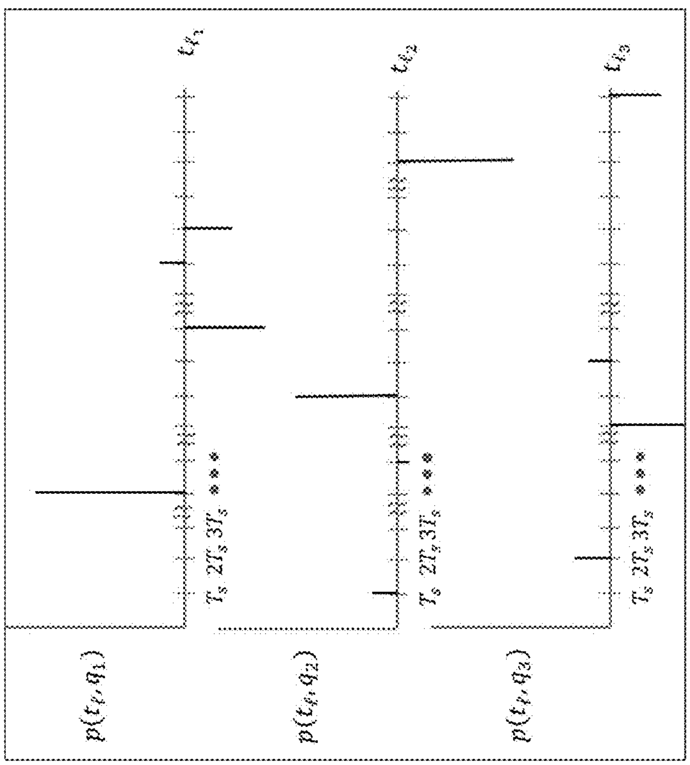
FIG. 35 is an illustration of plots of Gaussian momentum samples, in accordance with one or more embodiments.

FIG. 35 illustrates plots 3500 of Gaussian momentum samples, in accordance with one or more embodiments. Plots 3500 illustrate how the Gaussian momentum samples are sparsely populated in time for 3 unique coordinates $q_1$, $q_2$, $q_3$ from a configuration sub-ensemble. Even though a particular record is sparse, the full ensemble is comprehensive of all coordinates in time and space (i.e. all i, k and l values) and therefore dense in the aggregate.

There are (i) such sets. While suitable for statistical characterization, such an arrangement is not suitable for time domain analysis of a random process because time continuity is disrupted in this view. Thus, spectral analysis via the W-K theorem is out of the question for these records. The organization illustrated in FIG. 35 will be described as a configuration ensemble.

The configuration ensemble representation, Ж̃ (q,p) is a very different sample and ensemble organization than the momentum ensemble prescription for the random process given by Ж(q,p). In the momentum ensemble arrangement, each sample function traces the unique trajectory of a particle sequentially through time and therefore provides an intuitive basis for understanding how one might extract encoded information. It is a continuum of coordinates tracing the particle history in space time. Autocorrelations and spectrums can be calculated via the W-K theorem for the momentum ensemble view only if the process is stationary in that view.

A reorganization of time samples into a configuration ensemble for purpose of statistical analysis does not alter the character of the configuration centric RVs. Their moments are constant for each $q_i$. The justification for this stationary behavior in the configuration ensemble view is due to the boundary conditions, specifically:

$$\frac{dP_m}{dt} = 0$$
$$\frac{d(PAER)}{dt} = 0$$
$$\frac{dR_s}{dt} = 0$$
$$v(\pm R_s) = 0$$

An overall expected momentum variance can be calculated based on the variances at each configuration coordinate. Probabilities for conditional momenta, given position, will blend in some weighted fashion on the average over many trajectories, and time. One can calculate $\sigma_{q_i}^2$ by statistical means or measure the power at each configuration coordinate by averaging over time. Both values will be identical simply due to energy conservation and the conditional stationary behavior. The averages of momenta in both cases remain zero. Since the variable is Gaussian at each position, the higher order moments may also be deduced as well. Any linear operation on the collection of such random variables cannot alter this conditional stationary behavior.

3.1.9.1 Momentum Averages

At an arbitrary position, the velocity variance is based on the location of the particle with respect to the phase space boundary. The span of momentum values is determined by the $PAER_c$ and $P_m$ parameters at each position, and the span of the configuration domain radius is $\pm R_s$. $PAER_c$ is the peak to average energy ratio of the configuration ensemble. $PAER_p$ is typically specified for a design or analysis, not $PAER_c$.

If each momentum sample function is of sufficiently long duration, comprising many independent time samples, then particle motions will eventually probe a representative number of states within the space and an appropriate momentum variance can be calculated from a densely populated configuration ensemble with diminishing bias on the alpha axis by averaging all configuration dependent variances. Such a calculation is given by:

$$\langle v_\alpha^2 \rangle = \frac{1}{2R_s}\int_{-R_s}^{R_s} v_q^2 \rho(v \mid q)\,dq \qquad \text{Equation 3-89}$$

The time average on the left is then equated with the statistical quantity on the right. This is a correct calculation even if the velocity variance is not stationary. There is an inconvenience with this calculation, however. One may only possess the velocity $v_q = v_{max\,|q}$ explicitly for trajectories of phase space at boundary conditions. Fortunately there is an alternative.

A time sampled trajectory from the momentum ensemble is composed of independent Gaussian random variables from the configuration ensemble. Hence, one can calculate an average momentum variance over i members of the configuration ensemble where i is a sufficiently large number and $\lambda_i$ is a relative weighting factor for each configuration ensemble member variance $$\langle v_\alpha^2 \rangle = \sum_i \lambda_i v_{q_i}^2 = \sum_i \lambda_i \frac{v_{max|q}^2}{PAER_c} \qquad \text{Equation 3-90}$$

The variance on the left comes from a Gaussian RV because the variances on the right come from independent Gaussian RVs. Therefore, one can specify a desired variance of interest from the peak to average ratio of energy or power directly in the momentum ensemble, along with $P_m$, as design or analysis criteria. One need not explicitly calculate $\lambda_i$ or even specify $PAER_c$ from the configuration ensemble because Equation 3-90 must be true from the properties of Gaussian RV's. Therefore:

$$\langle v_\alpha^2 \rangle_\zeta = \frac{2P_m}{m f_s PAER_p} \qquad \text{Equation 3-91}$$

Equation 3-91 is the velocity variance per sample for the $\zeta^{th}$ sample function of the momentum ensemble. Hence, the variables from the configuration ensemble, which are dictated by maximum uncertainty requirements, constrain samples from continuous time domain trajectories of the momentum ensemble to also be Gaussian distributed. The converse is also true. By simply specifying that the time domain sample functions are composed of Gaussian Random variables, one has ensured that the uncertainty for any position must be maximum for a given variance.

Equations 3-90 and 3-91 are verified more deliberately in a derivation where each sample function of the momentum ensemble is treated as a unique message sequence and the time ordered message sequence is reordered to configuration bins. In this analysis, each member of the message sequence is a time sample.

A message is defined by a sequence of 2N independent time samples similar to the formulation of chapter 2. The message sequence is then given by:

$$m_{\zeta}(t-lT_s)=\{(q,p)_1,(q,p)_2, \ldots (q,p)_2, \ldots (q,p)_{2N}\}_{\zeta} \quad \text{Equation 3-92}$$

The message is jointly Gaussian since it is a collection of independent Gaussian RVs. Position and momentum are related through an integral of motion, and therefore q also possesses a Gaussian pdf which can be derived from p.

The statistical average is reviewed and compared to message time averages from the perspective of the process first and second moments. The long term time average is nearly equivalent to the average of the accumulated independent samples, given a suitably large number of samples 2N.

$$\langle m_{\zeta}(t)\rangle \cong \lim_{N\to\infty}\frac{1}{2N}\sum_{\ell=-N}^{N}(q,\ p)_{\ell} \quad \text{Equation 3-93}$$

The mean square of the message is likewise approximated by:

$$\langle m_{\zeta}(t)^2\rangle \cong \lim_{N\to\infty}\frac{1}{2N}\sum_{\ell=-N}^{N}(q^2,\ p^2)_{\ell} = \sum_i(\lambda_i\sigma_{q_i}^2,\ \lambda_i\sigma_{p_i}^2) \quad \text{Equation 3-94}$$

A long term time average is approximated by the sum of independent samples. It is reasonable to assume that the variance of each sample contributes to the mean squared result weighted by some number $\lambda_i$ where i is a configuration coordinate index. The left hand side of Equation 3-94 is a time average of sample energies over 2N samples and the right hand side is the weighted sum of the variances of the same samples organized into configuration bins.

Each time sample may be mapped to a specific configuration coordinate and momentum coordinate at the $1^{th}$ instant. Each position $q_i$ is accompanied by a stationary momentum statistic, $\rho(p|q_i)$. The averaged first and second moments for each $q_i$ are therefore stationary. This insures that any linear functional of a set RVs with these statistics must also be stationary when averaged over long intervals. Thus, long term time averages inherit a global stationary property as will be shown. The right hand side of the prior equations are a sum of Gaussian RVs and Gamma RVs, respectively. Therefore, the mean and variance of the sum is the sum of the independent means and variances if the samples are statistically independent. The cumulative result remains Gaussian and Gamma distributed respectively. This permits relating the time averages and statistical averages of the messages in the following manner;

$$\lim_{N\to\infty}\frac{1}{2N}\sum_{\ell=-\infty}^{\infty}(q,\ p)_{\ell} = \frac{1}{\ell}\sum_i\sqrt{\lambda_i}\sum_{\ell}(q_{\ell},\ p_{\ell})_i = (\overline{q},\ \overline{p}) \quad \text{Equation 3-95}$$

$$\lim_{N\to\infty}\frac{1}{2N}\sum_{\ell=-\infty}^{\infty}(q^2,\ p^2)_{\ell} = \frac{1}{\ell}\sum_i\lambda_i\sum_{\ell}(q_{\ell}^2,\ p_{\ell}^2) = (\overline{\sigma}_q^2,\ \overline{\sigma}_p^2) \quad \text{Equation 3-96}$$

The right hand sides of these equations are a reordering of the left hand side time samples in a manner which does not alter the overall averages. $\lambda_i$ are ultimately determined by the characteristic process pdf and boundary conditions and are related to the relative frequency of time samples near a particular coordinate $q_i$. Whenever the averages are conducted over suitably large i, l the sampled averages are good estimates of a continuum average. Since the right hand side is stationary, then the left hand side is stationary also.

The prior analysis shows that the process appear stationary in the wide sense or that:

$$\left\langle\{\vec{p}_{\alpha}^{\,z}\}_{\zeta}\right\rangle=\int_{-\infty}^{\infty}\{[\vec{p}_{\alpha}(q_{\alpha})]^z\rho(\vec{v}_{\alpha}|q_{\alpha})\}_{\zeta}d\vec{v}_{\alpha};z=1,2 \quad \text{Equation 3-97}$$

The maximum weighting is at the configuration origin where it is possible to achieve $v_{max}$ at the apex of the $v_p$ profile. The conditional pdf provides a weighting function for this statistic averaged over all possible positions $q_{\alpha}$. Over an arbitrarily long interval of random motion, all coordinates will be statistically visited. The specific order for probing the coordinates versus time is unimportant because the statistic at each particular configuration coordinate is known to be stationary. The time axis for the momentum ensemble member thus cannot affect the ensemble average or variance per sample.

In summary:

$$\frac{1}{\zeta}\sum_{\zeta=1}^{k}\left\langle\{p_{\alpha}^z\}_{\zeta}\right\rangle \cong E\{p_{\alpha}^z\};\ z = 1,\ 2 \quad \text{Equation 3-98}$$

$$(\overline{\sigma}_{v_{\alpha}}^2)_s = \frac{P_m\Delta t}{mPAER} \quad \text{Equation 3-99}$$

$$\langle\varepsilon_k\rangle = \frac{m(v_{max})^2}{2PAER} \quad \text{Equation 3-100}$$

$$\langle p_{\alpha}^2\rangle = \frac{\left(p_{\substack{max\\ \alpha}}\right)^2}{PAER} \quad \text{Equation 3-101}$$

$\langle\tilde{\varepsilon}_k\rangle$ may also be calculated for a maximum cardinal pulse boundary condition.

The average energy for the maximum cardinal velocity pulse main lobe is calculated from (ignoring the tails);

$$\langle\tilde{\varepsilon}_{k_{card}}\rangle = \left\langle\frac{mv_{m_{card}}^2}{2}\int_{-T_s}^{T_s}\frac{\sin^2(\pi f_s t)}{(\pi f_s t)^2}dt\right\rangle \cong .903\frac{mv_{m_{card}}^2}{2} \quad \text{Equation 3-102}$$

The average energy and momentum of all trajectories subordinate to the maximum cardinal pulse bound is therefore $$\langle\varepsilon_{k_{card}}\rangle = .4515\frac{mv_{m_{card}}^2}{(PAER)}; \quad \text{Equation 3-103}$$

$$\langle p_{card}^2\rangle = .903\frac{m^2v_{m_{card}}^2}{(PAER)};$$

The ratio of the average energy for the trajectories subordinate to the two profiles is approximately 1.1074 when $v_{m\_card}^2 = v_m^2$. If the two cases are compared with an equivalent R, design parameter, then the ratio of comparative energies increases to (1.13)(1.1074)~1.25. This was obtained from Equation 3-103 and section 3.1.8.2, as well as Sections 10.6 and 10.7.

3.1.10. Configuration Position Coordinate Time Averages

Figure 36:
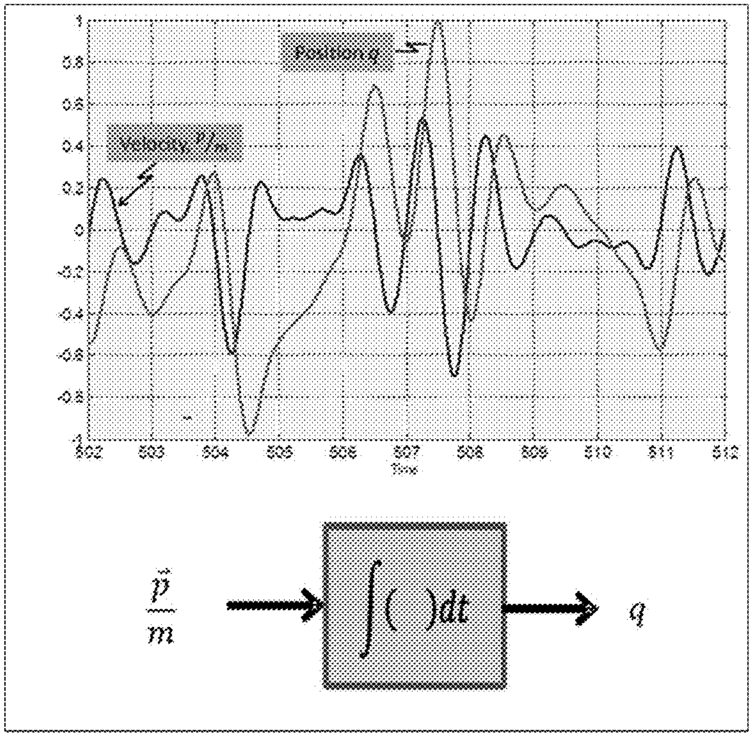
FIG. 36 is an illustration of a plot of the relationship between velocity and position for a particular sample function, in accordance with one or more embodiments.

Since the configuration coordinates are related to the momentum by an integral, the position statistic is also zero mean Gaussian with a variance related to the average of the mean square velocity profile. FIG. 36 illustrates a plot 3600 of the relationship between velocity and position for a particular sample function, in accordance with one or more embodiments.

Because the statistics of a position $q_i$ are stationary, the linear function of a particular $q_i$ also possesses a stable statistic.

In the prior sections, the Gaussian nature of momentum was presented from the maximum uncertainty requirement of momentum at each phase space coordinate. The position over an interval of time $t_a - t_b$ is given by:

$$q_\zeta(t) = \frac{1}{m}\int_{t_a}^{t_b} \check{p}_\zeta(t)dt = \frac{1}{m}\int_{t_a}^{t_b} a_\zeta(t)p_\zeta(t)dt + q_a \qquad \text{Equation 3-104}$$

The momentum $p_\zeta(t)$ can be scaled by a continuous function of time $a_\zeta(t)$, resulting in an effective momentum, $\check{p}_\zeta(t)$. Sample functions of this form produce output RVs which are Gaussian when the kernel $p_\zeta(t)$ is Gaussian. Furthermore, if for each $\zeta$ this is true it can also be shown that $$q_\zeta(t) = \frac{1}{m}\int_{t_a}^{t_b} A_\zeta(t,\tau)p_\zeta(\tau)d\tau + q_a \qquad \text{Equation 3-105}$$

and the output process is also Gaussian when A (t, τ) is a continuous function of both time and τ, an offset time variable. In such cases, the position covariance $K_q$ due to this class of linear transformations can be obtained from:

$$K_q = \frac{1}{m^2}\int\int_{t_a}^{t_b} A(t,\tau_1)A(t,\tau_2)K_p(\tau_1,\tau_2)d\tau_1 d\tau_2 \qquad \text{Equation 3-106}$$

An alternate form in terms of an effective filter impulse response and input covariance $K_p$, is given by:

$$K_q = \frac{1}{m^2}\int\int_{-\infty}^{\infty} h(t-\tau_1)h(t-\tau_2)K_p(\tau_1-\tau_2)d\tau_1 d\tau_2 \qquad \text{Equation 3-107}$$

When the covariance in each sample function is unaffected by time axis offset, then $h(t)=u(t-t_a)$ is the impulse response from the integral of motion, which leads to:

$$K_q = \frac{1}{m^2}\int\int_{t_a}^{\infty} u(t-t_a-\tau_1) \qquad \text{Equations 3-108}$$

$$u(t-t_a-\tau_2)\check{K}_p(\tau_1-\tau_2)d\tau_1 d\tau_2 = (\sigma_q^2)_s$$

$\check{K}_p$ includes any time invariant scaling effects due to A(t). $(\sigma_q^2)_s$ is a position variance per sample and $T_s$ is a sample interval. Equation 3-108 is given in meters squared per sample. Alternately, the frequency domain calculation for the covariance is given by:

$$K_q = \frac{1}{m^2}\int_{-\infty}^{\infty} |h_p(j\omega)|^2 S_p(\omega)d\omega \qquad \text{Equation 3-109}$$

$S_p(\omega)$ is the double sided power spectral density of the momentum and $H_p(j\omega)$ is the frequency response of the effective filter. For maximum uncertainty conditions, $S_p(\omega)$ is a constant power spectral density.

Finally, the variance of q is also given in terms of the q, variables from the prior section (for large i):

$$\begin{aligned} K_q(\tau=0) &= \sigma_q^2 \qquad \text{Equation 3-110} \\ &\cong \sum_i \lambda_i q_i^2 \\ &= \frac{1}{m^2}(\sigma_p^2)_s T_s^2 \end{aligned}$$

Therefore, if we specify $\sigma_p^2$, $PAER_p$, and in we can calculate $\sigma_q^2$. A simulation creating the signals of FIG. 36 reveals that except for the units, the position and momentum as functions of time seem to possess the same dynamic behavior. This is due to the fact that the momentum is significantly filtered prior to obtaining the position and both are analytic.

3.1.10.1 Joint Probability for Momentum and Position

ρ(p|q) is recalled as a point of reference. The multidimensional pdf may be given as (m=1):

$$\rho(\vec{v}_p \mid q) = \frac{1}{\sqrt{(2\pi)^P|\Lambda|}} e^{\left[-\frac{1}{2}(v_\alpha-\overline{v_\alpha})^T\Lambda^{-1}(v_\beta-\overline{v_\beta})\right]} \qquad \text{Equation 3-111}$$

$\sigma_\alpha^2$, the velocity variance and diagonal of Λ, are averaged over all probable configurations. Each configuration coordinate possesses a characteristic momentum variance which contributes to that average.

A phase space density of states in terms of configuration position must therefore be scaled according to:

$$\rho(q_\alpha) = \frac{1}{\sqrt{2\pi\langle q_\alpha^2\rangle}} e^{-\frac{(q_\alpha)^2}{2\langle q_\alpha^2\rangle}} \qquad \text{Equation 3-112}$$

$$\langle q_\alpha^2\rangle \equiv \sigma_q^2$$

The density along the $\alpha^{th}$ dimension of phase space is obtained from:

$$\rho(v_\alpha, q_\alpha) = \rho(v_\alpha \mid q_\alpha)\rho(q_\alpha) \qquad \text{Equation 3-113}$$

Figure 37:
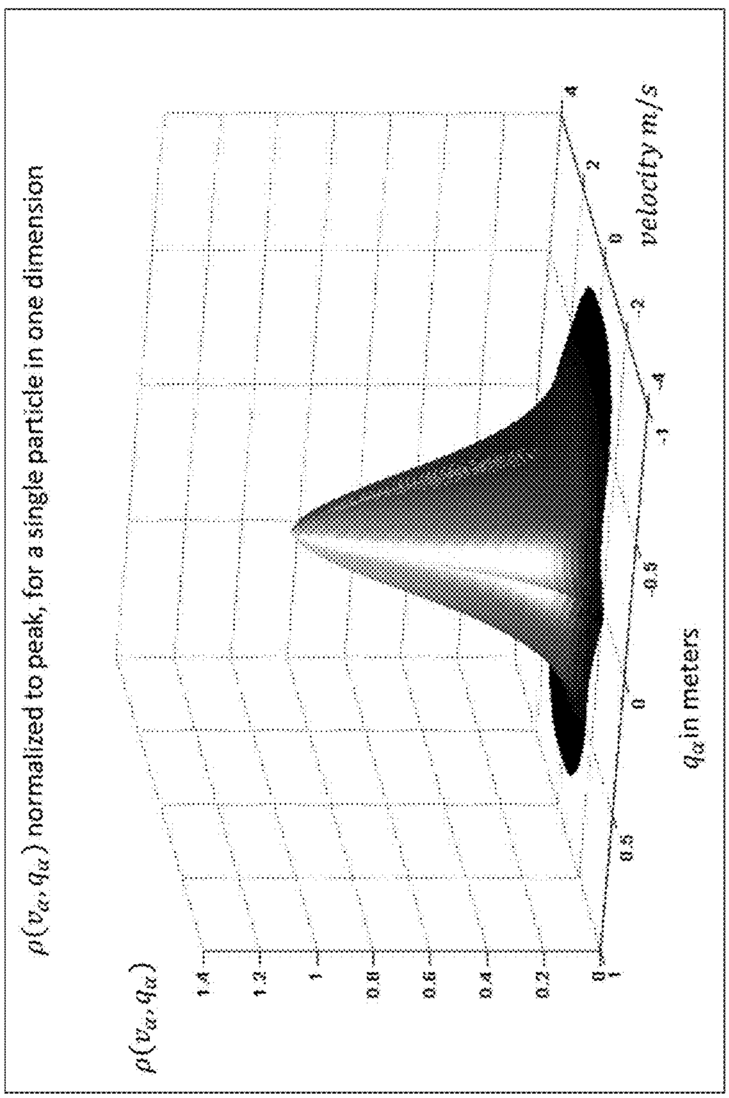
FIG. 37—is an illustration of a plot of the joint pdf of configuration and momentum coordinates, in accordance with one or more embodiments.
Figure 38:
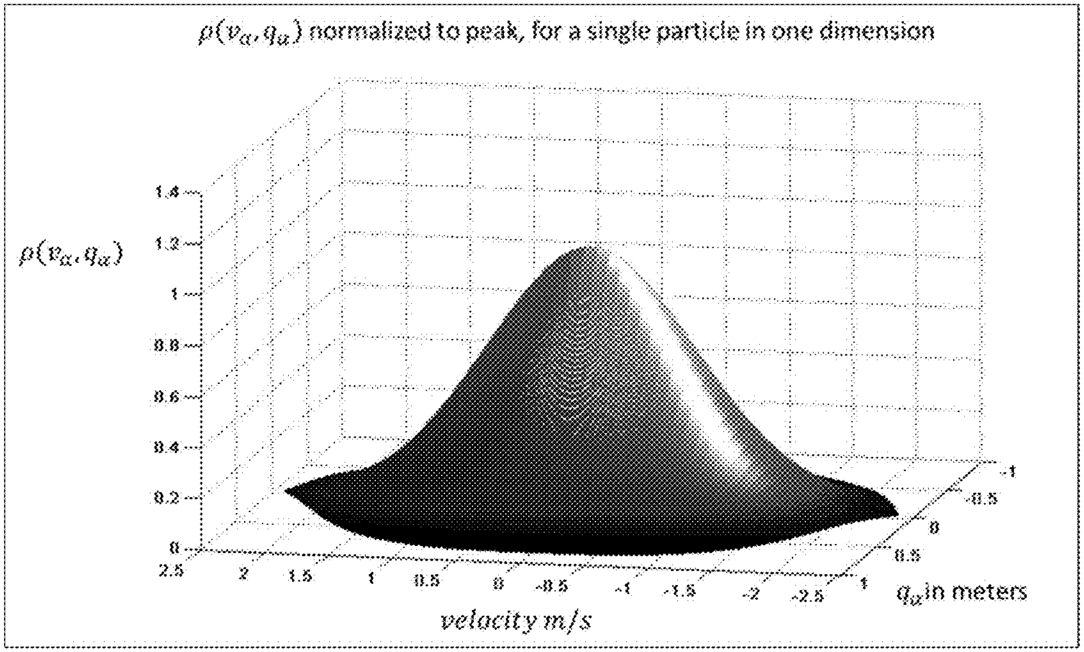
FIG. 38 is an illustration of a plot of the joint pdf of configuration and momentum coordinates, in accordance with one or more embodiments.
Figure 39:
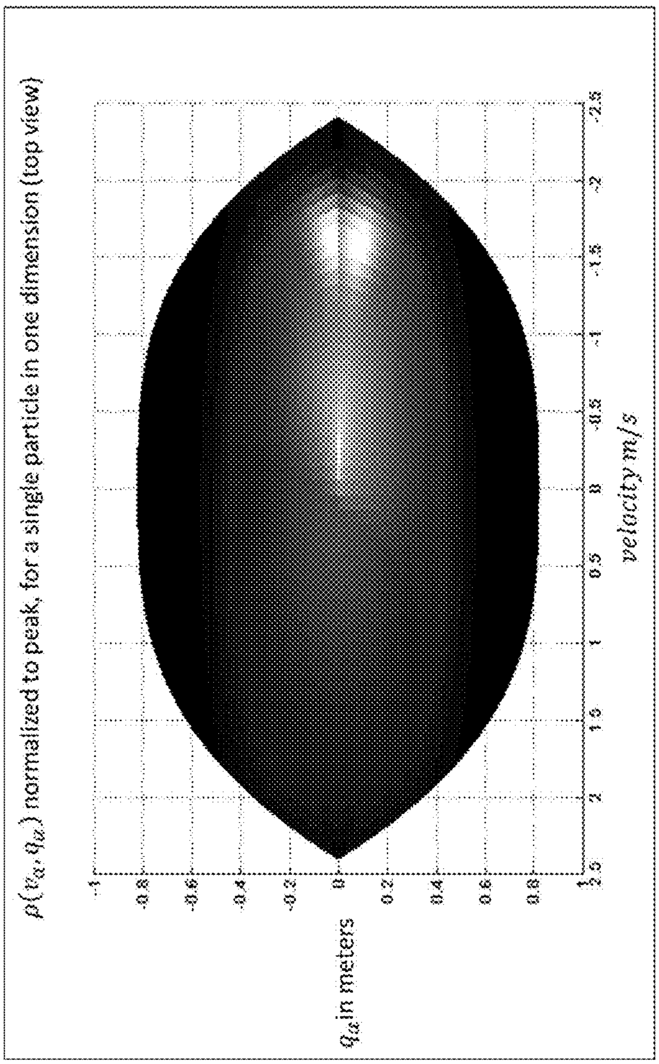
FIG. 39 is an illustration of a plot of the joint pdf of configuration and momentum coordinates, in accordance with one or more embodiments.

FIGS. 37-39 illustrate plots 3700, 3800, and 3900 of the joint pdf of configuration and momentum coordinates in a single dimension for the maximum velocity profile, in accordance with one or more embodiments. In plots 3700, 3800, and 3900, the probability has been scaled relative to the peak which occurs at the center of the space, at $q_\alpha=0$. In plots 3700, 3800, and 3900, parameters of interest are; PAER=4, Δt=1 s, m=1 kg, $P_m$=1 J/s.

Whenever the orthogonal dimensions are also statistically independent, each dimension will have the form illustrated in FIGS. 37-39 and there are 2 degrees of freedom per dimension. The 2 degrees of freedom per dimension per particle are fully realized if sample intervals $T_s$ are prescribed.

A joint phase space density representation for the continuous RVs can be specified from the following synopsis of equations whenever momentum and position can be decoupled (case m=1).

$$\rho(v_\alpha, q_\alpha) = \rho(q_\alpha)\rho(v_\alpha \mid q_\alpha) \quad \text{Equation 3-114}$$

$$\rho(q, p)_\Omega = \left( \frac{1}{\sqrt{2\pi \langle q_\alpha^2 \rangle}} e^{-\frac{q_\alpha^2}{2\langle q_\alpha^2 \rangle}} \left( \frac{\sqrt{PAER}}{\sqrt{2\pi}\, v_{\alpha_{peak}}} e^{-\frac{(PAER) v_\alpha 2}{2\left(v_{\alpha_{peak}}\right)^2}} \right) \right) \quad \text{Equation 3-115}$$

$$1 = \int_{-v_p}^{v_p} \int_{-R_s}^{R_s} \rho(q, p)_\Omega \, dq \, dp; \text{ for } m = 1 \quad \text{Equation 3-116}$$

This joint statistic is also zero mean Gaussian.

3.1.11. Statistical Behavior of the Particle Based Communications Process Model

Localized motions in time are correlated over the intervals less than Δt due to the momentum and associated inertia. Eventually, the memory of prior motions is erased by cumulative independent forces as the particle is randomly directed to new coordinates. This erasure requires energy. The evolving coordinates possess both Gaussian momentum and configuration statistics by design and the variance at each configuration coordinate is sculpted to accommodate boundary conditions. The boundary conditions require particle accelerations which may be deduced from the random momenta and finite phase space dimension. If a large number of independent samples are analyzed at a specific configuration coordinate, the momentum variance calculated for that coordinate is stationary for any member of the ensemble. Each configuration coordinate can be analyzed in this manner with its sample values reorganized as a configuration centric ensemble member.

The set of momentum variances from a plurality of configuration coordinates can be averaged. That result is stationary. Yet, the process is not stationary in the strict sense because the momentum statistics are a function of position and therefore fluctuate in time as the history of a single particle evolves sequentially through unique configuration states. The process is technically not stationary in the wide sense because the autocorrelations fluctuate as a function of time origin. The moments of the process are however predictable at each configuration coordinate though the sequence of such coordinates is uncertain.

This process shall be distinguished as an "entropy stable" stationary (ESS) process. The features of an ESS process are:

(a) Autocorrelations possess the same characteristic form at all-time offsets but differ in some predictable manner, for instance, variance versus position or parametrically versus time. The uncertainty of these variances can be removed given knowledge of relative configuration offsets compared to an average.

(b) Shannon's entropy over the ensembles is unchanging even though the momentum random variable is not stationary. The momentum does possess a known long term average variance.

(c) The long term time averages are characterized by the corresponding statistical average for a specific RV. The RV statistics (such as momentum) can change as a function of time but will be constant at a particular configuration coordinate.

(d) Time averages and statistical averages for the ensemble members can be globally related by reorganizing samples from the process to favor either the momentum or configuration ensemble views respectively. The statistics are unaltered by such comparative organizations.

(e) The variance of position may not necessarily be obtained through the momentum autocorrelation and system impulse response without further qualification. That is, the configuration variance may not always be calculated by direct application of the W-K theorem and system impulse response.

Items (a) and (b) are of interest because they illustrate that statistical characterizations which are not classically stationary still may possess an information theoretic stability of sorts.

Stability of the uncertainty metric should be the preoccupation and driving principle rather than the legacy quest to establish an ergodic assumption. Information can be lost or annihilated.

Generally, the entropy stable stationary communications process is a collection of individually stationary random variables with differing moments determined by physical boundary conditions and a time sequence for accessing the RVs which is randomly manifest whenever the process is sequentially sampled at sufficient intervals 3.2. Comments Concerning Receiver and Channel For the purposes herein, both the channel and receiver are considered to be linear. Therefore, the signal at the receiver is a replica, or alias, of the transmit signal scaled by some attenuation factor, contaminated by additive white Gaussian noise (AWGN) and perhaps some interference with an arbitrary statistic. The channel conveys motion from the transmitter to the receiver via some momentum exchange whether field or material based.

The extended channel comprises a transmitter, physical transport media, and receiver. The physical transport medium can be modeled as an attenuator without adding other impairments except for AWGN noise. Although, the AWGN contribution can be distributed amongst the transmitter, transport medium and receiver, it is both convenient and sufficient to include its affect into the receiver since the concern is with the capacity of a linear system.

Figure 40:
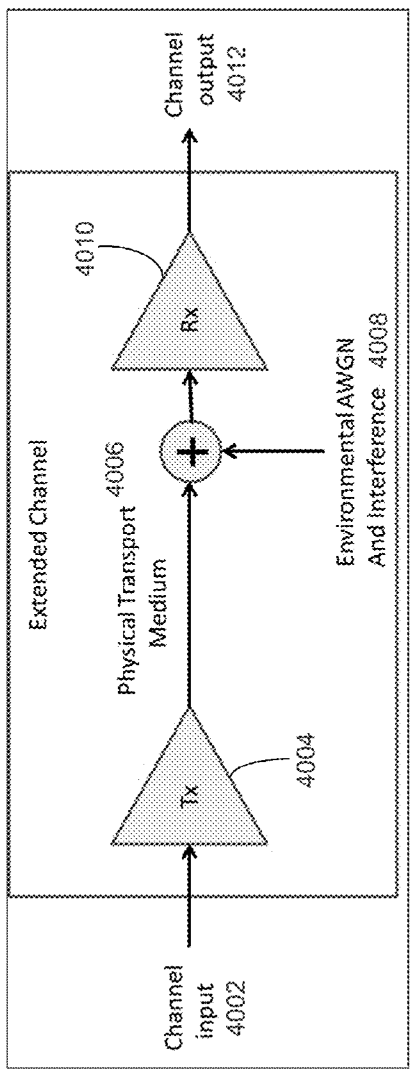
FIG. 40 is an illustration of an extended channel model, in accordance with one or more embodiments.

FIG. 40 illustrates an extended channel model 4000 and includes channel input 4002, Tx 4004, a physical transport medium 4006, environmental AWGN and interference 4008, Rx 4010, and channel output 4012, in accordance with one or more embodiments. FIG. 40 represents the continuous bandwidth limited AWGN channel model without physical transport medium memory. Both the transmitter and receiver may possess finite bandwidth restrictions.

It is useful to connect this idea to the concepts of phase space. One approach is a global phase space model since it is an extension of the current theme and preserves a familiar analysis context.

Figure 41:
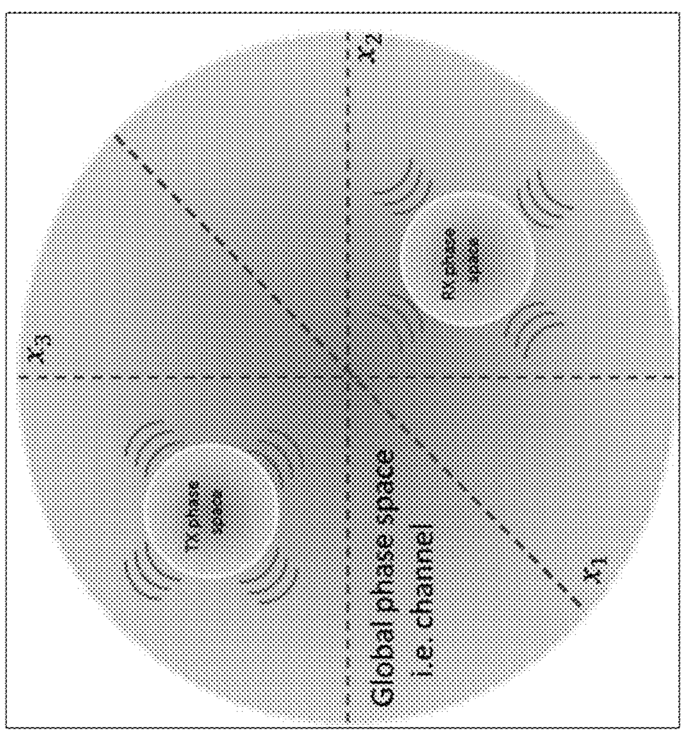
FIG. 41 is an illustration of a global phase space, in accordance with one or more embodiments.

FIG. 41 illustrates a global phase space 4100, in accordance with one or more embodiments. The coordinate systems for the transmitter, receiver, and channel may be co-referenced. Relative motions between the transmitter and receiver can be accommodated. The implied momentum exchanges between the transmitter, transport medium and receiver indicated by FIG. 41 can be assigned arbitrary direction within the global space. Arbitrary interferences can be simulated by insertion of additional transmitter sources if so desired. Channel distortions can use more detailed consideration and specification of the spatial properties of the transport medium between the transmitter and receiver.

Channel attenuation is a property of the space between the transmitter and receiver. Attenuation is different for mechanical models, electromagnetic models, etc. There is a preferred consideration for the case of free space and an electromagnetic model where the power radiated in fields follows an inverse square law. Likewise, the momentum transferred with the radiated field is well understood, and this momentum reflects corresponding accelerated motions of the charged particles within the transmitter and receiver phase spaces. This will be revisited in section 5.5.

If one assumes that transmission times are relatively long term compared to observation intervals, then average momentum densities at each point in the global phase space will be relatively stationary if the transmit and receive platforms are fixed in terms of relative position. The momentum density is 3 dimensional Gaussian with a spatial profile sculpted proportional to $R^{-2}$ where R is the radius from the transmitter, excluding the near field zone. This follows the same theme as the analysis for the velocity profiles with the exception of the boundary condition. At large distances, the PAPR for the momentum profile is the same as for local fields but the variance converges as $R^{-2}$. The pdf for the field momentum in the channel transport medium will be of the following form.

$$\rho(\vec{p}_\alpha) \cong \frac{\sqrt{PAER}}{\sqrt{2\pi}\, p_{\alpha_{peak}}} e^{-\frac{(PAER) p_{x_\alpha}{}^2}{2\left(p_{\alpha_{peak}}\right)^2}}, \quad \text{Equation 3-117}$$

$$PAER \equiv \left(\frac{p_{x_\alpha peak}}{\sigma_{p_{x_\alpha}}}\right)^2$$

$$\rho(\vec{p}) = \prod_{\alpha=1}^{D=3} \rho(\vec{p}_\alpha)$$

$\sigma_{p_\alpha}$ is a function of radial offset from the transmitter, and the radius vector is a composition of 3 orthogonal position vectors. In the basic model, the density is independent of direction. That is, the propagation is omnidirectional. This follows if the receiver position is uncertain. $\sigma_{p_\alpha}$ could vary as a function of azimuth and elevation for analysis if the receiver position is known and the transmitter equipped to take advantage of this a priori knowledge. The receiver may occupy any region accept the transmitter position.

There are two interfaces to consider; transmitter-channel and channel-receiver. Maximum power transfer is assumed at both interfaces. Hence, the effect of loading, is that half of the source power is transferred at each interface. Otherwise, the relative statistics for motions of particles and fields through phase space are unaffected except by scale.

Similar analogies can be leveraged for acoustic channels and optical channels. In those cases, momentum may be transferred by material or virtual particles, but the same concepts apply.

The receiver model mimics the transmitter model in many respects. The geometry of phase space for the receiver can be hyper-geometric and spherical as well. The significant differences are:

(a) Relative location of information source and phase space;

(b) The direction of information flow is from the channel which is reversed from the Tx scenario;

(c) The sampling theorem applies in the sense of measuring rather than generating signals; and (d) There can be significant competitive interfering signals and contamination of motion beyond thermal agitation.

With respect to item (d), the relative power of the desired signal compared to potential interference power which may contaminate the channel can be many orders of magnitude in deficit. The demodulator which decodes the desired signal discriminates encoded information while removing the effects of the often much larger noise and interference, to the greatest extent possible.

Capacity is greatly influenced by the separation R of the information source and the information sink (see Equation 3-117). In an embodiment, the receiver must redact patterns of motions which can survive transfer through large contaminated regions of space (transport medium) and still recognize the patterns. The sensitivity of this process is remarkable in some cases because the desired signal momenta and associated powers interacting with the particles of the receiver can be on the order of pica watts. This requires very sensitive and linear receiver technology.

Figure 42:
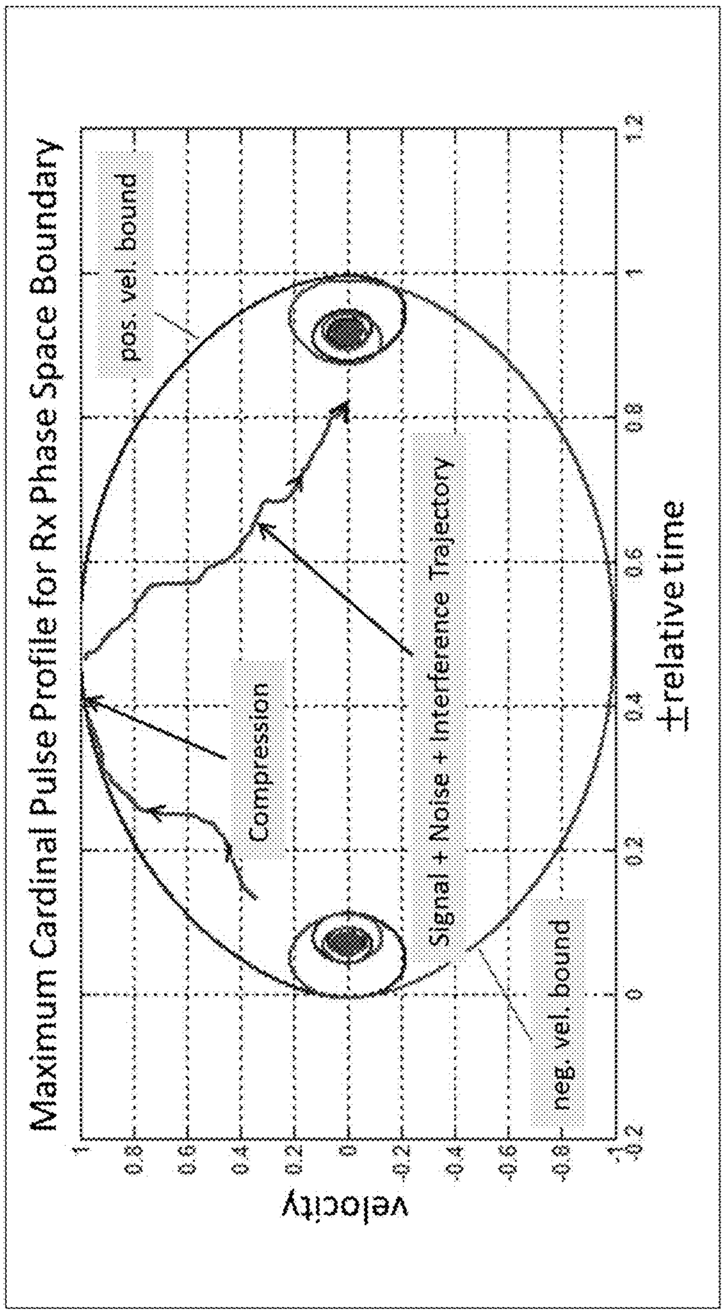
FIG. 42 is an illustration of a plot of a receiver phase space graphic, in accordance with one or more embodiments.

FIG. 42 illustrates a plot 4200 of a receiver phase space graphic showing a momentum trajectory comprising the desired signal motions summed with random noise and interference, in accordance with one or more embodiments. The collision with the boundary producing a compression event. At that boundary, the motions become nonlinear and information is lost. If the signal portion of the motion is much less in magnitude compared to the noise and interference, then the nonlinearities will also create competing intermodulation distortions in the preferred motions, unwanted spectrums will grow, etc. Thus, the $P_m$ and PAER of design are heavily influenced by the levels of permitted interference and noise as well as signal. In Section 4, it is shown that the particle momenta encoding information should be sufficient to overcome competing momenta from environmental contamination to achieve a certain capacity. This in turn influences the efficiency of the operating hardware as will be established in Section 5.

The same concepts for communications efficiency apply throughout the extended channel. Similarly, capacity, while independently affected by receiver performance, transmitter performance and extended channel conditions, finds common expression in certain distributed aspects of the capacity equation such as signal power, noise power, observation time, sampling time, etc. A high level analysis of capacity versus efficiency dependent on these common variables is applied to the current particle based model where information is transferred through momentum exchange.

4. Uncertainty and Information Capacity

This section discusses the following:

(a) Refining a suitable uncertainty metric for a communications process of the model described in Section 3.

(b) Deriving the physical channel capacity.

An uncertainty associated with coordinates of phase space can be obtained from a density of the phase space states which calculates the probability of particle occupation for position and momentum. Once the uncertainty metric is known, the capacity can be obtained from this metric, the TE relation, and some basic knowledge of the extended channel.

4.1. Uncertainty

Uncertainty is a function of the momentum and configuration coordinates. Thus, formulations from statistical mechanics can be adopted at least in part. However, one of the most powerful assumptions of statistical mechanics is forfeit. A basic postulate of statistical mechanics asserts that all microstates (pairings of {q,p}) of equal energy for a closed system be equally probable. This postulate provides much utility because particles possess equal energy distribution everywhere within a container or restricted phase space under equilibrium conditions. The communications process of Section 3 shows that the average kinetic energy for a particle in motion is a specific function of q due to boundary conditions. Therefore, communications processes require more detailed consideration of the statistics for the particle motion to calculate the uncertainty because they are not in equilibrium.

The uncertainty for a single particle moving in D dimensional continuum is given by:

$$H_{\Omega}=-\iint\ldots\rho(\vec{q},\vec{p})_{\Omega}\ln\rho(\vec{q},\vec{p})_{\Omega}d^{D}(q)d^{D}(p) \qquad \text{Equation 4-1}$$

The joint density $\rho(q,p)_{\Omega}$ was obtained in Section 3. Some attention is afforded to Jaynes' scrutiny of Shannon's differential entropy (Equations 2-11 and 4-1) which was earlier stated by Boltzman in his discussion of statistical mechanics. The discrete form of Shannon's entropy given in Equation 2-10 cannot be readily transformed to the continuous form in Equation 4-1, which can provide some ambiguity for the absolute counting of states.

It is the difference in entropy measures which is at the heart of capacity. This is because capacity is a property of the communication system's ability to both convey and differentiate variations in states rather than evaluate absolute states.

If the mechanisms which encode and decode information possess baseline uncertainties prior to information transfer, then such pre-existing ambiguity cannot contribute to the capacity. This, a change in state referred to a baseline state is used as a metric to calculate capacity. This is a kind of information relativity principle in that relative differences of some physical quantity may convey information.

In this section, a lower limit resolution is promoted for the momentum and configuration, based on quantum uncertainty. A discrete resolution is introduced to limit the number of states per trajectory which may be unambiguously observed.

Continuous entropies originate from observables connected to the phase space proper. In this connection the Gaussian distribution explicitly includes the variance of the observable as well as the character of its time evolution. If the discrete random variable is derived by sampling a continuous process then it can logically inherit attributes of the continuous physical process, if it is properly sampled. Conversely, if it is merely a probability measure of events without connection to physics, it may provide an incomplete characterization.

The approach moving forward, adopts the statistical mechanics formulation. The applicable probability density is normalized to a measure of unity while accommodating the quantum uncertainty by setting the granularity of phase space cells for each observable coordinate.

$$\frac{1}{h^D}\int\ldots\int\rho(\vec{q},\vec{p})_{\Omega}d^{D}(q)d^{D}(p)=1 \qquad \text{Equation 4-2}$$

$h^D$ provides a scale according to a phase cell possessing a D dimension span on the order of h, Planck's constant.

The total uncertainty can be calculated from a weighted accumulation of Gaussian random variables. Each variable is associated with a position coordinate $q_{\alpha}$, and each coordinate possesses a corresponding probability weighting.

The relation between $\Delta\Gamma$ (number of relevant quantum states within a phase space) in quantum theory and $\Delta p\Delta q$ in the limit of classical theory where a cell of volume $(2\pi h)^s$ (where s is the number of degrees of freedom of the system) 'corresponds' in phase space to each quantum state the number of states $\Delta\Gamma$ may be written $$\Delta\Gamma=\frac{\Delta p\Delta q}{(2\pi h)^s}$$

The logarithm of $\Delta\Gamma$ is dimensionless when scaled by the denominator and that changes of entropy in a given process, are definite quantities independent of the choice of units.

The single particle uncertainty with finite phase cell, in 3 dimensions is:

$$H=-\frac{1}{h^3}\int_{-p_{max}}^{p_{max}}\ldots\int_{-R_s}^{R_s}\ldots\rho(q,p)_{\Omega}\ln[\rho(q,p)_{\Omega}]\,dq_1\,dp_1\ldots dq_3dp_3 \qquad \text{Equation 4-3}$$

This entropy is that of a scaled Gaussian multivariate and:

$$H=H_q+H_p \qquad \text{Equation 4-4}$$

$H_q$, $H_p$ are the uncertainties due to position and momentum respectively which are statistically independent Gaussian RVs. The momentum and position may be encoded independent of one another subject to the boundary conditions.

$$H_q+H_p=\ln(\sqrt{2\pi e})^{2D}+\ln(|\Lambda|^D) \qquad \text{Equation 4-5}$$

$\Lambda$ is the joint covariance matrix (see Section 10.4).

The lower limit of this entropy can be calculated by allowing the quantity $(\sigma_q\sigma_p)$, to approach the quantum value $(\sigma_{q_{\tilde{h}}}\sigma_{p_{\tilde{h}}})$, and assuming that the quantum variance may be approximated as Gaussian. $\tilde{h}$ is the rationalized form of Plank's constant and $\tilde{h}/2\leq\sigma_{q_{\tilde{h}}}\sigma_{p_{\tilde{h}}}$, according to the quantum uncertainty relation.

$$\tilde{h}=\frac{h}{2\pi}$$

The number of single particle degrees of freedom D may be set to one since the entropy is extensible. Limit is achieved for $\sigma_q\sigma_p\rightarrow\sigma_{q_{\tilde{h}}}\sigma_{p_{\tilde{h}}}$, D=1 case, $$H_{min}\geq\lim_{\sigma_q\sigma_p\rightarrow\sigma_{q_{\tilde{h}}}\sigma_{p_{\tilde{h}}}}\{\ln(2\pi e)+\ln(\sigma_q\sigma_p)\} \qquad \text{Equation 4-6}$$

$$H_{min}\geq\left\{\ln(2\pi e)+\ln\left(\frac{h}{4\pi}\right)\right\} \qquad \text{Equation 4-7}$$

Therefore, the minimum entropy is non negative and fixed by a physical constant, assuming the resolution of the phase space cell is subject to the uncertainty principle. This limit is approached whenever the joint particle position and momentum recedes to the quantum "noise floor." Positive differences from this limit correspond to the uncertainty in motions available to encode information. The limit is also independent of temperature.

4.2. Capacity

Capacity is defined as the maximum transmission rate possible for error free reception. Error free is defined as the ability to resolve position and momentum of a particle. The following analysis is directed to the continuous bandwidth limited AWGN channel without memory. "Without memory" refers to the circumstance where samples of momentum and position from the random communications process can be decoupled and treated as independent quantities at proper sampling time intervals.

The capacity of a system is determined by the ability to generate and discriminate sequences of particle phase space states, and their associated connective motions through an extended channel. Each sequence can be regarded as a unique message similar to the discussion of Section 2. The ability to discriminate one sequence from all others necessarily must contemplate environmental contamination which can alter the intended momentum and position of the particle.

4.2.1. Classical Capacity

A summary of Shannon's solution follows:

$$C = \max_{\rho(x)}\{H(\rho(x)) - H_y(\rho(x))\} \quad \text{Equation 4-8}$$

$$C = \lim_{T\to\infty} \max\left\{\frac{1}{T}\left[-\int \rho(x)\ln(\rho(x))dx + \int\int \rho(x,\ y)\ln\left(\frac{\rho(x,\ y)}{\rho(y)}\right)dxdy\right]\right\}$$

$$C = \lim_{T\to\infty} \max\left\{\frac{1}{T}\left[\int\int \rho(x,\ y)\ln\left(\frac{\rho(x,\ y)}{\rho(x)\rho(y)}\right)dxdy\right]\right\}$$

Maximization is with respect to the Gaussian pdf ρ(x) given a fixed variance. The channel input and output variables are given by x, y respectively, where y is a contaminated version of x. The scale within the argument of the logarithm is ratio-metric, and therefore the concerns of infinities are dispensed, but only in the case where thermal noise variance is greater than zero, as will be shown. This form can also be applied to the continuous approximation of the quantized space or even the quantized space if each volume element is suitably weighted with a Dirac delta function. In the following derivation, differential entropy forms and take ratios are used. Ultimately, the quantum uncertainty will also be accounted for through distinct terms to emphasize its limiting impact on capacity.

The mutual information can be defined as:

$$I(x;\ y) = \ln\left(\frac{\rho(x\mid y)}{\rho(x)}\right)$$

ρ(x|y) is the probability of x entering the channel given the observation of y at the receiver load. This is the probability kernel of the equivocation $H_y(x)$. The capacity for the discretely sampled continuous AWGN channel:

$$C = \max\{E[I(x;\ y)]\} \quad \text{Equation 4-9}$$

$$= \max\left\{E\left[\ln\left(\frac{\rho(x\mid y)}{\rho(x)}\right)\right]\right\}$$

-continued $$= \max\left\{E\left[\ln\left(\frac{\rho(y\mid x)}{\rho(y)}\right)\right]\right\}$$

E is the expectation operator.

Finding the capacity includes weighting all possible mutual information conditions, resulting in an uncertainty relationship. The averaged mutual information of interest can be written as:

$$E[I(x;y)]=[\overline{I(x;y)}]=H(y)-H_x(y)$$

$$[\overline{I(x;y)}]=H(x)-H_y(x)$$

$$[\overline{I(x;y)}]=+H(x,y)-H(x)-H(y) \quad \text{Equation 4-10}$$

The joint density $\rho(q,p)_\Omega$ developed in the previous sections accounts for this through detailed expansion of covariance as a function of time where all off diagonal terms of the covariance matrix are zero. The pdf for the channel output is given by:

$$\rho(y)=\rho(\tilde{q},\tilde{p})_\Omega$$

The tilde represents the corrupted observation of the joint position and momentum. The variances introduced by a noise process can be represented by $\sigma_{q_n}^2$, $\sigma_{p_n}^2$. The joint pdf ρ(x,y) is obtained for the Gaussian case where time samples are elements of the Gaussian vector (see Section 10.4). Using a shorthand notation, which simultaneously contemplates position and momentum, the expected value for the mutual information for a single dimension can be calculated from:

$$\overline{I(x;\ y)} = \ln\left((2\pi e)^{\frac{N}{2}}|\Lambda_x|^{\frac{1}{2}}\right) + \ln\left((2\pi e)^{\frac{N}{2}}|\Lambda_x|^{\frac{1}{2}}\right) - \ln\left((2\pi e)^{N}|\Lambda_{x,y}|^{\frac{1}{2}}\right) \quad \text{Equation 4-11}$$

$\Lambda_x$, $\Lambda_y$, are the input, output covariance matrices respectively for the samples. $\Lambda_x$, $\Lambda_y$ are N square in dimension while $\Lambda_{x,y}$ is a 2N by 2N composite covariance of the N input and output samples. The approach for the single configuration dimension thus mimics Shannon's where the independent time samples are arranged as a Gaussian multivariate vector of sample dimension N=2BT, sometimes referred to as Shannon's number. The extension of capacity for D configuration dimensions can then be calculated simply by using a multiplicative constant if all D dimensions are independent. The variance terms for the input and output samples are:

$$\sigma_x^2 = \left\{\langle q_\alpha^2\rangle,\ \frac{(p_{\alpha\_max})^2}{2PAER}\right\} \quad \text{Equations 4-12}$$

$$\sigma_y^2 = \left\{[k_g\langle q_\alpha^2\rangle + \sigma_{q_n}^2],\ \left[k_g\frac{(p_{\alpha\_max})^2}{2PAER} + \sigma_{p_n}^2\right]\right\}$$

The variance terms are segregated because they have different units. Each sample has a unique position and momentum variance. Thus, position and momentum are treated as independent data types. Subsequently the units will be removed through ratios. $k_g$ is a gain constant for the extended channel and may be set to 1 provided the channel noise power terms are accounted for relative to signal power. The elements of the covariance matrices are therefore obtained from the enumeration of (i, j) over N for $\sigma_{xi}\sigma_{xj}$ and $\sigma_{yi}\sigma_{yj}$. The elements for the joint covariance $\Lambda$ are derived from the composite input-output vector samples. The compact representation for the averaged mutual information from 4-11 then becomes:

$$\overline{I(x,y)} = \frac{1}{2}\ln\left[\frac{|\Lambda_x||\Lambda_y|}{|\Lambda|}\right] \quad \text{Equation 4-13}$$

Maximization of this quantity yields capacity.

In the case where the process interfering with the input variable x is Gaussian and independent from x, the capacity can be obtained from the alternate version of $\overline{I(x;y)}$ by inspection:

$$C = \max\{\overline{I(x;y)}\} = \max\{H(y) - H_x(y)\} \quad \text{Equation 4-14}$$

$H_x$ (y) is the uncertainty in the output sample given the desired variable x entered the channel. This is simply the uncertainty due to the corrupting noise or;

$$H_x(y) = \frac{1}{2}\ln[(2\pi e)^N|\Lambda_n|];\ D = 1 \quad \text{Equation 4-15}$$

Likewise, $$H(y) = \frac{1}{2}\ln[(2\pi e)^N|\Lambda_y|];\ D = 1 \quad \text{Equation 4-16}$$

Since the corruption consists of N independent samples from the same process, samples possess a statistic with noise variance $\sigma_n^2$ and the capacity becomes:

$$C = \frac{1}{2}\left(\ln\left[\frac{(\sigma_x^2 + \sigma_n^2)}{\sigma_n^2}\right]\right)\frac{nats}{\text{sample}} \quad \text{Equation 4-17}$$

N is not present in the normalized capacity because of the ratio of Equations 4-13 and 4-14. Furthermore, it is assumed that the required variances are calculated over representative time intervals for the process.

The capacity of 4-17 is per unit sample for a one particle system. Capacity rate must consider the minimum sample rate $f_{s\_min}$ which sets the information rate. This is known from the TE relationship as the minimum number of forces per unit time to encode information.

$$\begin{aligned} C &= \frac{f_{s\_min}}{2}\left(\ln\left[\frac{(\sigma_x^2 + \sigma_n^2)}{\sigma_n^2}\right]\right) \\ &= \frac{P_m}{2\langle\varepsilon_k\rangle_s PAER}\left(\ln\left[\frac{(\sigma_x^2 + \sigma_n^2)}{\sigma_n^2}\right]\right) \\ &= B\left(\ln\left[\frac{(\sigma_x^2 + \sigma_n^2)}{\sigma_n^2}\right]\right) \end{aligned} \quad \text{Equation 4-18}$$

Now an appropriate substitution using the results of Section 3 can be made for $\sigma_x^2$ and $\sigma_n^2$ to realize the capacity for the case of a particle in motion with information determined from independent momentum and position in the $\alpha^{th}$ dimension. Capacity can be organized into configuration and momentum terms.

$$C_\alpha = C_{q_\alpha} + C_{p_\alpha} \quad \text{Equation 4-19}$$

$$C_\alpha = \frac{P_{m_\alpha}}{2\langle\varepsilon_{k_\alpha}\rangle_s PAER_\alpha} = \left(\ln\left[\frac{([\langle q_{x_\alpha}^2\rangle + \tilde{\sigma}_{q_{n_\alpha}}^2])}{\tilde{\sigma}_{q_{n_\alpha}}^2}\right] + \ln\left[\frac{([\langle p_{x_\alpha}^2\rangle + \tilde{\sigma}_{p_{n_\alpha}}^2])}{\tilde{\sigma}_{p_{n_\alpha}}^2}\right]\right)$$

It is presumed that there will always be some variance due to quantum uncertainty. The variances $\sigma_{q_h}^2$, $\sigma_{p_h}^2$ prevent the capacity equation from diverging because their minimums reflect this quantum uncertainty. One way of expressing this is:

$$\sigma_{q_n}^2 = \sigma_{q_n}^2 + \sigma_{q_h}^2$$

$$\sigma_{p_n}^2 = \sigma_{p_n}^2 + \sigma_{p_h}^2 \quad \text{Equation 4-20}$$

This formulation estimates the maximum entropy of the quantum uncertainty to be based on a Gaussian RV. Therefore the variance of quantum uncertainty may add to the noise variance $\sigma_{q_n}^2$ and $\sigma_{p_n}^2$ in a simple way. Entropy with a bound given by:

$$H_q + H_p \geq \ln\left(\frac{\pi e\tilde{h}}{2}\right) \quad \text{Equation 4-21}$$

$$[\ln(\sigma_{q_{\tilde{h}}}) + \ln(\sqrt{2\pi e})] + [\ln(\sigma_{p_{\tilde{h}}}) + \ln(\sqrt{2\pi e})] \geq \ln(\pi e\tilde{h})$$

$$\sigma_{q_{\tilde{h}}}\sigma_{p_{\tilde{h}}} \geq \frac{\tilde{h}}{2}e^{(H_q + H_p - \ln(e\pi))} \geq \frac{\tilde{h}}{2}$$

If $|f(q)|^2$ and $|g(p)|^2$ are both probability frequency functions and g(p) is the Fourier transform of f(q) then the entropies of $|(q)|^2$ and $|g(p)|^2$ cannot be simultaneously concentrated in q and p.

For the case of information transfer via D independent dimensions, the available energy and information can be distributed amongst these dimensions. When all dimensions have parity, the capacity with a maximum velocity pulse boundary condition ($k_p=1$), is given by;

$$C \leq \sum_{\alpha=1}^{D}\frac{P_{m_\alpha}}{2\langle\varepsilon_{k_\alpha}\rangle_s PAER_\alpha}\left(\ln\left[\frac{\left(\left[\frac{1}{m^2}(\sigma_{p_\alpha}^2)_s T_{s_\alpha}^2 f_{s_\alpha} + \tilde{\sigma}_{q_{n_\alpha}}^2\right]\right)}{\tilde{\sigma}_{q_{n_\alpha}}^2}\right] + \ln\frac{([(\sigma_{p_\alpha}^2)_s f_{s_\alpha} + \tilde{\sigma}_{p_{n_\alpha}}^2])}{\tilde{\sigma}_{p_{n_\alpha}}^2}\right] \quad \text{Equation 4-22}$$

where variances from Section 3 have been substituted and are also normalized per unit time.

A multidimensional channel can behave like D independent channels which share the capacity of the composite. Given a fixed amount of energy, the bandwidth per dimension scales as $$B/D = \frac{P_{m,\alpha}}{2D\langle\varepsilon_{k\_\alpha}\rangle PAER_\alpha}$$

and the overall capacity remains constant for the case of independently modulated dimensions. Capacity as given, is in units of nats/second but can be converted to bits/second if the logarithm is taken in base 2.

The capacity equation may also be written in terms of the original set of hyperspace design parameters (m=1).

$$C \leq \sum_{\alpha=1}^{D} \frac{P_{m_\alpha}}{2\langle \varepsilon_{k_\alpha} \rangle_s PAER_\alpha} \left( \ln\left[ \frac{\left(\left[\frac{2P_{m_\alpha} T_{s_\alpha}^2}{PAER_\alpha} + \tilde{\sigma}_{q_{n_\alpha}}^2\right]\right)}{\tilde{\sigma}_{q_{n_\alpha}}^2} \right] + \ln \frac{\left(\left[\frac{2P_{m_\alpha}}{PAER_\alpha} + \tilde{\sigma}_{p_{n_\alpha}}^2\right]\right)}{\tilde{\sigma}_{p_{n_\alpha}}^2} \right] \qquad \text{Equation 4-23}$$

$$C \leq \sum_{\alpha=1}^{D} \frac{P_{m_\alpha}}{2\langle \varepsilon_{k_\alpha} \rangle_s PAER_\alpha} (\ln[\overline{SNR}_{q_\alpha} + 1] + \ln[\overline{SNR}_{p_\alpha} + 1]) \qquad \text{Equation 4-24}$$

This form assumes that D dimensions from the original hyper sphere transmitter are linearly translated through the extended channel. The signal is sampled at an effective rate of $f_s$, though each dimension is sampled at the rate $f_{s\_\alpha}=f_s/D$. It should be noted that a reference coordinate system at the receiver can be ambiguous and the aggregate sample rate of $f_s$ can in general be required to resolve this ambiguity in the absence of additional extended channel knowledge.

$$\tilde{\sigma}_{q_{n\_\alpha}}^2$$

can be replaced by the filtered variance of a noisy process with input variance $$\tilde{\sigma}_{p_{n\_\alpha}}^2.$$

This was calculated in Section 3 and results in the substitution (for m=1):

$$\tilde{\sigma}_{q_{n_\alpha}}^2 = \tilde{\sigma}_{p_{n_\alpha}}^2 T_{s_\alpha}^2$$

After substitution into 4-23 and cancelling the $T_{s\_\alpha}^2$ terms, the capacity equation becomes:

$$C \leq \sum_{\alpha=1}^{D} \frac{P_{m_\alpha}}{2\langle \varepsilon_{k_\alpha} \rangle_s PAER_\alpha} \left( \ln\left[ \frac{\left(\frac{2P_{m_\alpha}}{PAER_\alpha}\right)}{\tilde{\sigma}_{p_{n_\alpha}}^2} + 1 \right] \right); \; PAER > 1 \qquad \text{Equation 4-25}$$

$$C \leq \sum_{\alpha=1}^{D} \frac{P_{m_\alpha}}{2\langle \varepsilon_{k_\alpha} \rangle_s PAER_\alpha} (\ln[\overline{SNR}_{eq} + 1])$$

The influence of The TE relation in 4-25 indicates that greater energy rates correspond to larger capacities. The scaling coefficient is the number of statistically independent forces per unit time encoding particle information while the logarithm kernel reflects the allocated signal momentum squared relative to competing environmental momentum squared.

A similar result can be written for the case with a cardinal velocity pulse boundary condition by appropriate substitutions for the variance in equation 4-23. The proper substitutions from Section 3 are (m=1);

$$\langle (p_{x_\alpha})^2 \rangle_{card} = .903 \frac{m^2 v_{m_{card}}^2}{(PAER)}; \qquad \text{Equation 4-26}$$

$$\langle q_{card}^2 \rangle \cong \langle p_{card}^2 \rangle T_s^2 \qquad \text{Equation 4-27}$$

$$R_s = 1.85(v_{m_{card}}) \text{ (see Appendix } F) \qquad \text{Equation 4-28}$$

Both position and momentum are regarded as statistically independent and equally important in this capacity formula. This is an intuitively satisfying result since the coordinate pairings (q,p) are equally uncertain, at least to lower bound values just above the quantum noise floor. Although not contemplated by these equations, an upper relativistic bound would also limit the momentum accordingly. The implication of this model is that physical capacity summarized by equation 4-25 is twice that given in the Shannon-Hartley formula.

Quantum uncertainty prevents the argument of the logarithm in equation 4-23 from diverging when environmental thermal agitation is zero, unlike the classical forms of the Shannon-Hartley capacity equation. When the absolute temperature of the system is zero, the capacity is quite large but finite for finite $P_m$. $\overline{SNR}_{eq}$ applies to any one dimension or all dimensions collectively for this capacity formula since energy is equally partitioned for signal and noise processes alike.

Figure 43:
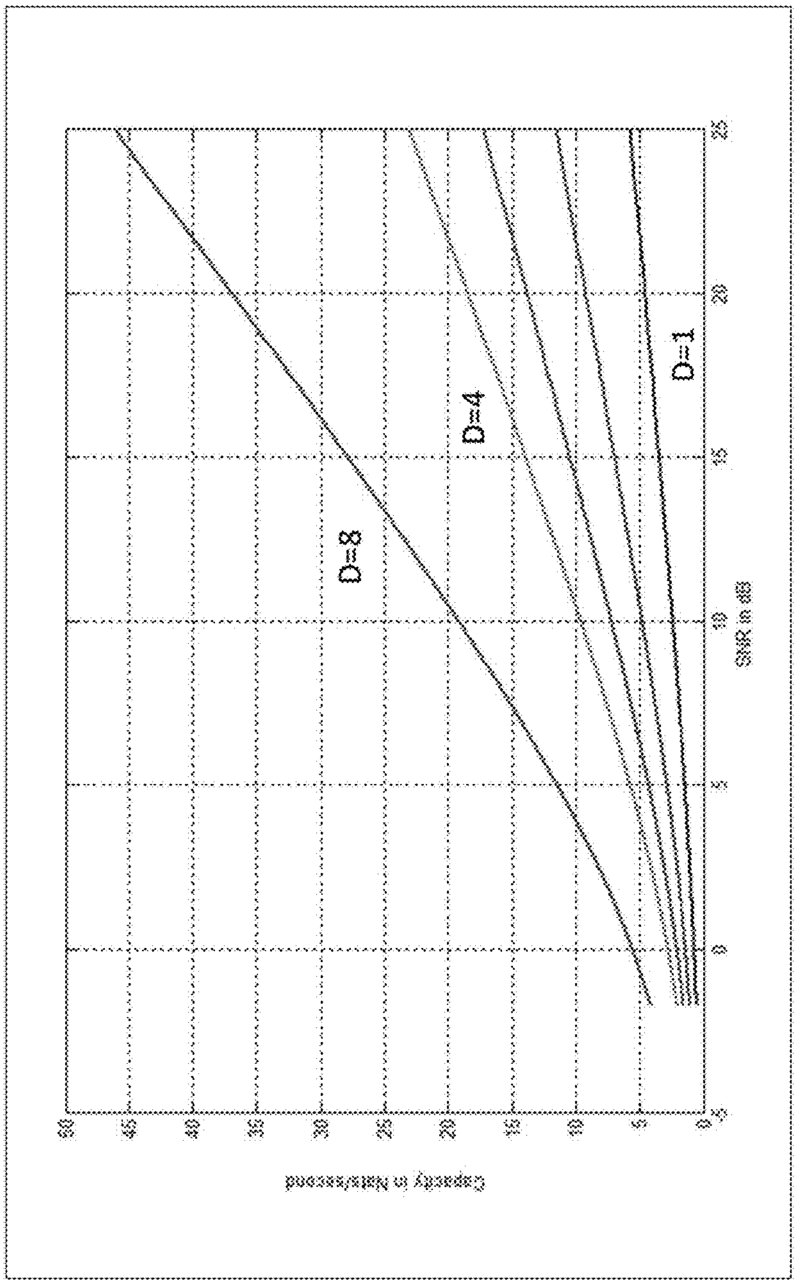
FIG. 43 is an illustration of a plot of capacity versus $\overline{\text{SNR}}$, in accordance with one or more embodiments.
Figure 44:
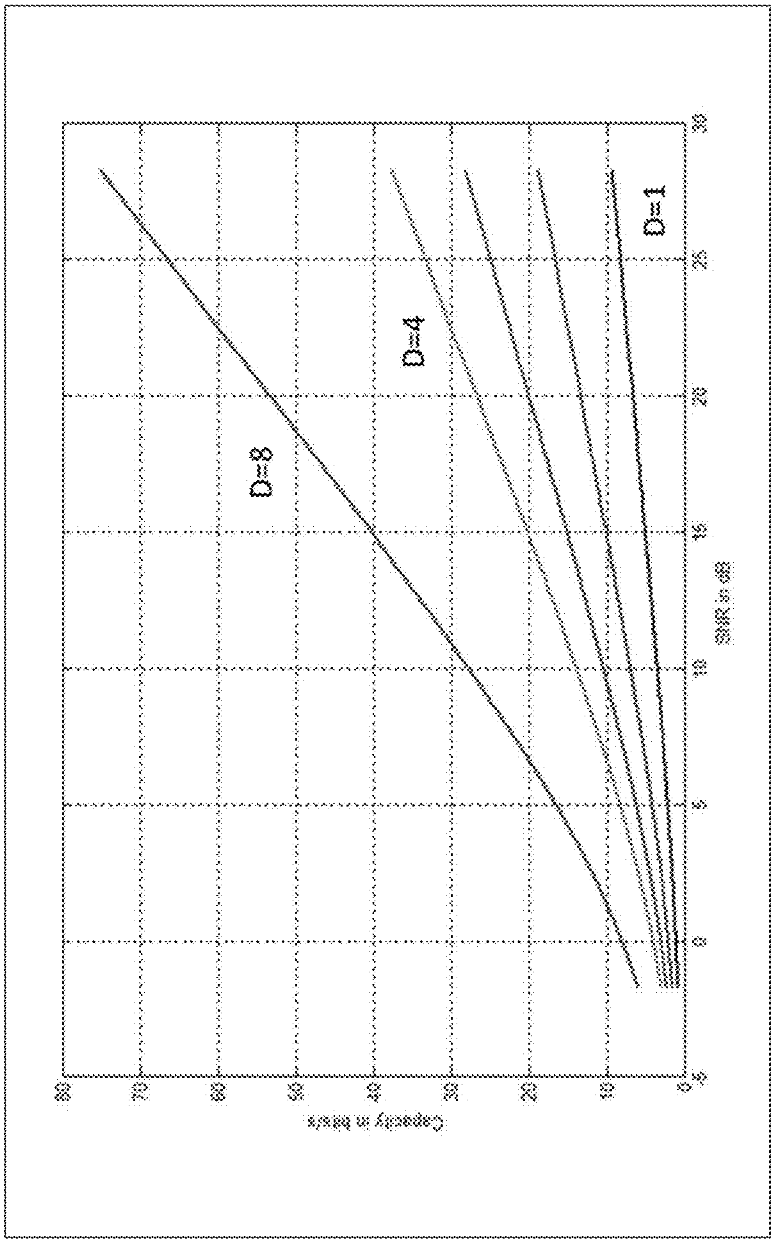
FIG. 44 is an illustration of a plot of capacity in bits/s versus $\overline{\text{SNR}}$, in accordance with one or more embodiments.

Capacity in nats per second and bits per second are plotted in FIGS. 43 and 44.

FIG. 43 illustrates a plot 4300 of capacity in nats/s versus $\overline{SNR}$ for a D dimensional link with a maximum velocity pulse profile, in accordance with one or more embodiments. Plot 4300 shows capacity in nats/s versus given the following parameters, PAER=10, $P_m$=1 J/s, m=1 kg, $f_s$=1.

FIG. 44 illustrates a plot 4400 of capacity in bits/s vs. $(SNR)^-$ for a D dimensional link given the following parameters, PAER=10, P_m=1 J/s, m=1 kg, f s=1 samp./s, B=0.5 Hz, D=1, 2, 3, 4, 8, in accordance with one or more embodiments.

The capacity for the case of a cardinal velocity pulse boundary condition follows the same form, but the SNR for a given $P_{m\_card}$ must necessarily adjust according to the relationships provided in Equations 4-26, 4-27, and 4-28. There it was illustrated that the energy increase on the average for the cardinal case is approximately 1.967 times that of a maximum nonlinear velocity pulse boundary condition. This factor ignores the precursor and post cursor tails of the maximum cardinal pulse profile. If the tails are considered then the factor is approximately equal to the peak power increase requirement. The peak power increase ratio for the cardinal profile is 2.158. This corresponds to the circumstance where the same R, must be spanned in an equivalent time while comparing the impact of the two prototype pulse profiles. Thus, roughly 3 dB more power is required by the cardinal profile to maintain a standard configuration span for a given time interval and capacity comparison.

4.3. Multi-Particle Capacity

Capacity for the multi-particle system is extensible from the single particle case. Comments are now expanded to non-interacting species of particles under the influence of independent forces with multiple internal degrees of freedom.

The form for the uncertainty function is given as a reference for μ species of particle, where the particle clusters might exhibit dynamics governed by μ Gaussian pdfs. Each cluster can comprise one or more particles. A general uncertainty function considers coordinates from all the particle clusters which can contain $\nu_\mu$ particles per cluster and $l_\mu$ states per particle and spatial dimensionality=1, 2 . . . D. Within each cluster domain, particles can swarm subject to a few constraints. One constraint is that particle collisions are forbidden. The total number of degrees of freedom, $\aleph$, can generally be considered as the product, $\aleph$ Dνμl, and for a single particle type with one internal state per sample, $\aleph$=D.

$$H_\Omega(q, p) = -\sum_1^{D}\sum_1^{\mu}\sum_1^{\ell_\mu}\sum_1^{\nu_\mu}\int\cdots\int\rho_\mu(q_{\nu,\ell}, p_{\nu,\ell})\ell n\rho_\mu(q_{\nu,\ell}, p_{\nu,\ell})\, d^{D\nu\mu}(q_{\nu,\ell})d^{D\nu\mu}(p_{\nu,\ell}) \quad \text{Equation 4-29}$$

The pdf for this form of uncertainty can be adjusted using the procedures previously discussed.

The normalization integral is integrated over all states within the D dimensional hyper-sphere where the lower and upper limits (ll,ul) are set according to the techniques presented in Section 3.

The capacity for a system with K equivalent degrees of freedom is simply $$C \le \sum_{i=1}^{\aleph}\frac{P_{m_\aleph}}{\langle\varepsilon_{k_\aleph}\rangle_s PAER_\aleph}(\ln[\overline{SNR}_{eq}+1]) \quad \text{Equation 4-30}$$

Energy is equally dispersed amongst all the degrees of freedom in equation 4-30.

Whenever $\aleph$ is not composed of homogeneous degrees of freedom, the form of 4-30 can be adjusted by calculating an $\overline{SNR}_{eq}$ from the amalgamation of particle diversities.

The multi-particle impact is an additional consideration which is important to mention at this point. The effect of particle number ν on the momentum and energy of a signal is as important as velocity. Energy and energy rate of signals is a central theme of legacy theories as well as the theories presented here. Modulation of momentum through velocity is emphasized for the present discussion. However, this presents the obvious challenge in the classical case because of the uncertainty ΔqΔp≥h. At the least, two factors which may accommodate this concern when particles are indistinguishable, are, $(\nu!h^{D\nu})^{-1}$ and m, where ν! is the Gibb's correction factor for counting states of indistinguishable particles. Mass m is extensive and therefore may represent a bulk of particles. Such a bulk at a particular velocity will have a greater momentum and kinetic energy as the mass (number of particles) increases. The same is true of charge. A multiplicity of charges in motion will proportionally increase momentum and the energies of interest both in terms of material and electromagnetic quantities. Hence, velocity is not the only means of controlling signal energy. The number of particles can also fluctuate whilst maintaining a particular velocity of the bulk. Such is the case for instance where current flow in an electronic circuit is modulated. The fundamental motions of electrons and associated fields can possess characteristic wave speeds in certain media yet the square of the number of wave packets per interval of time traversing a cross section of the media is a measure of the power in the signal. This means that counting particles and possibly additional particle states is every bit as important as acknowledging their individual momentums. Indeed, the probability density of numbers of particles possessing particular kinetic energies distributed in various degrees of freedom is the comprehensive approach. This requires specific detail of the physical phenomena involved, accompanied by greater analytic complexity.

5. Communications Process Energy Efficiency

This section discusses the efficiency of target particle motion within the phase space introduced in Section 3. Though we have a primary interest in Gaussian motion, the derived relationships for efficiency can be applied to any statistic given knowledge of the PAPR for the particle motions. This is a remarkable inherent characteristic of the TE relation.

The 1st Law of thermodynamics accounts for all types of energy conversions as well as exchanges and requires that energy is conserved in processes restricted to some boundary such as a closed system. One can account for energy at a specific time using simple equations such as:

$$\varepsilon_{tot} = \sum\varepsilon_{kin} + \sum\varepsilon_\varphi + \sum\varepsilon_{elec.} + \sum\varepsilon_{mag.} + \ldots + U \quad \text{Equation 5-1}$$

$$\varepsilon_{tot} = \sum\varepsilon_e + \sum\varepsilon_w + \sum\varepsilon_\varphi + U$$

In this representation, energy is effectively utilized, $\varepsilon_e$, wasted, $\varepsilon_w$, or potential, $\varepsilon_\varphi$. U is defined as the internal system energy. All forms of energy may be included in this accumulation, such as chemical, mechanical, electrical, magnetic, thermal, etc.

δQ is an incremental amount of energy acquired from a source to power an apparatus and δW is an incremental quantity of work accomplished by an apparatus. A change in the total internal energy of a closed system can be given in terms of heat and work as:

$$\Delta U = Q - W$$

$$dU = \delta Q - \delta W \quad \text{Equation 5-2}$$

This equation is useful for general purpose. dU is an exact differential and is therefore independent of the procedure required for exchange of heat and work between the apparatus and environment.

For a system in isolation, the total energy and internal energy are equivalent. Using this definition enables several interchangeable representations which will be employed from time to time depending on circumstance.

$$Q - W = \Sigma\Delta\varepsilon_e + \Sigma\Delta\varepsilon_w + \Sigma\Delta\varepsilon_\varphi$$

$$\Delta\varepsilon_{tot} = Q - (W_{effective} + W_{waste})$$

$$\varepsilon_{tot} = \varepsilon_e + \varepsilon_w + \varepsilon_\varphi = \varepsilon_\varphi \mp \varepsilon_k \quad \text{Equation 5-3}$$

$\varepsilon_k$ and $\varepsilon_y$, are kinetic and potential energies respectively. One can account for the various quantities using the most convenient formulation to fit the circumstance and a suitable sign convention for the directional flow of work when the energy varies with time. Negative work means that the apparatus accomplishes work on its environment. Positive work means that the environment accomplishes work on the apparatus. Work forms of energy exchange such as kinetic for example or a charge accelerated by an electric field can be effective or waste. Thus, the change in total energy of a system can be found from, Q, the energy supplied and, W, the work accomplished with sign conventions determined by the direction of energy and work flow. The forms of energy exchanged for work in equation 5-3 is a form of the work energy theorem.

It is also desirable to define energy efficiency consistent with the second law of thermodynamics. The consequence of the second law is that efficiency $\eta \leq 1$ where the equality is never observed in practice. The tendency for waste energy to be translated to heat, with an increase of environmental entropy, is also a consequence of the second law. $\varepsilon_w$ reduces to heat by various direct and indirect dissipative mechanisms. Directly dissipative refers to the portion of waste originating from particle motion and described by such phenomena including, drag, viscous forces, friction, electrical resistance etc. indirectly dissipative or ancillary dissipative phenomena, in a communications process, are defined as those inefficiencies which arise from the necessary time variant potentials synthesizing forces to encode information.

As will be illustrated, momentum exchange between particles of an information encoding mechanism possess overhead as uncertainty of motion increases. The overhead cannot be efficiently recycled and significant momentum must be discarded as a byproduct of encoding. $\varepsilon_e$ is the deliverable portion of energy to a load which evolves through the process of encoding. $\varepsilon_w$ is generated by the absorption of overhead momentum into various degrees of freedom for the system, including modes which increase the molecular kinetic energy of the apparatus constituents. This latter form is generally lost to the environment, eventually as heat.

The equation for energy efficiency can be written as;

$$\begin{aligned}\langle\eta\rangle &= \frac{\langle\varepsilon_e\rangle}{\langle\varepsilon_e\rangle+\langle\varepsilon_w\rangle} \\ &= \frac{\langle\varepsilon_e\rangle}{\langle\varepsilon_{in}\rangle} \leq \frac{P_{out}}{P_{in}}\end{aligned} \quad \text{Equation 5-4}$$

$$\frac{P_{out}}{P_{in}}$$

represents a familiar definition for efficiency often utilized by engineers. In this definition, the output power from an apparatus is compared to the total input power consumed to enable the apparatus function. The proper or effective output power, $P_e$, is the portion of the output power which is consistent with the defined function of the apparatus and delivered to the load. Usually, one is concerned with the case where $P_{out}=P_e$. This definition is important so that waste power is not incidentally included in $P_{out}$.

In subsequent discussion the phase space target particle is considered as a load. Its energy consists of $\varepsilon_e$ and $\varepsilon_w$ corresponding to desired and unwanted kinetic energies, respectively. Not only are there imperfections in the target particle motion, but there will be waste associated with the conversion of a potential energy to a dynamic form. This conversion inefficiency may be modeled by delivery particles which carry specified momentum between a power source and the load. Thus, the inefficiencies of encoding particle motion are distributed within the encoding apparatus where ever there is a possibility of momentum exchange between particles.

5.1. Average Thermodynamic Efficiency for a Canonical Model

Consider the basic efficiency definition using several useful forms including the sampled TE relation from Section 3 (eq. 3-42):

$$\begin{aligned}\langle\eta\rangle &= \frac{\langle\varepsilon_e\rangle}{\langle\varepsilon_e\rangle+\langle\varepsilon_w\rangle} \\ &= 1-\frac{\langle P_w\rangle}{\langle P_{in}\rangle} \\ &= \frac{\langle P_e\rangle}{\langle P_{in}\rangle} \\ &= \frac{P_{m_e}}{f_s\langle\varepsilon_{in}\rangle_s PAPR_e}\end{aligned} \quad \text{Equation 5-5}$$

In terms of apparatus power transfer from input to output;

$$\begin{aligned}&\langle P_{in}\rangle\langle\eta\rangle = \langle P_e\rangle \\ &f_s\langle\varepsilon_{in}\rangle_s\langle\eta\rangle = \frac{P_{m_e}}{PAPR_e} = \langle P_e\rangle\end{aligned} \quad \text{Equation 5-6}$$

$\langle\varepsilon_{in}\rangle_s$ is defined as the average system input energy per sample, given the force sample frequency $f_s$ obtained in Section 3. In systems which are 100 percent efficient, the effective maximum power associated with the signal, $P_{m_e}$, and maximum power required by the apparatus, $P_m$, are equivalent. In general though, $P_m \geq P_{m\_e}$ or $P_m=P_{m\_e}/\eta$, where, $$P_m = \max\left\{\frac{d}{dt}\varepsilon_{in}\right\}.$$

In both 5-5 and 5-6 we recognize that $PAPR_e$ is inversely proportional to efficiency.

Figure 45:
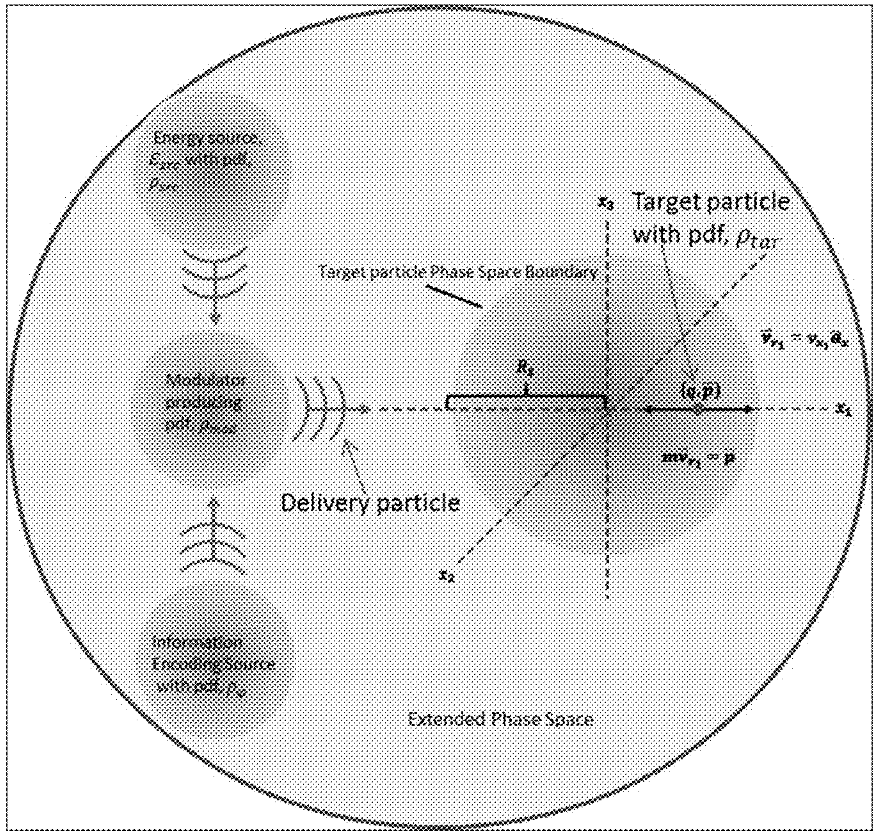
FIG. 45 is an illustration of an extended encoding phase space, in accordance with one or more embodiments.

The phase space model is now extended to facilitate a discussion concerning the nature of momentum exchange which stimulates target particle motion. FIG. 45 illustrates an extended encoding phase space 4500 in accordance with one or more embodiments. FIG. 45 shows the relationship between the several functions; information encoding/modulation, power source and target particle phase space. As a whole, this could be considered as a significant portion of a transmitter phase space for an analogous communications system.

The information source possesses a Gaussian statistic of the form introduced in Section 3. It provides instruction to internal mechanisms which convert potential energy to a form suitable to encode the motion of particles in the target phase space. The interaction between the various apparatus segments can be through fields or virtual particles which convey the necessary forces. The energy source for accomplishing this task, illustrated in a separate sub phase space, is characterized by its specific probability density for particle motions within its distinct boundaries. $\varepsilon_{src}$ is used as the resource to power motions of particles comprising the apparatus. A modulator is required which encodes these particles with a specific information bearing momentum profile. As a consequence, delivery particles or fields recursively interact with the target particle imparting impulsive forces at an average rate greater than or equal to $f_{s\_min}$. The sculpting rate of the impulse forces may be much greater than the effective sample rate $f_s$ for detailed models. However, when $f_s$ is used to characterize the signal samples it is understood that a single equivalent impulse force per sample at the $f_s$ frequency may be used, provided the TE relation is regarded.

Figure 46:
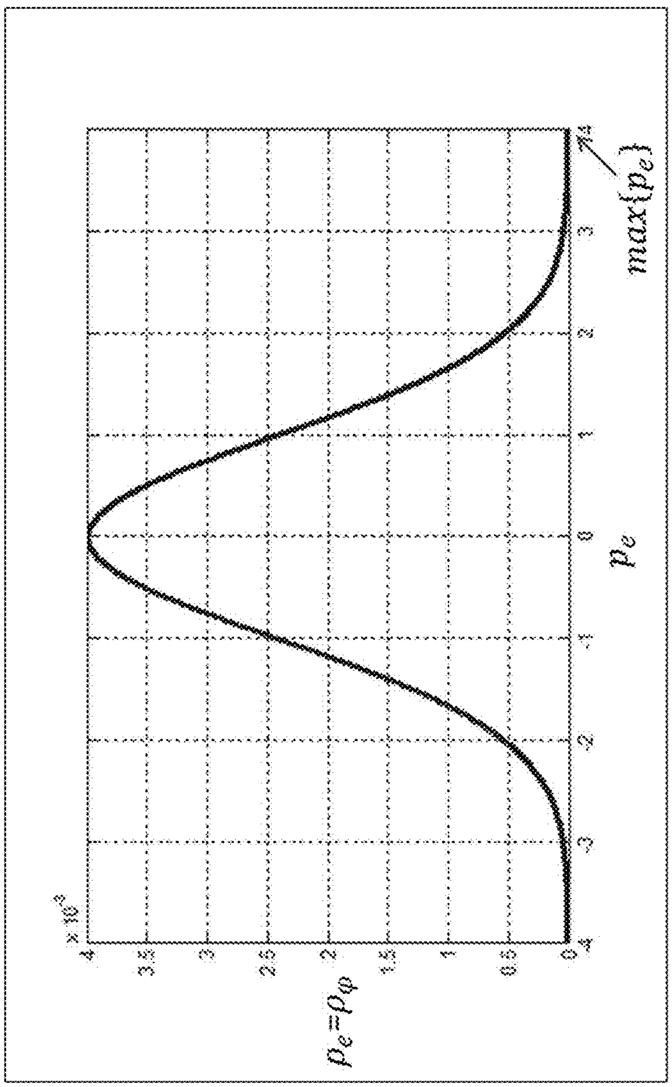
FIG. 46 is an illustration of a plot of a desired target particle momentum statistic, in accordance with one or more embodiments.

FIG. 46 illustrates a plot 4600 of a desired target particle momentum statistic $\rho_\varphi=\rho_e$, in accordance with one or more embodiments.

Figure 47:
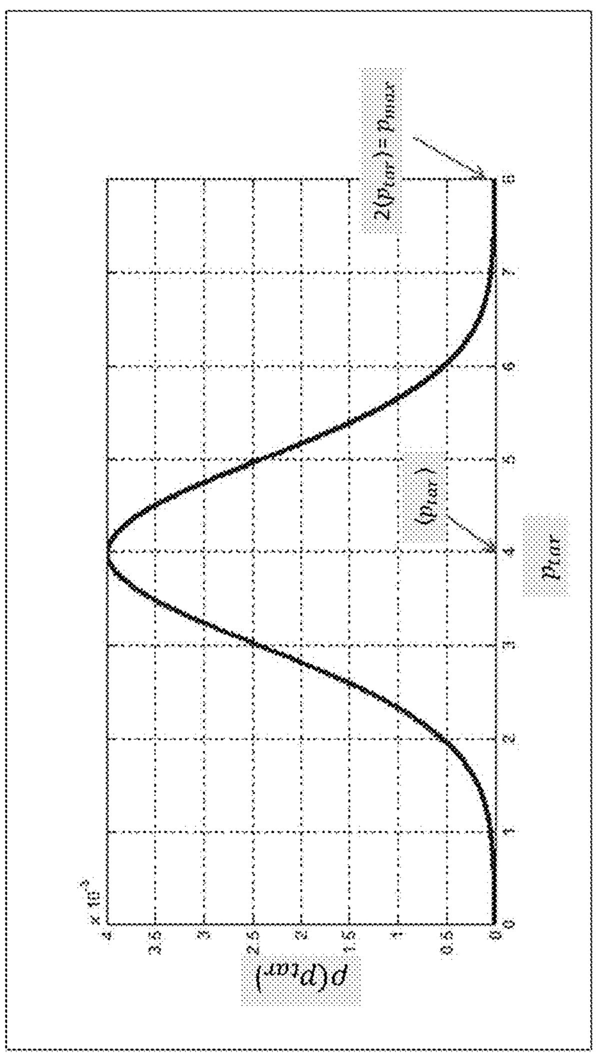
FIG. 47 is an illustration of a plot of an actual target particle statistic, in accordance with one or more embodiments.

FIG. 47 illustrates a plot 4700 of an actual target particle statistic $\rho_{tar}$, in accordance with one or more embodiments.

Figure 48:
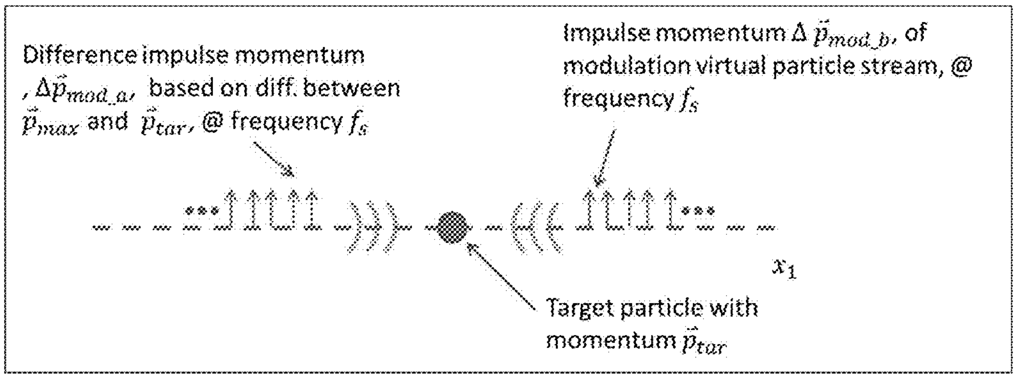
FIG. 48 is an illustration of a model for encoding particle motion, in accordance with one or more embodiments.

FIG. 48 illustrates a model 4800 for encoding particle motion, in accordance with one or more embodiments. All particles of this model are ballistic and possess the same mass.

There are two delivery particle streams illustrated in FIG. 48, oriented along the $x_1$ axis. Such an arrangement could be deployed for generating motion along the $x_2$ and $x_3$ axes as well. The $1^{th}$ momentum impulse $(\Delta\vec{p}_{mod\_a})_l$ from a successive non-interacting stream of delivery particles accelerates the target particle to the right (positive $x_1$ direction). The modulation impulse stream. $\Delta\vec{p}_{mod\_b}$ decelerates the target particle through application of forces in the negative direction. These two opposing streams interact with the target particle at regular intervals, $\sim\Delta T_s$, though their relative interactions may not be perfectly synchronized. That is, the opposing particle streams can possess some relative small time offset $\Delta t_\varepsilon \ll \Delta T_s$. The domains for the impulse momenta are:

$$0 \le \Delta p_{mod_a} \le \Delta p_{max}$$

$$0 \ge \Delta p_{mod_b} \ge \Delta p_{max}$$

In the absence of $\Delta\vec{p}_{mod\_b}$ the particle accelerates up to a terminal velocity $\vec{v}_{max}$ and can no longer be accelerated whenever $\vec{p}_{tar} \ge \vec{p}_{max}$. $\vec{p}_{max}$ is a boundary condition inherited from the phase space model of chapter 3. The finite power resource $P_m$ limits the maximum available momentum, system wide. The finite limit of the velocity due to forward acceleration can be deduced through the difference equation:

$$\Delta\vec{p}_{(mod_a)_l} = \left(\vec{p}_{max} - \Delta\vec{p}_{tar_{l-1}}\right)_l \qquad \text{Equation 5-7}$$

$$\Delta\vec{p}_{(mod_a)_l} = \left(\vec{p}_{max}\left[\left(1 - \frac{\Delta\vec{p}_{tar_{l-1}}}{\vec{p}_{max}}\right)\right]\right)_l$$

where $\vec{p}_{tar_{l-1}} \ge 0$. Thus, the impulse momentum of the delivery particle at the $1^{th}$ sample is a function of the maximum available momentum and the prior target particle momentum. The output differential momentum is given by:

$$\Delta\vec{p}_{tar_l} = \Delta\vec{p}_{(mod_a)_l} + \Delta\vec{p}_{(mod\_b)_l} \qquad \text{Equation 5-8}$$

The output momentum at the $1^{th}$ sample is obtained by:

$$\vec{p}_{tar_l} = \int_{T_s(l-1)}^{T_s(l)} \Delta\vec{p}_{tar_l}\,\delta(t - T_s(l-1))\,dt + \vec{p}_{tar_{l-1}} \qquad \text{Equation 5-9}$$

Equation 5-9 indicates that an impulse momentum weighted by $\Delta\vec{p}_{tar_l}$ is imparted during the sampling interval to generate a new momentum value $\vec{p}_{tar_l}$ when summed to the initial condition $\vec{p}_{tar_{l-1}}$. The target particle momentum samples at the $1^{th}$ and $(1-1)^{th}$ are Gaussian and statistically independent by definition. Therefore, $\Delta\vec{p}_{(mod\_a)_l}$ and $\Delta\vec{p}_{(mod\_b)_l}$ are also independent in this case. However, careful review of FIGS. 50, 51, and 54 in the following simulation records, illustrate that these waveforms are inverted with respect to one another and delayed by one sample. The inversion follows since one waveform is associated with acceleration and one with deceleration. If not for the delay of one cycle, these signals would be anti-correlated, a consequence of Newton's third law and momentum conservation.

Figure 49:
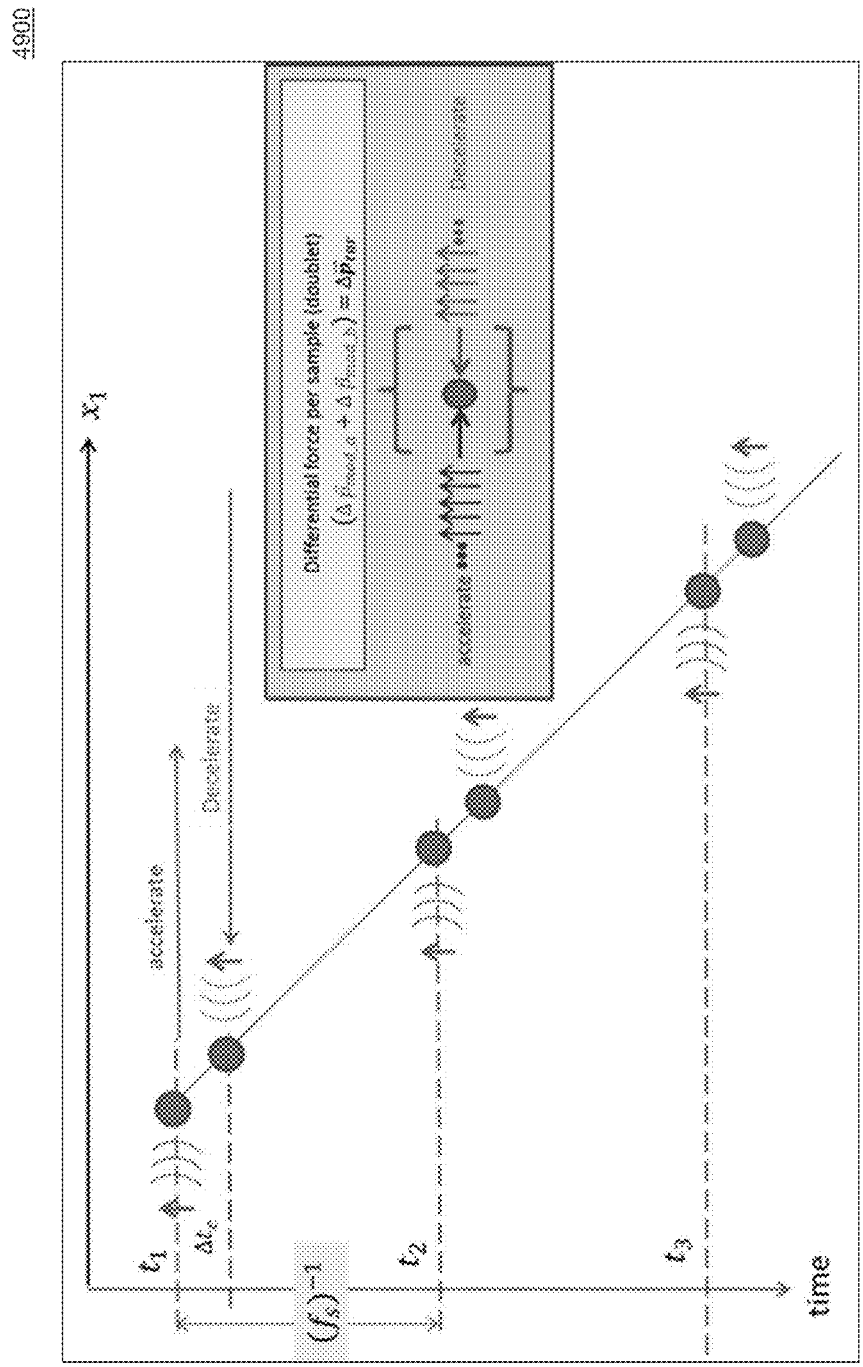
FIG. 49 is an illustration of a momentum exchange diagram, in accordance with one or more embodiments.
Figure 50:
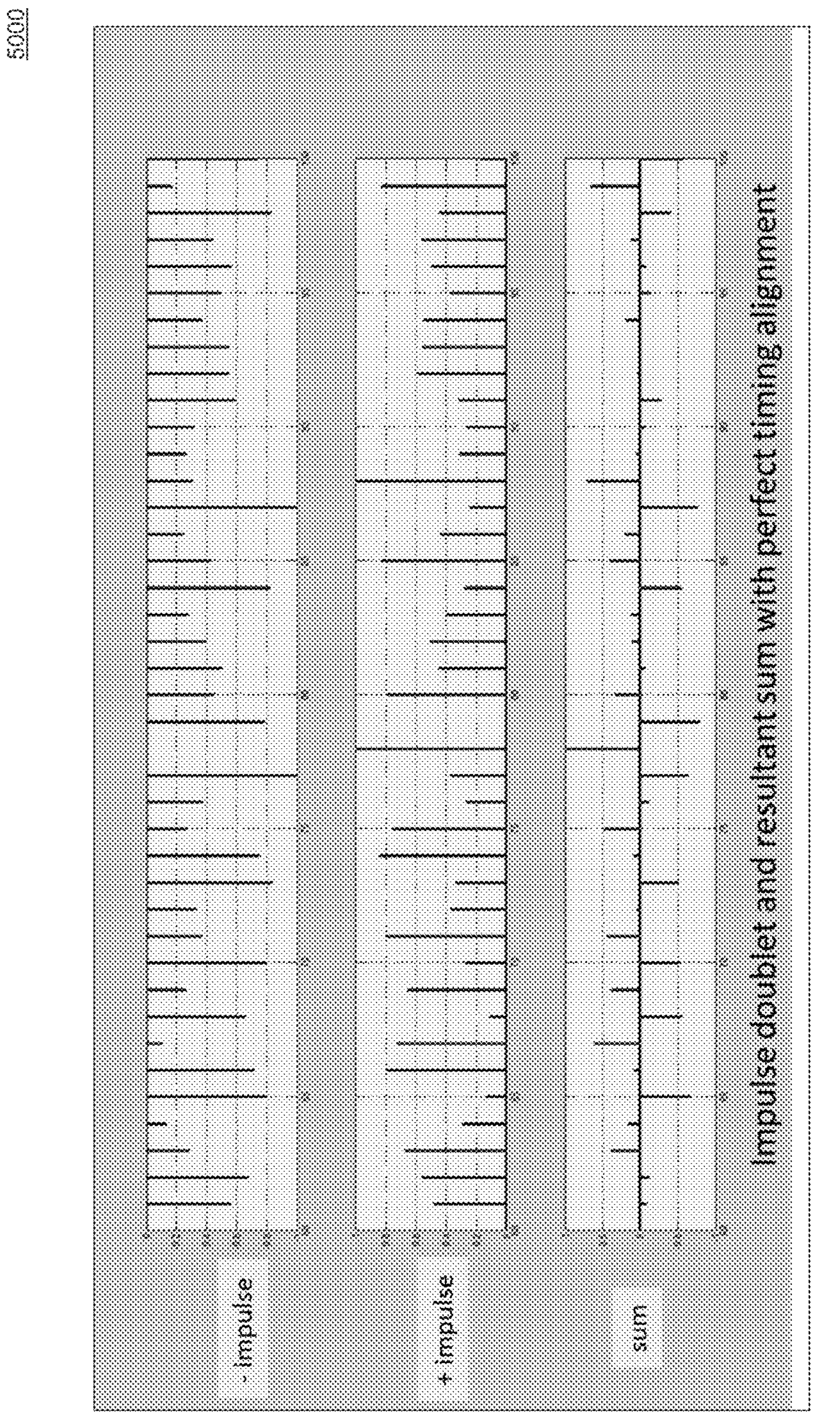
FIG. 50 is an illustration of a plot of encoding particle stream impulses, in accordance with one or more embodiments.
Figure 51:
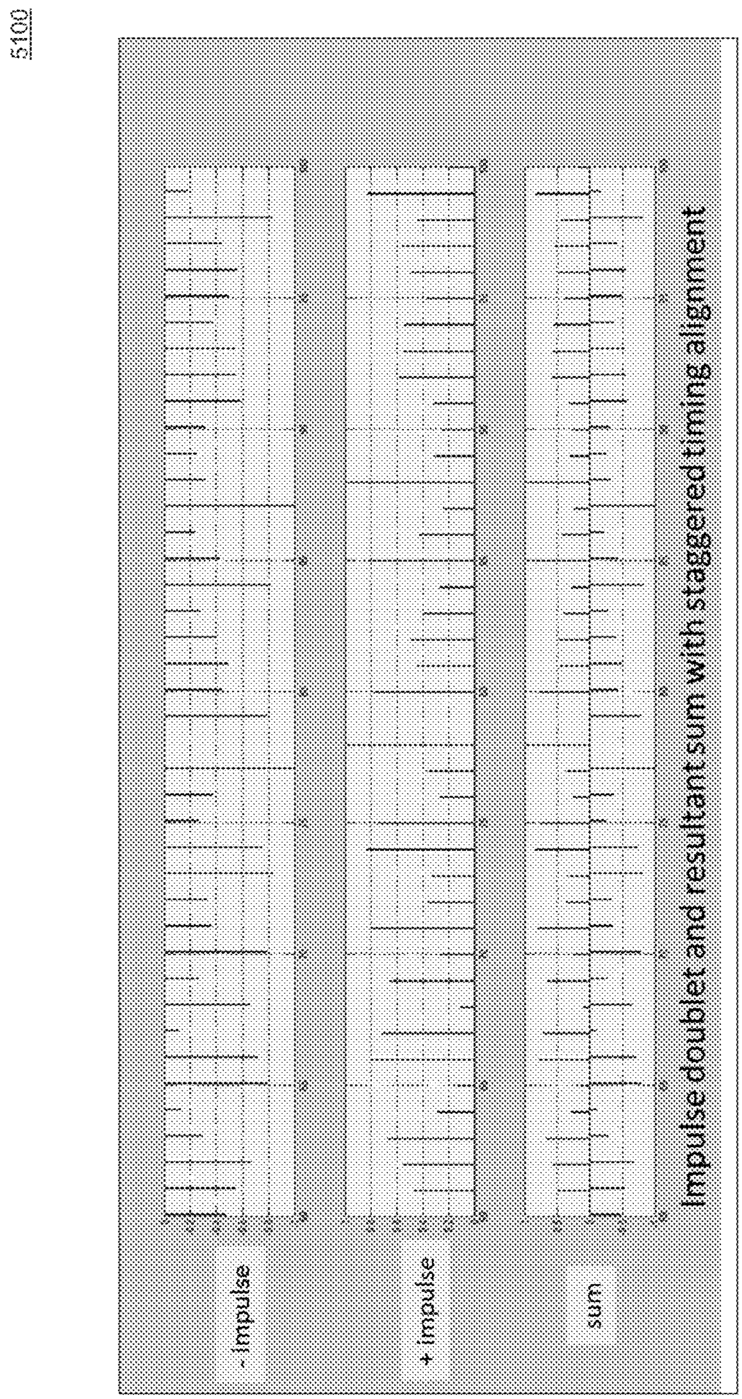
FIG. 51 is an illustration of a plot of encoding particle stream impulses, in accordance with one or more embodiments.

FIG. 49 illustrates a momentum exchange diagram 4900, in accordance with one or more embodiments. Momentum exchange diagram 4900 illustrates the successive interaction of modulation delivery and target particles. Interactions are realized via impulse doublets. Impulses forming the doublets may be slightly skewed in time by $\Delta t_\varepsilon$ seconds and the doublets are separated by a nominal $t_s=\Delta t/2$ seconds corresponding to a sampling interval. The target particle may possess a nonzero average drift velocity along $x_1$. FIGS. 50 and 51 illustrate plots 5000 and 5100 of the input and output impulses related to the interactions for the cases where $\Delta t_\varepsilon=0$ and it $\Delta t_\varepsilon\neq0$ respectively, in accordance with one or more embodiments. The error in timing alignment does not affect motion appreciably at the time scale of interest because $\Delta t_\varepsilon$ is much less than the nominal sampling time interval separating doublets. The integral of equation 5-8 suppresses the effect of a it offset.

Figure 52:
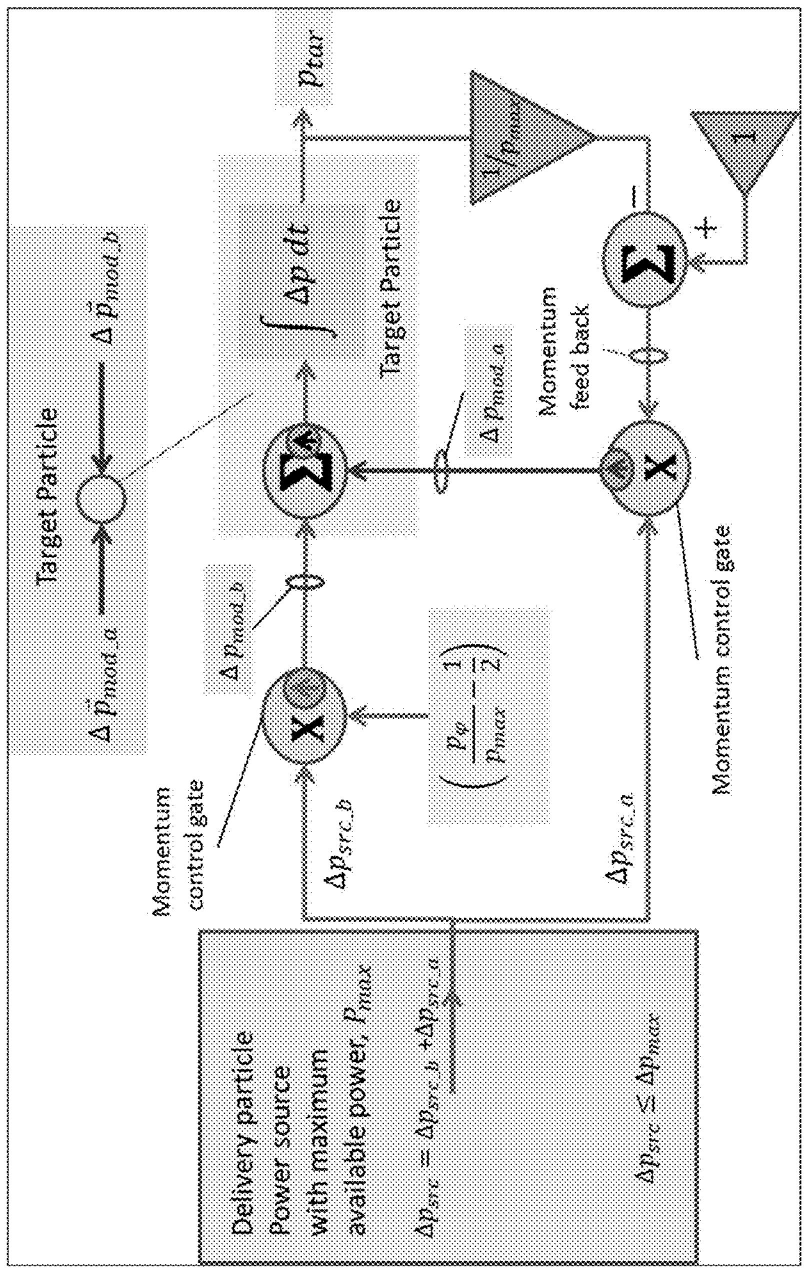
FIG. 52 is an illustration of a block diagram of a particle encoding simulation, in accordance with one or more embodiments.

FIG. 52 illustrates a block diagram 5200 of a particle encoding simulation, in accordance with one or more embodiments. Block diagram 5200 is suitable for simulating the particle motion.

Figure 53:
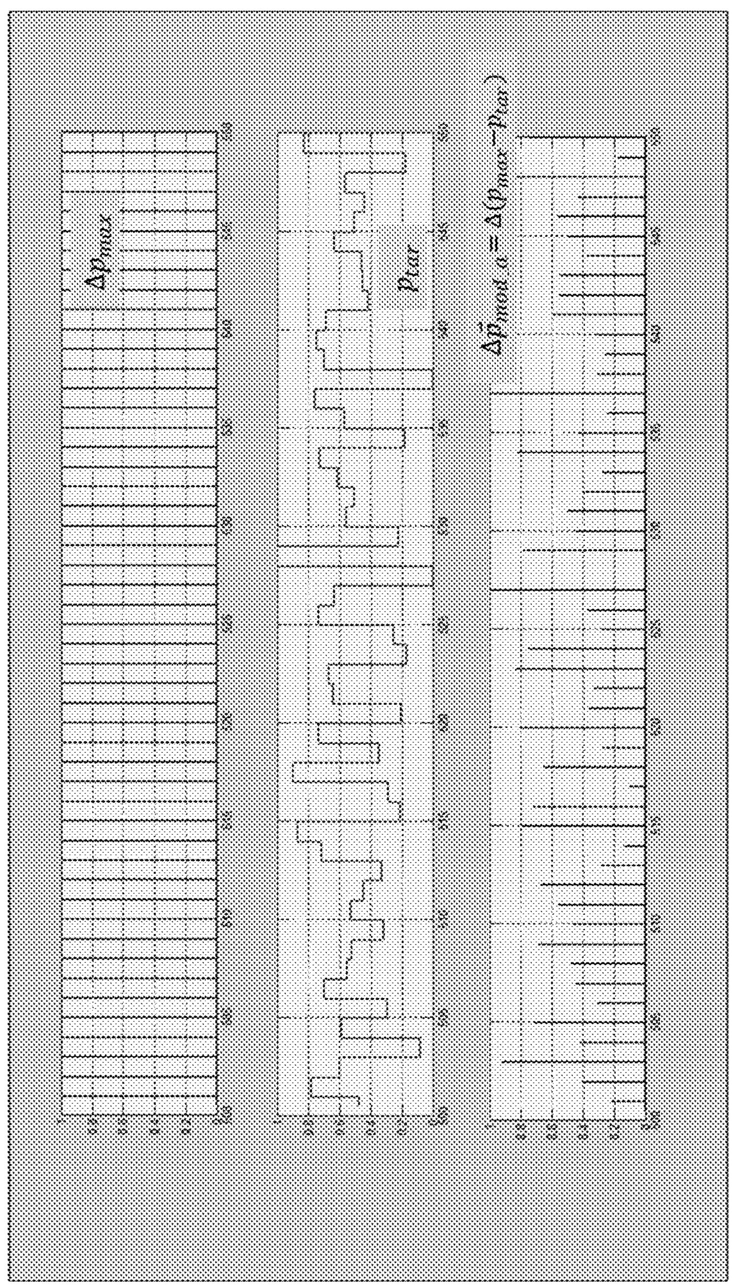
FIG. 53 is an illustration of a plot of simulation signals and waveforms, in accordance with one or more embodiments.
Figure 54:
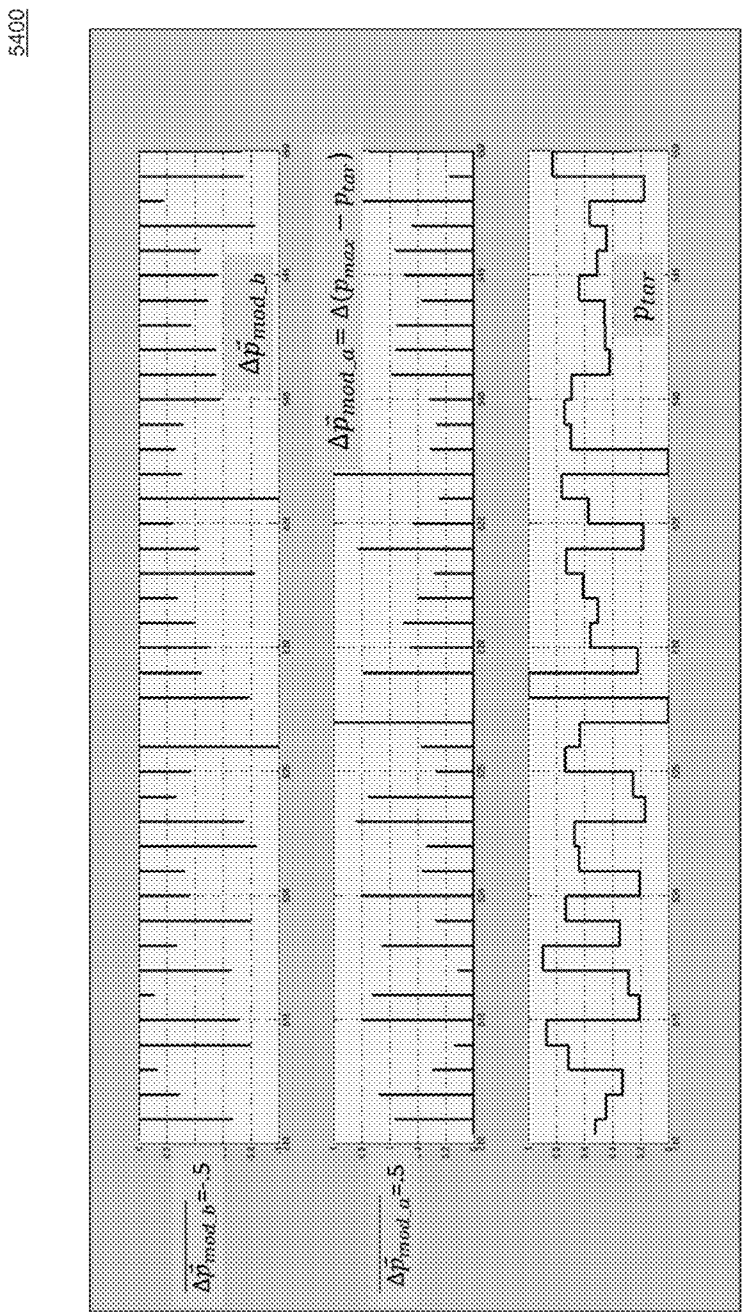
FIG. 54 is an illustration of a plot of simulation signals and waveforms, in accordance with one or more embodiments.
Figure 55:
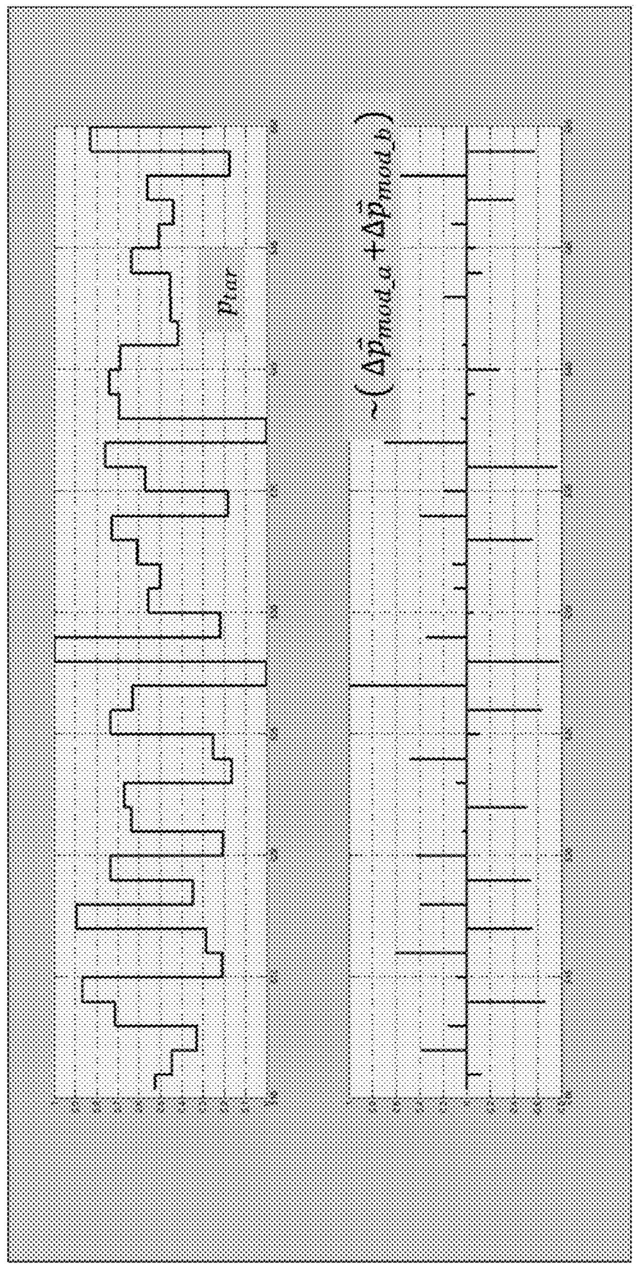
FIG. 55 is an illustration of a plot of simulation signals and waveforms, in accordance with one or more embodiments.

FIGS. 53-55 illustrate plots 5300, 5400, and 5500 of various signals and waveforms associated with the simulation model of FIG. 52, in accordance with one or more embodiments. $T_s$ equals 1 in these simulations.

Figure 56:
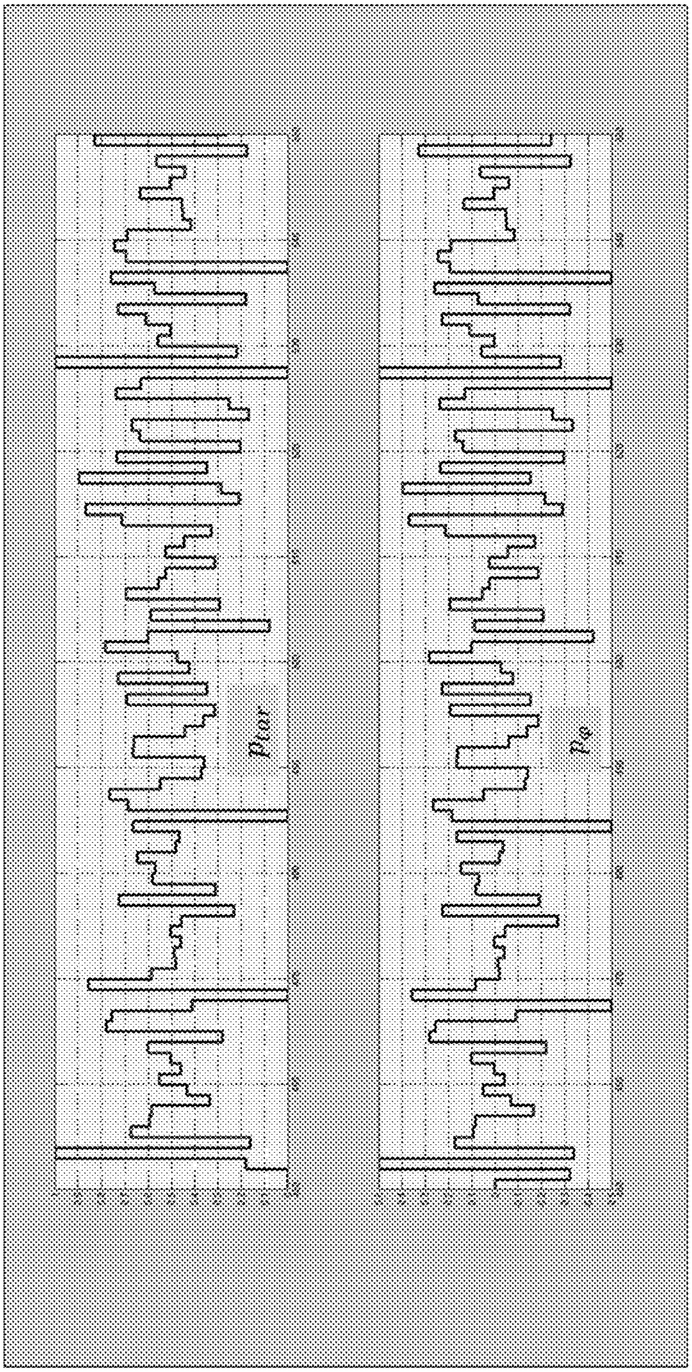
FIG. 56 is an illustration of a plot of an encoded output and an encoded input, in accordance with one or more embodiments.

FIG. 56 illustrates a plot 5600 of an encoded output and an encoded input, in accordance with one or more embodiments. FIG. 56 confirms the reproduction of the input signal $p_\varphi$ in the form $p_{tar}$ at the target particle, albeit with an offset. The startup transient near time sample 450 confirms the nature of the feedback convergence of the model. In addition, there is a one sample delay.

Referring back to FIG. 52, the momentum transfers from the power source through two branches labeled $p_{src\_a}$ and $p_{src\_b}$. The maximum power transfer from the power source is less than or equal to $P_{max}$. The momentum flows through these supply paths metered by the illustrated control functions. Due to symmetry, each input supply branch possesses the same average momentum transfer and energy consumption statistics though the instantaneous values fluctuate. In the $\Delta p_{src\_b}$ path, momentum is controlled by an input labeled $$\left(\frac{p_\varphi}{p_{max}} - \frac{1}{2}\right).$$

This unit-less control gates effective impulse momentum $\Delta p_{src\_b}$ through to the branch segment labeled $\Delta p_{mod\_b}$ such that $$\Delta p_{src\_b} \sim \Delta p_{mod\_b} = \Delta\left(p_\varphi - \frac{p_{max}}{2}\right),$$

causing deceleration. It is a virtually lossless operation analogous to a sluice gate metering water flow supplied by a gravity driven reservoir. Impulse momentum $\Delta p_{src\_a}$ is formed from the difference of the maximum available momentum $p_{max}$ and target particle momentum $p_{tar}$ as indicated by equation 5-7, 5-8. This is a feedback mechanism built into nature through the laws of motion. This feedback control meters the gating function channeling the resource $\Delta p_{src\_a}$ to generate $\Delta p_{mod\_a}$, which in turn causes forward acceleration. The gating process in the feedback path is virtually 100 percent efficient so that $\Delta p_{src\_a} \sim \Delta p_{mod\_a}$.

Two input/delivery particle streams is calculated from corresponding cumulative kinetic energy differentials over n exchanges.

$$\langle \Delta \varepsilon_k \rangle_{in} = \langle \Delta \varepsilon_k \rangle_{mod_a} + \langle \Delta \varepsilon_k \rangle_{mod_b} \qquad \text{Equation 5-10}$$

$$\langle \Delta \varepsilon_k \rangle_{in} \cong \frac{1}{(2m)n} \sum_{l=1}^{n} \Delta \vec{p}^{\,2}_{(mod_a)_l} + \frac{1}{(2m)n} \sum_{l=1}^{n} \Delta \vec{p}^{\,2}_{(mod_b)_l}$$

$$\langle \Delta \varepsilon_k \rangle_{in} \cong \frac{1}{(2m)n} \sum_{l=1}^{n} (\Delta [p_{max} - p_{tar_{l-1}}])^2 + \frac{1}{(2m)n} \sum_{l=1}^{n} \left(\Delta\left[\frac{p_{max}}{2} - P_{\varphi_l}\right]\right)^2$$

$$\langle \Delta \varepsilon_k \rangle_{in} \cong \frac{1}{(2m)n} \sum_{l=1}^{n} \left(\Delta\left[\frac{p_{max}}{2} - P_{\varphi_l}\right]\right)^2 + \frac{1}{(2m)n} \sum_{l=1}^{n} \left(\Delta\left[\frac{p_{max}}{2} - P_{\varphi_l}\right]\right)^2$$

$$\sim 2\left\langle \left(\left[\frac{p_{max}}{2} - P_{\varphi_l}\right]\right)^2 \right\rangle$$

The time average and statistical average are approximately equal for a sufficiently large n, the number of sample intervals observed for computing the average. The final two lines of eq. 5-10 were obtained by substitution of the relevant pdf definitions for $p_\varphi$ and $p_{tar}$ (see FIGS. 46 and 47). Each average can be obtained from the sum of the variance and mean squared, recognizing that the relevant power statistic for both input impulse streams is also given by a non-central Gamma probability density (see Section 10.8). Hence, $$\langle \Delta \varepsilon_k \rangle_{in} = 2\left(P_{m_e} + \frac{\sigma_\varphi^2}{2m}\right)\sigma_e^2 \qquad \text{Equation 5-11}$$

$$= \frac{1}{2m}\sigma_\varphi^2$$

$$P_{m_e} = \frac{1}{2m}\left(\frac{p_{max}}{2}\right)^2$$

The effective output power is by definition $\sigma_e^2$ and $\sigma_\varphi^2$ is the information momentum pdf of interest. The maximum waveform momentum $p_{max}$, in equation 5-11 is twice that of the effective signal momentum. Therefore the efficiency is given by:

$$\eta = \frac{P_e}{P_{in}} \qquad \text{Equation 5-12}$$

$$= \frac{\sigma_e^2}{2(P_{m_e} + \sigma_e^2)}$$

-continued $$= \frac{1}{2(PAPR_e + 1)}$$

For large information capacity signals, the efficiency is approximately $(2PAPR_e)^{-1}$. This result can also be deduced by noticing that the total input power to the encoding process is split between delivery particles and the target particle. This power may be calculated by inspecting FIGS. 46 and 47. The target particle power in this process can be calculated from a non-central Gamma RV applied to FIG. 47 or simply obtained from inspection as $P_{tar}=P_e+P_w=\sigma_e^2+P_{m\_e}$. In the example provided, the delivery particles recoil, which is a form of overhead. The statistic of this recoil momentum is identical to the statistic of FIG. 47 which can be reasoned from the principle of momentum conservation and Newton's laws. Hence, the input power due to conveyed momentum in the exchange and the recoil momentum, is simply $P_{in}=2(\sigma_e^2+P_{m\_e})$. The effective output power of the target particle is defined as $\sigma_e^2$ and so equations 5-11, 5-12 are justified by inspection.

Figure 57:
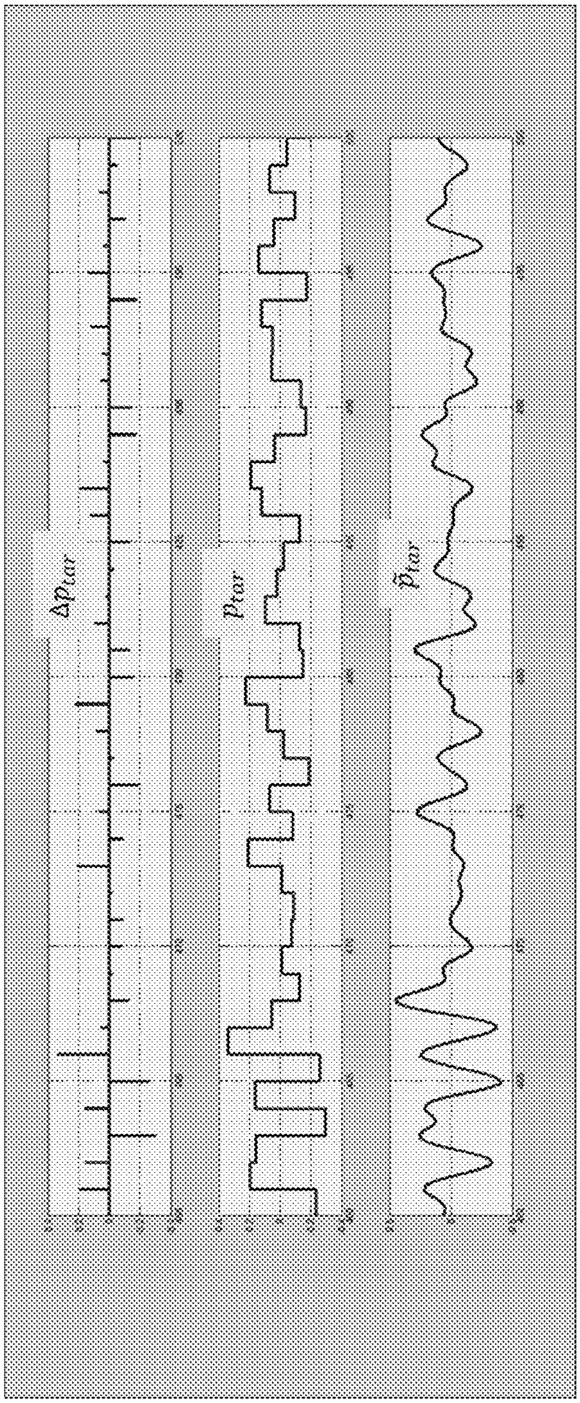
FIG. 57 is an illustration of a plot of a momentum change, in accordance with one or more embodiments.

FIG. 57 illustrates a plot 5700 of an analytic version of $p_{tar}$ without offset, in accordance with one or more embodiments. $\tilde{p}_{tar}=\Delta p_{tar}*h_t$ is a filtered version of $\Delta p_{tar}$ which corresponds with the result discussed in section 3.1.8. $h_t$ is an effective impulse response for the system created by integrating acceleration and additional non dissipative mechanisms which smooth the particle motion. An analytic boundary condition is obtained by complying with the TE relation and using the methods disclosed in Section 3. The effective impulse response could be due to some apparatus network of mass, springs and shock absorbers operating on the impulses. The analog for an electronic communications system is obvious where a preferred form of $h_t$ could be implemented by capacitors and inductors organized to enable a raised cosine or other suitable filtered impulse response. In addition, the effect of $P_m$ via the TE relation could be used to smooth the delivery particle forces.

FIG. 52 shows what is considered to be the offset canonical model because of the offset in $p_{tar}$ of the output waveform of FIG. 56. The offset canonical model is a closed system model because the target particle momentum is not transferred beyond the boundary of the target phase space. However, in a communications scenario, this momentum must also transfer beyond the target particle phase space by some means. In electronic applications, the momentum is primarily transferred through the additional interaction of electromagnetic fields.

Suppose that the model of FIG. 52 is adjusted to reflect the transfer of momentum from the target particle sample by sample to some load outside of the original target particle phase space. In this circumstance, the feedback is no longer active, because $p_{tar}$ is effectively regulated sample to sample by transfer of momentum to another load, ensuring a peak target particle velocity which resets to some average value just prior to subsequent input momentum exchanges from delivery particles. This model variation is referred to as an open system canonical model and illustrated in FIG. 58.

Figure 58:
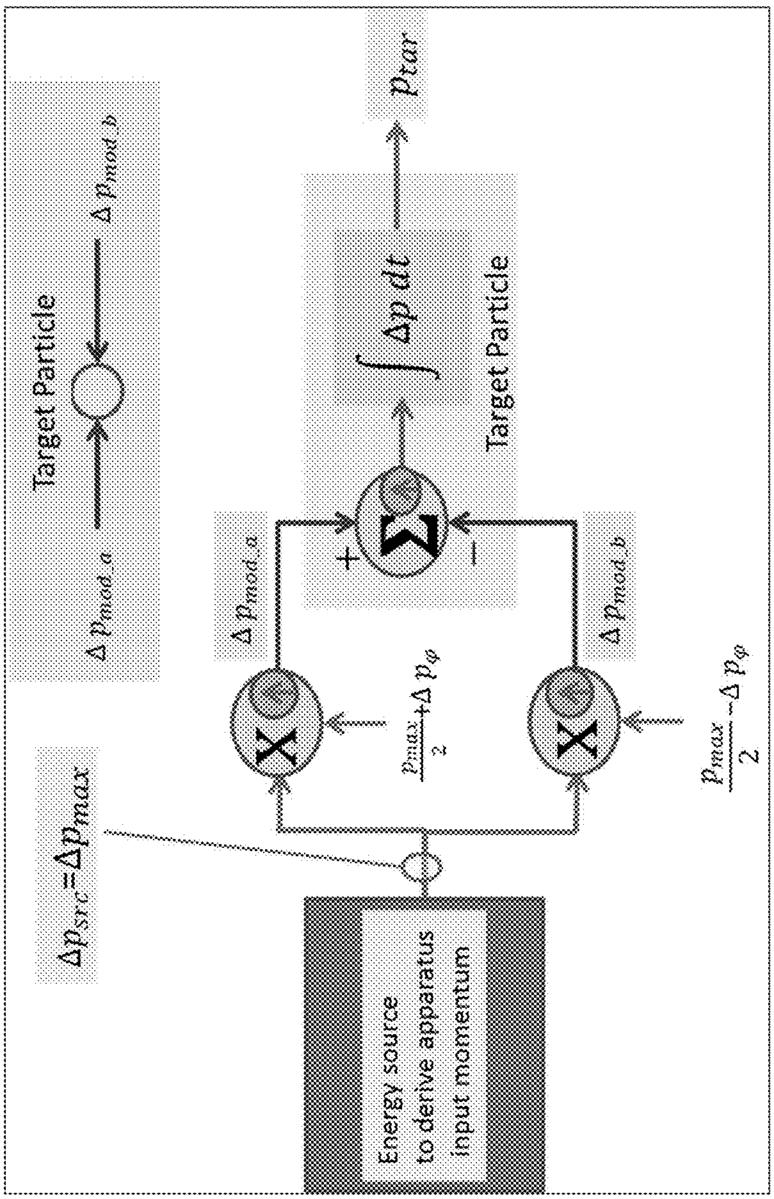
FIG. 58 is an illustration of a block diagram of a zero offset open system canonical simulation model, in accordance with one or more embodiments.

FIG. 58 illustrates a block diagram 5800 of a zero offset open system canonical simulation model, in accordance with one or more embodiments.

Figure 59:
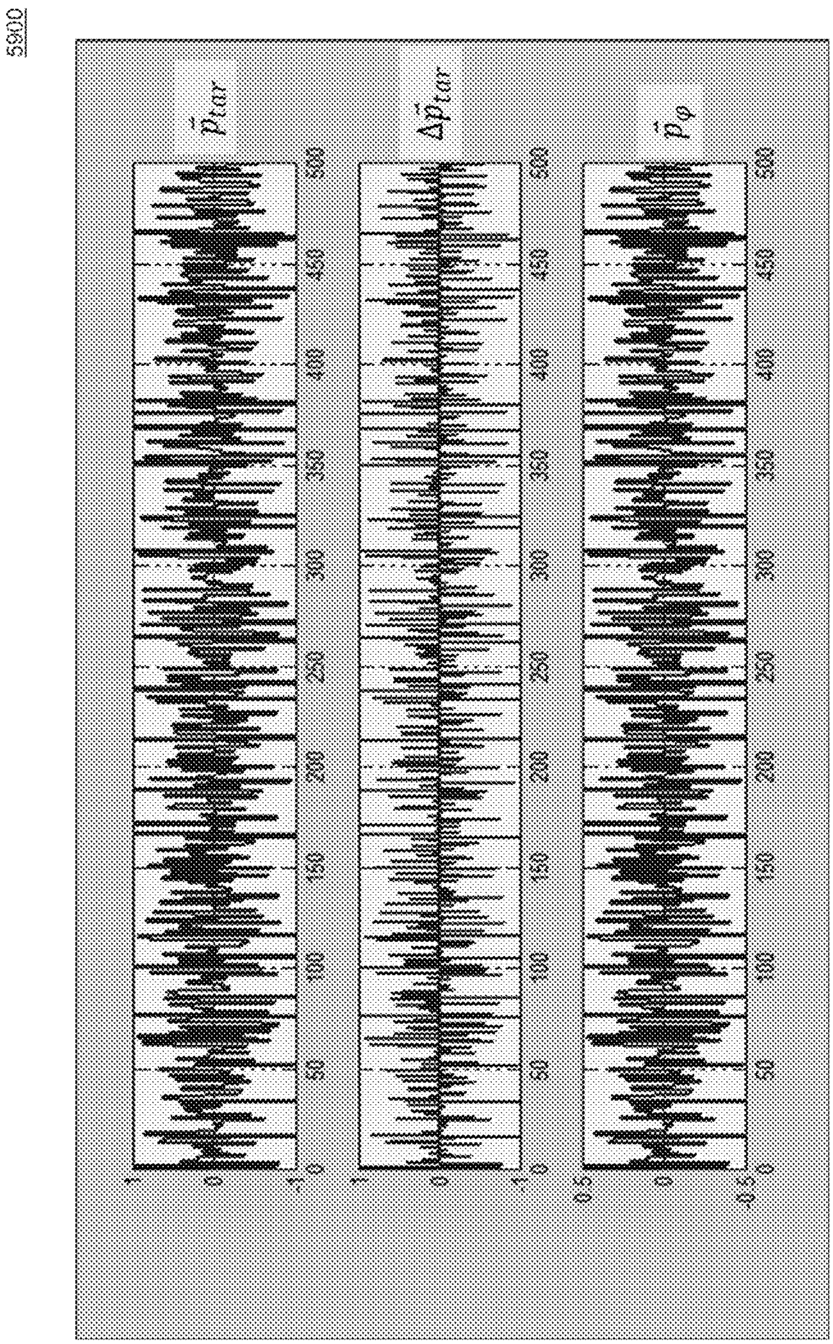
FIG. 59 is an illustration of a plot of simulation results for an open system zero offset model, in accordance with one or more embodiments.

FIG. 59 illustrates a plot 5900 of the waveforms associated with a simulation of FIG. 59.

Referring back to FIG. 58, there is an offset for each branch of the apparatus of $p_{max}/2$. The offsets cancel while the random variables $\pm\Delta p_\varphi$ add in a correlated manner to double the dynamic range of the particle momentum peak to peak. The energy source must contemplate this requirement. An efficiency calculation follows the procedures introduced earlier, taking into account the symmetry of the apparatus, offsets, as well as the correlated acceleration and deceleration components.

$$\eta = \frac{P_e}{P_{in}} = \frac{\sigma_e^2}{(P_{m_e} + \sigma_e^2)} = \frac{1}{(PAPR_e + 1)} \quad \text{Equation 5-13}$$

This model reflects an increase in efficiency over the apparatus of FIG. 52. If the $PAPR_e$ approaches 1, then the efficiency approaches 50%.

5.1.1. Comments Concerning Power Source

The particle motions within the information source are statistically independent from the relative motions of particles in the power source. There is no a priori anticipation of information between the various apparatus functions. A joint pdf captures the basic statistical relationship between the energy source and encoding segment.

$$\rho_{\varphi\varepsilon} = \rho_\varphi \rho_{src} \quad \text{Equation 5-14}$$

$\rho_{\varphi\varepsilon}$ is the joint probability where the covariance of relative motions are zero in the most logical maximum capacity case. The maximum available power resource may or may not be static, although the static case was considered as canonical for analytical purposes in the prior examples. In those examples the instantaneous maximum available resource is always $p_{max}$, a constant. This is not a requirement, merely a convenience. If the power source is derived from some time variant potential then an additional processing consideration is required in the apparatus. Either the time variant potential must be rectified and averaged prior to consumption or the apparatus must otherwise ensure that a peak energy demand does not exceed the peak available power supply resource at a sampling instant. Given the nature of the likely statistical independence between the particle motions in the various apparatus functions, the most practical solution is to utilize an averaged power supply resource. An alternative is to regulate and coordinate the $PAPR_e$ and hence the information throughput of the apparatus as the instantaneous available power from a power source fluctuates.

5.1.2. Momentum Conservation and Efficiency

Section 5.1 provided a derivation of average thermodynamic efficiency based on momentum exchange sampled from continuous random variables. This section verifies that idea with a more detailed discussion concerning the nature of a conserved momentum exchange. The quantities here are also regarded as recursive changes in momentum at sampling intervals $f_s^{-}=T_s$, where samples are obtained from a continuous process. The model is based on the exchange of momentum between delivery particles and a target particle to be encoded with information. The encoding pdf is given by $\rho(p_\varphi)$, a Gaussian random variable.

The current momentum of a target particle is a sum of prior momentum and some necessary change to encode information. Successive samples are de-correlated according to the principles presented in Section 3. The momentum conservation equation is:

$$\sum_i \vec{p}_i^{\,-} = \sum_i \vec{p}_i^{\,+} = C \quad \text{Equation 5-15}$$

C is a constant. $\vec{p}_i^{\,-}$ is the $i^{th}$ particle momentum $t_\varepsilon$ seconds just prior to the $n^{th}$ momentum exchange. $\vec{p}_i^{\,+}$ is the $i^{th}$ particle momentum just after the $n^{th}$ momentum exchange.

$$\vec{p}_i^{\,-} = \vec{p}_i(t - nT_s + t_\varepsilon)$$

$$\vec{p}_i^{\,+} = \vec{p}_i(t - nT_s - t_\varepsilon)$$

In the following example only two particles are deployed per exchange. In concept, many particles could be involved.

Figure 60:
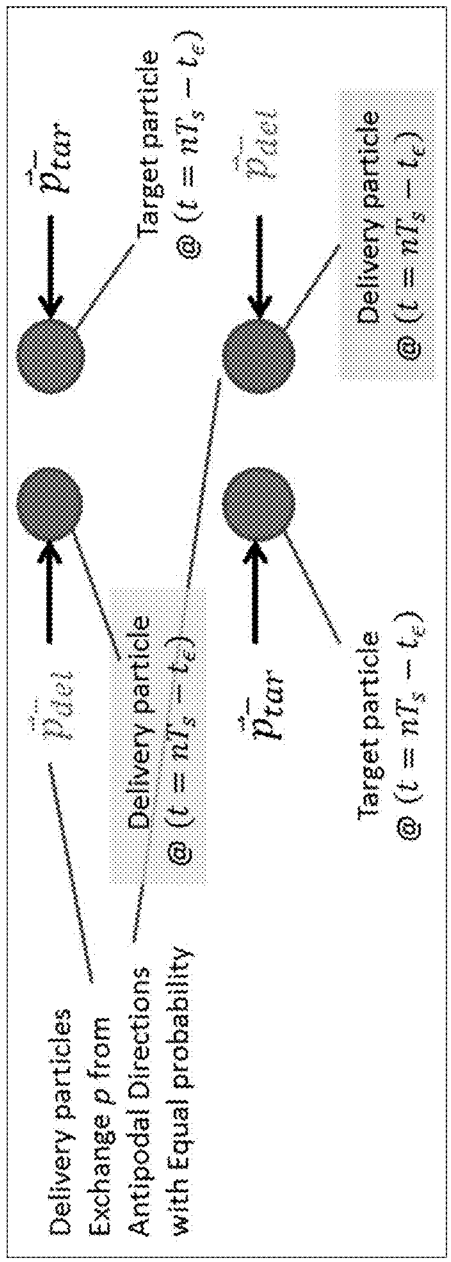
FIG. 60 is an illustration of a block diagram of relative motion of particles prior to exchange, in accordance with one or more embodiments.

FIG. 60 illustrates a block diagram 6000 of the possible single axis relative motions of the delivery and target particles prior to exchange, in accordance with one or more embodiments.

Figure 61:
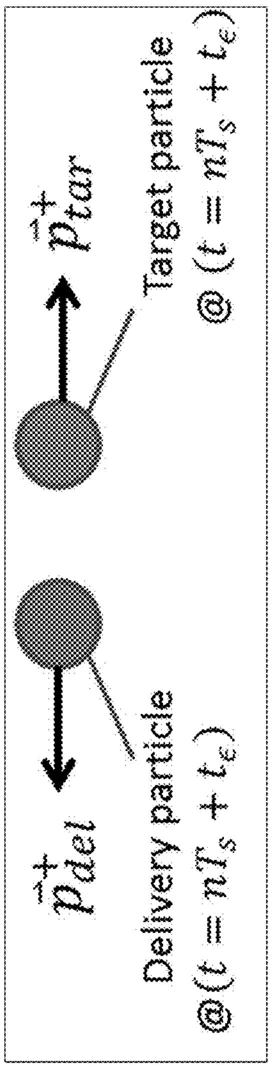
FIG. 61 is an illustration of a block diagram of relative motion of particles after an exchange, in accordance with one or more embodiments.

FIG. 61 illustrates a block diagram 6100 of relative motion of particles after an exchange, in accordance with one or more embodiments. After the sample instant, i.e. the momentum exchange, the particles recoil as illustrated in FIG. 61 for the first of the cases illustrated in FIG. 60.

The conservation collation over n exchanges is $$\sum_n [\vec{p}_{del}^{\,-} + \vec{p}_{tar}^{\,-}]_n = \sum_n [\vec{p}_{del}^{\,+} + \vec{p}_{tar}^{\,+}]_n \quad \text{Equation 5-16}$$

First we examine the case of differential information encoding. The information is encoded in momentum differentials of the target particle rather than absolute quantities.

$$\vec{p}_{tar}^{\,+} - \vec{p}_{tar}^{\,-} = \Delta\vec{p}_{tar}$$

Also it follows that:

$$\langle \vec{p}_{del}^{\,-} \rangle = \langle \vec{p}_{tar}^{\,+} - \vec{p}_{tar}^{\,-} \rangle = \langle \Delta\vec{p}_{tar} \rangle$$

This comes from the fact that particle motions are relative and random with respect to one another, and the exchanging particles possess the same mass. $\vec{p}_{del}^{\,-} = \vec{p}_\varphi + \langle p_{del}^{-} \rangle$ is exchanged in a set of impulses at the delivery and target particle interface at the sample instants, $t=nT_s$. $\langle \vec{p}_{del}^{\,-} \rangle$ is an average overhead momentum for the encoding process. Using the various definitions the conservation equation may be restated as:

$$\sum_n [\vec{p}_\varphi + \langle \vec{p}_{del}^{\,-} \rangle]_n = \sum_n [\vec{p}_{del}^{\,+} + \Delta\vec{p}_{tar}^{\,+}]_n \quad \text{Equation 5-17}$$

$\vec{p}_{del}^{\,+}$ on the right side of equation 5-17 can be discarded in efficiency calculations since it is a delivery particle recoil momentum and therefore output waste. Now we proceed with the efficiency calculation which utilizes the average energies from the momentum exchanges.

$$\frac{1}{n}\sum_n [\vec{p}_\varphi + \langle \vec{p}_{del}^{\,-} \rangle]_n^2 = \frac{1}{n}\sum_n [\Delta\vec{p}_{tar}]_n^2$$

The left hand side of the above equation represents the input energy of delivery particles prior to exchange. The right hand side represents the desired output signal energy associated with a differential encoded target particle. For large n we approximate the sample averages with the time averages so that:

$$\langle(\vec{p}_\varphi)^2\rangle+\langle 2\vec{p}_\varphi\langle\vec{p}_{del}^{\,-}\rangle\rangle+(\langle\vec{p}_{del}^{\,-}\rangle)^2=\langle(\Delta\vec{p}_{tar})^2\rangle \quad \text{Equation 5-18}$$

We can calculate the efficiency along the $\alpha^{th}$ axis from:

$$\eta_\alpha=\left[\frac{P_{out}}{P_{in}}\right]_\alpha=\frac{\langle(\Delta p_{tar})^2\rangle_\alpha}{\langle(p_\varphi)^2\rangle_\alpha+\langle\bar{\vec{p}}_{del}\rangle_\alpha^2} \quad \text{Equation 5-19}$$

We now specify an encoding pdf such that max $\{p_\varphi\}=\langle p_{del}^{-}\rangle$ (ref. FIGS. 5-2, 5-3) Also, in the differential encoding case, $\langle(\Delta p_{tar})^2\rangle\equiv\langle(p_\varphi)^2\rangle$, with a zero mean $\Delta p_{tar}$.

Now the averaged efficiency over all dimensions may be rewritten as:

$$\eta=\sum_\alpha\frac{\lambda_\alpha\langle(p_\varphi)^2\rangle_\alpha}{\langle(p_\varphi)^2\rangle_\alpha+(\max\{p_\varphi\})_\alpha^2}=\frac{\langle(p_\varphi)^2\rangle}{\langle(p_\varphi)^2\rangle+(\max\{p_\varphi\})^2}=\frac{1}{1+PAPR} \quad \text{Equation 5-20}$$

$\lambda_\alpha$ is a probability weighting of the efficiency in the $\alpha^{th}$ dimension. Equation 5-20 is the efficiency of the differentially encoded case. When the PAPR is very large the efficiency may be approximated by $(\mathrm{PAPR})^{-1}$.

Now suppose that we define the encoding to be in terms of absolute momentum values where the target particle momentum average is zero as a result of the symmetry of the delivery particle motions. The momentum exchanges per sample are independent Gaussian RV's so that the two sample variance forming $\langle(\Delta p_{tar})^2\rangle$ is twice that of the absolute quantity $\langle(p_{tar}^{+})^2\rangle$. That is, $$\langle(p_{tar}^{+})^2\rangle=\frac{1}{2}\langle(p_\varphi)^2\rangle.$$

If the same PAPR is stipulated for the comparison of the differential and absolute encoding techniques then the average of the delivery particle momentum must scale as $$\frac{1}{\sqrt{2}},$$

and we obtain:

$$\eta=\frac{\frac{1}{2}\langle(p_\varphi)^2\rangle}{\langle(p_\varphi)^2\rangle+\left(\frac{1}{\sqrt{2}}\max\{p_\varphi\}\right)^2}=\frac{1}{2(PAPR+1)} \quad \text{Equation 5-21}$$

In the most general encoding cases the efficiency may be written as:

$$\langle\eta\rangle=\frac{\sigma^2}{k_{mod}P_m+k_\sigma\sigma^2}$$

$\sigma^2$ is desired output signal power and $k_{mod}$, $k_\sigma$ are constants which absorb the variation of potential apparatus implementations and contemplate other imperfections as well.

5.1.3. A Theoretical Limit

FIGS. 60 and 61 illustrate the case for particles where each exchange possesses a random recoil momentum because the motions of delivery and target particles are not synchronized and a material particle possesses a finite speed. If we posit a circumstance where the momentum of each delivery particle is 100% absorbed in an exchange then the efficiency can approach a theoretical limit of 1 given a fully differential zero offset scenario. In this hypothetical case $$\eta=\frac{P_{out}}{P_{in}}=\frac{\sum_\alpha\lambda_\alpha\langle(\Delta p_{tar})^2\rangle_\alpha}{\sum_\alpha\lambda_\alpha\langle(\Delta p_\varphi)^2\rangle_\alpha}$$

Suppose that a stream of virtual delivery particles, such as a photons, acts upon a material particle. Each delivery particle possesses a constant momentum used to accelerate or decelerate the target particle and the desired target particle statistic $\vec{p}_\varphi$ is created by the accumulation of n impulse exchanges over time interval $T_s$. The motion of the target particle with statistic $\vec{p}_\varphi$ is verified by sampling at intervals of time $t-lT_s$ where l is a sample index for the target particle signal. Also, we identify the time averages $\langle(\vec{p}_\varphi)^2\rangle\leq\langle(\vec{p}_{del})^2\rangle$ and $\langle(\vec{p}_{del})^2\rangle\leq\langle[\max\{\vec{p}_{del}\}]^2\rangle$. We further assume that the statistics in each dimension are iid so that efficiency is a constant with respect to $\alpha$.

Time averages may be defined by the following momentum quantities imparted to the target particle by the delivery particles over n impulses exchanges per sample interval and N samples where N is a suitably large number:

$$\langle(p_\varphi)^2\rangle\equiv\frac{1}{NT_s}\sum_{\ell=1}^{N}\sum_n[(p_{del})^2]_n$$

$$\max\{(p_\varphi)^2\}\equiv\frac{1}{T_s}\sum_{\ell=1}^{N}\sum_n[\max\{(p_{del})^2\}]_n$$

And finally:

$$\eta\leq\frac{\frac{1}{NT_s}\sum_{\ell=1}^{N}\sum_n[(p_{del})^2]_n}{\frac{1}{T_s}\sum_{\ell=1}^{N}\sum_n[\max\{(p_{del})^2\}]_n}=\frac{1}{PAPR} \quad \text{Equation 5-22}$$

Equation 5-22 presumes that n the number of delivery particle impulses over the material particle sample time $T_s$ can be much greater than 1.

When PAPR→1 the efficiency approaches 1. An example of this circumstance is binary antipodal encoding where the momentum encoded for two possible discrete states or the momentum required to transition between two possible states is equal and opposite in direction and $\dot{\vec{p}} \to \infty$. This would be a physically non-analytic case.

5.2. Capacity Vs. Efficiency Given Encoding Losses

Encoding losses are losses incurred for particle momentum modulation where the encoding waveform is an information bearing function of time. This may be viewed as a necessary but inefficient activity. If the momentum is perfectly Gaussian then the efficiency tends to zero since the PARR for the corresponding motion is infinite. However, practical scenarios preclude this extreme case since $P_m$ is limited. Therefore, in practice, some reasonable PAPR can be assigned such that efficiency is moderated yet capacity not significantly impacted.

A direct relationship between PA PR and capacity can be established from the capacity definition of equation 4-14.

$$C=\max\{\overline{I(x;y)}\}=\max\{H(y)-H_x(y)\}$$

As before we shall assume an AWGN which is band limited but we relax the requirement for the nature of ρ(p) such that a Gaussian density for momentum is not required. Also the following capacity discussion is restricted to a consideration of continuous momentum since the capacity obtained from position is extensible. Technically we are considering a qualified capacity or pseudo capacity $\tilde{C}$ whenever ρ(p) is not Gaussian, yet ρ(p) is still descriptive of continuous encoding.

$$\tilde{C}=\max\left\{-\int_{p_u}^{p_{ul}}\rho(p_y)\ln[\rho(p_y)]\,dp_y-\frac{1}{2}\ln\left(\sqrt{2\pi e}\,\sigma_n\right)\right\} \quad \text{Equation 5-23}$$

We can rewrite equation 5-22 with a change of variables $z=p_y/\sigma_{p_y}$ as follows:

$$\tilde{C}=\max\left\{-\sigma_{p_y}\int_{z_u}^{(\sqrt{PAER})_y}\rho(z)\ln[\rho(z)]\,dz-\frac{1}{2}\ln\left(\sqrt{2\pi e}\,\sigma_n\right)\right\} \quad \text{Equation 5-24}$$

For a given value of momentum variance $\sigma_{p_y}^2$ with a fixed SNR ratio $(\sigma_{p_x})^2/(\sigma_{p_n})^2$, an increase in $(\sqrt{\text{PAER}})_y$ always increases the integral of 5-23 and therefore increases pseudo capacity $\tilde{C}$. This can also be confirmed by finding the derivative of $\tilde{C}$ with respect to $(\sqrt{\text{PAER}})_y$ with the lower limit in eq. 5-23 held constant.

$$\frac{d\tilde{C}}{d\left(\sqrt{PAER}\right)_y}=\rho\left(\sqrt{PAER}\right)\ln\left[\rho\left(\sqrt{PAER}\right)\right] \quad \text{Equation 5-25}$$

Equation 25 confirms that capacity is a monotonically increasing function of PAER without bound.

$(\sqrt{\text{PAER}})_y$ includes the consideration of noise as well as signal. When the noise is AWGN and statistically independent from the signal:

$$\sigma_{p_y}=\sqrt{(\sigma_{p_x})^2+(\sigma_{p_n})^2},\ \sigma_y=\sqrt{(\sigma_x)^2+(\sigma_n)^2}$$

Thus $\text{PAPR}_y=P_m/\sigma_y^2$ is the output peak to average power ratio for a corrupted signal.

$\text{PAPR}_y$ may be obtained in terms of the effective peak to average ratio for the signal as:

$$PAPR_y=\frac{\sigma_e^2}{\sigma_y^2}PAPR_e+\frac{\sigma_n^2}{\sigma_y^2}PAPR_n+\frac{\sqrt{P_{m_e}}\sqrt{P_{m_n}}}{\sigma_y^2}$$

$\text{PAPR}_n$ is the peak to average power ratio for the noise. $\text{PAPR}_y$ is of concern for a receiver analysis since the contamination of the desired signal plays a role. In the receiver analysis where the noise or interference is significant, a power source specification $P_m$ must contemplate the extreme fluctuation due to $p_x+p_n$. The efficiency of the receiver is impacted since the phase space must be expanded to accommodate signal plus noise and interference so that information is not lost as discussed in Section 3. Most often, the efficiency of a communications link is dominated by the transmitter operation. That is, the noise is due to some environmental perturbation added after the target particle has been modulated. We thus proceed with a focus on the transmitter portion of the link.

Whenever the signal density is Gaussian we then have the classical result:

$$\lim_{PAER\to\infty}\tilde{C}=\max\left\{-\sigma_{p_y}\int_{-\infty}^{\infty}\rho(z)\ln[\rho(z)]\,dz+\frac{1}{2}\ln\left(\sqrt{2\pi e}\,\sigma_n\right)\right\}=\ln(\overline{SNR}_{eq}+1)=C \quad \text{Equation 5-26}$$

It is possible to compare the pseudo-capacity or information rate of some signaling case to a reference case like the standard Gaussian to obtain an idea of relative performance with respect to throughput for continuously encoded signals.

We now define the relative continuous capacity ratio figure of merit from:

$$C_r=\frac{\tilde{C}_{\rho_x}}{C_G}=\frac{\max\left\{-\int_{p_{ll}}^{p_{ul}}\rho(p_y)\ln[\rho(p_y)]\,dp_y-\frac{1}{2}\ln\left(\sqrt{2\pi e}\,\sigma_n\right)\right\}}{\ln\left(\frac{\sigma_G^2}{\sigma_n^2}+1\right)}=\frac{H_y-H_x(y)}{[\ln(\overline{SNR}_{eq}+1)]} \quad \text{Equation 5-27}$$

The uncertainty $H_y$ is due to a random signal plus noise. $C_G$ is a reference AWGN channel capacity found in Section 4 and $\tilde{C}_{\rho_x}$ is a pseudo-capacity calculated with the pdf describing the signal random variable of interest. The noise is band limited AWGN with entropy $H_x(y)=H_n$. There are several choices for the constituents of $C_r$ such as the SNR's of numerator and denominator as well as the form of the probability densities involved.

A precise calculation of $C_r$ first involves finding the numerator pdf for the sum of signal plus noise RV's. When the signal and noise are completely independent then the separate pHs may be convolved to obtain the pdf, $\rho_y$, of their sum. A generalization of $C_r$ is possible whenever the numerator and denominator noise entropy are identical and when the signal of interest is statistically independent from the noise. In this circumstance a capacity ratio bound can be obtained from:

$$C_r \leq \log_{\left\{\frac{\sigma_G^2}{\sigma_n^2}+1\right\}}\left[\frac{k\sigma_G^2}{\sigma_n^2}+1\right]; \quad 0 \leq k \leq 1 \qquad \text{Equation 5-28}$$

k is a constant and $\sigma_x^2$ is the variance of a signal which is to be compared to the Gaussian standard. k is determined from the entropy ratio $H_r$ of the signal to be compared to the standard entropy, $\ln(\sqrt{2\pi e}\sigma_G)$. Most generally, the value for $C_{\rho_x}$ must be explicitly obtained from the integral in equation 5-26. However, $C_{\rho_x}$ can also be known for some common distributions like for instance a continuous uniform distribution.

$H_r$ is the relative entropy ratio for an arbitrary random variable compared to the Gaussian case with a fixed variance. A bounded value for $H_r$ can be estimated by assuming that the noise and signal are statistically independent and uncorrelated. It has been established that the reference maximum entropy process is Gaussian so that for a given variance all other random variables will possess lower relative differential entropies. This means that $H_r \leq 1$ for all cases since $H_{\rho_x} \leq H_{G_x}$. Thus:

$$H_r \equiv \frac{H_{\rho_x}}{H_{G_x}} = \frac{H_{\rho_x}}{\ln\left(\sqrt{2\pi e}\,\sigma_x\right)}$$

An example illustrates the utility of $H_r$. $H_r$ for the case when the signal is characterized by a continuous uniform pdf over $\{-v_{max}, v_{max}\}$ (m=1) is found as:

$$H_r = \frac{\ln(2p_{max})}{\ln\left(\sqrt{2\pi e}\,\sigma\right)} = \frac{\ln\left(2\sqrt{3}\right)}{\ln\left(\sqrt{2\pi e}\right)} \approx .876$$

The variance of the Gaussian reference signal and the uniformly distributed signal are equated in this example ($\sigma_G^2=\sigma_U^2=1$) to obtain a relative result. At large SNR, the capacity ratio can be approximated:

$$C_r = \frac{H_{\rho_y} - H_{\rho_n}}{H_G - H_n} \approx \frac{H_{\rho_x}}{H_G} = H_r; \quad \text{for } \overline{SNR}_{eq} \gg 1 \qquad \text{Equation 5-29}$$

Therefore, the capacity for the band limited AWGN channel when the signal is uniformly distributed and power limited, is approximately 0.876 that of the maximum capacity case whenever the AWGN of the numerator and denominator are not dominant. Section 10.10 provides additional detail concerning the comparison of the Gaussian and continuous uniform density cases.

In general, the relative entropy is calculated from:

$$H_r = \frac{\int_{-v_{max}}^{+v_{max}} \rho(v)\ln p(v)\,dv}{\int_{-\infty}^{+\infty} \rho_G(v)\ln p_G(v)\,dv} \qquad \text{Equation 5-30}$$

$\rho(v)$ is the pdf for the signal of analysis and $\rho_G(v)$ is the Gaussian pdf. $v_{max}$ is a peak velocity excursion. The denominator term is the familiar Gaussian entropy, $\ln(\sqrt{2\pi e}\sigma_G)$.

This formula may be applied to the case where $\rho(v)$ for the numerator distribution of a $C_r \approx H_r$ calculation is based on a family of clipped or truncated Gaussian velocity distributions. $\eta$ is inversely related to PAPR by some function as indicated by two prior examples using particle based models, summarized in equations 5-11 and 5-12. PAPR can be found where $\pm v_{max}$ indicates the maximum or clipped velocities of each distribution.

$$PAPR = \frac{v_{max}^2}{\int_{-v_{max}}^{+v_{max}} v^2 \rho(v)\,dv} \qquad \text{Equation 5-31}$$

Figure 62:
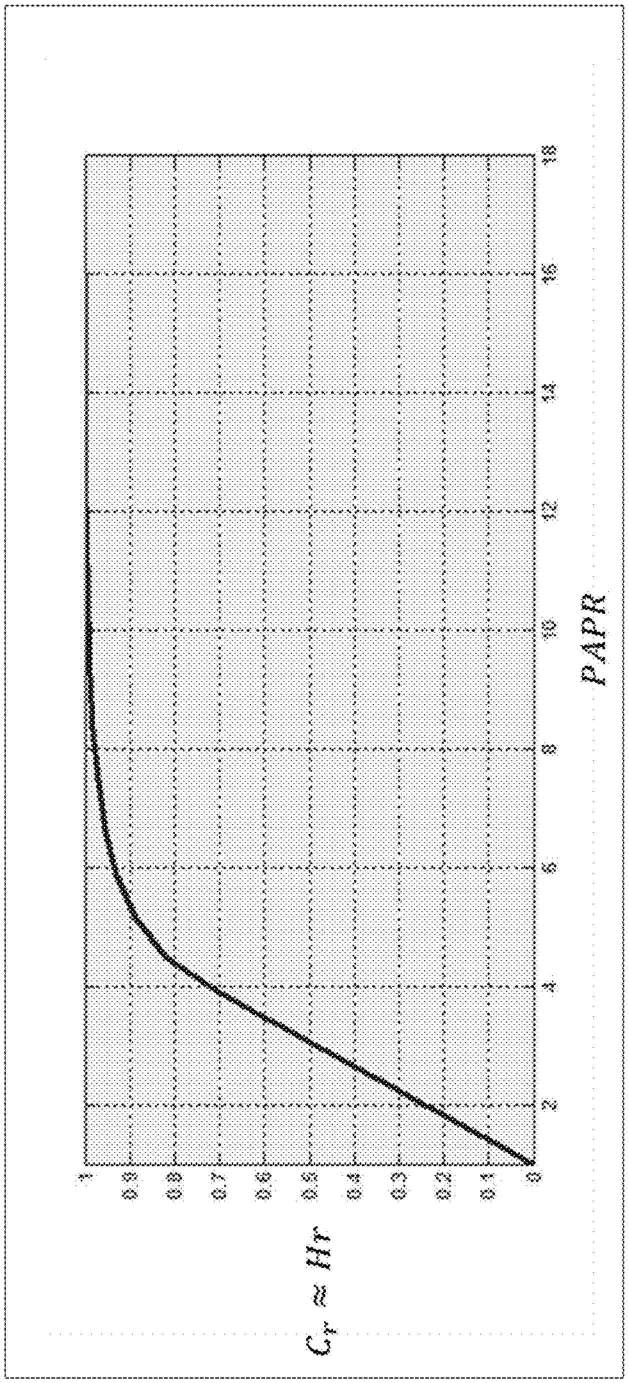
FIG. 62 is an illustration of a plot of a capacity ratio for truncated Gaussian distributions versus PAPR, in accordance with one or more embodiments.
Figure 63:
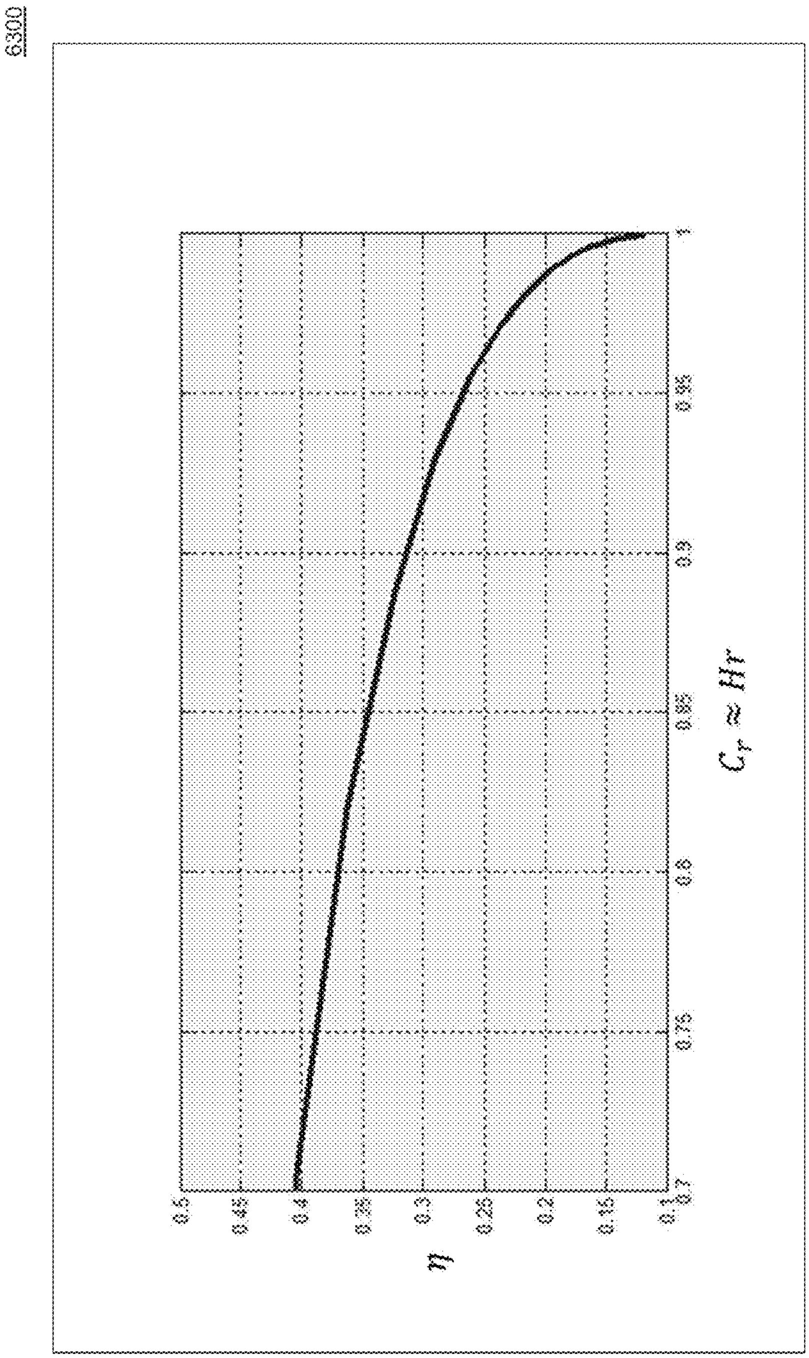
FIG. 63 is an illustration of a plot of efficiency versus capacity ratio for truncated Gaussian distributions, in accordance with one or more embodiments.

FIGS. 62 and 63 illustrate the relationship between the relative capacity ratio, PAPR, and $\eta$ for a single degree of freedom at high SNR where $\rho(v)$ is a truncated Gaussian density function, in accordance with one or more embodiments. FIG. 62 includes a plot 6200 of a capacity ratio for truncated Gaussian distributions versus PAPR for a large SNR. FIG. 63 includes a plot 6300 of efficiency versus capacity ratio for truncated Gaussian distributions and a large SNR, in accordance with one or more embodiments. FIG. 63 assumes an efficiency due to a particle based encoding model illustrated in FIG. 58 with efficiency given by equation 5-12.

Both variance and PAPR can vary in the numerator function compared to the reference Gaussian case of the denominator, though the variance must never be greater than unity when the denominator is based on the classical Gaussian case. In FIG. 62, the relative entropy and therefore potential capacity reduces significantly as a function of PAPR. The lowest PAPR=1 of the graph approximates the case of a constant (the mean value of the Gaussian density) and therefore results in an entropy of zero for the numerator of the $H_r$ calculation.

The results indicate that preserving greater than 99% of the capacity results in efficiencies lower than 15 percent for these particular truncated distribution comparisons. In the cases where the Gaussian distribution is significantly truncated, the momentum variable extremes are not as great and efficiency correspondingly increases. However, the corresponding phase space is eroded for the clipped signal cases thereby reducing uncertainty and thus capacity. A PAPR of 16 (12 dB) preserves nearly all the capacity for the Gaussian case while an efficiency of 40% can be obtained by giving up approximately 30% of the relative capacity.

Figure 64:
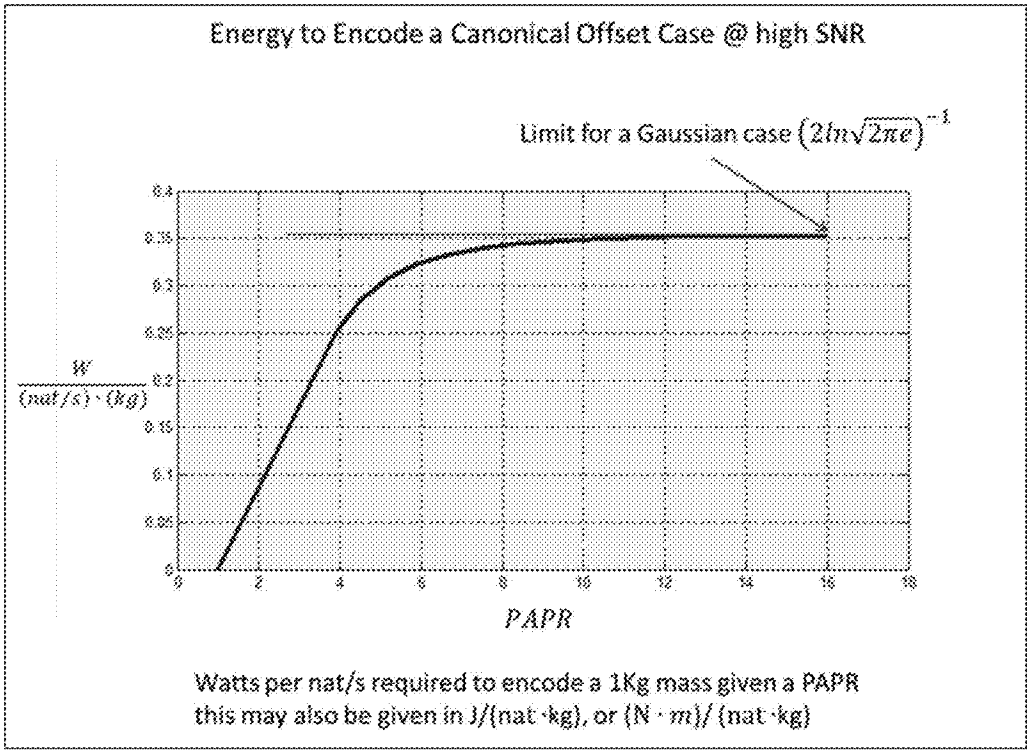
FIG. 64 is an illustration of a plot of canonical offset encoding efficiency, in accordance with one or more embodiments.

As another comparison of efficiency, consider FIG. 64. FIG. 64 illustrates a plot 6400 of the number of encoded Joules per nat (JPN) for the truncated Gaussian densities versus PAPR given 1 kg mass of encoding, in accordance with one or more embodiments.

For relatively low PAPR, an investment of energy is more efficiently utilized to generate 1 nat/s of information. However, the total number of nats instantly accessible and associated with the physical encoding of phase space, is also lower for the low PAPR case compared to the circumstance of high PAPR maximum entropy encoding. Another way to state this is: there are fewer nats imparted per momentum exchange for a phase space when the PAPR of particle motion is relatively low. Even though a low PAPR favors efficiency, more particle maneuvers are required to generate the same total information entropy compared to a higher PAPR scenario when the comparison occurs over an equivalent time interval. Message time intervals, efficiency, and information entropy are interdependent.

The TE relation illustrates the energy investment associated with this process as given by eq. 5-5 and modified to include a consideration of capacity. In this case $\Im\{\tilde{C}\}$ is some function of capacity. The prior analysis indicates the nonlinearly proportional increase of $\Im\{\tilde{C}\}$ for an increasing $PAPR_e$. The following TE relation equivalent combines elements of time, energy, and information where information capacity $\tilde{C}$ is a function of $PAPR_e$ and vice versa. We will refer to this or substantially similar form (eq. 5-32) as a TEC relation, or time-energy-capacity.

$$\langle \eta \rangle = \frac{P_{m_e}}{f_s \langle \mathcal{E}_{in} \rangle_s PAPR_e} \leq \frac{P_{m_e}}{f_s \langle \mathcal{E}_{in} \rangle_s \Im} \quad \text{Equation 5-32}$$

If the power resource, sample rate and average energy per momentum exchange for the process are fixed then:

$$\langle \eta \rangle \leq \frac{k}{\Im\{\tilde{C}\}} \quad \text{Equation 5-33}$$

k is a constant. As $\Im\{\tilde{C}\}$ increases $\langle \eta \rangle$ decreases. The exact form of $\Im\{\tilde{C}\}$ depends on the realization of the encoding mechanisms. The ≤operator accounts for the fact that an implementation can always be made less efficient if the signal of interest is not required to be of maximum entropy character over its span $\{p_{max}, p_{max}\}$.

Since $\Im\{\tilde{C}\}$ is not usually a convenient function, it is often expedient to use one of several techniques for calculating efficiency in terms of capacity. The alternate related metric $PAPR_e$ may be used then related back to capacity. Numerical techniques may be exploited such as those used to produce the graphics of FIGS. 62-64. A suitable convenient approximation of the function depicted by graphic of FIG. 62 is sometimes available. For instance, $PAPR_e$ can be approximated as follows:

$$PAPR_e \approx \left(3.1 \tanh^{-1}\left[\frac{\tilde{C}}{1.4189385}\right]\right) + 1 \quad \text{Equation 5-34}$$

The numerical constant in the denominator of the inverse hyperbolic tangent argument is the entropy for a Gaussian distribution with variance of unity. When $C_r$ tends to a value of 1 then $PAPR_e$ tends to infinity. FIGS. 62 and 63 illustrate that efficiency tends to zero for the truncated Gaussian example and $PAPR_e \to \infty$. When $C_r=0.7$ the corresponding calculations using eq. 5-35 and FIG. 62 predict a $PAPR_e \approx 3.886$ and an efficiency of approximately 40% is likewise deduced. This result is also apparent by comparing the graphs from FIGS. 62 and 63.

This approximation is now re-examined using the general result extrapolated from equation 5-32, a TEC relation, and some numbers from an example given in section 3.1.6.

For the truncated Gaussian case:

$$\langle \eta \rangle \approx \frac{P_{m_e}}{f_s \langle \varepsilon_{in} \rangle_s \left[\left(3.1 \tanh^{-1}\left[\frac{\tilde{C}}{1.4189385}\right]\right) + 1\right]} = \frac{k}{\left[\left(3.1 \tanh^{-1}\left[\frac{\tilde{C}}{1.4189385}\right]\right) + 1\right]} \quad \text{Equation 5-35}$$

$f_s$, $\langle \varepsilon_{in} \rangle_s$ and $P_{m_e}$ are easily specified or measured system values in practice. The following values from the example of section 3.1.6 are used to illustrate the application of this approximation and the consistency of the various expressions for efficiency developed thus far.

$P_{m_e}=1$ Joule, $\langle \varepsilon_k \rangle_s = 10\times10^{-0}$ Joules, $f_s=2.5\times10^4$ momentum exchanges per second If we wish a maximum capacity solution then the efficiency tends to zero in equation 5-35 verifying prior calculations. If we would like to preserve 70% of the maximum capacity solution then the efficiency should tend to 40% confirming the prior calculation. This would require that k≅1.554 for consistency between the formulations of 5-35 and numerical techniques related to the transcendental graphic procedure leveraging FIGS. 62 and 63. Using the values for $P_{m_e}$, $f_s$ and the fact that $\langle \varepsilon_k \rangle_s = \langle \varepsilon_{in} \rangle_s \eta$ we can easily verify that:

$$k = \frac{P_{m_e}}{f_s \langle \varepsilon_{in} \rangle_s} = \frac{1}{.625} = 1.6$$

Alternately, if k=1.554, then the efficiency calculates to 39.98%. This is a good approximation and a verification of consistency between the various theories and techniques developed to this point.

One may choose a variety of ratios and metrics to compare how arbitrary distributions reduce capacity in exchange for efficiency compared to some reference like the Gaussian norm. The curves of FIGS. 62-64 will change depending on the distributions to be compared and encoding mechanisms, but the trend is always the same. Lower PAPR increases efficiency but decreases capacity compared to a canonical case.

5.3. Capacity Vs. Efficiency Given Directly Dissipative Losses

Directly dissipative losses refer to additional energy expenditures due to drag, viscosity, resistance, etc. These time variant scavenging affects impact the numerator component of the $\overline{SNR}_{eq}$ term in the capacity equations of Section 4 by reducing the available signal power. As direct dissipation increases, the available $\overline{SNR}_{eq}$ also decreases thereby reducing capacity.

The relationship between channel capacity and efficiency $\eta_{diss\_\alpha}$ can be analyzed by recalling the capacity equations of chapter 4 and substituting the total available energy for supporting particle motion into the numerator portion of $\overline{SNR}_{eq}$.

$$C \leq \sum_{\alpha=1}^{D} f_{s_\alpha} (\ln[\overline{SNR}_{eq} + 1]) \quad \text{Equation 5-36}$$

-continued $$C \leq \sum_{\alpha=1}^{D} f_{s_\alpha}\left(\ln\left[m^2\frac{(\langle P_e\rangle\langle\eta_{diss_\alpha}\rangle)}{\tilde{\sigma}^2_{p_{n_\alpha}}}+1\right]\right);$$

$$0 \leq \eta_{diss_\alpha} \leq 1$$

As the average efficiency $\langle\eta_{diss\_\alpha}\rangle$ reduces, the average signal power $\langle P_e\rangle$ must increase to maintain capacity.

5.4. Capacity Vs. Total Efficiency

In this section, both direct and modulation efficiency $(\eta_{iss}, \eta_{mod})$ impacts are combined to express a total efficiency. The total efficiency is then $\eta=\eta_{diss}\eta_{mod}$ where $\eta_{mod}$ is the efficiency due to modulation loss described in sections 5.1 and 5.2.

One can use the procedure and equations developed in section 5.2 to obtain a modified TEC relation:

$$\langle\eta\rangle = \eta_{diss}\eta_{mod} \leq \frac{P_{m_e}}{f_s\langle\varepsilon_{in}\rangle_s \mathcal{T}\{\tilde{C}\}} \quad \text{Equation 5-37}$$

$$\langle\varepsilon_k\rangle_s = \langle\varepsilon_{in}\rangle_s\eta_{diss}\eta_{mod}$$

The capacity equation 5-36 can be modified to include overall efficiency $\eta=\eta_{diss}\eta_{mod}$. The following equation applies only for the case where the signal is nearly Gaussian. As indicated before, this requires maintaining a PAPR of nearly 12 dB with only the extremes of the distribution truncated.

$$C \leq \sum_{\alpha=1}^{D} f_{s_\alpha}\left(\ln\left[m^2\frac{(\langle P_{src}\rangle\langle\eta_{diss_\alpha}\eta_{mod_\alpha}\rangle)}{\tilde{\sigma}^2_{p_{n_\alpha}}}+1\right]\right); \quad \text{Equation 5-38}$$

$\eta$ has a direct influence on the effective signal power, $P_e=\langle P_{src}\rangle\eta_{diss\_\alpha}\eta_{mod\_\alpha}$. When the average signal power output decreases, then the channel noise power becomes more significant in the logarithm argument, thereby reducing capacity. For a given noise power the average power $\langle P_e\rangle$ for a signal must increase to improve capacity. In order to attain an adequate value for $\langle P_e\rangle=\langle P_{src}\rangle\eta_{diss}\eta_{mod}$, $\langle P_{src}\rangle$ must increase.

The capacity of equation 5-38 applies only to the maximum entropy process. Arbitrary processes can possess a lower PAPR and therefore higher efficiency, but the capacity equation must be modified by using the approximate relative capacity method of section 5.2 or the explicit calculation of pseudo-capacity for a particular information and noise distribution through extension of the principles from chapter 4.

Figure 65:
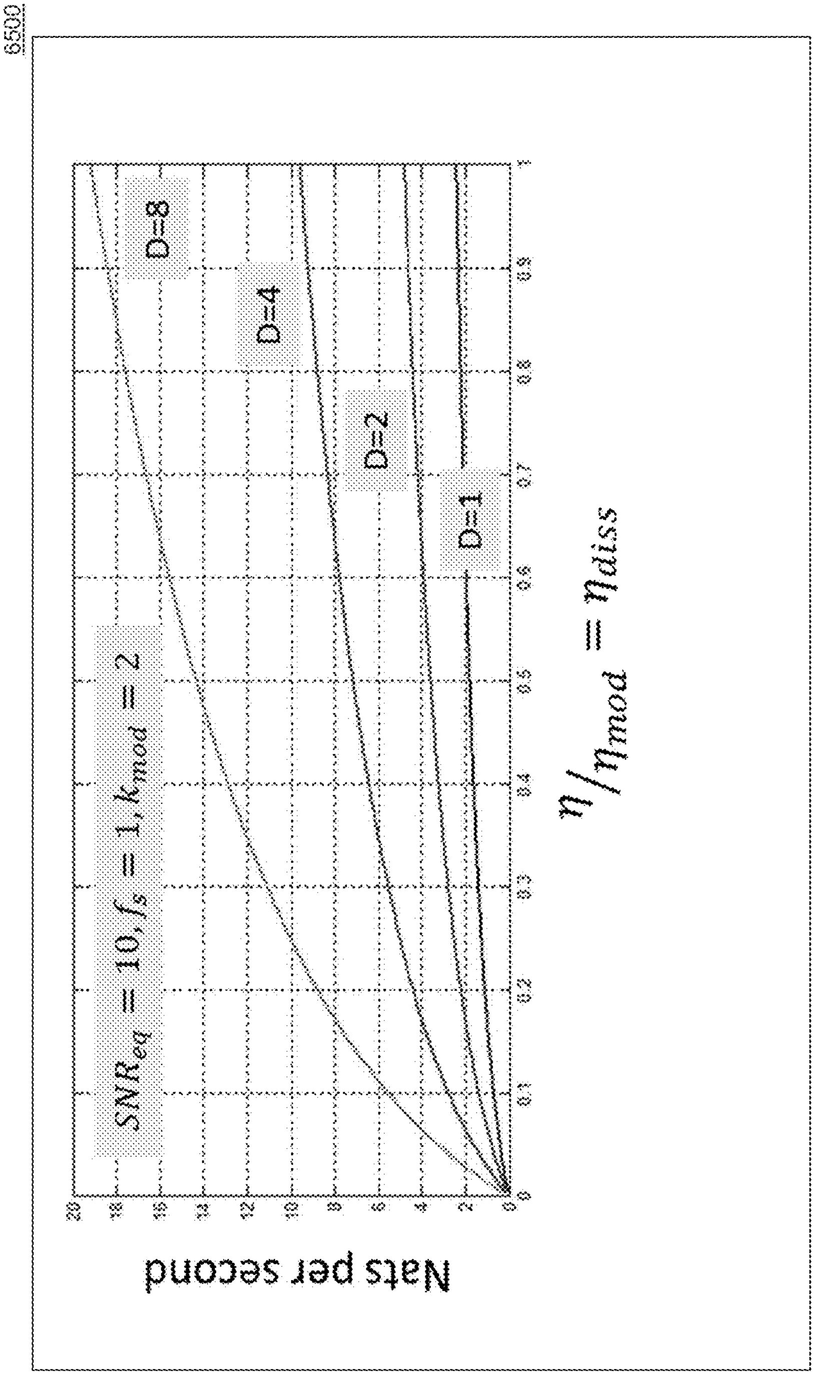
FIG. 65 is an illustration of illustrates a plot of capacity versus dissipative efficiency, in accordance with one or more embodiments.

FIG. 65 illustrates a plot 6500 of capacity versus dissipative efficiency, in accordance with one or more embodiments. Efficiency vs. capacity in nats/second for the 10 dB SNR Gaussian signal case is illustrated in plot 6500. $\eta_{mod}$ possesses a small but finite value associated with some standardized norm for an approximate Gaussian case and assumed encoder mechanism, such as for instance a PAPR of 12 dB and the encoder model of FIG. 58. Since $\eta_{mod}$ is fixed in such an analysis, capacity performance is further determined by $\eta_{diss}$.

All members of the capacity curve family can be made identical to the D=1 case if the sample rate $f_{s\_\alpha}$, per sub channel is reduced by the multiplicative factor $D^{-}$. That is, dimensionality may be traded for sample rate to attain a particular value of C, and a given $\eta$.

5.4.1. Effective Angle for Momentum Exchange

Information can be lost in the process of waveform encoding or decoding unless momentum is conserved during momentum exchange. The capacity equation may be altered to emphasize the effective work based on the angle of time variant linear momentum exchanges.

$$C \leq \sum_{\alpha=1}^{D} f_{s_\alpha}\left(\ln\left[\frac{\left(m^2\langle\dot{\vec{p}}_\alpha\cdot\dot{\vec{q}}_\alpha\rangle_{eff_\alpha}\right)}{\tilde{\sigma}^2_{p_{n_\alpha}}}+1\right]\right) = \quad \text{Equation 5-39}$$

$$\sum_{\alpha=1}^{D} f_{s_\alpha}\left(\ln\left[\frac{\left(m^2\langle(|\dot{\vec{p}}_\alpha||\dot{\vec{q}}_\alpha|)_{in_\alpha}\cos(\theta_{eff_\alpha})\rangle\right)}{\tilde{\sigma}^2_{p_{n_\alpha}}}+1\right]\right)$$

The subscript "in" refers to input work rate. $\cos\theta_{eff\_\alpha}$ controls the efficiency relationship in the second equation. $\langle(|\dot{\vec{p}}_\alpha||\dot{\vec{q}}_\alpha|)_{in\_\alpha}\cos(\theta_{eff\_\alpha})\rangle$ is the effective work rendered at the target particle. Therefore, $\langle\eta_\alpha\rangle=\langle\cos\theta_{eff\_\alpha}\rangle$.

$\cos\theta_{eff\_\alpha}$ must be unity for every momentum exchange to reflect perfect motion and render maximum efficiency. $\theta_{eff\_\alpha}=(\theta_{mod\_\alpha}-\theta_{diss\_\alpha})$ is composed of a dissipative angle and a modulation angle, relating to the discussion of the prior section. $\theta$ provides a means for investigation of the inefficiencies at a most fundamental scale in multiple dimensions, where angular values may also be decomposed into orthogonal quantities.

For an increasing number of degrees of freedom and dimensionality, the relative angle of particle encoding and interaction is important and provides more opportunity for inefficient momentum exchange. For example, the probability of perfect angular recoil of the encoding process is on the order of $(2\pi)^{-D}$ in systems whenever the angular error is uniformly distributed. Even when the error is not uniformly distributed it tends to be a significant exponential function of the available dimensional degrees of freedom.

Whenever D>1, the angle $\theta_{eff\_\alpha}$ can be treated as a scattering angle. This concept is understood in various disciplines of physics where momentum exchanges cN be modeled as the interaction of particles or waves. The variation of this scattering angle due to vibrating particles or perturbed waves goes to the heart of efficiency at a fundamental scale. Thermal state of the apparatus is one way to increase $\theta_{diss\_\alpha}$, the unwanted angular uncertainty in $\theta_{eff\_\alpha}$. Interaction between the particles of the apparatus, environment and the encoded particles exacerbates inefficiency evidenced as an inaccurate particle trajectory. Energy is bilaterally transferred at the point of particle interface as has been noted from examining recoil momentum. Thus during every targeted non-adiabatic momentum exchange in which some energy is dissipated to the local environments, there is also some tendency to expose the target particle momentum to environmental contamination.

5.5. Momentum Transfer Via an EM Field

The focus of prior discussions has been at the subsystem level, examining the dynamics of particles constrained to a local phase space. However, the discussion of section 3.3 and the implication of Section 4 is that such a model may be expanded across subsystem interfaces. It is not necessary to resolve all of the particulars of the interfaces enabling the extended channel to understand the fundamental mechanisms of efficiency. Wherever momentum is exchanged, the principles previously developed can apply. It is valuable to understand how the momentum can extend beyond boundaries of a particular modeled phase space, particularly for the case of charge-electromagnetic field interaction. Here the discussion is restricted to the case where particles are conserved charges. Specifically, charges in the transmitter phase space do not cross the ether to the receiver or vice-versa yet momentum is transferred by EM fields. This is the case for a radio communications link.

Figure 66:
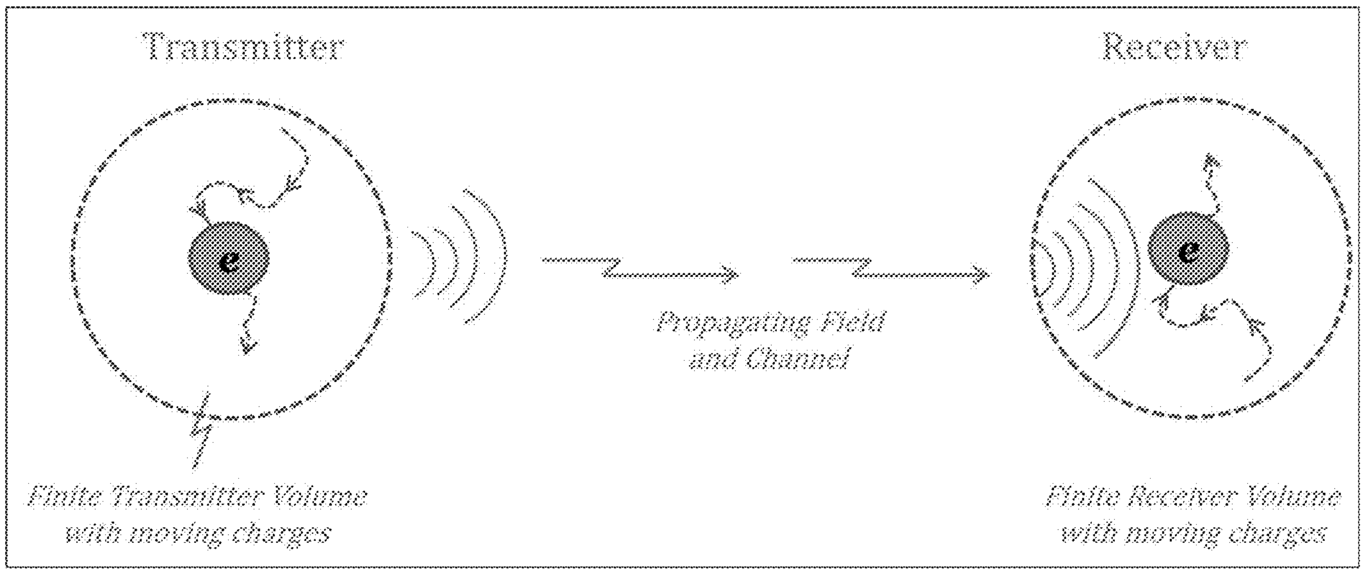
FIG. 66 is an illustration of a block diagram of a system for momentum exchange through a radiated field, in accordance with one or more embodiments.

FIG. 66 provides a reference point for the discussion. FIG. 66 illustrates a block diagram of a system 6600 for momentum exchange through a radiated field, in accordance with one or more embodiments. In FIG. 66, a charge in a restricted transmitter phase space moves according to accelerations from applied forces. The accelerating transmitter charge radiates energy and momentum contained in the fields which transport through a physical medium to the receiver. The transmitter charge does not leave the transmitter phase space, complying with the boundary conditions of Section 3. In electronic communications applications, we can obtain the momentum of the transmitter charge from the Lorentz force.

$$\frac{d}{dt}\vec{p}_{tx} = e\vec{E} + \frac{e}{c}\vec{v}\times\vec{H} \qquad \text{Equation 5-40}$$

$\vec{E}$ is the stimulating electric field and H is the stimulating magnetic field. Often electronic communications application will stimulate charge motion using a time variant scalar potential φ(t) alone so that the magnetic field is zero. In those common cases:

$$\frac{d}{dt}\vec{p}_{tx} = e\vec{E} = -e\nabla\varphi(t) \qquad \text{Equation 5-41}$$

The momentum of the transmitter charge is imparted by a time variant circuit voltage in this circumstance. Since the charge motions involve accelerations, encoded fields radiate with momentum. Radiated fields transfer time variant momentum to charges in the receiver, likewise transferring the information originally encoded in the motion of transmitter charges.

The receiver charge mimics the motion of the transmitter charge at some deferred time.

The equations of motion for the receiver charge are given by:

$$\frac{d}{dt}\vec{p}_{rx} = e\vec{E} + \frac{e}{c}\vec{v}\times\vec{H} \qquad \text{Equation 5-42}$$

$$\frac{d}{dt}\varepsilon = e\left(\vec{v}\cdot\vec{E}\right)$$

The Lorentz force, which moves the receiver particle, is a function of the dynamic electric ($\vec{E}$) and magnetic ($\vec{H}$) field components of the field bridging the channel. These fields can be derived from the potentials which in turn reflect variations associated with the transmitter charge motion. The so called radiation field of the transmitter charge is based on accelerations i.e.

$$\frac{d}{dt}\vec{p}_{tx}.$$

FIG. 67 illustrates a diagram 6700 including a conversation equation for a radiated field, in accordance with one or more embodiments. The integral equation in diagram 6700 for a D=3 hyper sphere illustrates the various components of energy and momentum flux through the surface of a transmit phase space volume. The integral equation written in a conservation form with particle terms on the left and field terms on the right accounting for momentum within the space and moving through the surface of the space. The components with super scripts labeled (⇝) and (⦚) in the integral equation refer to particle and field components respectively.

The energy-momentum tensor provides a compact summary of the quantities of interest associated with the momentum flux of the phase space based on the calculations of the conservation equation. The tensor is related to the space-time momentum $\mathcal{P}$ by:

$$\mathcal{P}^{\alpha} = \frac{1}{C}\int T^{\alpha\beta}\,df_{\beta} \qquad \text{Equation 5-43}$$

α,β are the spatial indices of the tensor in three space and the $0^{th}$ index is reserved for the time components in the first row and column.

Figure 68:
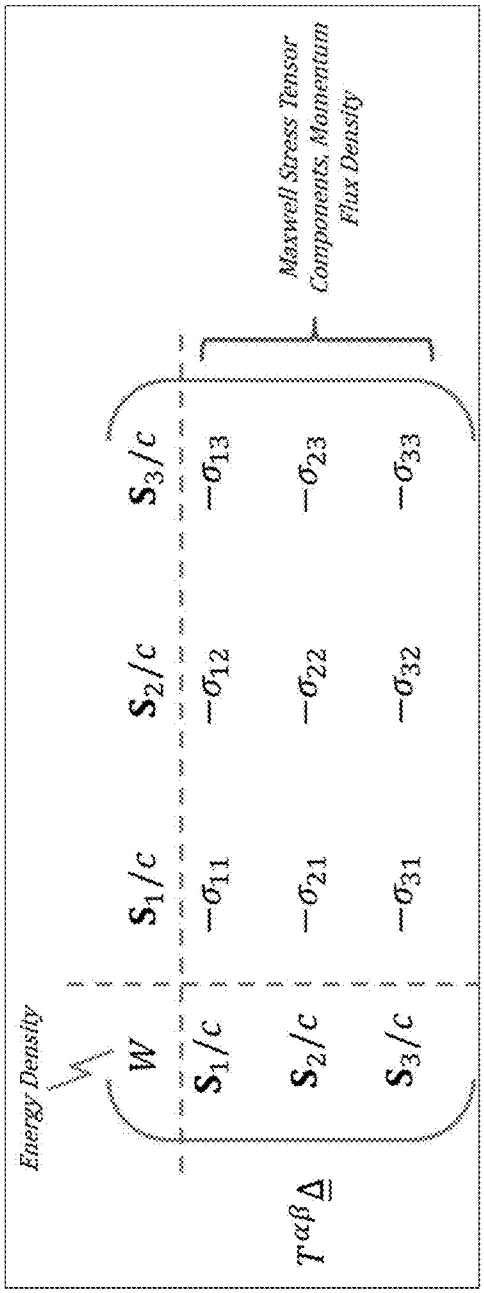
FIG. 68 is an illustration of an energy momentum tensor, in accordance with one or more embodiments.

FIG. 68 illustrates an energy momentum tensor 6800, in accordance with one or more embodiments.

The energy density associated with the phase space in joules per unit volume is given by:

$$T^{00} = \frac{1}{8\pi}(E^2 + H^2) \equiv W \qquad \text{Equation 5-44}$$

The energy flux density per unit time crossing the differential surface element df (chosen perpendicular to the field flux) is given by the tensor elements $T^{0\beta}$ multiplied by c, where:

$$T^{01} = \frac{S_1}{c},\ T^{02} = \frac{S_2}{c},\ T^{03} = \frac{S_3}{c} \qquad \text{Equation 5-45}$$

And Poynting's Vector is obtained from:

$$\vec{S} = \frac{c}{4\pi}\left(\vec{E}\times\vec{H}\right) \qquad \text{Equation 5-42}$$

Maxwell's stress tensor expresses the components of the momentum flux density per unit time passing from the transmitter volume through a surface element of the hypersphere;

$$T^{\alpha\beta} = -\mathcal{G}_{\alpha\beta} = -\frac{1}{4\pi}\left\{E_{\alpha}E_{\beta} + H_{\alpha}H_{\beta} - \frac{1}{2}\delta_{\alpha\beta}(E^2 + H^2)\right\}; \quad \alpha, \beta = 1, 2, 3 \qquad \text{Equation 5-47}$$

The second term in the integral equation of FIG. 67 is zero in our case, $\{\sigma_{\alpha,\beta}^{(\rightsquigarrow)} = 0\}$, since transmit charges are confined by boundary conditions. The right hand side of the integral equation is the momentum change within the transmit volume along with the momentum flux transported through the phase space volume surface. The momentum flux carries information from the transmitter to the receiver through a time variant modulated field. Poynting's vector may also be used to calculate the average energy in that field.

Extended results are commented on by application of modulation to encode information in the fields.

In an embodiment, a modulated harmonic motion of an electron corresponds to a modulated RF carrier. It can be shown that the modulated harmonic motion produces an approximate transverse electromagnetic plane wave in the far field given by:

$$E_y(t) = E_0(\alpha(t))e^{j(\omega t - \phi(t))} \quad \text{Equation 5-48}$$

$$H_z(t) = \frac{1}{-j\omega\mu}\frac{\partial}{\partial x}E_y(t) = \frac{2\pi}{\lambda(t)}\frac{1}{j\omega\mu}E_0(\alpha(t))e^{j(\omega t - \phi(t))} \quad \text{Equation 5-49}$$

$\alpha(t)$ and $\phi(t)$ are random variables encoded with information in this view corresponding to the amplitude and phase of the harmonic field. The momentum of the field changes according to $\alpha(t)$ and $\phi(t)$ in a correlated manner. Therefore the $E_y$ and $H_z$ field components are also random variables possessing encoded information from which we may calculate time variant momentum using the integral conservation equation above.

Accelerating charges radiate fields which carry energy away from the charge. This radiating energy depletes the kinetic energy of the charge in motion, a distinct difference compared to the circumstance of matter without charge. The prior comments do not explicitly contemplate the impact of the radiation reaction on efficiency which may become significant at relativistic speeds.

The field energies calculated by Poynting's vector at the receiver are attenuated by the spherical expansion of the transmitted flux densities as the EM field propagates through space. This attenuation is in proportion to the square of the distance between the transmitter and receiver for free space conditions according to Friis' equation when the separation is on the order of 10 times the wavelength of the RF carrier or greater. Ultimately, the effect of this attenuation is accounted for in the capacity calculations by a reduction in SNR at the receiver.

Finally, it is posited that the principles of section 5.5 are extensible to the general electronics application. Variable momentum is due to the modulation of charge densities and their associated fields, whether it is viewed as simply a bulk phenomena or the ensemble of individual scattering events which average to the bulk result. A circuit composed of conductors and semiconductors can be characterized by voltage and current. Voltage is the work per unit charge to convey the charge through a potential field. When multiplied by the charge per unit time conveyed, one can calculate the total work required to move the charge. This is analogous to the prior discussions involving the conjugate derivative field quantities of particles in a model phase space used to calculate the trajectory work rate ($\vec{p}\cdot\dot{\vec{q}}$) which can be integrated over some characteristic time interval $\Delta t$, to obtain the total work over that interval.

6. Increasing η mod an Optimization Approach

Section 5 establishes the total efficiency for processing as $\eta=\eta_{diss}\eta_{mod}$. $\eta_{mod}$ applies for the modulation process wherever there is an associated efficiency for any interface where the momentum of particles must deliberately be altered to support a communications function. For communications this could include encoding, decoding, modulation, demodulation, increasing the power of a signal, etc. This section introduces a method for increasing $\eta_{mod}$ while maintaining capacity. The method can apply to cases for which distributions of particle momentum are not necessarily Gaussian. Nevertheless, the Gaussian case is examined, since modern communications signals and standards are ever marching toward this limit.

6.1. Sum of Independent RVs

Consider the comparative case where N vs. some greater integer number where is the number of summed signal inputs $x_i$ to a channel. Suppose that it is desirable to conserve energy in the comparison. The total energy is allocated amongst $\zeta$ distributions with an $i^{th}$ branch efficiency inversely related to the $PAPR_i$ of the $i^{th}$ signal.

$$\eta_i=(k_i PAPR_i+a_i)^{-1} \quad \text{Equation 6-1}$$

Equation 6-1 is a general form suitable for handling all information encoding circumstances given a suitable choice of $k_i$ and $a_i$.

Figure 69:
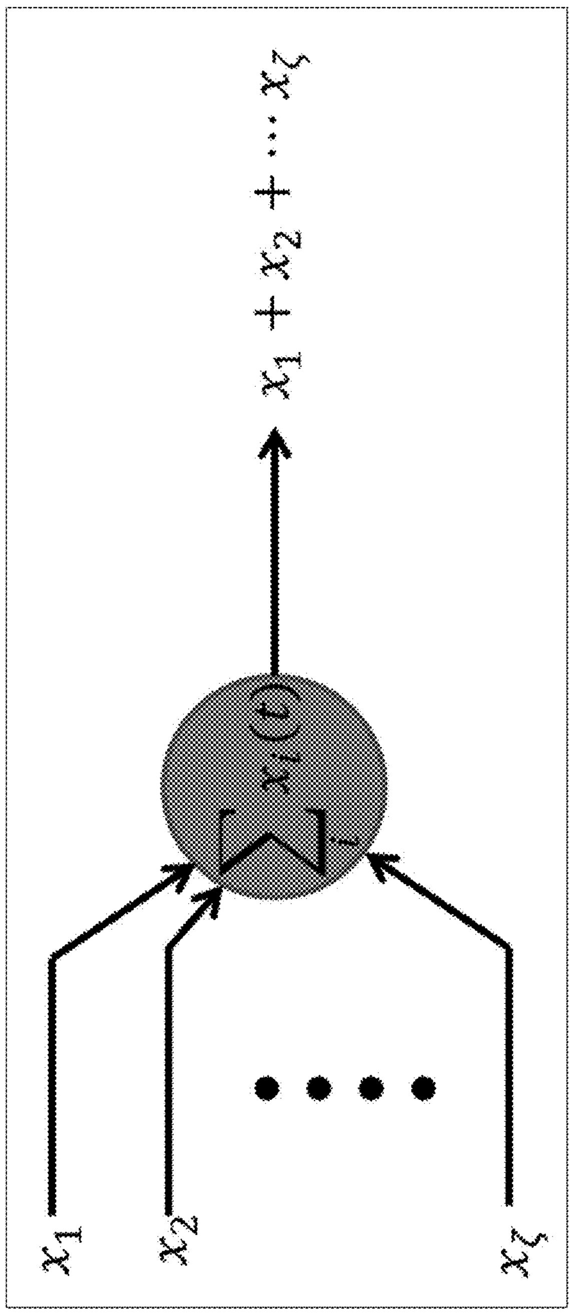
FIG. 69 illustrates a system for summing random signals, in accordance with one or more embodiments.

FIG. 69 illustrates a system 6900 for summing random signals, in accordance with one or more embodiments. System 6900 assists with ongoing discussion.

An effective total efficiency can be calculated from the input efficiencies when the densities of $x_i$ are independent, beginning from the general form developed in Section 5 where $k_{mod}$ and $k_\sigma$ are constants based on encoder implementation.

$$\langle\eta\rangle = \frac{\sigma^2}{k_{mod}P_m + k_\sigma\sigma^2} \quad \text{Equation 6-2}$$

$$P_m = \max\sum_i x_i^2 \quad \text{Equation 6-3}$$

Then, eq. 6-2 may be written for the $i^{th}$ branch as:

$$\eta_i = \frac{\sigma_i^2}{k'_{mod_i}P_{m_i} + k'_{\sigma_i}\sigma_i^2} \quad \text{Equation 6-4}$$

Defining $k_{mod\_i}'=\lambda_i k_{mod}$ and $k_{\sigma\_i}'=\lambda_i k_\sigma$, Equation 6-4 becomes:

$$\lambda_i\eta_i = \frac{\sigma_i^2}{k_{mod_i}P_{m_i} + k_{\sigma_i}\sigma_i^2} \quad \text{Equation 6-5}$$

Forming a time average of equation 6-5 yields:

$$\langle\eta\rangle = \left\langle\sum_i \lambda_i\eta_i\right\rangle = \left\langle\sum_i \frac{\sigma_i^2}{k_{mod_i}P_{m_i} + k_{\sigma_i}\sigma_i^2}\right\rangle \quad \text{Equation 6-6}$$

Stipulating that:

$$\sum_i \lambda_i = 1 \quad \text{Equation 6-7}$$

Equation 6-7 defines $\lambda_i$ as a suitable probability measure for the $i^{th}$ branch. Comparing Equations 6-2 and 6-6 yields:

$$\langle\eta\rangle = \sum_i \lambda_i \eta_i \quad \text{Equation 6-8}$$

Equation 6-8 requires that the weighting coefficients associated with the $i^{th}$ branch be specified to yield the corresponding composite time average. Equations 6-1 through 6-6 suggest that a particular design PAPR can be achieved using a composite of signals, and the individual branch $PAPR_i$ can be lower than the final output which implies that overall efficiency can be improved.

Examination of FIG. 69 and equation 6-6 carries an additional burden of ensuring that each input branch not adversely interact or alternately that $\eta_i$ not be a function of more than 1 input. This is no small challenge for linear continuous processing technologies. In a particle based model, it is possible for all particles of the input delivery streams to interact at a common target particle (i.e. summing node). Energy from a delivery particle in one branch may be redistributed amongst the $\zeta$ branches as well as the output target particle. A preferred strategy would allocate as much momentum from an input branch to the output target particle, without other branch interaction.

In electronics, the analogy is that all the input branches can interact via a circuit summing node through the branch impedances, thus distributing energy from the inputs to all circuit branches, not just the intended output load. Fortunately, there are methods for avoiding these kinds of redistributions.

6.2. Composite Processing

A sampled system provides one means of controlling the signal interactions at the summing node of FIG. 69. A solution addressing the Gaussian case which is also suitable for application using any pdf follows.

Figure 70:
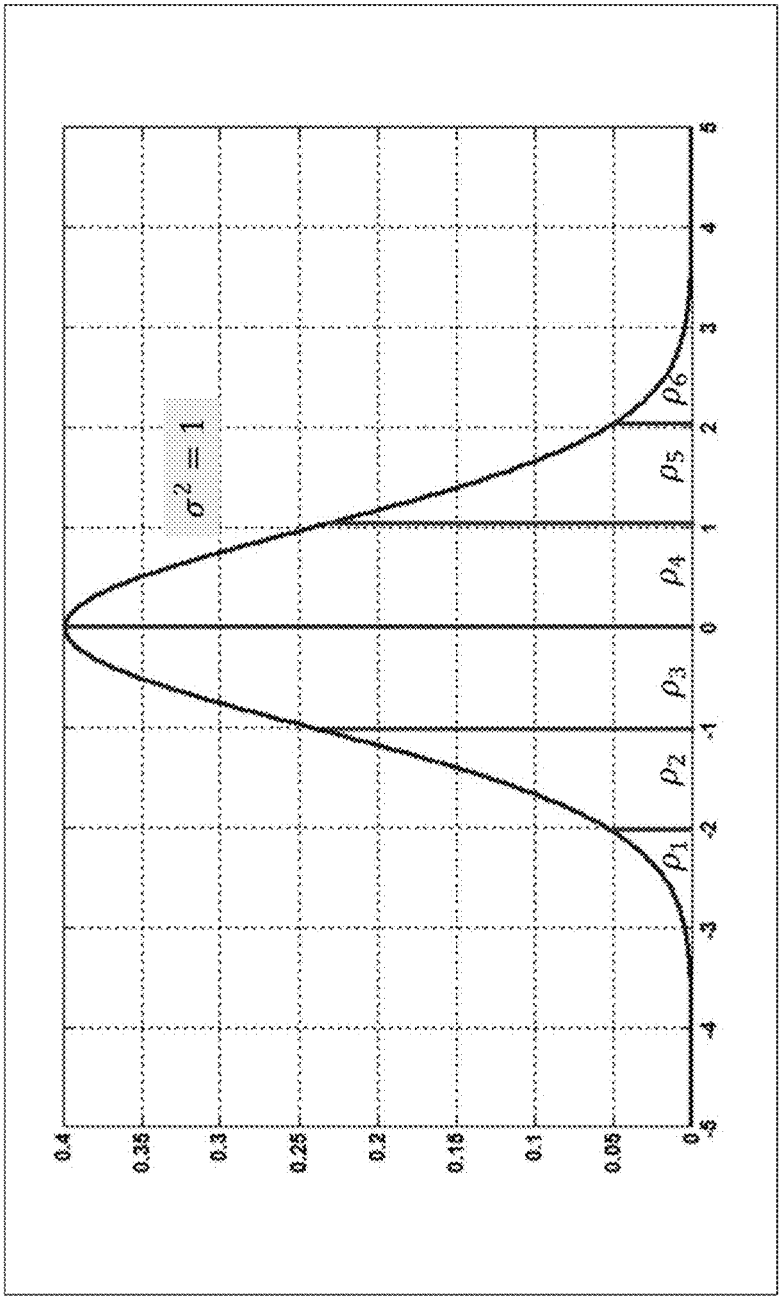
FIG. 70 is an illustration of a plot of a Gaussian pdf formed with composite sub densities, in accordance with one or more embodiments.

FIG. 70 illustrates a plot 7000 of composite sub densities which fit the continuous Gaussian curve precisely, in accordance with one or more embodiments. An appealing feature of this approach is that even with a few sub distributions, the composite is Gaussian and capacity is preserved. Each sub density. $\rho_1$ through $\rho_6(\zeta=6)$, possesses an enhanced efficiency due to a reduced $PAPR_i$. In addition, it is interesting to note that as more sub densities of this kind are deployed with narrower spans, they resemble uniform densities. In the extreme limit $\zeta\to\infty$, they become discrete densities with the momenta probabilities equal to $\lambda_i$ and overall efficiency asymptotically approaches a maximum since each $PAPR_i\to 1$. Just as argued in Section 4, a quantum resolution can be assigned to avoid ill-behaved interpretations of entropy for the theoretical case $\zeta\to\infty$.

For a single dimension D=1, samples for each sub density $\rho_i$, occur at noninterfering sampling intervals. Thus, if this scheme is applied to the system 6900 illustrated in FIG. 69, each input $x_i$ possesses a unique pdf $\rho_i=\rho(x_i)$, and unique sets of signal samples are assigned to populate the sub densities $\rho_i$ whenever the composite signal $\Sigma x_i(t-NT_s)$ crosses the respective sub density domain thresholds. The thresholds are defined as the boundaries between each sub density.

This approach can be extended to each orthogonal dimension for D>1, since orthogonal samples are also physically decoupled. The intersection of the thresholds in multiple dimensions form hyper geometric surfaces defining subordinate regions of phase space. In the most general cases, these thresholds can be regarded as the surfaces of manifolds.

FIG. 70 illustrates each sub distribution as occupying a similar span. However, this is not optimal. In fact, the spans only approach parity for a large number of sub densities. For a few sub densities the spans must be specifically defined to optimize efficiency. Each unique value of $\zeta$ will require a corresponding unique set of density domains and corresponding thresholds.

Figure 6-2 and equation 6-6 suggests that the optimal efficiency can be calculated from:

$$\eta_{opt} = \max_{\eta_\zeta}\left\{\sum_{i=1}^{\zeta} \lambda_i \eta_i\right\} \quad \text{Equation 6-9}$$

The coefficients, $\lambda_i$ are variables dependent on the total number of domains $\zeta$. The thresholds, $\tilde{\eta}_\zeta$, for the domains of each sub-density are varied for the optimization, requiring specific $\lambda_i$. $\eta$ increases as $\zeta$ increases though there is a diminishing rate of return for practical application. Therefore, a significant design activity is to trade $\eta$ vs. $\zeta$ versus cost, size, etc. The trade between efficiency and $\zeta$ is addressed in Section 7 along with examples of optimization.

7. Modulator Efficiency and Optimization

In this Section, some modulator examples are presented to illustrate optimization consistent with the theory presented in prior Sections. Modulators encode information onto an RF signal carrier.

This Section focuses on encoding efficiency. Thus, we are primarily concerned with the efficiency of processing the amplitude of the complex envelope, though the phase modulated carrier case can also be obtained from the analysis.

7.1. Modulator

RF modulation is the process of imparting information uncertainty $H(\rho(x))$ to the complex envelope of an RF carrier. An RF modulated signal takes the form:

$$x(t) = a(t)e^{\omega_c t+\varphi(t)} = a_I(t)\cos(\omega_c t + \varphi(t)) - a_Q(t)\sin(\omega_c t + \varphi(t)) \quad \text{Equation 7-1}$$

$a(t)\underline{\Delta}$ Magnitude of complex envelope $a(t) = \sqrt{(a_I(t))^2 + (a_Q(t))^2}$ $a_I(t)\underline{\Delta}$ Time variant In Phase (real) component of the *REF* Envelope Any point in the complex signaling plane can be traversed by the appropriate orthogonal mapping of $a_I(t)$ and $a_Q(t)$. Alternatively, magnitude and phase of the complex carrier envelope can be specified provided the angle $\varphi(t)$ is resolved modulo $\pi/2$. As pointed out in section 5.5, information modulated onto an RF carrier can propagate through the extended channel via an associated EM field.

Figure 71:
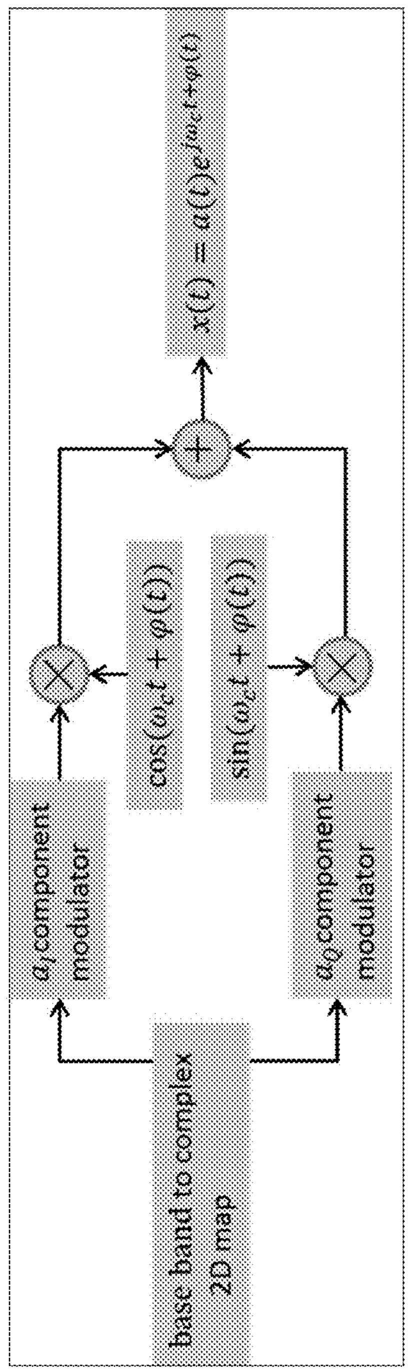
FIG. 71 is an illustration of a complex RF modulator, in accordance with one or more embodiments.

FIG. 71 illustrates a complex RP modulator 7100 in accordance with one or more embodiments. A complex modulator comprises orthogonal carrier sources ($\sin(\omega_c t+\varphi(t))$ and ($\cos(\omega_c t+\varphi(t)$, multipliers, in-phase as well as quadrature phase baseband modulators/encoders and an output summing node.

Figure 72:
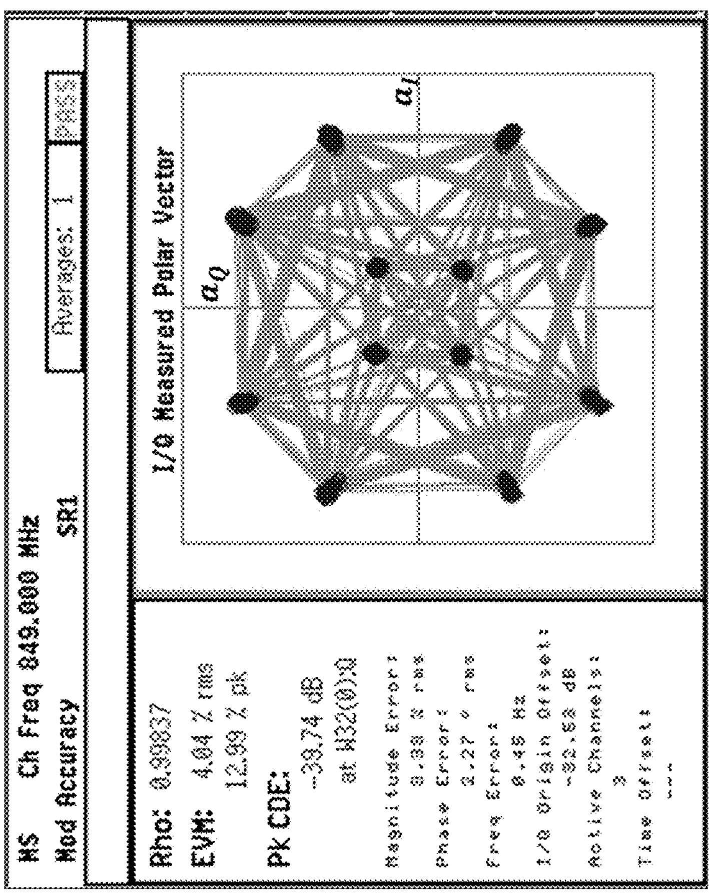
FIG. 72 is an illustration of a plot of a complex signal constellation for a wideband code division multiple access (WCDMA) signal, in accordance with one or more embodiments.

FIG. 72 illustrates a plot 7200 of an example of a measured output from an RF modulator mapped into the complex signal plane results in a 2D signal, in accordance with one or more embodiments. The constellation corresponds to the case of a wideband code division multiple access(WCDMA) signal. Specific sampling points are illustrated at the connecting nodes of trajectories which collectively define the constellation. The 2D time variant voltage trajectories of FIG. 72 are analogous to phase space particle trajectories presented in the prior chapters, restricted to 2 dimensions. Section 5.5 makes this connection top through the Lorentz Equation.

Battery operated mobile communications platforms typically possess unipolar energy sources. In such cases, the random variables defining $a_I(t), a_Q(t)$ are usually characterized by non-central parameters within the modulator segment. Efficiency optimization examples are provided on circuits which encode $a_I(t)$ and $a_Q(t)$ since extension to carrier modulation is straightforward. One need only understand the optimization of in phase $a_I(t)$ voltage or quadrature phase $a_Q(t)$ voltage encoding, then treat each result as independent parts of a 2D solution.

The following discussion advances efficiency performance for a generic series modulator/encoder configuration. Efficiency analysis of the generic model also enjoys common principles applicable to other classes of more complicated modulators.

Figure 73:
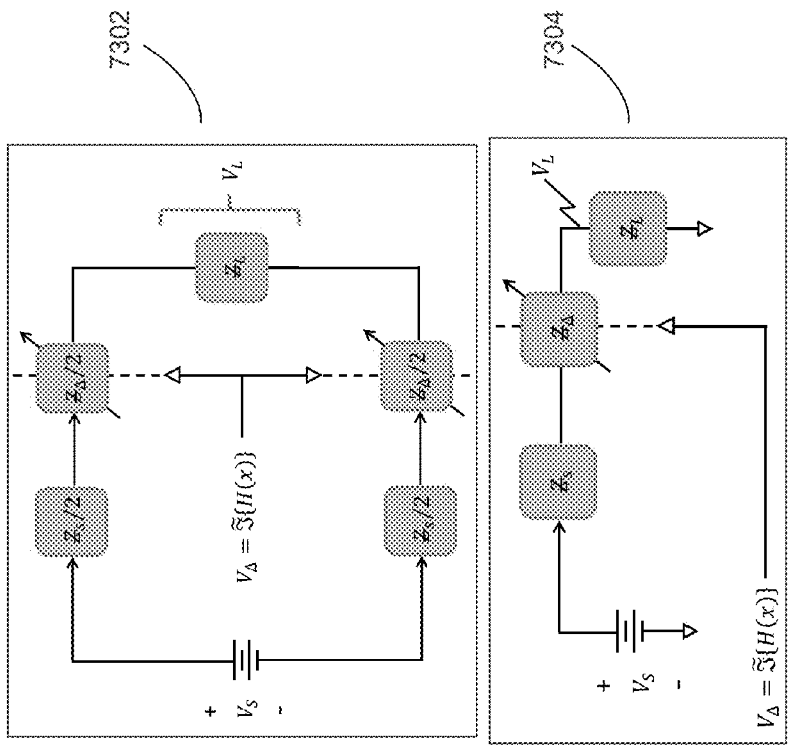
FIG. 73 is an illustration of a differential modulator/encoder and a single ended type 1 series modulator/encoder, in accordance with one or more embodiments.

The series impedance model for a baseband modulator in phase or quadrature phase segment of the general complex modulator is provided in FIG. 73, which illustrates differential and single ended topologies. FIG. 71 illustrates a differential modulator/encoder 7302 and a single ended type 1 series modulator/encoder 7304, in accordance with one or more embodiments. FIG. 73 is referred to as a type 1 modulator. $V_\Delta$ is some encoding function of the information uncertainty H(x) to be mapped using a controlled voltage changes which modify a variable impedance $\not{Z}_\Delta$. Impedance $\not{Z}_\Delta$ is variable from $(0+0_j)\Omega$ to $(\infty+\infty_i)\Omega$. Alternative configurations may be Thevinized, comprising current sources rather than voltage sources, working in conjunction with finite $\not{Z}_s$.

Sections 10.8 and 10.9 derive the thermodynamic efficiency for the type 1 modulator which results in a familiar form for symmetric densities without dissipation:

$$\eta = \frac{1}{2PAPR_{sig}} \quad \text{Equation 7-2}$$

Figure 74:
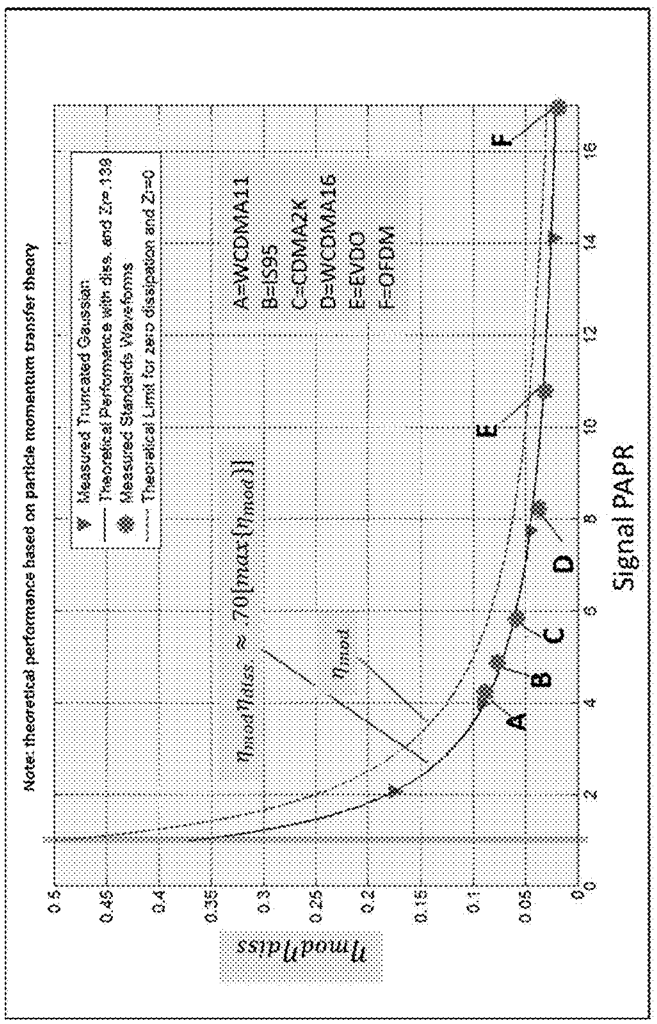
FIG. 74 is an illustration of provides a synopsis of these results of experimental testing, in accordance with one or more embodiments.

This formula was verified experimentally through the testing of a type one modulator. FIG. 74 provides a synopsis 7400 of these results of experimental testing, in accordance with one or more embodiments.

Several waveforms were tested, including truncated Gaussian waveforms studied in Section 5 as well as 3G and 4G+ standards based waveforms used by the mobile telecommunications industry. The maximum theoretical bound for $\eta_{mod}$ (i.e. $\eta_{diss}=1$) represented by the upper curve is based on the theories of this disclosure, for the ideal circumstance. The efficiency of the apparatus due to directly dissipative losses was found to be approximately 70%. The locus of test points depicted by the various markers falls nearly exactly on the predicted performance when directly dissipative results are accounted for. For instance, a truncated Gaussian signal (inverted triangle) with a PAPR of 2 (3 dB) was tested with a measured result of $\eta_{mod}\eta_{diss}=0.175$. Dividing 0.175 by the inherent test fixture losses of 0.7 equates to an $\eta_{mod}=0.25$ in agreement with theoretical prediction of $(2PAPR)^{-1}$. At the other extreme an IEEE802.11a standard waveform based on orthogonal frequency division multiplexed modulation was tested, with a result recorded by data point F. Data point E is representative of the Enhanced Voice Data Only services typical of most code division multiplexed (CDMA) based cell phone technology currently deployed. B and C represent the legacy CDMA cell phone standards. Data points A and D are representative of the modulator efficiency for emerging (WCDMA) wideband code division multiplexed standards. A key point of the results is that the theory of Sections 3 through 5 applies to Gaussian and standards waveforms alike with great accuracy.

7.1 Modulator Efficiency Enhancement for Fixed

An analysis proceeds for a type 1 series modulator with some numerical computations to illustrate the application of principles from Section 5 and a particular example where efficiency is improved.

Voltage domains are related to energy or power domains through a suitable transformation. $\rho(\check{\eta}(a(t))$ or simply $\rho(\check{\eta})$, can be obtained from the appropriate Jacobian to transform a probability density for a voltage at the modulator load to an efficiency (refer to Section 10.8). $\check{\eta}$ is defined as the instantaneous efficiency of the modulator and is directly related to the proper thermodynamic efficiency (refer to Section 10.9).

Let the baseband modulator output voltage probability density, $\rho(V_L)$, be given by;

$$\rho(V_L) \approx \frac{1}{\sqrt{2\pi}\,\sigma_{V_L}} e^{-\frac{(V_L-\langle V_L\rangle)^2}{2\sigma_{V_L}^2}}; \quad 0 \le V_L \le 1 \quad \text{Equation 7-3}$$

Equation 7-3 depicts an example pdf which is truncated non-zero mean Gaussian. $V_L$ corresponds to the statistic of a hypothetical in-phase amplitude or quadrature phase amplitude of the complex modulation at an output load. The voltage ranges are selected for ease of illustration but may be scaled to any convenient values by renormalizing the random variable.

Figure 75:
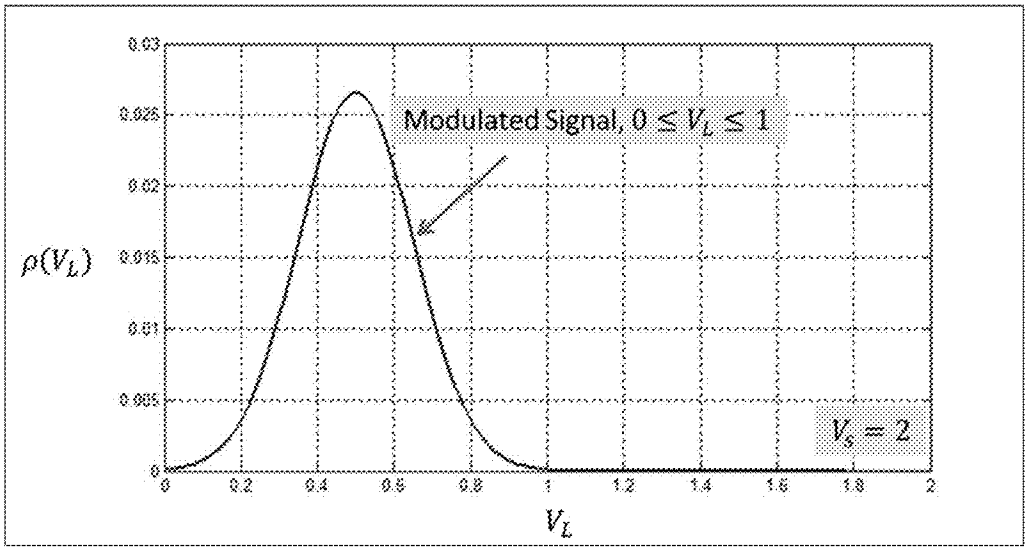
FIG. 75 is an illustration of a plot of a Gaussian pdf for an output voltage, in accordance with one or more embodiments.

FIG. 75 illustrates a plot 7500 of a Gaussian pdf for an output voltage in accordance with one or more embodiments. Plot 7500 includes Voltage, $V_L$, with $V_s=2$, $\langle V_L\rangle = V_s/4 = (4V)$, and $\sigma=0.15$ Average instantaneous waveform efficiency is obtained from:

$$\langle\check{\eta}\rangle = \left\langle\frac{P_{out}}{P_{in}}\right\rangle = \left\langle\frac{V_L^2}{(V_L V_S) - \mathrm{Re}\left\{\frac{Z_s^*}{Z_L}(V_L^2)\right\}}\right\rangle \quad \text{Equation 7-4}$$

Sections 10.8 and 10.9 provide a discussion concerning the use of instantaneous efficiency in lieu of thermodynamic efficiency. In this example, the instantaneous efficiency is used to illustrate a particular streamlined procedure to be applied in optimization in section 7.3.

$\eta_{WF}$ is the total waveform efficiency where the output power consists of signal power $\langle \tilde{V}_L^2 \rangle$ plus modulator overhead. That is, the RV of interest is $V_L = \tilde{V}_L + \langle V_L \rangle$. This differs from the preferred definition of output efficiency given in Section 5. $\tilde{\eta}$ is the thermodynamic efficiency and based on the signal output. $\tilde{\eta}$ is based on the proper output power, due exclusively to the information bearing amplitude envelope signal. Optimization of $\langle \eta_{WF} \rangle$ and $\langle \check{\eta} \rangle$ also optimizes thermodynamic efficiency (reference Section 10.8).

$$\tilde{\eta} = \langle \eta_{WF} \rangle - \frac{\langle V_L \rangle}{V_s};$$

$$Z_r = \frac{Z_s^*}{Z_L} = 1$$

Sometimes the optimization procedure favors manipulation of one form of the efficiency over the other depending on the statistic of the output signal.

We also note the supplemental relationships for an example case where the ratio of the conjugate power source impedance to load impedance, $Z_r = 1$.

$$Z_L = Z_s^*$$

$$Z_r = \frac{Z_s^*}{Z_L}$$

$$V_{L_{max}} = \frac{V_s}{2}$$

$$\langle V_L \rangle = \frac{V_s}{4}$$

$$V_L = \frac{\eta V_s}{(1 + Z_r \eta)} = \frac{\eta V_s}{(1 + \eta)}$$

More general cases can also consider any value for the ratio $Z_r$ other than 1. $Z_s$ has been defined as the power source impedance. The given efficiency calculation adjusts the definition of available input power to the modulator and load by excluding consideration of the dissipative power loss internal to the source. $V_s$ therefore is an open circuit voltage in this analysis. Ultimately then, $Z_s$ limits the maximum available power $P_{max}$ from the modulator.

Now the waveform efficiency pdf is written.

The Jacobian, $$\rho_\eta = \rho(V_L) \frac{d(V_L)}{d(\eta)},$$

yields:

$$\rho(\eta_{WF}) = \frac{V_s}{(1 + \eta)^2} \frac{1}{\sqrt{2\pi\sigma^2}} e^{-\frac{\left(\eta \frac{V_s}{(1+\eta)} - \frac{V_s}{4}\right)^2}{2\sigma^2}} \qquad \text{Equation 7-5}$$

Figure 76:
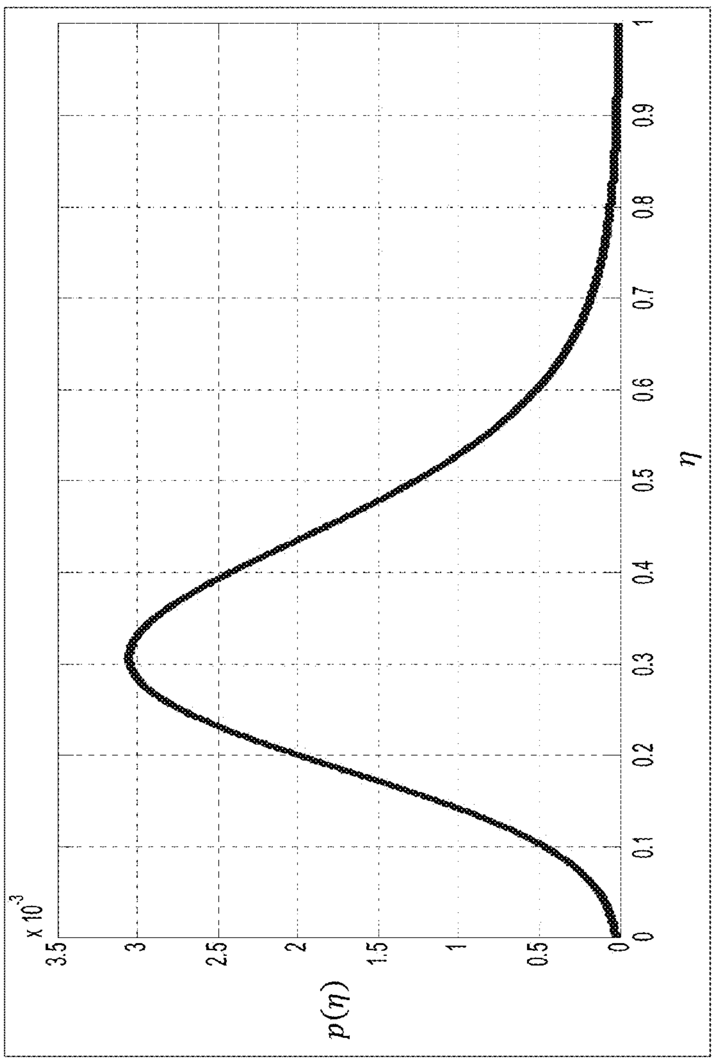
FIG. 76 is an illustration of a plot of a pdf for given Gaussian pdf for output voltage, in accordance with one or more embodiments.

FIG. 76 illustrates a plot 7600 of a pdf for $\check{\eta}$ given Gaussian pdf for output voltage, in accordance with one or more embodiments. Plot 7600 include Output Voltage, $V_L$, with $V_s = 2$, $\langle V_L \rangle = V_s/4(0.5\text{V})$, and $\sigma = 0.15$, $\langle \eta \rangle = 0.34$.

This efficiency characteristic possesses an $\langle \eta_{wf} \rangle$ of approximately 0.347. The $PAPR_{wf}$ is equal to $\langle _{wf} \rangle^{-1}$ or ~4.68 dB. Just as the waveform and signal efficiency are related, the associated peak to average power ratios, $PAPR_{wf}$ and $PAPR_e$, are also related by:

$$PAPR_{wf} = \frac{4PAPR_e}{1 + PAPR_e}$$

The signal peak to average power ratio $PAPR_e = 11.11$ for this example.

Figure 77:
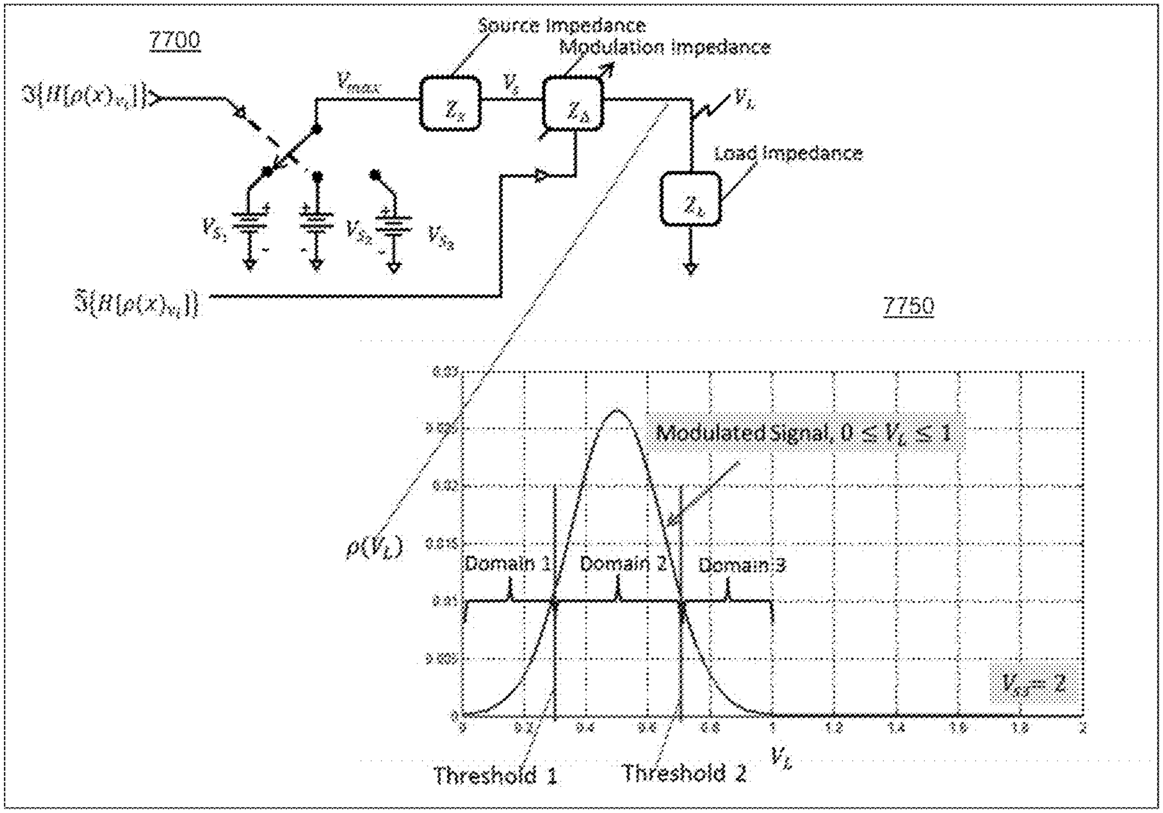
FIG. 77 is an illustration of a modified type 1 modulator architecture and corresponding plot of results, in accordance with one or more embodiments.
Figure 78:
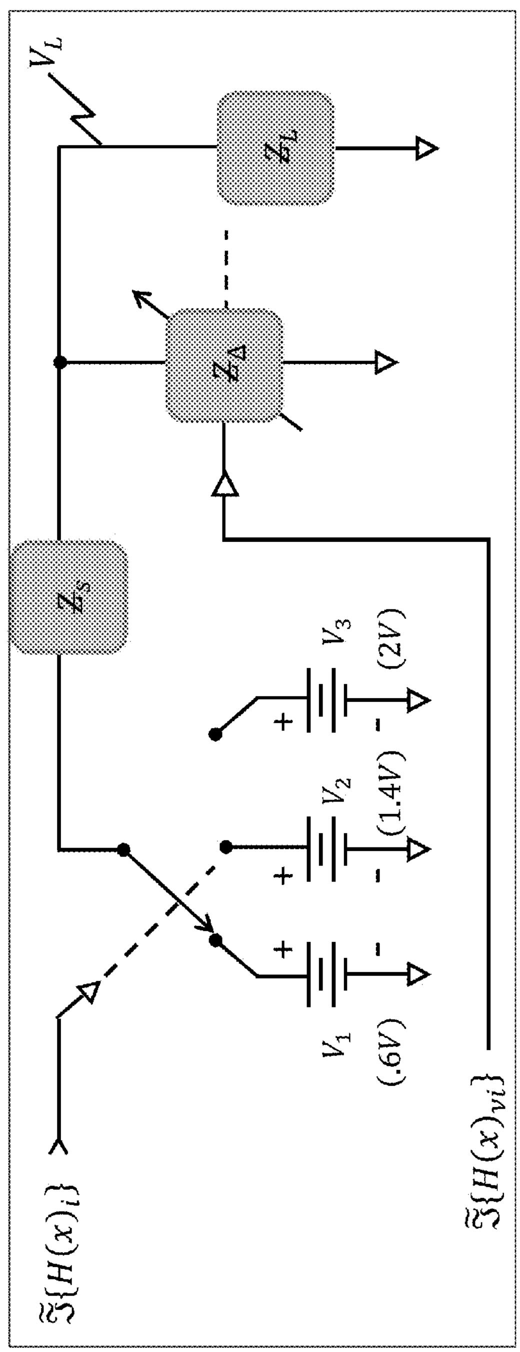
FIG. 78 is an illustration of a modified type 1 modulator architecture, in accordance with one or more embodiments.

2 waveform voltage thresholds which correspond to 3 momentum domains are applied, using a modified type 1 modulator architectures illustrated in FIGS. 77 and 78.

In this example the baseband modulation apparatus possesses 3 separate voltage sources $V_{s1}$, $V_{s2}$, $V_{s3}$. These sources are multiplexed at the interface between the corresponding potential boundaries, $V_1$, $V_2$, as the signal requires. An upper potential boundary $V_3 = V_{max}$ represents the maximum voltage swing across the load. There is no attempt to optimally determine values for signal threshold voltages $V_1$, $V_2$ at this point. The significant voltage ranges defined by $\{0,V_1\}$, $\{V_1,V_2\}\{V_2,V_3\}$, correspond to signal domains within phase space. We regard these domains as momentum domains with corresponding energy domains.

Domains are associated to voltage ranges according to:

Domain 1 if $V_L < V_1$

Domain 2 if $V_1 \le V_L \le V_2$

Domain 3 if $V_2 < V_L < V_3$

Average efficiency for each domain can be obtained from subordinate pdfs parsed from the waveform efficiency of FIG. 76.

The calculations of $\langle \check{\eta}_{1,2,3} \rangle$ are obtained from;

$$\langle \eta_\zeta \rangle = k_{\zeta_{norm}} \int_{\tilde{\eta}_{\zeta-1}}^{\tilde{\eta}_\zeta} \tilde{\eta} \rho_\zeta(\check{\eta}) d(\check{\eta}); \zeta = 1,2,3 \qquad \text{Equation 7-6}$$

$\zeta$ is a domain increment for the calculations and $k_{\zeta\_norm}$ provides a normalization of each partition domain such that each separate sub pdf possesses a proper probability measure. Thus, the averages of eq. 7-6 are proper averages from three unique pdfs. First we calculate the peak efficiency in domain 1, using a 2V power supply as an illustrative reference for a subsequent comparison.

$$\check{\eta}_{1peak} \triangleq \frac{\langle V_L^2 \rangle}{\langle V_L V_S \rangle - V_L^2};$$

$$V_L = .3V,$$

$$V_s = 2V,$$

$$\therefore \check{\eta}_{1peak} \approx .176$$

$\check{\eta}_{1peak}$ is the instantaneous peak waveform efficiency possible for the modulator output voltage of 0.3V when the modulator supply is at 2V. $\langle \check{\eta}_1 \rangle$ according to eq. 7-6, calculates to ≈0.131 in the domain where $0 \le V_L \le 0.3$V.

Now suppose that this region is operated from a new power source with voltage $V_{s_1} = 0.6$V instead of 2 volts. The calculations above are renormalized so that $$\tilde{\eta}_{1_{peak_{norm}}} \Delta 1, \{V_{s_1} = .6V, V_{L1_{max}} = V_s/2 = .3V\}$$

$$\langle \tilde{\eta}_{1_{norm}} \rangle = .131/.176 \cong .744, \; PAPR_{wf1} \approx 1.344$$

$\langle \check{\eta}_{1\_norm} \rangle$ is substantially enhanced because the original peak efficiency of 0.176 is transformed to 100 percent available peak waveform efficiency through the selection of a new voltage source, $V_{s_1}$. Another way to consider the enhancement is that $Z_\Delta$ becomes zero for the series modulator when 0.3 volts is desired at the load. There is therefore zero dissipation in $Z_\Delta$, for that particular operating point. Hence, just as $\check{\eta}_{1peak}$ is transformed from 0.176 to 1, $\langle \check{\eta}_1 \rangle$ is transformed from 0.131 to 0.744.

In domain 2 we perform similar calculations $$\check{\eta}_{2peak}=0.538;\{V_s=2V,V_{L2}=0.7V\}$$

Again we use the modified CDF to obtain the un-normalized $\langle \check{\eta}_2 \rangle \approx 0.338$ first, followed by $\langle \eta_{2\_norm} \rangle$.

$$\langle \tilde{\eta}_{2_{norm}} \rangle \approx .629,\ \tilde{\eta}_{2_{peak_{norm}}} \Delta 1,\ \{V_{s_2} = 1.4V,\ V_{L2_{max}} = .7V\},$$

$$PAPR_{wf2} \approx 1.589$$

Likewise we apply the same procedure for domain 3 and obtain;

$$\langle \check{\eta}_{3_{norm}} \rangle \approx 0.626, \check{\eta}_{3_{Pnorm}} \underline{\Delta} 1, \{V_s=2V, V_{L3_{max}}=1V\}, PAPR_{wf3} \approx 1.597$$

The corresponding block diagram for an instantiation of this solution becomes that shown in FIG. 78. The switch transitions as each threshold associated with a statistical boundary is traversed, selecting a new domain according to $\Im\{H(x)_1, H(x)_2, H(x)_3\}$ ($\zeta=3$). The index i in FIG. 78 is a domain index which is a degree of freedom for the modulator. The ν,i subscript refers to ν degrees of modulator freedom associated with the $i^{th}$ domain. In a practical implementation, the entropy H(x) of the information source is parsed between the various modulator degrees of freedom. In this example, 2 bits of information can be assigned to select the $i^{th}$ domain. Using this method we obtain efficiency improvements above the single domain average which is calculated as $\langle \eta \rangle \approx 0.347$. In comparison, the new efficiencies and probability weightings per domain are:

$\langle \check{\eta}_1 \rangle = 0.744$; 9.1% probability weighting
$\langle \check{\eta}_2 \rangle = 0.629$; 81.8% probability weighting
$\langle \check{\eta}_3 \rangle = 0.626$; 9.1% probability weighting The final weighted average of this solution, which has not yet been optimized, is given by:

$$\langle \check{\eta}_{tot} \rangle = \eta_{sx} \cdot [(0.091 \times 0.744) + (0.818 \times 0.629) + (0.091 \times 0.626)] \cong \eta_{sx} \cdot 0.64$$

As is shown in the next section, the optimal choice of values for $V_1$, $V_2$, can improve on the results of this example, which is already a noticeable improvement over the single domain solution of $\langle \check{\eta}_{mod} \rangle = 0.347$.

$\eta_{sx}$ is the efficiency associated with the switching mechanism which is a cascade efficiency. Typical switch efficiencies of moderate to low complexity can attain efficiencies of 0.9. However, as switch complexity increases, $\eta_{sx}$ may become a design liability. $\eta_{sx}$ is considered a directly dissipative loss and a design tradeoff.

Voltage is the fundamental quantity from which the energy domains are derived. Preserving the information to voltage encoding is equivalent to properly accounting for momentum. This is important because $\rho(\check{\eta})$ is otherwise not unique. We could also choose to represent efficiency as an explicit function of momentum as in Section 5, thereby emphasizing a more fundamental view. However, there is no apparent advantage for this simple modulator example. More complex encoder mappings involving large degrees of freedom and dimensionality can benefit from explicitly manipulating the density $(\check{\eta}(p))$ at a more fundamental level.

7.3. Optimization for Type 1 Modulator, ζ=3 Case

From the prior example we can obtain an optimization of the form $$\max\{\langle \check{\eta}_{tot} \rangle\} = \max\{\lambda_1 \langle \check{\eta}_1 \rangle + \lambda_2 \rangle \lambda_2 \langle \check{\eta}_2 \rangle + \lambda_3 \rangle\} \qquad \text{Equation 7-7}$$

$$\Sigma \lambda_i = 1$$

It is also noted that $$\langle \check{\eta}_1 \rangle = \Im\{V_{s_1}\}, \langle \check{\eta}_2 \rangle = \Im\{V_{s_1}, V_{s_2}\}, \langle \check{\eta}_3 \rangle = \Im\{V_{s_2}, V_{s_3}\}$$

The goal is to solve for the best domains by selecting optimum voltages $V_{s_1}$, $V_{s_2}$, $V_{s_3}$, $V_{s_3}$ is selected as the maximum available supply by definition and was set to 2V for the prior example. The minimum available voltage is set to $V_{s_0}=0$. Therefore only $V_{s_1}$ and $V_{s_2}$ must be calculated for the optimization of a three domain example, which also simultaneously determines $\lambda_1$, $\lambda_2$ and $\lambda_3$. We proceed with substitutions for thresholds, domains, and efficiencies in terms of appropriate variables and supplementary relations:

$$\max\{\check{\eta}_{tot}\} = \max\left\{\lambda_1 k_{1_{norm}} \int_0^{\eta_1} \check{\eta}_1 \rho_1(\check{\eta}_1) d\check{\eta}_1 + \lambda_2 k_{2_{norm}} \int_{\eta_{12}}^{\eta_2} \check{\eta}_2 \rho_2(\check{\eta}_2) d\check{\eta}_2 + \lambda_2 k_{2_{norm}} + \int_{\eta_{23}}^{\eta_3} \check{\eta}_3 \rho_3(\check{\eta}_3) d\check{\eta}_3 \right\} \qquad \text{Equation 7-8}$$

$$\eta_1 = \frac{V_{L_1}^2}{V_{L_1} V_{s_1} - V_{L_1}^2},$$

$$\eta_2 = \frac{V_{L_2}^2}{V_{L_2} V_{s_2} - V_{L_2}^2},$$

$$\eta_3 = \frac{V_{L_3}^2}{V_{L_3} V_{s_3} - V_{L_3}^2},$$

$$\eta_{12} = \frac{V_{L_1}^2}{V_{L_1} V_{s_2} - V_{L_1}^2},$$

$$\eta_{23} = \frac{V_{L_2}^2}{V_{L_2} V_{s_{23}} - V_{L_2}^2},$$

$$\check{\eta}_1 = \frac{V_L^2}{V_L V_{s_1} - V_L^2},$$

$$\check{\eta}_2 = \frac{V_L^2}{V_L V_{s_2} - V_L^2},$$

$$\check{\eta}_3 = \frac{V_L^2}{V_L V_{s_3} - V_L^2},$$

$$d\check{\eta}_\zeta = \left(\frac{V_{S_\zeta}}{(V_{S_\zeta} - V_L)^2}\right) dV_L,$$

$$\zeta = 1, 2, 3$$

$$\lambda_1, \lambda_2, \lambda_3 \ge 0 \quad \lambda_1 + \lambda_2 + \lambda_3 = 1$$

$$\begin{cases} \lambda_1 = \int_0^{V_{L_1}} \rho_1(V_L) dV_L \\ \lambda_2 = \int_{V_{L_1}}^{V_{L_2}} \rho_2(V_L) dV_L \\ \lambda_3 = \int_{V_{L_1}}^{1} \rho_3(V_L) dV_L \end{cases}$$

-continued $$V_{L_\zeta} \Delta \frac{V_{S_\zeta}}{2},$$

$$\zeta = 1, 2, 3$$

$k_{\zeta_{norm}}$ are determined such that each sub distribution max {CDF} equal 1, transforming them into separate pdfs with proper probability measures. $\lambda_{1,2,3}$ are simply the following probabilities with respect to the original composited Gaussian pdf $\rho(V_L)$;

$$\lambda_1 = \{P(0 \le V_L \le V_{L_1}\}$$

$$\lambda_2 = \{P(V_{L_1} < V_L \le V_{L_2}\}$$

$$\lambda_3 = \{P(V_{L_2} \le V_L \le 1\}$$

What must be obtained from the prior equations are $V_{L_1}$ and $V_{L_2}$. Varying $V_{L_1}$ and $V_{L_2}$ provides an optimization for $\langle \check{\eta}_{tot} \rangle$. The optimization performed according to the domains calculation equations yields an optimal set of fixed sources, $V_{s_1} \cong 0.976$ and $V_{s_2} \cong 1.328$, which enable the overall averaged efficiency $\langle \check{\eta}_{tot} \rangle \cong 0.736$. This is significantly better than the original single domain partition result of 0.347 and 9.6% better than the guess used to demonstrate calculation mechanics in the previous section. If the signal amplitude statistic Changes then so do the numbers. However, the methodology for optimization remains essentially the same. What is also significant is the fact that partitioning the original pdf has simultaneously lowered the dynamic range requirement in each partitioned domain. This dynamic range reduction can figure heavily into strategies for optimization of architectures which use switched power supplies.

7.4. Ideal Modulation Domains

Suppose we wish to ascertain an optimal theoretical solution for both number of domains and their respective threshold potentials for the case where amplitude is exclusively considered as a function of any statistical distribution $p(V_L)$. We begin in the familiar way using PAPR and $\langle \check{\eta} \rangle$ definitions from Section 6.

$$\langle \check{\eta}_i \rangle = \frac{1}{(k_i PAPR_i + a_i)}$$

This defines instantaneous $\langle \check{\eta} \rangle$ for a single domain. For multiple energy domains and the 1st Law of Thermodynamics we may write;

$$\langle \check{\eta}_i \rangle = \sum_i \langle \check{\eta}_i \lambda_i \rangle = \sum_i \lambda_i \left\langle \frac{P_{out_i}}{P_{in_i}} \right\rangle \quad \text{Equation 7-9}$$

From the 2nd Laws of Thermodynamics we know $$\left\langle \frac{P_{out_i}}{P_{in_i}} \right\rangle \le 1$$

$$\langle \check{\eta}_i \rangle \le 1$$

$\lambda_i$ is the statistical weighting for $\check{\eta}_i$ over the $i^{th}$ domain so that:

$$\sum_i \lambda_i = 1$$

It is apparent that each and every $\check{\eta}_i \to 1$ for $\langle \eta \rangle$ to become one. That is, it is impossible to achieve an overall efficiency of $\langle \check{\eta} \rangle \to 1$ unless each and every $i^{th}$ partition is also 100% efficient. Hence, $$\max \langle \check{\eta}_i \rangle = \sum_i \lambda_i = 1$$

$\lambda_i$ are calculated as the weights for each $i^{th}$ partition such that:

$$\lambda_i = \int_{V_{L_{i-1}}}^{V_{L_i}} \rho(V_L) dV_L$$

It follows for the continuous analytical density function $\rho(V_L)$ that $$\sum_i \lambda_i = \int \rho(V_L) dV_L$$

In order for the prior statements to be consistent we recognize the following for infinitesimal domains:

$$\Delta V_L \underline{\Delta} (V_{L_i} - V_{L_{i-1}}) \to dV_L$$

$$\Delta\lambda_i \to \lambda_i - \lambda_{i-1} \to d\lambda$$

$$\zeta \to \infty$$

This means that in order for the Riemannian sum to approximately converge to the integral, $$\lambda_i \approx \rho(V_{L_i})$$

The increments of potentials in the domains must become infinitesimally small such that ζ grows large even though the sum of all probabilities is bounded by the CDF. Since there are an infinite number of points on a continuous distribution and we are approximating it with a limit of discrete quantities, some care must be exercised to insure convergence. This is not considered a significant distraction if we assign a resolution to phase space according to the arguments of Section 4.

This analysis implies an architecture consisting of a bank of power sources which in the limit become infinite in number with the potentials separated by $\Delta V_{si} \to dV_s$. A switch can be used to select this large number of separate operating potentials "on the fly". Such a switch cannot be easily constructed. Also, its dissipative efficiency $\eta_{sx}$, would approach zero, thus defeating a practical optimization. Such an architecture can be emulated by a continuously variable power supply with bandwidth calculated from the TE relation of Section 3. Such a power supply poses a number of competing challenges as well. Fortunately, a continuously variable power source is not required to obtain excellent efficiency increases as we have shown with a 3 domain solution and will presently revisit for domains of variable number.

7.5. Sufficient Number of Domains, ζ

A finite number of domains will suffice for practical applications. A generalized optimization procedure can then be prescribed for setting domain thresholds.

$$\max\{\check{\eta}_{tot}\} = \max\left\{\sum_i \lambda_i k_{i_{norm}} \int_{\eta_{\{i-1,i\}}}^{\eta_i} \check{\eta}_i p_i(\check{\eta}_i)\, d\check{\eta}_i\right\} \quad \text{Equation 7-20}$$

$$\eta_i \Delta \frac{V_{L_i}^2}{V_{L_i} V_{S_i} - V_{L_i}^2},$$

$$\eta_{\{i-1,i\}} \Delta \frac{V_{L_{i-1}}^2}{V_{L_{i-1}} V_{S_i} - V_{L_{i-1}}^2}$$

$$\check{\eta}_i \Delta \frac{V_L^2}{V_L V_{S_i} - V_L^2}$$

$$d\check{\eta}_i = \left(\frac{V_{S_i}}{(V_{S_i} - V_L)}\right) dV_L$$

$$\lambda_i = \int_{V_{L_{i-1}}}^{V_{L_i}} p(V_L)\, dV_L$$

$$\sum_i \lambda_i \Delta 1$$

$$V_{L_i} \Delta \frac{V_{S_i} Z_L}{(Z_s + Z_L)}$$

Figure 79:
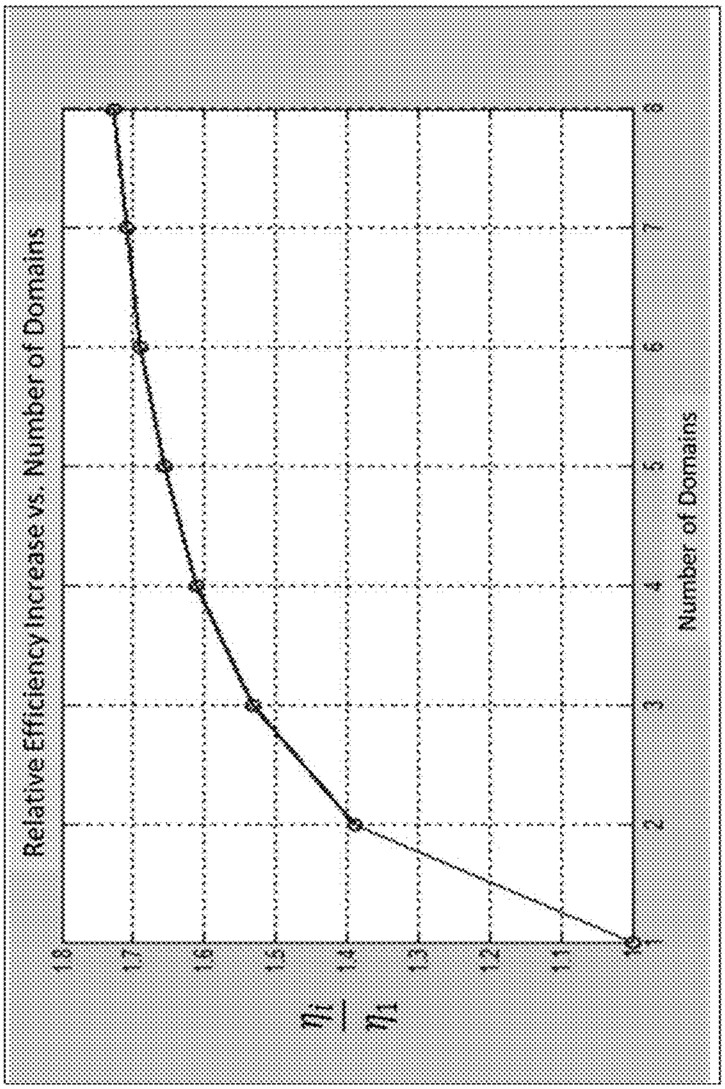
FIG. 79 is an illustration of a plot of relative efficiency increase as a function of the number of optimized domains, in accordance with one or more embodiments.
Figure 80:
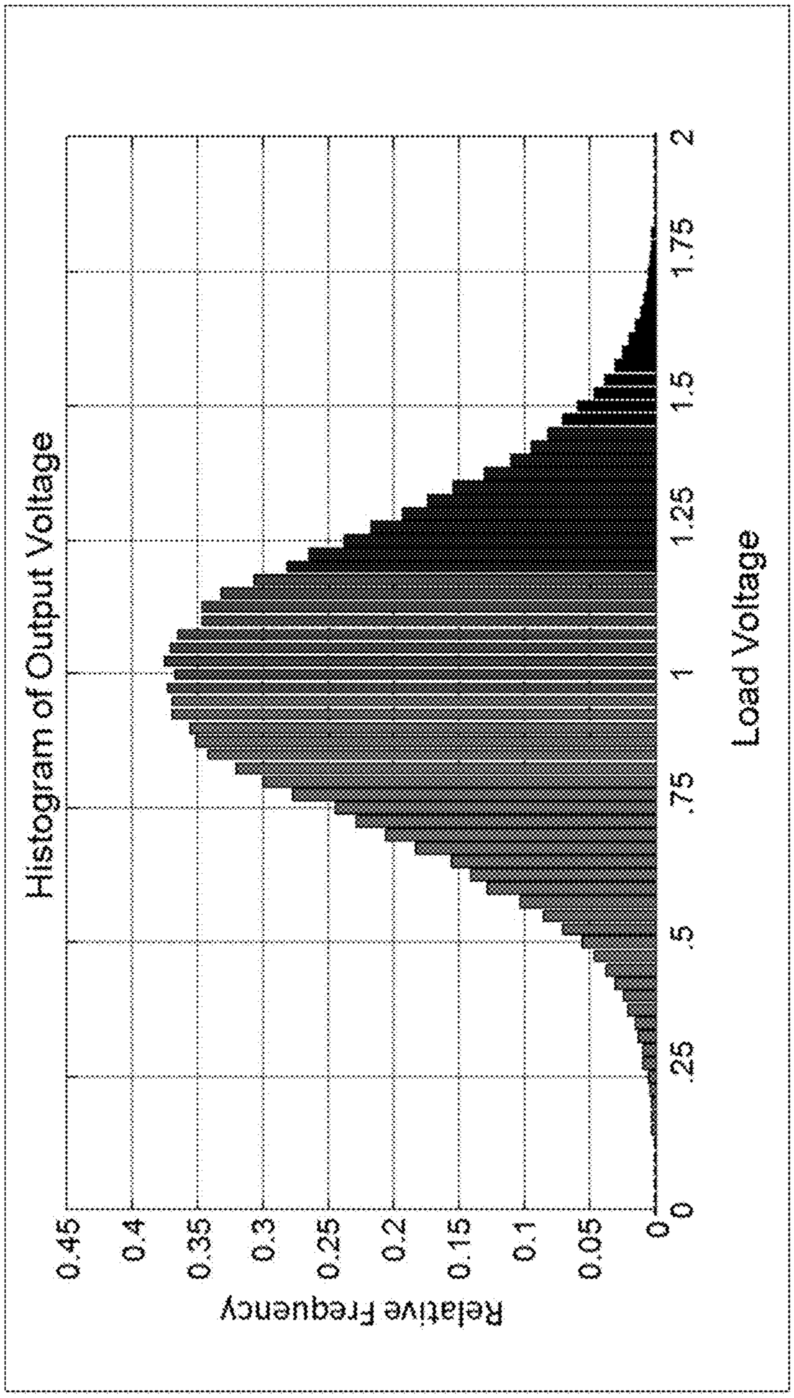
FIG. 80 is an illustration of a plot of the relative frequencies of voltages measured across the load, in accordance with one or more embodiments.

FIG. 78 illustrates the thermodynamic efficiency improvement as a function of the number of optimized domains in the case where the signal PARR~10.5 dB. FIG. 79 illustrates a plot 7900 of relative efficiency increase as a function of the number of optimized domains, in accordance with one or more embodiments. FIG. 79 was verified with theoretical calculation and experimentation using a laboratory apparatus. In all cases the deviation between calculation and measurement was less than 0.7%, attributed to test fixture imperfections, resolution in generating the test signal distribution and measurement accuracies. FIG. 80 illustrates a plot 8000 of the relative frequencies of voltages measured across the load for the experiment with a circuit source impedance of zero, in accordance with one or more embodiments. Table 7-1 lists the optimized voltage thresholds or alternately, the power supplies required for implementation.

TABLE 7-1

Corresponding Power Supply Values Defining optimized Thresholds for a given ζ

| | 1 Domain | 2 Domains | 3 Domains | 4 Domains | 5 Domains | 6 Domains | 7 Domains | 8 Domains |
|---|---|---|---|---|---|---|---|---|
| Supply1 | 2.0 V | 2.0 V | 2.0 V | 2.0 V | 2.0 V | 2.0 V | 2.0 V | 2.0 V |
| Supply2 | | 1.28 V | 1.41 V | 1.46 V | 1.53 V | 1.55 V | 1.57 V | 1.59 V |
| Supply3 | | | 1.07 V | 1.19 V | 1.28 V | 1.34 V | 1.37 V | 1.39 V |
| Supply4 | | | | 0.95 V | 1.09 V | 1.18 V | 1.22 V | 1.26 V |
| Supply5 | | | | | 0.89 V | 1.02 V | 1.07 V | 1.12 V |
| Supply6 | | | | | | 0.85 V | 0.92 V | 0.99 V |
| Supply7 | | | | | | | 0.81 V | 0.88 V |
| Supply8 | | | | | | | | 0.79 V |

This optimization procedure is applicable for all forms of $\rho(V_L)$, even those with discrete RVs, provided care is exercised in defining the thresholds and domains for the RV. Optimization is best suited to numerical techniques for arbitrary $\rho(V_L)$.

7.6. Zero Offset Gaussian Case

A zero offset Gaussian case is reviewed in this section using a direct optimization method to illustrate the contrast compared to the instantaneous efficiency approach. The applicable probability density for the load voltage is illustrated in plot 8100 of FIG. 81. The optimization procedure in this case uses the proper thermodynamic efficiency as the kernel of optimization so that;

$$\max\{\eta\} = \max\left\{\frac{\langle P_e\rangle}{\langle P_{in}\rangle}\right\}$$

The more explicit form with domain enumeration is given by;

$$\max\{\eta\} = \max\left\{\sum_i \lambda_i k_{i_{norm}} \frac{\langle P_e\rangle_i}{\langle P_{in}\rangle_i}\right\}$$

$\langle P_e\rangle \langle P_{in}\rangle_i$ are the average effective and input powers respectively. Section 10.8 provides the detailed form in terms of the numerator RV and denominator RV which are in the most general case non-central gamma distributed with domain spans defined as functions $f\{V_T\}_i$, $f\{V_T\}_{i-1}$ of the threshold voltages.

$$\eta = \max\left\{\frac{\sum_i \lambda_i k_{i_{norm}} \int_{f\{V_T\}_{i-1}}^{f\{V_T\}_i} \mathcal{X}_e \rho(\mathcal{X}_e)\, d\mathcal{X}_e}{\sum_i \lambda_i k_{i_{norm}} \int_{f\{V_T\}_{i-1}}^{f\{V_T\}_i} \mathcal{X}_{in} \rho(\mathcal{X}_{in})\, d\mathcal{X}_{in}}\right\} \quad \text{Equation 7-13}$$

The general form of the gamma distributed RV in terms of the average $i^{th}$ domain load voltage is:

$$\rho(\mathcal{X}) = \frac{1}{2}\left(\frac{\mathcal{X}}{\sum_i^N \langle V_{L_i}\rangle}\right)^{[(N-2/4)]} e^{-\frac{(\mathcal{X} - \sum_i^N \langle V_{L_i}\rangle)}{2\sigma^2}} \quad \text{Equation 7-12}$$

$$I[(N-2)/2]\left(\frac{1}{2\sigma^2}\sqrt{\mathcal{X}\sum_i^N \langle V_{L_i}\rangle}\right);$$

$$\mathcal{X} \geq 0$$

Figure 81:
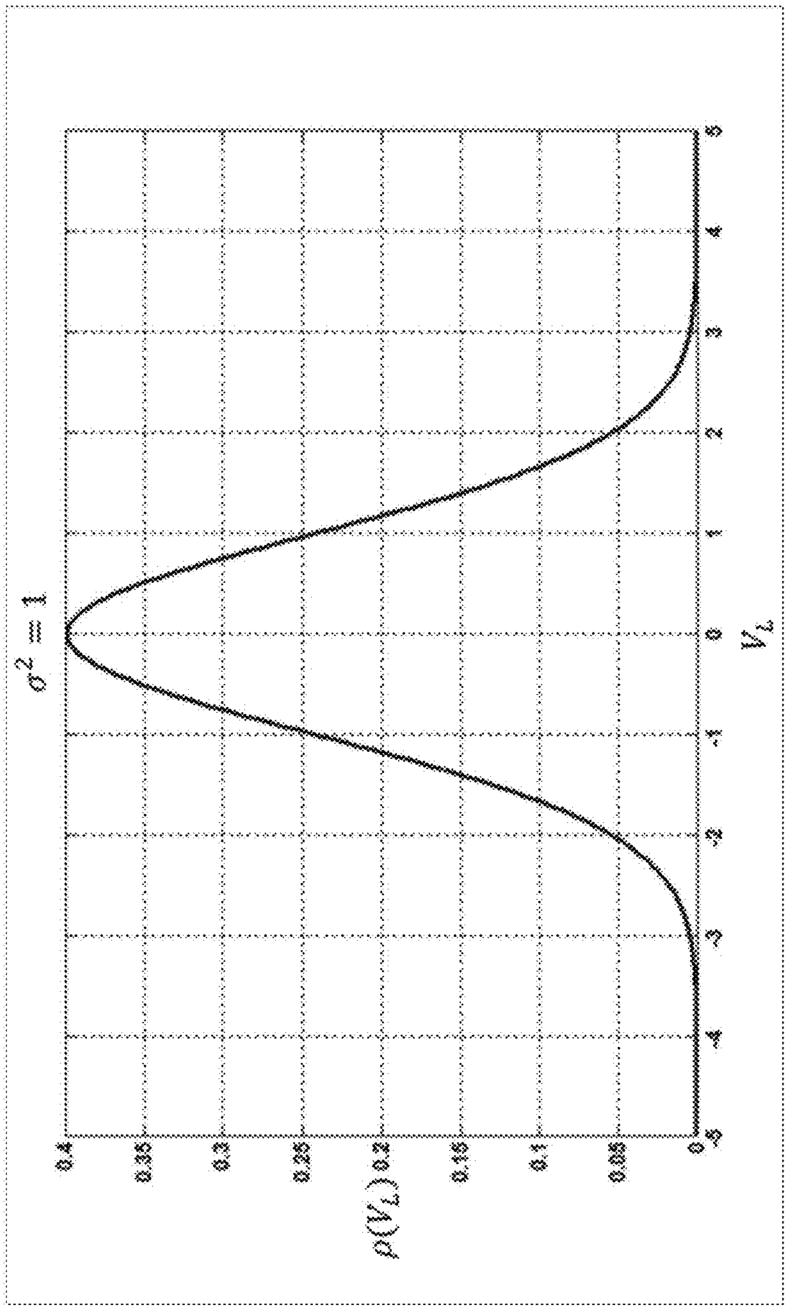
FIG. 81 is an illustration of a plot of a probability density of load voltage for zero offset case, in accordance with one or more embodiments.
Figure 82:
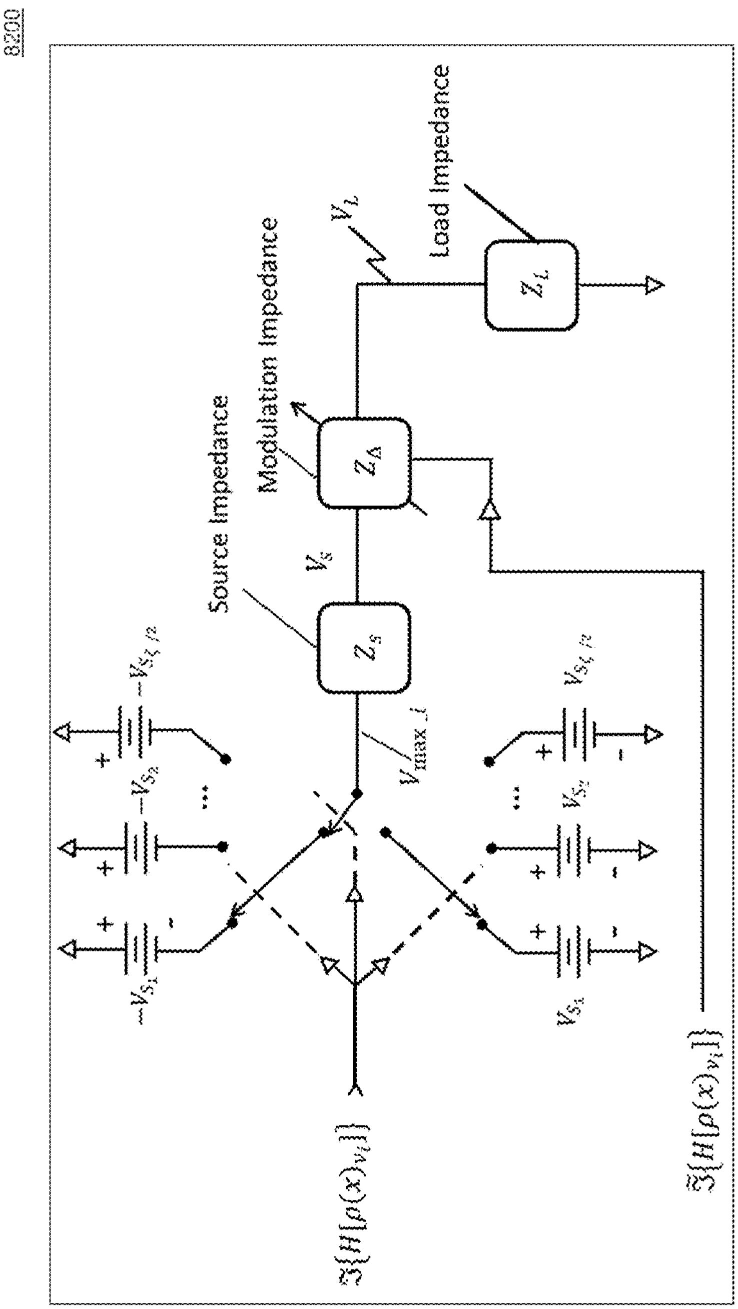
FIG. 82 is an illustration of a block diagram of a type 1 differentially sourced modulator, in accordance with one or more embodiments.

Since a single subordinate density corresponds to FIG. 81, N=1 for the current example $I_{[(N-2)/2]}$ is a modified Bessel function. The $i^{th}$ domain load voltage in the numerator of eq. 7-11 is due to signal only while the denominator must contemplate signal plus any overhead terms. This direct form of efficiency optimization can be more tedious under certain circumstances compared to an optimization based on the instantaneous efficiency metric. The optimized thresholds can be calculated by varying the domains similar to the method illustrated in Equation 7-10. This is a numerical calculus of variations approach where the ratio of 7-11 is tested to obtain a converging gradient. Optimized thresholds are provided in table 7-2 for up to $\zeta=16$ and normalized maximum Load Voltage of 1. In this case symmetry reduces the number of optimizations by half. The corresponding circuit architecture is illustrated in FIG. 82. FIG. 82 illustrates a block diagram of a type 1 differentially sourced modulator 8200, in accordance with one or more embodiments.

TABLE 7-2

Values for Thermodynamic Efficiency vs. Number of Optimized Partitions (Zs = 0), PAPR~11.8 dB

| Num. of Domains $\zeta = \max\{i\}$ | Supply Voltages ($V_{si}$) | Thermodynamic Efficiency |
|---|---|---|
| 2 | ±1 | 32.0% |
| 4 | ±1, ±0.45 | 56.6% |
| 6 | ±1, ±0.55, ±0.32 | 68.26% |
| 8 | ±1, ±0.6, ±0.4, ±0.24 | 75.0% |
| 10 | ±1, ±0.65, ±0.47, ±0.33, ±0.21 | 79.45% |
| 12 | ±1, ±0.67, ±0.51, ±0.39, ±0.29, ±0.19 | 82.5% |
| 14 | ±1, ±0.68, ±0.53, ±0.42, ±0.33, ±0.25, ±0.16 | 84.8% |
| 16 | ±1, ±0.70, ±0.56, ±0.46, ±0.38, ±0.3, ±0.23, ±0.15 | 86.5% |

Figure 83:
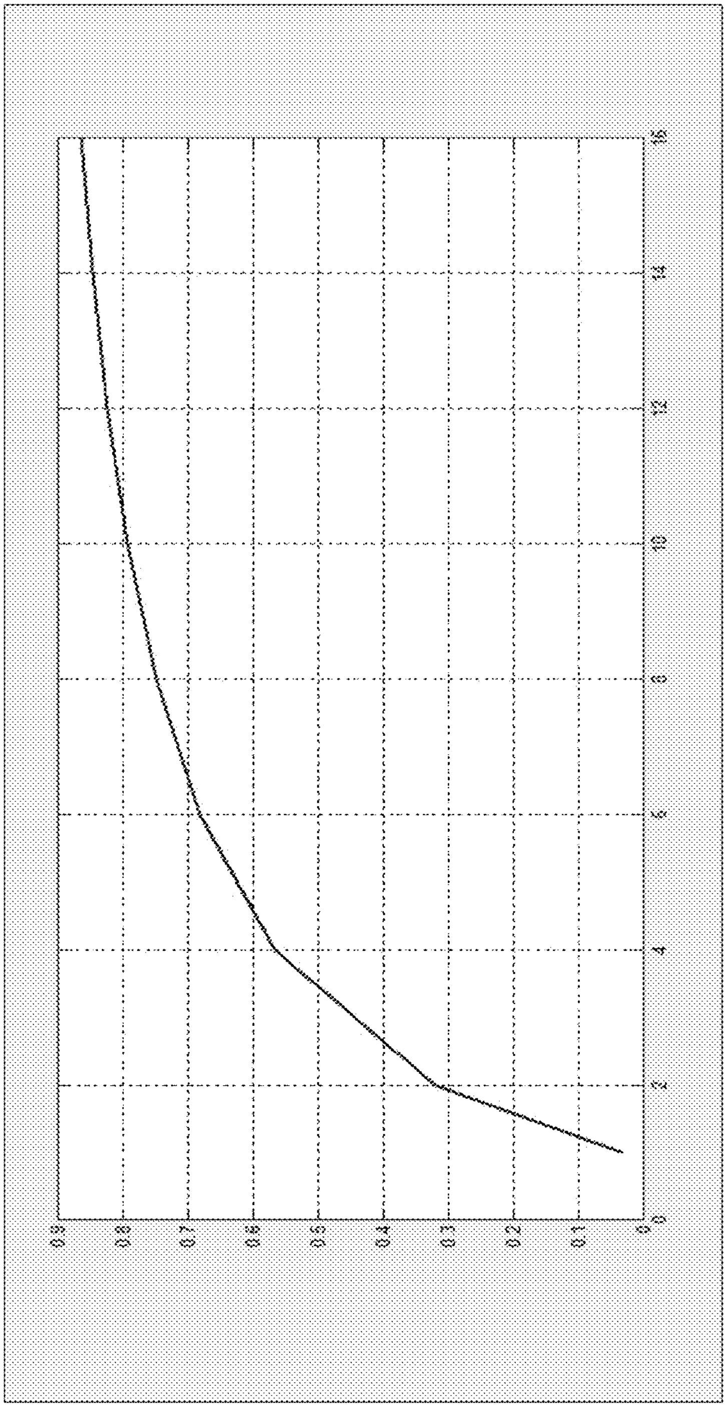
FIG. 83 is an illustration of a plot of thermodynamic efficiency for a given number of optimized domain, in accordance with one or more embodiments.

Table 7-3 and FIG. 83 illustrate the important performance metrics. FIG. 83 illustrates a plot 8300 of thermodynamic efficiency for a given number of optimized domain, in accordance with one or more embodiments,

TABLE 7-3

Calculated thermodynamic efficiency using thresholds from table 7-2

| | $\zeta = 2$ | $\zeta = 4$ | $\zeta = 6$ | $\zeta = 8$ | $\zeta = 10$ |
|---|---|---|---|---|---|
| Domain Pair 1 | $2\lambda_1 = 1$ $\eta_1 =$ 32.0% | $2\lambda_1 =$ 0.627 $\eta_1 =$ 56.6% | $2\lambda_1 = 0.368$ $\eta_1 = 61.6\%$ | $2\lambda_1 = 0.199$ $\eta_1 = 64.1\%$ | $2\lambda_1 = 0.147$ $\eta_1 = 64.8\%$ |
| Domain Pair 2 | | $2\lambda_2 =$ 0.373 $\eta_2 =$ 56.5% | $2\lambda_2 = 0.424$ $\eta_2 = 75.7\%$ | $2\lambda_2 = 0.329$ $\eta_2 = 79.1\%$ | $2\lambda_2 = 0.229$ $\eta_2 = 81.7\%$ |
| Domain Pair 3 | | | $2\lambda_3 = 0.201$ $\eta_3 = 64.7\%$ | $2\lambda_3 = 0.325$ $\eta_3 = 80.2\%$ | $2\lambda_3 = 0.295$ $\eta_3 = 83.4\%$ |
| Domain Pair 4 | | | | $2\lambda_4 = 0.146$ $\eta_4 = 68.8\%$ | $2\lambda_4 = 0.234$ $\eta_4 = 83.5\%$ |
| Domain Pair 5 | | | | | $2\lambda_5 = 0.093$ $\eta_5 = 73.1\%$ |
| Final Efficiency | 32.0% | 56.6% | 68.26% | 75.0% | 79.45% |

| | $\zeta = 12$ | $\zeta = 14$ | $\zeta = 16$ |
|---|---|---|---|
| Domain Pair 1 | $2\lambda_1 = 0.117$ $\eta_{1l} = 65.3\%$ | $2\lambda_1 = 0.074$ $\eta_{1l} = 66.0\%$ | $2\lambda_1 = 0.063$ $\eta_{1l} = 66.1\%$ |
| Domain Pair 2 | $2\lambda_2 = 0.174$ $\eta_2 = 82.9\%$ | $2\lambda_2 = 0.134$ $\eta_2 = 82.4\%$ | $2\lambda_2 = 0.110$ $\eta_2 = 83.14\%$ |
| Domain Pair 3 | $2\lambda_3 = 0.216$ $\eta_3 = 86.7\%$ | $2\lambda_3 = 0.163$ $\eta_3 = 87.7\%$ | $2\lambda_3 = 0.133$ $\eta_3 = 88.3\%$ |

TABLE 7-3-continued

Calculated thermodynamic efficiency using thresholds from table 7-2

| | | | |
|---|---|---|---|
| Domain Pair 4 | $2\lambda_4 = 0.233$ $\eta_4 = 87.1\%$ | $2\lambda_4 = 0.197$ $\eta_4 = 88.8\%$ | $2\lambda_4 = 0.177$ $\eta_4 = 89.1\%$ |
| Domain Pair 5 | $2\lambda_5 = 0.18$ $\eta_5 = 85.9\%$ | $2\lambda_5 = 0.202$ $\eta_5 = 88.6\%$ | $2\lambda_5 = 0.168$ $\eta_5 = 90.7\%$ |
| Domain Pair 6 | $2\lambda_6 = 0.078$ $\eta_6 = 74.75\%$ | $2\lambda_6 = 0.158$ $\eta_6 = 87.05\%$ | $2\lambda_6 = 0.162$ $\eta_6 = 90.2\%$ |
| Domain Pair 7 | | $2\lambda_7 = 0.072$ $\eta_7 = 75.6\%$ | $2\lambda_7 = 0.127$ $\eta_7 = 88.2\%$ |
| Domain Pair 8 | | | $2\lambda_8 = 0.059$ $\eta_8 = 77.2\%$ |
| Final Efficiency | 82.5% | 84.8% | 86.5% |

Figure 84:
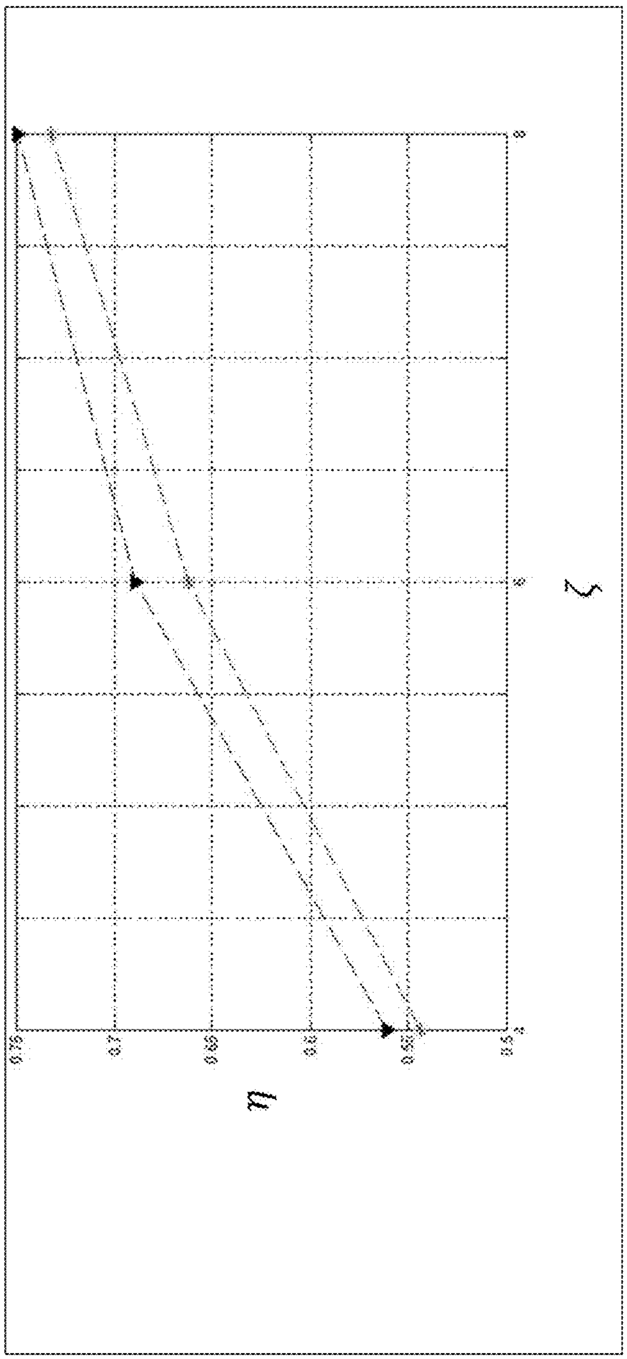
FIG. 84 is an illustration of a plot of the measured results for thermodynamic efficiency compared to theoretical, in accordance with one or more embodiments.

Experiments were conducted with modulator hardware using 4, 6, and 8 domains with a signal PAPR ~11.8 dB. FIG. 84 shows a plot 8400 of the measured results for thermodynamic efficiency compared to theoretical, in accordance with one or more embodiments. The differences were studied and found to be due to fixture losses (i.e. $\eta_{diss} \neq 1$), and the resolutions associated with signal generation as well as measurement. The $\zeta=1$ case in FIG. 83 is based on the single supply solution.

Experiments agree well with the theoretical optimization.

7.7. Results for Standards Based Modulations

The standards based modulation schemes, used to obtain the efficiency curve of FIG. 74 for the canonical non-zero offset case, were tested after optimization using a differential based zero offset implementation of FIG. 82. The results are given for 4, 6, 8 domains illustrated in FIG. 85.

Figure 85:
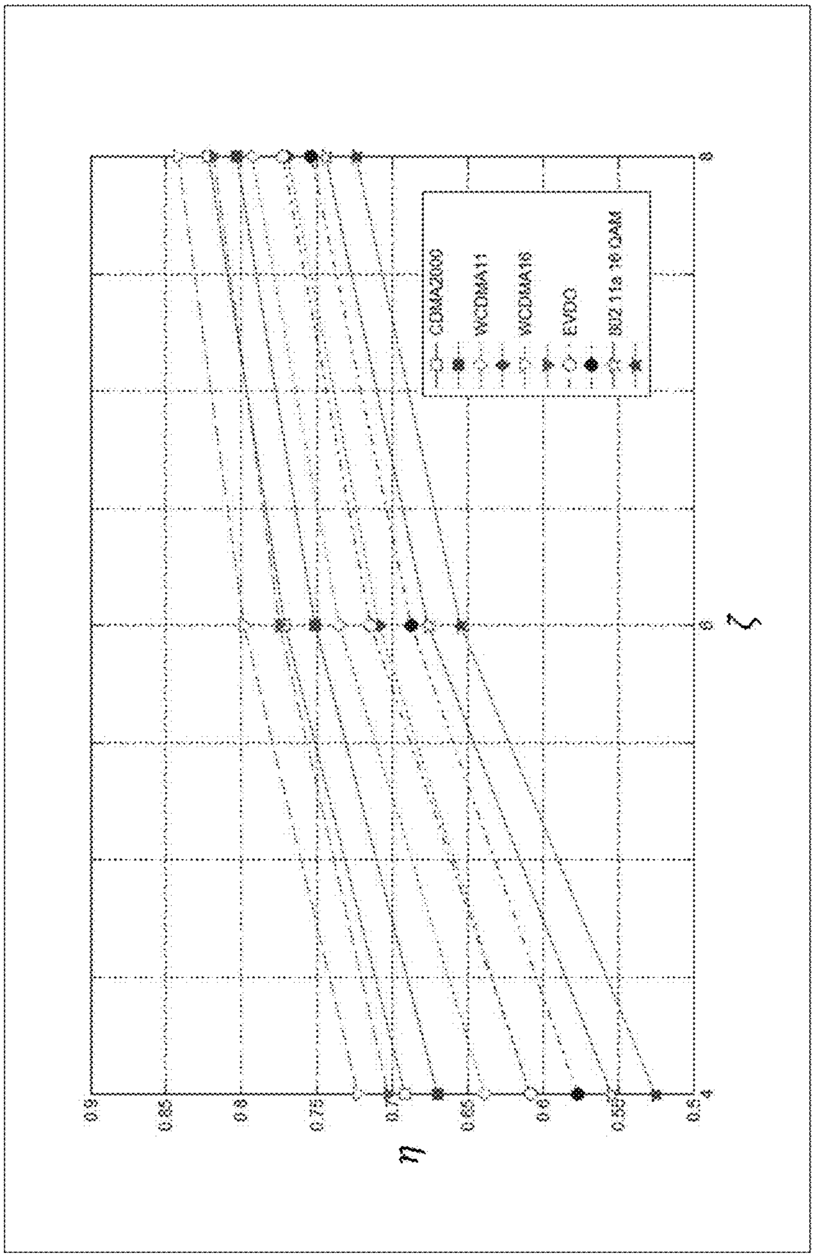
FIG. 85 is an illustration of a plot of thermodynamic efficiency for a given number of optimized domains, in accordance with one or more embodiments.
Figure 86:
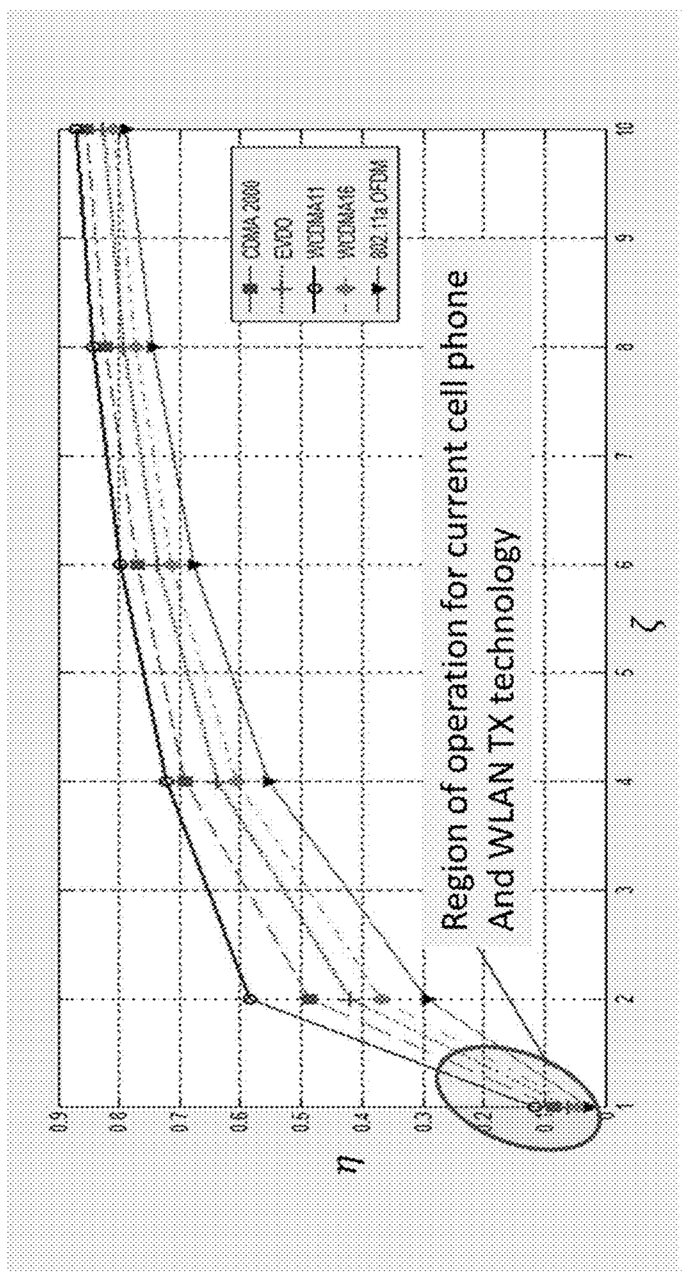
FIG. 86 is an illustration of a plot of the performance of the standards over the range of domains, in accordance with one or more embodiments.
Figure 87:
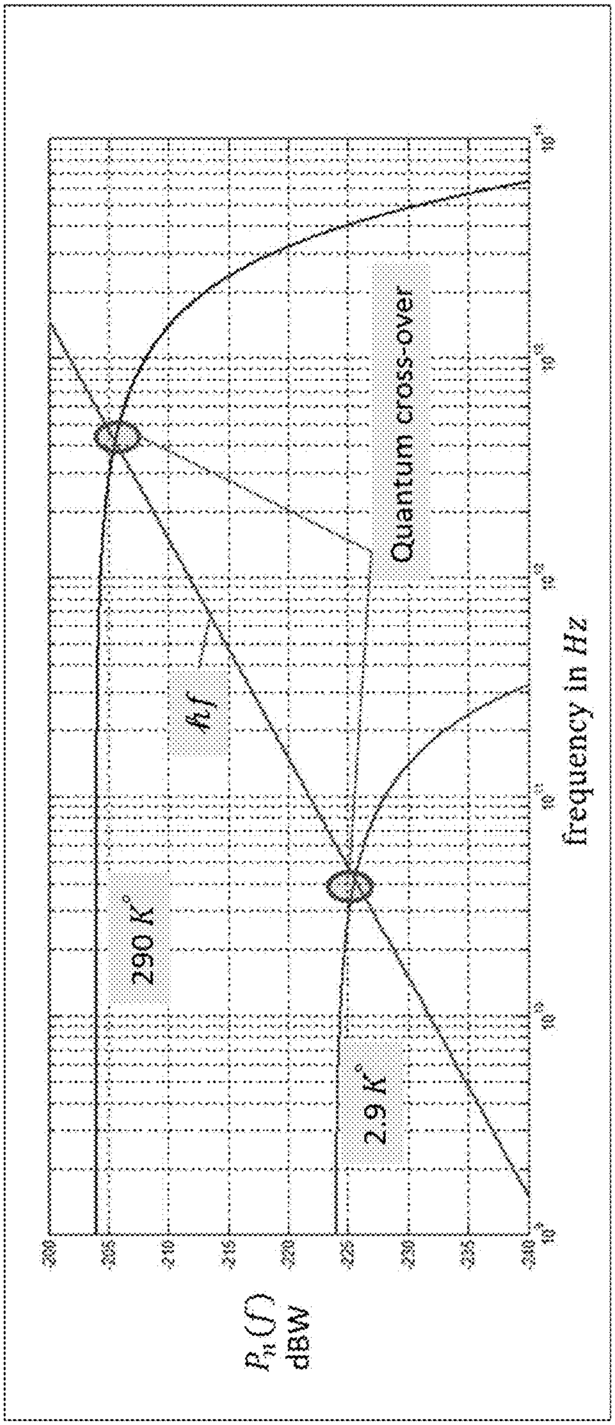
FIG. 87 is an illustration of a plot of optimized efficiency performance versus frequency, in accordance with one or more embodiments.

FIG. 85 illustrates a plot 8500 of thermodynamic efficiency for a given number of optimized domains, in accordance with one or more embodiments. Each modulation type is indicated in the legend. Open symbols correspond to a theoretical optimal with $\eta_{diss}=1$. Filled symbols correspond to measured values with $\eta_{diss} \cong 0.95$. The plot 8500 in FIG. 85 ascend from the greatest signal PAPR to the least. FIG. 86 illustrates a plot 8600 of the performance of the standards over the range of domains from 1 through 10, in accordance with one or more embodiments.

Section 10.12 provides an additional detailed example of an 802.11a waveform as a consolidation of the various calculations and quantities of interest. In addition, a schematic of the modulation test apparatus is included.

8. Miscellaneous Topics

A variety of topics are presented in this Section to. The treatments are brief and include, some limits on performance for capacity, relation to Landauer's principle, time variant uncertainty, and Gabor's uncertainty. The diversity of subjects illustrates a wide range of applicability for the disclosed ideas.

8.1. Encoding Rate, Some Limits, and Relation to Landauer's Principle

The capacity rate equation was derived in Section 4 for the D dimensional case:

$$C \leq \sum_{\alpha=1}^{D} \frac{P_{m\_\alpha}}{\langle \varepsilon_{k\_\alpha} \rangle_s PAER_\alpha} \left( \ln \left[ \frac{\left( \frac{m^2 P_{m\_\alpha}}{PAER_\alpha} \right)}{\tilde{\sigma}^2_{p_{n\_\alpha}}} + 1 \right] \right)$$

Consider the circumstance where $$\frac{P_{m_\alpha}^{lim}}{\langle \varepsilon_{k_\alpha} \rangle PAER_\alpha} \to \infty \qquad \text{Equation 8-1}$$

$$C = \frac{2D}{\ln(2)} \frac{P}{N_0} \equiv C_\infty$$

A limit of the following form is used to obtain the result of Equation 8-1:

$$\lim_{x \to \infty} x \log_2\left(\frac{x+1}{x}\right) = \log_2(e) = \frac{1}{\ln(2)}$$

The infinite slew rate capacity $C_\infty$ is twice that for the comparative Shannon capacity because both momentum and configuration spaces are considered here. This is the capacity associated with instantaneous access to every unique coordinate of phase space. One can further rearrange the equation for $C_\infty$ to obtain the minimum required energy per bit for finite non zero thermal noise where P is the average power per dimension:

$$\frac{P}{C_\infty} = \frac{N_o \ln(2)}{2D} \; J/\text{bit} \qquad \text{Equation 8-2}$$

$N_o$ is an approximate equivalent noise power spectral density based on the thermal noise floor, $N_o=2\ kT°$, T° is a temperature in degrees Kelvin (K°) and Boltzman's constant $k=1.38\times10^{-23}$ J/K°. A factor of 2 is included to account for the independent influence of configuration noise and momentum noise. Therefore, the number of Joules per bit for D=1 is the familiar classical limit of (0.6931) kT°/2 and the energy per bit to noise density ratio is $$E_b/N_o = \frac{\ln(2)}{2} \simeq -4.6 \text{ dB}.$$

This is 3 dB lower than the classical results because we may encode one bit in momentum and one bit in configuration for a single energy investment.

Each message trajectory consisting of a sequence of samples would be infinitely long and therefore require an infinite duration of time to detect at a receiver to reach this performance limit. Moreover the samples of the sequence must be Gaussian distributed.

In the case where the values are binary orthogonal encodings it can be shown that:

$$E_b/N_o \cong \frac{2\ln\sqrt{2}}{2} = -1.6 \text{ dB}$$

Both momentum and configuration are included to obtain the result per dimension. The encoded sequence must be comprised of an infinite sequence of binary orthogonal symbols to achieve this limit, and both configuration and momentum must be used, else the results increase by 3 dB for the given $E_b/N_o$.

$N_o$ as given is an approximation. Over its domain of accuracy the total noise variance may be approximated using:

$$\sigma_n^2=\int_0^B N_o df$$

A difficulty with this approximation arises from the ultraviolet catastrophe when B approaches ultra-high frequencies. Plank and Einstein resolved this inconsistency using a quantum correction which yields:

$$P_n(f) = \frac{\hbar f}{e^{\hbar f/kT°} - 1} W/\text{Hz}, \qquad \text{Equation 8-3}$$

$$h = 6.6254 \times 10^{-0.}\text{Js}$$

FIG. 86 illustrates a plot 8600 of optimized efficiency performance versus frequency, in accordance with one or more embodiments. Plot 8600 of the results follows for room temperature and 2.9 K°, $$K° \cdot \tilde{\sigma}_{Pn\_\alpha}^2$$

is composed of thermal and quantum terms which are plotted separately in plot 8600. The thermal noise with quantum correction has an approximate 3 dB bandwidth of 7.66e12 Hz for the room temperature case and 7.66e10 for the low temp case. The frequencies at which the quantum uncertainty variance competes with the thermal noise floor is approximately 4.26e12 and 4.26e10 Hz respectively. The corresponding adjusted values for $P_n(f)$+hf are the suggested values to be used in the capacity equations to calculate noise powers at extreme bandwidths or low temperature. At the crossover points, the total value of $$\tilde{\sigma}_{Pn\_\alpha}^2$$

is increased by 3 dB. hf is apparently independent of temperature.

An equivalent noise bandwidth principle can be applied to accommodate the quantity $P_n(f)$+hf and calculate an equivalent noise density $\tilde{N}_o$ over the information bandwidth B.

$$\tilde{N}_o = \frac{1}{B}\int_0^B \hbar f \frac{e^{\hbar f/kT°}}{e^{\hbar f/kT°} - 1} df \qquad \text{Equation 8-4}$$

We may combine this density with the TE relation to obtain:

$$\frac{\langle \varepsilon_k \rangle_s}{\tilde{N}_o} \geq \frac{\max\{\dot{\vec{p}} \cdot \dot{\vec{q}}\}}{2\int_0^B \hbar f \frac{e^{\hbar f/kT°}}{e^{\hbar f/kT°} - 1} df \, (PAER)} \qquad \text{Equation 8-5}$$

If we consider antipodal binary state encoding then the energy per sample correspond to one half the energy per bit. At frequencies where thermal noise is predominate, one can calculate the required energy per bit to encode motion in a particle while overcoming the influence of noise such that over a suitably long interval of observation a sequence of binary encodings may be correctly distinguished.

$$\frac{\langle \varepsilon_b \rangle}{\tilde{N}_o} \geq \frac{\max\{\dot{\vec{p}} \cdot \dot{\vec{q}}\}}{f_s k T^\circ \ (PAER)} \qquad \text{Equation 8-6}$$

The maximum work rate of the particle is therefore bounded by (for thermal noise only);

$$\max\{\vec{p} \cdot \vec{q}\} \leq f_s k T^\circ (\text{PAER}) \ln(2) \qquad \text{Equation 8-7}$$

According to Section 5, a maximum theoretical efficiency to generate one bit is bounded by:

$$\eta \leq \frac{f_s k T^\circ \ln(2)}{P_m} \qquad \text{Equation 8-8}$$

Figure 88:
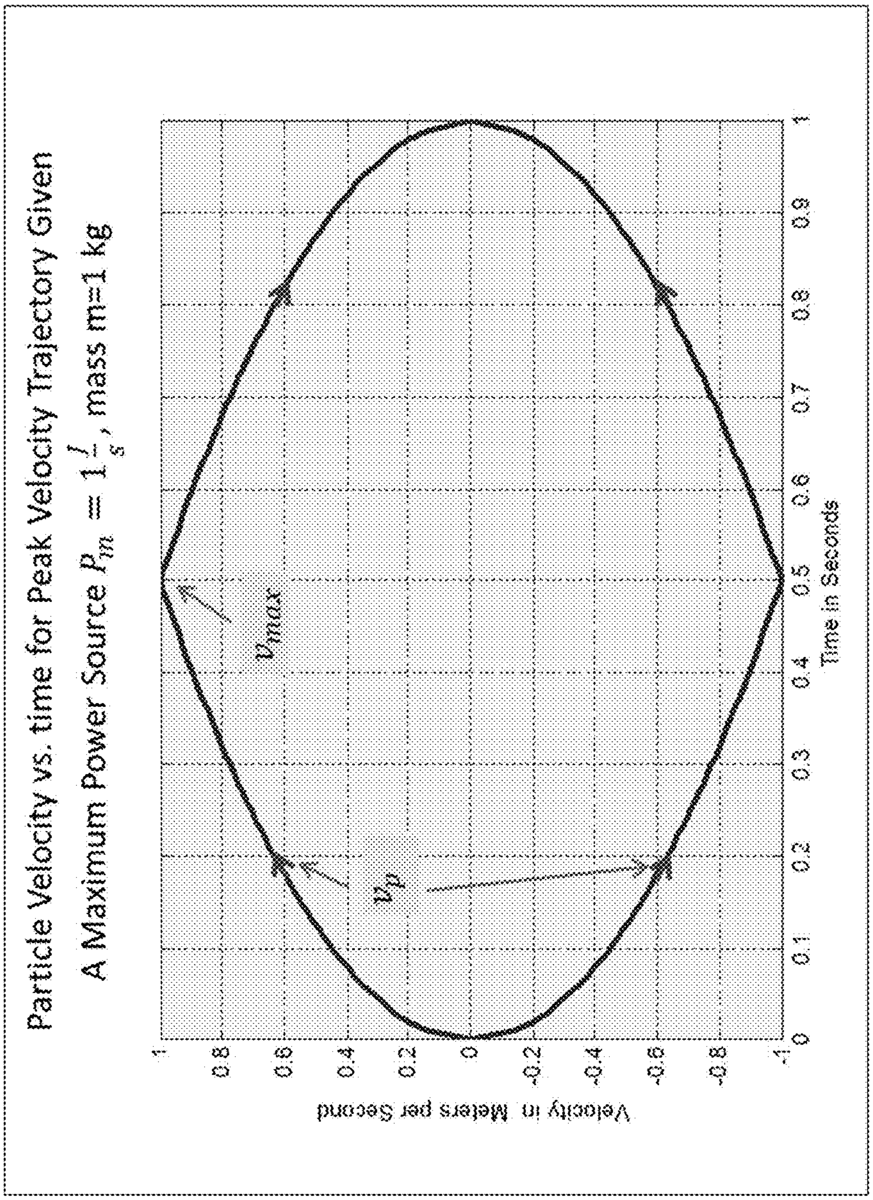
FIG. 88 is an illustration of a plot of an example momentum space trajectory, accordance with one or more embodiments.

A plot 8800 of an example momentum space trajectory depicting a binary encoding situation is illustrated in FIG. 88, in accordance with one or more embodiments. In FIG. 88, information is encoded in $\pm p_{max} = \pm 1$ the extremes of the momentum space for this example. This extreme trajectory is the quickest path between the two states. $|\langle v_p \rangle| \neq v_{max}$. Therefore PAER≠1. If PAER=1 is required for maximum encoding efficiency, then Δt (the time span of the trajectory) must approach zero which requires the rate of work to approach infinity. Clearly this pathological case is also limited by relativistic considerations.

Figure 89:
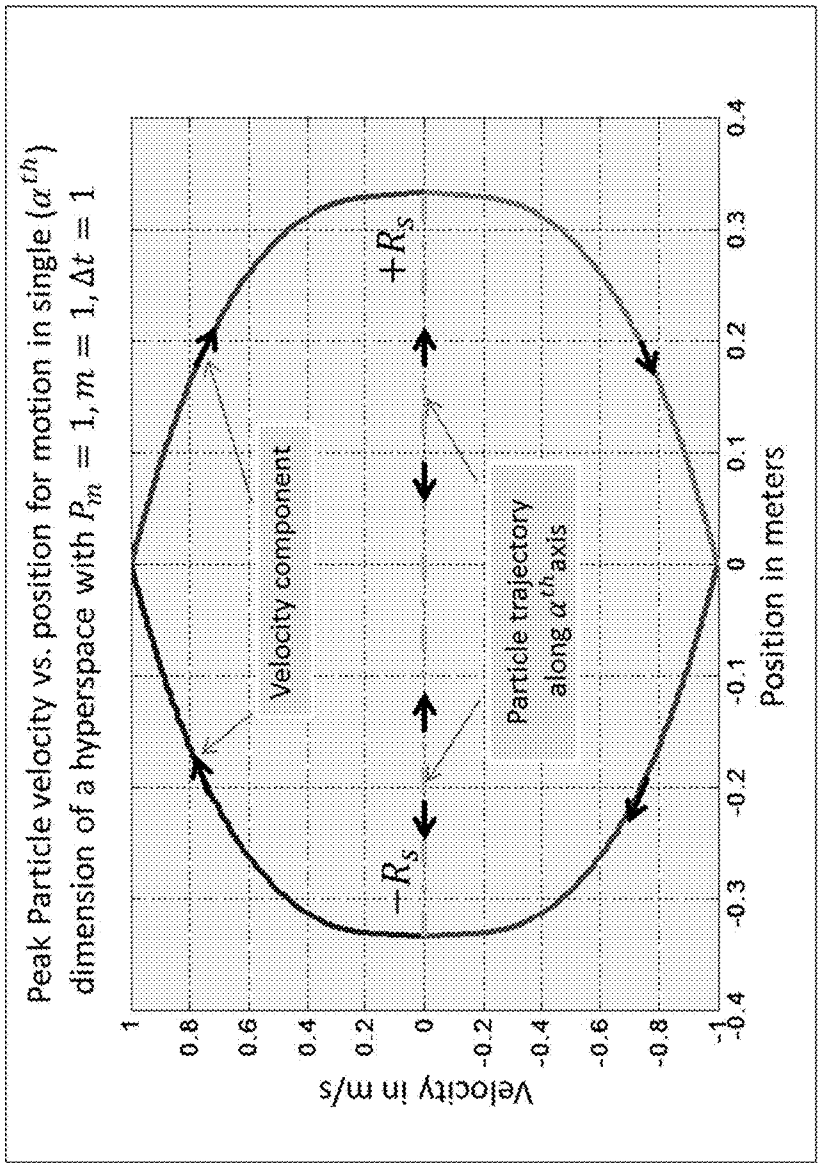
FIG. 89 is an illustration of a plot of the velocity versus position plane for a single dimension for the position encoding, in accordance with one or more embodiments.

Suppose that binary data is encoded in position rather than momentum. This activity is illustrated in a plot 8900 of the velocity versus position plane for a single dimension for the position encoding of $\pm R_s$, the extremes of configuration space shown in FIG. 89. The velocity trajectory as shown is the fastest between the extreme positions. In this view, the particle momentum can be zero at the extremes $\pm R_s$ but not between. If one considers that information can be stored in the positions $\pm R_s$, then work is required to move the particle between these positions. Even when thermal noise is removed (i.e. T°=0) from the scenario, one can calculate a finite maximum required work per bit because $\tilde{N}_o$ possesses a residual quantum uncertainty variance which must be overcome to distinguish between the two antipodal states. This can be given approximately in equation 8-9:

$$\max\{\vec{p} \cdot \vec{q}\} \gtrsim f_s h (\text{PAER}) \ln(2) \qquad \text{Equation 8-9}$$

Note that PAER may only approach 1 as Δt approaches zero, requiring $f_s \to \infty$. No matter the encoding technique we cannot escape this requirement. If we construct a binary system which transfers distinguishable data in the presence of thermal noise or quantum noise, independent states require the indicated work rate per transition. As discussed in Section 5, since one cannot predict a future state of a particle, the delivery particle possesses an average recoil momentum during an exchange equal and opposite in a relative sense to the target particle encoding the state. This recoil momentum is waste, and ultimately dissipates in the environment according to the second law. According to equation 8.8 (the thermal noise regime), the theoretical efficiency of 1 is achieved when $P_m = f_s \, kT^\circ \ln\sqrt{2}$, which is equivalent to an energy per sample of $$(\varepsilon_k)_s = kT^\circ \ln\sqrt{2} \qquad \text{Equation 8-10}$$

Likewise for the case where $T^\circ \to 0$, one has a minimum energy per sample limited by quantum effects.

$$\varepsilon_k \gtrsim h f_s \ln\sqrt{2} \qquad \text{Equation 8-11}$$

In general, one can calculate a minimum energy to unambiguously encode a bit of information using a binary antipodal encoding procedure as:

$$\varepsilon_b = \int_0^{2T_s} \max\{\dot{\vec{p}} \cdot \dot{\vec{q}}\} dt \geq f_s \tilde{N}_o \ln\sqrt{2} \qquad \text{Equation 8-12}$$

If the binary antipodal requirement is removed in favor of maximum entropy encoding, then:

$$\varepsilon_b \geq \frac{f_s \tilde{N}_o \ln(2)}{2} \qquad \text{Equation 8-13}$$

where $\tilde{N}_o$ is given by equation 8-4.

However, this is for the circumstance of 100% efficiency, i. e. PAER→1 According to principles of Section 3, if the information is encoded in the form of momentum, this information can only be removed by re-setting the momentum to zero. This means that at least the same energy investment is required to reverse an encoded momentum state. Likewise, if the information is recorded in position then a particle must possess momentum to traverse the distance between the positions. In one direction, for instance moving from $-R_s$ to $R_s$, a quantity of work is required. Reversing the direction requires at least the same energy. The foregoing discussion reveals a principle that at least $\tilde{N}_o$ ln(2) is required to both encode or erase one bit of binary information. This resembles Landauer's principle which requires the environmental entropy to raise by the minimum of kT° ln(2) when one bit of information is erased. The important differences here are that the principle applies for the case of generating unique data as well as annihilating data. In addition, the rate at which one requires generation or erasure to occur, can affect the minimum requirement via the quantity PAER (ref. eq. 8-7) since transitions are finite in time and energy. Finite transition times correspond to PAER>1. This latter effect is not contemplated by Landauer. Thus efficiency considerations will necessarily raise the Landauer limit under all practical circumstances, because a power source with a maximum power of $P_m$ is required which ensures a PAER>1. For the model of Section 3 applied to binary encoding where transitions are defined using a maximum velocity profile such as indicated in FIG. 88, one can calculate PAER=2, which at minimum, doubles the power requirements to generate the antipodal bits of equation 8-12.

8.2. Time Variant Uncertainty

Time sampling of a particle trajectory in momentum space evolves independently from the allocation of dimensional occupation. The dimensional correlations for α≠β will be zero for maximum uncertainty cases of interest. Likewise, the normalized auto-correlation is defined for α=β. It is interesting to interject the dimension of time into the auto-correlation as suggested in eq. 3-26 through 3-28. In doing so we can derive a form of time variant uncertainty.

The density function of interest to be used for the uncertainty calculation may be written explicitly as:

$$\rho(\vec{p}_\Delta) = \frac{1}{\sqrt{2\pi(\sigma_\Delta^2)|\Lambda|}} e^{\left[-\frac{1}{2}\left(\frac{\vec{p}_\Delta}{\sigma_\Delta}\right)^T \Lambda^{-1}\left(\frac{\vec{p}_\Delta}{\sigma_\Delta}\right)\right]} \qquad \text{Equation 8-14}$$

-continued $$[\Lambda]=\begin{bmatrix}\sigma_{v_{11}}^2 & \Gamma_{12}\sigma_{v_1}\sigma_{v_2} & \dots & \Gamma_{1D}\sigma_{v_1}\sigma_{v_D}\\ \Gamma_{21}\sigma_{v_2}\sigma_{v_1} & \sigma_{v_{22}}^2 & \dots & \Gamma_{2D}\sigma_{v_2}\sigma_{v_D}\\ \Gamma_{D1}\sigma_{v_D}\sigma_{v_1} & \Gamma_{D2} & \dots & \sigma_{v_{DD}}^2\end{bmatrix}$$

$$\Gamma_{(\alpha,\beta)}=\frac{\sigma_{\alpha,\beta}}{\sigma_\alpha\sigma_\beta}$$

The notation is organized to enumerate the dimensional correlations with α,β and the adjacent time interval correlations with $l,\hat{l}$. The time interval is given by:

$$t_l-t_{l+1}=T_s$$

$$(t_{\hat{l}}-t_l)\leq T_s$$

$$\vec{p}_\Delta=\vec{p}_{\hat{l}}-\vec{p}_l$$

$$\sigma_\Delta=\sqrt{\sigma_{\hat{l}}^2+\sigma_l^2-2\gamma_{l,\hat{l}}\sigma_l\sigma_{\hat{l}}} \quad \text{Equation 8-15}$$

$\rho(\vec{p}_\Delta)$ represents the probability density for a transition between successive states where each state is represented by a vector. One can calculate the correlation coefficients for the time differential $(t_{\hat{l}}-t_l)$ recalling that the TE relation defines the sampling frequency $f_s$.

$$\gamma_{\ell,\hat{\ell}}=\frac{P_m}{f_s\langle\varepsilon_k\rangle_s PAER k_p}\frac{\sin\left[\frac{P_m}{\langle\varepsilon_k\rangle_s PAER}(t_{\hat{\ell}}-t_\ell)\right]}{\pi\frac{P_m}{\langle\varepsilon_k\rangle_s PAER}(t_{\hat{\ell}}-t_\ell)} \quad \text{Equation 8-16}$$

The uncertainty $H(\rho(\vec{p}_\Delta))$ is maximized whenever information distributed amongst the degrees of freedom are iid Gaussian. It is clear from the explicit form of $\rho(\vec{p}_\Delta)$ that the origin and the terminus of the velocity transition can be completely unique only under the condition that $\gamma_{l,\hat{l}}=0$. This occurs at specific time intervals modulo $T_s$. Otherwise, there will be mutual information over the interval $\{l,\vec{l}\}$. Elimination of all forms of space-time cross-correlations maximizes $\rho(\vec{p}_\Delta)$. Given these considerations, the pdf for the state transitions may be factored to a product of terms.

$$\rho(\vec{p}_\Delta)=\prod_{\alpha=1}^{D}\frac{1}{\sqrt{(2\pi)(\sigma_{\hat{\ell}}^2+\sigma_\ell^2)\alpha}}e^{-\left(\frac{(v_{\hat{\ell}_\alpha})^2}{2(\sigma_{\hat{\ell}}^2+\sigma_\ell^2)\alpha}\right)} \quad \text{Equation 8-17}$$

The origin and terminus coordinates are related statistically through the independent sum of their respective variances. An origin for a current trajectory is also a terminus for the prior trajectory.

The particle can therefore acquire any value within the momentum space and simultaneously occupy any conceivable location within the configuration space at the subsequent time offset of $T_s$. The case where the time differential $(t_{\hat{l}}-t_l)$ td is less than $T_s$ carries corresponding temporal reduction of the phase space access, given knowledge of the prior sampling instant. If the phase space accessibility fluctuates as a function of time differential, then so too must the corresponding uncertainty for $(\vec{p}_\Delta)$, at least over a short interval $0\leq(t_{\hat{l}}-t_l)\leq T_s$. The corresponding differential entropy which incorporates a relative uncertainty metric over the trajectory evolution is governed by the correlation coefficient $\gamma_{l,\hat{l}}$. If the time difference Δt=0 then by definition the differential entropy metric may be normalized to zero plus the quantum uncertainty variance on the order of h. This means that if a current sample coordinate is known that for zero time lapse it is still known. Adopting this convention, the relative entropy metric over the interval is defined as:

$$H_\Delta=\ln\left(\sqrt{(\sigma_{\hat{l}}^2+\sigma_l^2-2\gamma_{l,\hat{l}}\sigma_l\sigma_{\hat{l}})2\pi e+(1+2\pi eh)}\right) \quad \text{Equation 8-18}$$

In this simple formula the origin state of the of the trajectory is considered as the average momentum state or zero.

Figure 90:
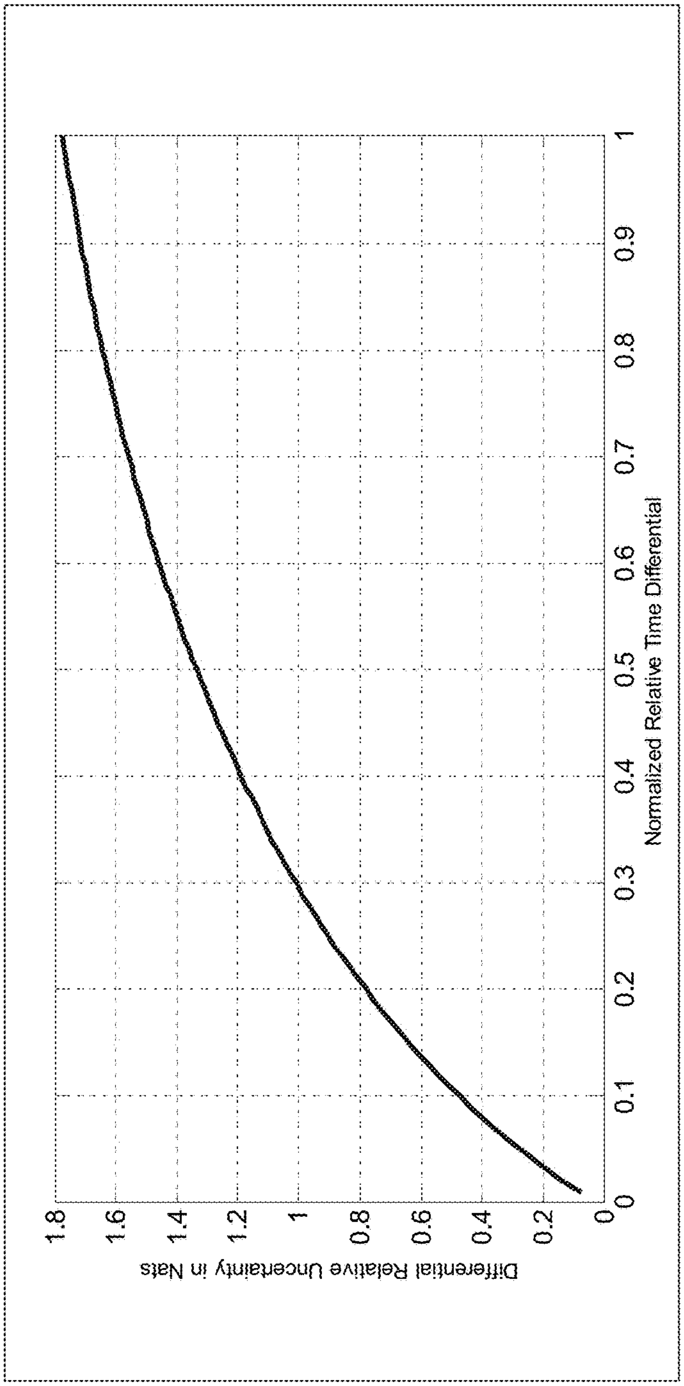
FIG. 90 is an illustration of a plot of differential relative uncertainty between sample uncertainty for a phase space reference trajectory, in accordance with one or more embodiments.

When $T_s=0$ then $\gamma_{l,\hat{l}}=1$ and $H_\Delta\geq\ln(\sqrt{(1+2\pi eh)})$. If $$T_s=\frac{2\langle\varepsilon_k\rangle_s PAER}{P_m}$$

then $H_\Delta=\ln(\sqrt{\sigma_{\hat{l}}^2+\sigma_l^2)2\pi e+(1+2\pi eh}()$. The plot 9000 of FIG. 90 records $H_\Delta$ for a normalized differential time ($T_s=1$) into the future, in accordance with one or more embodiments. At some increasing future time relative to a current known state, the particle entropy correspondingly increases up to the next sampling event. In this example $P_m$ is limited to 10 Joules/second, the average kinetic energy is 1 joule, the particle mass is 1 kg, and the PAER is 10 dB. The relative uncertainty as plotted is strictly in momentum space and for a single dimension. This function is repetitive modulo $T_s$. The plotted uncertainty is proportional to the $D^{th}$ root of an expanding hyper-sphere volume in which the particle exists.

At a future time differential of $T_s$, the particle dynamic acquires full probable access to the phase space and entropy is maximized. Once the particle state is identified by some observation procedure then this uncertainty function resets. $H_\Delta$ is calculated based on an extreme where the origin of the example trajectory is at the center of the phase space. $H_\Delta$ may fluctuate depending on the origin of the sampled trajectory.

8.3. A Perspective of Gabor's Uncertainty

In Gabor's 1946 paper "Theory of Communication," be rigorously argued the notion that fundamental units, "logons," were a quantum of information based on the reciprocity of time and frequency. Gabor punctuated his paper with the time-frequency uncertainty relation for a complex pulse:

$$\Delta f\Delta t\geq\frac{1}{2} \quad \text{Equation 8-19}$$

This uncertainty is related to the ambiguity involved when observing and measuring a finite function of time such as a pulse. Gabor's pulse was defined over its rms extent corresponding more or less to energy metrics which can be considered as analogous to the baseband velocity pulse models of Section 3. Gabor ingeniously expanded the finite duration pulse in a complex series of orthogonal functions and calculated the energy of the pulse in both the time and frequency domains. His tool was the Fourier integral. He was interested in complex band pass pulsed functions and determined that the envelope of such functions which is compliant with the minimum of the Gabor limit to be a probability amplitude commonly used in quantum mechanics. Gabor's paper was partially inspired by *Pauli* and reviewed by Max Born prior to publication.

Nyquist had reached a related conclusion in 1924 and 1928 with his now classic works, "*Certain Factors Affecting Telegraph Speed*" and "*Certain Topics in Telegraph Transmission Theory*", Nyquist expanded a "DC wave" into a series using Fourier analysis and determined the number of signal elements required to transmit a signal is twice the number of the sinusoidal components which must be preserved to determine the original DC wave formed by the signal element sequence. This was for the case of a sequence of telegraph pulses forming a message and repeated perpetually. This cyclic arrangement permitted Nyquist to obtain a proper complex Fourier representation without loss in generality since the message sequence duration could be made very long prior to repetition; an analysis technique later refined by Wiener. Nyquist's analysis concluded that the essential frequency span of the signal is half the rate of the signal elements and inversely related. The signal elements are fine structures in time or samples in a sense and his frequency span was determined by the largest frequency available in his Fourier expansion.

Gabor was addressing this wonder with his analysis and pointing out his apparent dissatisfaction with the lack of intuitive physical origin of the phenomena. He also regarded the analysis of Bennett in a similar manner concerning the time frequency reciprocity for communications, stating; "Bennett has discussed it very thoroughly by an irreproachable method, but, as is often the case with results obtained by Fourier analysis, the physical origin of the results remains somewhat obscure." Gabor also comments; "In spite of the extreme simplicity of this proof, it leaves a feeling of dissatisfaction. Though the proof (one forwarded in Gabor's 1946 paper) shows clearly that the principle in question is based on a simple mathematics identity, it does not reveal this identity in tangible form."

An explanation is now presented for the time-frequency uncertainty, using a time bandwidth product, based on physical principles expressed through the TE relation and the physical sampling theorem. An instantiation of Gabor's In-phase or Quadrature phase pulse can be accomplished by using two distinct forces per in-phase and quadrature phase pulse according to the physical sampling theorem presented in Section 3. The time span of such forces are separated in time by $T_s$. The characteristic duration of a pulse event is $\Delta t=2T_s$.

From the TE relation, one knows:

$$\frac{f_{s\_min}}{2} = \frac{P_m}{2\langle\varepsilon_k\rangle PAER} = B = \Delta t^{-1} \qquad \text{Equation 8-20}$$

$$\frac{f_s}{2} \geq \frac{P_m}{2\langle\varepsilon_k\rangle PAER}$$

$\tilde{B}$ the bandwidth available due to the sample frequency $f_s$ is always greater than or equal to B the bandwidth available due to an absolute minimum sample frequency $f_{s\_min}$ so that:

$$\tilde{B} \geq \frac{f_{s\_min}}{2}$$

Therefore:

$$\tilde{B}T_{s\_max} \geq \frac{1}{2}$$

This is called a time bandwidth product. If one wishes to increase the observable bandwidth $\tilde{B}$, then $T_{s\_max}$ can be lowered. If a lower bandwidth is required then $T_{s\_max}$ is increased where $T_{s\_max}$ is an interval of time required between forces such that the forces may be uncorrelated given some finite $P_m$.

Figure 91:
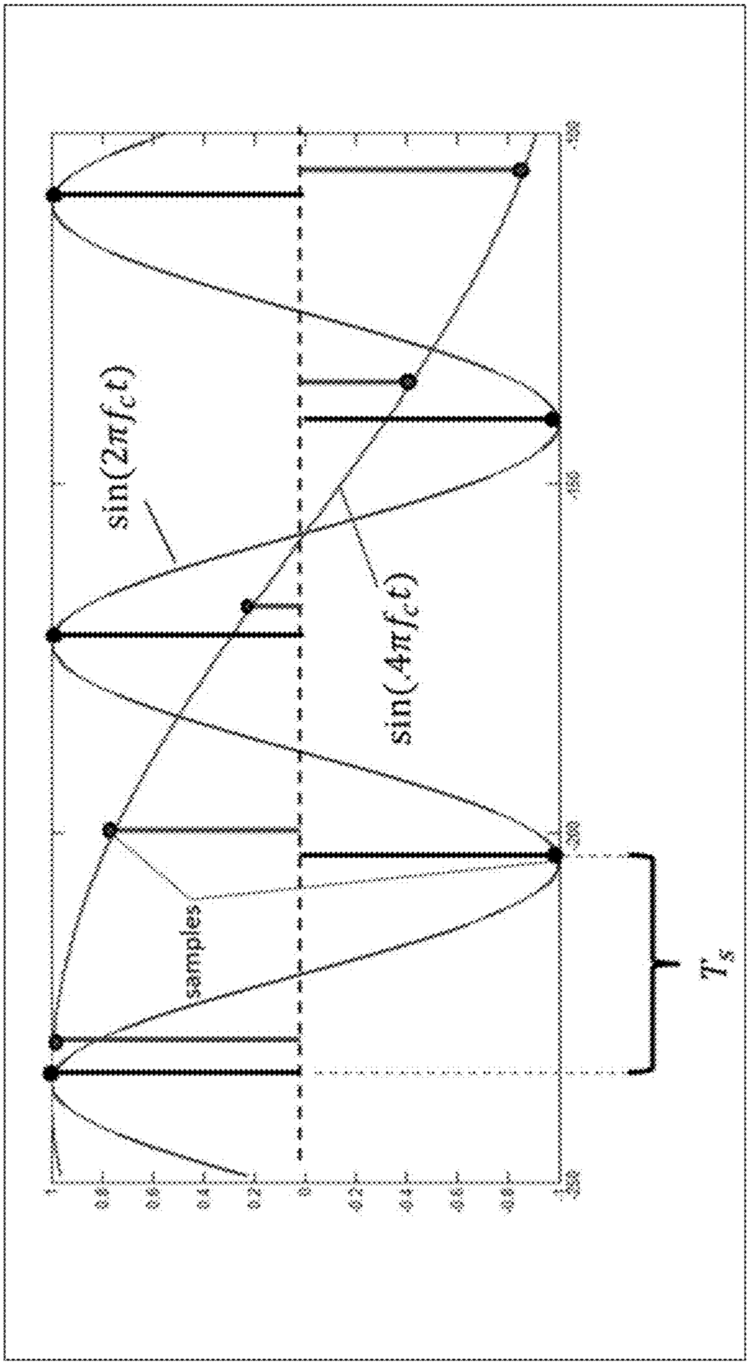
FIG. 91 illustrates plots of the sampling of two sine waves of differing frequency, in accordance with one or more embodiments.
Figure 92:
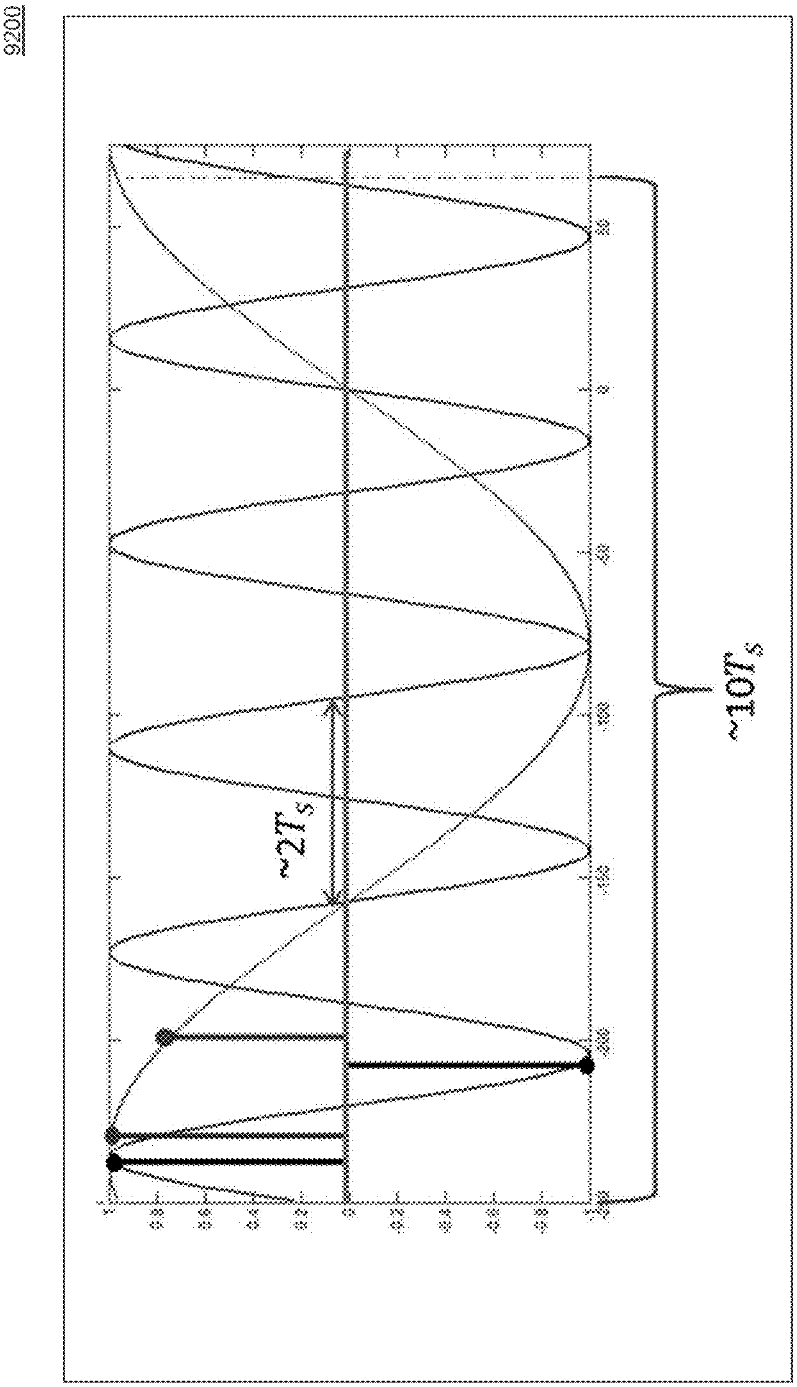
FIG. 92 illustrates plots of the sampling of two sine waves of differing frequency, in accordance with one or more embodiments

An example provides a connection between the TE relation, physical sampling theorem and Gabor's uncertainty. FIGS. 91 and 92 illustrate plots 9100 and 9200 of the sampling (depicted by vertically punctuated lines) of two sine waves of differing frequency, in accordance with one or more embodiments. The frequency of the slower sine function is one fifth that of the greater and assigned a frequency $B_2=f_c/5$. The sampling rate is set to capture the greater frequency sine function with bandwidth $B_1=f_c$. In the first frame of plot 9100, the sample rate $f_s \approx 2f_c$ with samples generated for both functions slightly skewed in time for convenience of representation.

Only two samples are required to create or capture one cycle of the higher frequency sine wave. However, two samples separated in time by $T_s$ cannot create the trajectory of the slower sine wave over its full interval $10T_s$. That trajectory is ambiguous without the additional 8 samples, as is evident by comparing frame 2 with frame 1 of the figure. The sampling frequency of $f_s \approx 2f_c$ is adequate for both sine waves but in order to resolve the slower sine wave and reconstruct it, the samples must be deployed over the full interval $10T_s$. The prior equation may capture this by accounting for the extended interval using a multiplicity of samples.

$$\frac{B_1}{5}(5T_{s1}) \geq \frac{1}{2}$$

$$B_2 \geq \frac{1}{2(5T_{s1})}$$

The slow sine wave case is significantly oversampled so that all frequencies below $B_1$ are accommodated but ambiguities may only be resolved if the sample record is long enough. This is consistent with Gabor's uncertainty relation as well as Nyquist's analysis.

We can address the requirement for an extended time record of samples by returning to the physical sampling theorem and a comparative form of the TE relation. The next equation calculates the time required between independently acting forces for a particle along the trajectory of the slow sine wave:

$$T_{s2} = T_{s1}\frac{PAER_2}{PAER_1} = T_{s1}\frac{\max\{\dot{\varepsilon}_k\}_1}{\max\{\dot{\varepsilon}_k\}_2} = 5T_{s1}$$

The result means that effective forces must be deployed with a separation of $5T_{s1}$ to create independent motion for the slower trajectory. Adjacent samples separated by $T_s=T_{s1}$ cannot produce independent samples for the slower waveform because they are significantly correlated.

Hence the effective change in momentum $\dot{p}$ per sample is lower for the over sampled slow waveform. As a general result, the corresponding work rate is lower for the lower frequency sine wave so that:

$$T_{s2} = T_{s1}\frac{\max\{\dot{\vec{p}}\cdot\dot{\vec{q}}\}_1}{\max\{\dot{\vec{p}}\cdot\dot{\vec{q}}\}_2} \quad \text{Equation 8-21}$$

Even though 10 forces must be deployed to capture the entire slower sine wave trajectory over its cycle, only pairs taken from subsets of every $5^{th}$ force can be jointly decoupled.

Gabor's analysis considered the complex envelope modulated onto orthogonal sinusoids. A complex carrier consisting of a cosine and sine has a corresponding TE equation:

$$f_{sI} + f_{sQ} \geq \frac{2P_m}{\langle \varepsilon_k \rangle PAER} \quad \text{Equation 8-22}$$

The effective samples for in phase and quadrature components occur over a common interval so that the sample frequency doubles yet so does the peak power excursion $P_m$ for the complex signal. This is analogous to the case D=2. Gabor's modulation corresponds to a double side band suppressed carrier scenario. This is the same as specifying pulse functions $a_I(t)$, $a_Q(t)$ in the complex envelope as zero offset unbiased RV's, where the envelope takes the form:

$$x(t)=a(t)e^{j\omega_c t+\varphi(t)}=a_I(t)\cos(\omega_c t+\varphi(t))-a_Q(t)\sin(\omega_c t+\varphi(t))$$

To obtain Gabor's result, the peak power in the baseband pulses expressed by $a_I(t)$, $a_Q(t)$ will be twice that of the unmodulated carrier. Therefore the TE relation for the complex envelope of x(t) is given by:

$$f_{sI\_BB} + f_{sQ\_BB} \geq \frac{2(2P_m)}{\langle \varepsilon_k \rangle_s PAER}$$

This reduces to:

$$\frac{f_{s\_BB}}{2} \geq \frac{P_{m\_BB}}{\langle \varepsilon_k \rangle PAER} \quad \text{Equation 8-23}$$

The time bandwidth product now becomes;

$$B_{BB}\Delta t_{max} \geq \frac{1}{2} \quad \text{Equation 8-24}$$

$$\frac{P_{m\_BB}}{2\langle \varepsilon_k \rangle PAER}\Delta t_{max} \geq \frac{1}{2}$$

A variation in the sample interval for independent forces which create a signal must be countered by an inverse variation in the apparatus bandwidth or correspondingly the work rate. $2NT_s=\Delta t_{max}$ for a sequence of deployed forces creating a signal trajectory; always extends to a time interval accommodating at least two independent forces for the slowest frequency component of the message. The minimum number of deployed forces occurs for N=1, a single pulse event.

This result is also equivalent to Shannon's number which is given by N=2BT where $2B=fs_{min}$ and $T=\Delta t_{max}$. Care must be exercised using Shannon's number to account for I and Q components.

9. Conclusions

Communications is the transfer of information through space and time via the encoded motions of particles and corresponding fields. Information is determined by the uncertainty of momentum and position for the dynamic particles over their domain. The rate of encoding information is determined by the available energy per unit time required to accelerate and decelerate the particles over this domain. Only two statistical parameters are required to determine the efficiency of encoding: the average work per deployed force and the maximum required PARR for the trajectory. This is an extraordinary result applicable for any momentum pdf.

Bandwidth in the Shannon-Hartley capacity equation is a parameter which limits the rate at which the continuous signal of the AWGN channel can slew. This in turn limits the rate at which information can be encoded. The physical sampling theorem determined from the laws of motion and suitable boundary conditions requires that the number of forces per second to encode a particle be given by;

$$f_s \geq \frac{P_m}{\langle \varepsilon_k \rangle_s PAER}$$

This frequency also limits the slew rate of the encoded particle along its trajectory and determines its bandwidth in a manner analogous to the bandwidth of Shannon according to:

$$B = \frac{P_m}{2\langle \varepsilon_k \rangle_s PAER}$$

The calculated capacity rate for the joint encoding of momentum and position in D independent dimensions was calculated as:

$$C \leq \sum_{\alpha=1}^{D} \frac{P_{m\_\alpha}}{\langle \varepsilon_{k\_\alpha} \rangle_s PAER_\alpha}\left(\ln\left[\frac{\left(\frac{2P_{m\_\alpha}}{PAER_\alpha}\right)}{\sigma^2_{Pn\_\alpha}} + 1\right]\right)$$

As this capacity rate increases, the required power source, $P_{src}$, for the encoding apparatus also increases as is evident from the companion equation;

$$C \leq \sum_{\alpha=1}^{D} \frac{P_{m\_\alpha}}{\langle \varepsilon_{k\_\alpha} \rangle_s PAER_\alpha}\left(\ln\left[\frac{\eta_{mod}\eta_{diss}, P_{src}}{\sigma^2_n} + 1\right]\right)$$

Therefore, increases in the modulation encoding efficiency $\eta_{mod}$ can be quite valuable. For instance, in the case of mobile communications platform performance, data rates can be increased, time of operation extended, battery size and cost reduced or some preferred blend of these enhancements. In addition, the thermal footprint of the modulator apparatus may be significantly reduced.

Efficiency of the encoding process is inversely dependent on the dot product extreme, $\max\{\dot{\vec{p}}\cdot\dot{\vec{q}}\}=P_m$ divided by an average, $\langle \dot{\vec{p}}\cdot\dot{\vec{q}} \rangle=\sigma^2$, also known as PAPR or PAER. The fluctuations about the average represent changes in inertia which require work. Since these fluctuations are random, momentum exchanges required to encode particle motion produce particle recoils which are inefficient. The difference between the instantaneous energy requirement and the maximum resource availability is proportional to the wasted energy of encoding. On the average, the wasted energy of recoil grows for large PAPR. This generally results in an encoding efficiency of the form:

$$\eta_{enc} = \frac{\sigma^2}{k_{enc}P_m + k_\sigma\sigma^2} = \frac{1}{k_{enc}PAPR + k_\sigma}$$

Coefficients $k_{enc}$ and $k_\sigma$ depend on apparatus implementation. Several cases were analyzed for an electronic modulator using the theory developed in this work, then tested in experiments. Experiments included theoretical waveforms as well as 3G and 4G standards based waveforms. The theory was verified to be accurate within the degree of measurement resolution, in this case ~0.7%.

The inefficiency of encoding is regarded as a necessary inefficiency juxtaposed to dissipative inefficiencies such as friction, drag, resistance, etc. Capacity for the AWGN channel is achieved for very large PAPR, resulting in low efficiencies. However, if the encoded particle phase space is divided into multiple domains, then each domain may possess a lower individual PAPR statistic than the case of a single domain phase space with equivalent capacity. The implication is that separate resources can be more efficiently allocated in a distributed manner throughout the phase space. Resources are accessed as the encoded particle traverses a domain boundary. Domain boundaries which are optimized in terms of overall thermodynamic efficiency are not arbitrary. The optimization in the case of a Gaussian information pdf takes the form of a ratio of composited gamma densities:

$$\eta_{enc} = \max\left\{\frac{\Sigma_i\lambda_i k_{i_{norm}}\int_{f\{V_T\}_{i-1}}^{f\{V_T\}_i} X_e\rho(X_e)\,dX_e}{\Sigma_i\lambda_i k_{i_{norm}}\int_{f\{V_T\}_{i-1}}^{f\{V_T\}_i} X_{in}\rho(X_{in})\,dX_{in}}\right\}$$

There is no known closed form solutions to this pdf ratio. A numerical calculus of variations technique was developed to solve for the optimal thresholds $\{V_T\}_i$ and $\{V_T\}_{i-1}$, defining domain boundaries. The $i^{th}$ domain weighting factor $\lambda_i$ is a probability of domain occupation where a domain is defined between thresholds $\{V_T\}_i$ and $\{V_T\}_{i-1}$. In general, the numerator term corresponding to effective signal energy is based on a central gamma RV and the denominator term corresponding to apparatus input energy, is based on either a non-central or central gamma RV. Another optimization technique was also developed which reduces to an alternate form:

$$\max\{\breve{\eta}_{tot}\} = \max\left\{\sum_i \lambda_i k_{i_{norm}} \int_{\eta\{i-1,i\}}^{\eta_i} \breve{\eta}_i p_i(\breve{\eta}_i)\,d\breve{\eta}_i\right\}$$

In this case, thresholds are determined in terms of the optimized threshold values for $\eta_{\{i-1\}}$, $\eta_i$. Although this optimization is in terms of an instantaneous efficiency it was shown to relate to the thermodynamic efficiency optimum.

Modulation efficiency enhancements were theoretically predicted. Several cases were tested which corroborate the accuracy of the theory. Efficiencies may be drastically improved by dividing a phase space into only a few domains. For instance, dividing the phase space into 8 optimized domains results in an efficiency of 75% and dividing it into 16 domains results in an efficiency of 86.5% for the case of a zero offset Gaussian signal. Excellent efficiencies were observed for experiments using various cell phone and wireless LAN standards as well.

A key principle of this work is that the transfer of information can only be accomplished through momentum exchange. Randomized momentum exchanges are always inefficient because the encoding particle and particle to be encoded are always in relative random motion resulting in wasted recoil momentum which is not conveyed to the channel but rather absorbed by the environment. This raises the local entropy in agreement with the second law of thermodynamics. It was also shown that information cannot be encoded without momentum exchange and information cannot be annihilated without momentum exchange.

10. Other Topics

10.1 Isoperimetric Bound Applied to Shannon's Uncertainty (Entropy) Function and Related Comments Concerning Phasespace Hyper Sphere It is possible to identify the form of probability density function, $\rho(x)$, which maximizes Shannon's continuous uncertainty function for a given variance:

$$H[\rho(x)]=-\int_{-\infty}^{\infty}\rho(x)\ln\rho(x) \qquad \text{Equation A1.1}$$

A formulation from the calculus of variations historically known as Dido's problem can be adapted for the required solution. The classical formulation was used to obtain the form of a fixed perimeter which maximizes the enclosed area. Thus the formulation is often referred to as an isoperimetric solution.

In the case of interest here it is desirable to find a solution given v, a single particle velocity in the D dimensional hyper space and a fixed kinetic energy as the resource which can move the particle. Specifically, we wish to obtain a probability density function, $(v_1, v_2 \ldots . V_D)$, which maximizes a D dimensional uncertainty hyperspace for momentum with fixed mass, given the variance of velocity $v_\alpha$, where $\alpha$=1, 2, . . . D.

This problem takes on the following character:

$$\max\{H[\rho(v_1, v_2 \ldots v_D)]\} = \max\left\{-\int\int_{-\infty}^{\infty} \ldots \int \rho(v_1, v_2 \ldots v_D)\ell n\,\rho(_1, v_2 \ldots v_D)dv_1,\ dv_2 \ldots d\,v_D\right\} \qquad \text{Equation A1.2}$$

The kernel of the integral in A1.2 shall be referred to as $\mathfrak{F}$ on occasion in its various streamlined forms.

This D dimensional maximization can be partially resolved by recognizing two simple concepts. First, in the absence of differing constraints for each of the D dimensions, a solution cannot bias the consideration of one dimension over the other. If all dimensions possess equivalent constraints, then their physical metrics as well as any related probability distributions for $\nu_\alpha$ will be indistinguishable in form. A lack of dimensional constraints is in fact a constraint by omission.

Second, if the D dimensions are orthogonal, then variation in any one of the $\nu_\alpha$ variables is unique amongst all variable variations only if the $\nu_\alpha$ are mutually decoupled. It follows that the motions corresponding to $\nu_\alpha$ must be dimensionally decoupled to maximize A1.2. Maximizing the number of independent degrees of freedom for the particle is the underlying principle, similar to maximum entropy principles from statistical mechanics.

$\{\nu_1, \nu_2 \ldots V_D\}$ cannot be deterministic functions of one another else they share mutual information and the total number of independent degrees of freedom for the set is reduced. Therefore, $$\rho(\nu_1,\nu_2 \ldots \nu_D)=\rho(\nu_1)\rho(\nu_2) \ldots \rho(\nu_D) \qquad \text{Equation A1.3}$$

for a maximization. The $\nu_\alpha$ are orthogonal and statistically independent.

This reduces the maximization integral to a streamlined form over some interval a, b:

$$\{\mathfrak{I}\}=\int_a^b \mathfrak{I}\{\nu_\alpha,\rho(\nu_\alpha),\dot{\rho}(\nu_\alpha)\}d\nu_\alpha$$

Or more explicitly:

$$\max\{\mathfrak{I}\}=\max\{H[\rho(\nu_1,\nu_2, \ldots \nu_D)]\}=\max\{-\int\rho(\nu_\alpha)^D \ln((\rho(\nu_\alpha))^D)d\nu_\alpha\} \qquad \text{Equation A1.4}$$

We now define integral constraints. The first constraint is the probability measure.

$$\sum_\alpha \mathcal{J}_\alpha = 1 = \sum_\alpha \int_{-\infty}^{\infty} \rho(v_\alpha)\,dv_\alpha \qquad \text{Equation A1.5}$$

Since no distinguishing feature has been introduced to differentiate $\rho(\nu_\alpha)$ from any joint members of $\rho(\nu_1, \nu_2 \ldots \nu_D)$, all the integrals of A1.5 are equivalent, which requires simply:

$$\sum_\alpha \mathcal{J}_\alpha = 1 = D\int_{-\infty}^{\infty} \rho(v_\alpha)\,dv_\alpha \qquad \text{Equation A1.6}$$

A final constraint is introduced which limits the variance of each member function $\rho(\nu_\alpha)$. This variance is proportional to an entropy power and can also be viewed as proportional to an average kinetic energy $$\mathcal{E}_{k\_\alpha} = \frac{1}{2}\sigma_\alpha^2.$$

$$\mathcal{J}_\sigma = D\sigma_\alpha^2 = D\int_{-\infty}^{\infty} v_\alpha^2 \rho(v_\alpha)d(v_\alpha) \qquad \text{Equation A1.7}$$

Lagrange's method may be used to determine coefficients $\lambda_\alpha$ of the following formulation.

$$\mathcal{J}_0 = \mathcal{J} + \mathcal{J}_\alpha + \mathcal{J}_\sigma \qquad \text{Equation A1.8}$$

$$\mathcal{J}_0 = \int_a^b \cdots \int \left(\mathfrak{F} + \sum_\alpha \lambda_\alpha \mathfrak{F}_\alpha + \sum_\alpha \lambda_{\sigma_\alpha} \mathfrak{F}_{\sigma_\alpha}\right) dv_1 \ldots\ dv_D$$

$$\mathfrak{F}_0 = \mathfrak{F} + D\lambda_\alpha \mathfrak{F}_\alpha + D\lambda_{\sigma_\alpha} \mathfrak{F}_{\sigma_\alpha}$$

Euler's equation of the following form must be solved:

$$\frac{d}{dv_\alpha}\frac{\partial \mathfrak{F}_0}{\partial \dot{\rho}_\alpha} - \frac{\partial \mathfrak{F}_0}{\partial \rho_\alpha} = 0 \qquad \text{Equation A1.9}$$

Since derivative $\dot{\rho}$ constraints are absent:

$$-\frac{\partial \mathfrak{F}_0}{\partial \rho_\alpha} = 0 \qquad \text{Equation A1.10}$$

And, $$\mathfrak{F}_0 = \rho(v_\alpha)^D \ell n\, \rho(v_\alpha)^D + D\lambda_\alpha\, \rho(v_\alpha) + D\lambda_{\sigma_\alpha} v_\alpha^2 \qquad \text{Equation A1.11}$$

From A1.10:

$$\frac{\partial \mathfrak{F}_0}{\partial \rho(v_\alpha)} = Dp(v_\alpha)^{D-1} + D\rho(v_\alpha)^{D-1}\ell n\, \rho(v_\alpha)^D + D\lambda_\alpha + D\lambda_{\sigma_\alpha} v_\alpha^2 = 0 \qquad \text{Equation A1.12}$$

Since all of the D dimensions are orthogonal with identically applied constraints, D=1 is a suitable solution subset of A1.12. The problem therefore is reduced to solving:

$$1 + \ell n\rho_\alpha + \lambda_\alpha + \lambda_{\sigma_\alpha} v_\alpha^2 = 0$$

$$\rho_\alpha = e^{-\lambda_\alpha} e^{-\lambda_{\sigma_\alpha} v_\alpha^2} e^{-1}$$

Equation A1.13

A1.13 can be substituted into A1.7 to obtain:

$$\sigma_\alpha^2 = \int_{-\infty}^{\infty} (e^{-\lambda_\alpha} e^{-1}) v^2 e^{-\lambda_{\sigma_\alpha} v_\alpha^2}\,dv_\alpha \qquad \text{Equation A1.14}$$

$$\sigma_\alpha^2 = \frac{1}{2} e^{(-\lambda_\alpha+1)} v_\alpha^2\, e^{-\lambda_{\sigma_\alpha} v_\alpha^2}\Big|_{-\infty}^{\infty} - \int_{-\infty}^{\infty} e^{(-\lambda_\alpha+1)} v_\alpha e^{-\lambda_{\sigma_\alpha} v_\alpha^2}\,dv_\alpha \qquad \text{Equation A1.15}$$

$$\therefore \sigma_\alpha^2 = \frac{e^{(-\lambda_\alpha+1)}}{2\lambda_{\sigma_\alpha}} \int_{-\infty}^{\infty} e^{-\lambda_{\sigma_\alpha} v_\alpha^2}\,dv_\alpha$$

Rearranging A1.15 gives:

$$\sigma_\alpha^2 = \frac{1}{2\lambda_{\sigma_\alpha}} \int_{-\infty}^{\infty} e^{(-\lambda_\alpha+1)} e^{-\lambda_{\sigma_\alpha} v_\alpha^2}\,dv_\alpha$$

-continued $$\sigma_\alpha^2 = \frac{1}{2\lambda_{\sigma_\alpha}}\int_{-\infty}^{\infty}\rho_\alpha(v_\alpha)dv_\alpha = \frac{1}{2\lambda_{\sigma_\alpha}}$$

$$\therefore \lambda_{\sigma_\alpha} = \frac{1}{2\sigma_\alpha^2} = 1$$

This requires:

$$e^{(\lambda_\alpha+1)} = \int_{-\infty}^{\infty} e^{-\lambda_{\sigma_\alpha} v_\alpha^2}\, dv_\alpha = \int_{-\infty}^{\infty} e^{\frac{-v_\alpha^2}{2\sigma_\alpha^2}}\, dv_\alpha \quad \text{Equation A1.16}$$

$$e^{(\lambda_\alpha+1)} = \sqrt{2\pi\sigma_\alpha^2} \quad \text{Equation A1.17}$$

And:

$$\pi(v_\alpha) = e^{-(\lambda_\alpha+1)}e^{\frac{-v_\alpha^2}{2\sigma_\alpha^2}} = \frac{1}{\sqrt{2\pi}\,\sigma_\alpha}e^{\frac{-v_\alpha^2}{2\sigma_\alpha^2}} \quad \text{Equation A1.18}$$

It follows from A1.3 that the density function for the D dimensional case is simply:

$$(\rho(v_\alpha))^D = \frac{1}{(2\pi)^{D/2}\sigma_\alpha^D}\prod_\alpha e^{\frac{-v_\alpha^2}{2\sigma_\alpha^2}} \quad \text{Equation A1.19}$$

This is the density which maximizes A1.2 subject to a fixed total energy $\sigma^2=\Sigma_\alpha\sigma_\alpha^2$ where the D dimensions are indistinguishable from one another.

$v$ is Gaussian distributed in a D-dimensional space. This velocity has a maximum uncertainty for a given variance $\sigma_\alpha^2$.

Now if the particle is confined to some hyper volume it is useful to know the character of the volume. It was previously deduced that the dimensions are orthogonal. Thus we may represent the velocity as a vector sum of orthogonal velocities.

$$\vec{v} = \sum_{\alpha=1}^{D}\vec{v}_\alpha\hat{a}_\alpha \quad \text{Equation A1.20}$$

It was also determined that the $\rho(v_\alpha)$ have identical forms, i.e. they are iid Gaussian. Now let the maximum velocity $v_{max\_\alpha}$ in each dimension be determined as some multiple $k\sigma_\alpha$ on the probability tail of the Gaussian pdf, ignoring the asymptotic portions greater than that peak. Then A1.21 may be written in an alternate form:

$$v_{max}^2 - \sum_{\alpha=1}^{D}(v_\alpha)^2 \geq 0;\ v_{\alpha 0} \leq v_{max} \quad \text{Equation A1.21}$$

$$v_{max}^2 = \sum_\alpha \vec{v}_{max\_\alpha}^2 = \sum_\alpha k^2\sigma_\alpha^2 \quad \text{Equation A1.22}$$

A1.21 together with A1.22 define a hyper sphere volume with radius.

$$\sqrt{\varepsilon_{max}} = \sqrt{\sum_\alpha \frac{m}{2}k^2\sigma_\alpha^2} = \sqrt{\sum_\alpha \frac{PAER}{2m}\sigma_{p_\alpha}^2} \quad \text{Equation A1.23}$$

$k^2$ is the PAER and $\sigma_{p_\alpha}^2$ is the momentum variance in the $\alpha^{th}$ dimension. The hyper sphere has an origin of zero with a zero mean Gaussian velocity pdf characterizing the particle motion in each dimension.

The form of the momentum space is a hyper sphere and therefore the physical coordinate space is also a hyper sphere. This follows since position is an integral of velocity. The mean velocity is zero and therefore the average position of the space may be normalized to zero. The position coordinates within the space are Gaussian distributed since the linear function of a Gaussian RV remains Gaussian. Just as the velocity may be truncated to a statistically significant but finite value so too the physical volume containing the particle can be limited to a radius $R_S$. Truncation of the hyper sphere necessarily comes at the price of reducing the uncertainty of the Gaussian distribution pdf in each dimension. Therefore, PAER should be selected to moderate this entropy reduction for this approximation given the application requirements.

The preceding argument justifying the hyper sphere may also be solved using the calculus of variations. Since a hyper sphere may be synthesized as a volume of revolution based on the circle, it possesses the greatest enclosed volume for a given surface. The implication is that a particle may move in the largest possible volume given fixed energy resources when the volume is a hyper sphere. The greater the volume of the space which contains the particle, the more uncertain its random location and if the particle is in motion the more uncertain its velocity. Joint representation of the momentum and position is a hyper spherical phase space.

10.2 Derivation for Maximum Velocity Profile

This Section derives the maximum velocity profile subject to a limit of $P_m$ joules/second available to accelerate a particle from one end of a spherical space to the other where the sphere radius is $R_s$. Furthermore, it is assumed that the particle can execute the maneuver in Δt seconds but no faster. There is an additional constraint of zero velocity (momentum) at the sphere boundary. The maximum kinetic energy expenditure per unit time is given by:

$$\max\{\dot{\varepsilon}_k\}=P_m \quad \text{Equation B1.1}$$

The particle's kinetic energy and rate of work is given by:

$$\varepsilon_k = 1/2mv^2 \quad \text{Equation B1.2}$$

$$\dot{\varepsilon}_k = m\vec{v}\cdot\frac{d\vec{v}}{dt} = \dot{\vec{p}}\cdot\vec{v} \quad \text{Equation B1.3}$$

$m \equiv$ mass, $\vec{p} \equiv$ momentum, $\vec{v} \equiv$ velocity

Since the volume is symmetrical and boundary conditions require $|v|=0$ at a distance $\pm R_s$ from the sphere center:

$$\varepsilon_{k_{max}} = \int_0^{\Delta t/2}\max\{\dot{\varepsilon}_k\}dt = \frac{\Delta t}{2}P_m \quad \text{Equation B1.4}$$

$$\varepsilon_{k_{peak}} = tP_m \quad \text{Equation B1.5}$$

$$0 \leq t \leq \frac{\Delta t}{2}$$

-continued $$\varepsilon_{k_{peak}} = (\Delta t - t)P_m \quad \Delta t/2 \le t \le \Delta t \qquad \text{Equation B1.6}$$

Figure 93:
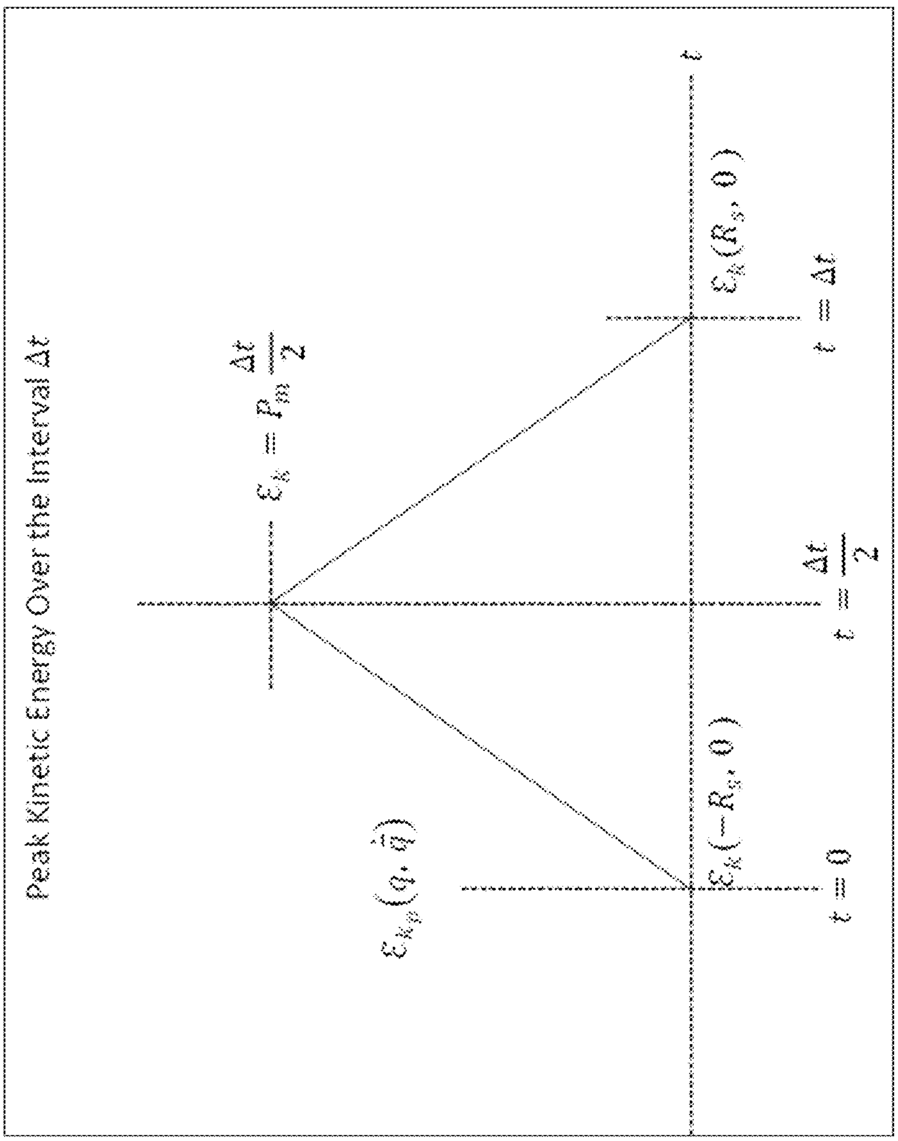
FIG. 93 is an illustration of a plot of kinetic energy versus time for maximum acceleration, in accordance with one or more embodiments.

Under conditions of maximum acceleration and deceleration the kinetic energy vs. time is a ramp, illustrated as a plot 9300 of kinetic energy versus time for maximum acceleration in FIG. 93, in accordance with one or more embodiments.

$\vec{q}$ and $\dot{\vec{q}}$ are position and velocity respectively ($\dot{\vec{q}}=\vec{v}$). Equations B1.5 and B1.6 can be used to obtain peak velocity over the interval Δt.

$$\frac{1}{2}mv_p^2 = tP_m \quad 0 \le t \le \frac{\Delta t}{2} \quad R_s \le q \le 0 \quad \pm\vec{v}_p = \sqrt{\frac{2P_m t}{m}}\,\hat{a}_r \qquad \text{Equation B1.7}$$

$$\frac{1}{2}mv_p^2 = (\Delta t - t)P_m \quad t/2 \le t \le \Delta t \quad 0 \le q \le R_s \quad \mp\vec{v}_p = \sqrt{\frac{2P_m(\Delta t - t)}{m}}\,\hat{a}_r \qquad \text{Equation B1.8}$$

Equations B1.7 and B1.8 are defined as the peak velocity profile.

Positive and negative velocities may also be defined as those velocities which are associated with motion of the particle in the $\pm\hat{a}_r$ direction with respect to the sphere center.

It is possible to have $\pm v_p$ over the entire domain since $\pm v_p$ is rectified in the calculation of $\varepsilon_k$ and boundary constraints do not preclude such motions.

Position q may be calculated from these quantities through an integral of motion $$\vec{q} = \int \vec{v}_p\,dt \qquad \text{Equation B1.9}$$

$$\vec{q} = \int -\sqrt{\frac{2P_m t}{m}}\,\hat{a}_r dt = \left(R_s - 2/3 v_{max}\sqrt{\frac{2}{\Delta t}}\,t^{3/2}\right)\hat{a}_r \quad 0 \le t \le \frac{\Delta t}{2} \quad R_s \le q \le 0 \qquad \text{Equation B1.10}$$

Integration of the opposite velocity yields:

$$\vec{q} = \int -\sqrt{\frac{2P_m t}{m}}\,\hat{a}_r dt = \left(2/3 v_{max}\sqrt{\frac{2}{\Delta t}}\,t^{3/2} - R_s\right)\hat{a}_r \quad 0 \le t \le \frac{\Delta t}{2} \quad 0 \le q \le R_s \qquad \text{Equation B1.11}$$

$\pm R_s$ is the constant of integration in both cases which may be deduced from boundary conditions, or initial and final conditions.

The other peak velocity profile trajectories (from B1.8) yield similar relationships:

$$\vec{q} = \int \pm\sqrt{\frac{2P_m(\Delta t - t)}{m}}\,\hat{a}_r dt = \pm\left(2/3 v_{max}\sqrt{\frac{2}{\Delta t}}\,(\Delta t - t)^{3/2} - R_s\right)\hat{a}_r \qquad \text{Equation B1.12}$$

where:

$$v_{max} = \sqrt{\frac{P_m \Delta t}{m}} \qquad \text{Equation B1.13}$$

The result of B1.10 may be solved for the characteristic radius of the sphere, $R_s$:

$$R_s = v_m\sqrt{\frac{2}{\Delta t}}\left(\frac{\Delta t}{2}\right)^{3/2} = \sqrt{\frac{2P_m}{m}}\left(\frac{\Delta t}{2}\right) \qquad \text{Equation B1.14}$$

At this point it is possible to parametrically relate velocity and position. This can be accomplished by solving for time in equations B1.10, B1.11 and B1.12 then eliminating the time variable in the q and $\dot{q}$ equations.

$$t = \left(\frac{3}{2}\sqrt{\frac{\Delta t}{2}}\,\frac{R_s - q}{v_m}\right)^{2/3} \quad R_s \ge q \ge 0 \qquad \text{Equation B1.15}$$

$$t = \Delta t - \left(\frac{3}{2}\sqrt{\frac{\Delta t}{2}}\,\frac{q + R_s}{v_m}\right)^{2/3} \quad 0 \ge q \ge -R_s \qquad \text{Equation B1.16}$$

Equations B1.15 and B1.16 may be substituted into the peak velocity equations B1.7 and B1.8.

$$\vec{v}_p = \sqrt{\frac{2P_m}{m}}\,\sqrt{t}\,a_r = \left(\frac{3P_m}{m}(q + R_s)\right)^{1/3}\hat{a}_r \quad -R_s \le q \le 0$$

$$-\vec{v}_p = -\left(\frac{3P_m}{m}(q - R_s)\right)^{1/3}\hat{a}_r \quad 0 \le q \le R_s$$

Similarly $$\vec{v}_p = \sqrt{\frac{2P_m}{m}}\,\sqrt{t}\,\hat{a}_r = \left(\frac{3P_m}{m}(q + R_s)\right)^{1/3}\hat{a}_r \quad -R_s \le q \le 0$$

$$-\vec{v}_p = -\left(\frac{3P_m}{m}(q - R_s)\right)^{1/3}\hat{a}_r \quad 0 \le q \le R_s$$

10.3 Maximum Velocity Pulse Auto Correlation

Consider the piece wise pulse specification:

$$\vec{v}_\alpha = \sqrt{\frac{2P_m t}{m}}\,\hat{\alpha}_\alpha \quad 0 \le t \le \frac{\Delta t}{2} \qquad \text{Equation C1.1}$$

$$\vec{v}_\alpha = \sqrt{\frac{2P_m(\Delta - t)}{m}}\,\hat{\alpha}_\alpha \quad \frac{\Delta t}{2} \le t \le \Delta t \qquad \text{Equation C1.2}$$

The auto correlation of this pulse is given by (where we drop vector notations):

$$\mathfrak{R}_{v,v} = \int_{-\infty}^{\infty} v_\alpha(t) v_\alpha(t+\tau)\,dt \qquad \text{Equation C1.3}$$

The auto correlation must be solved in segments. Since it is symmetric in time the result for the first half of the correlation response may simply be mirrored for the second half of the solution.

Figure 94:
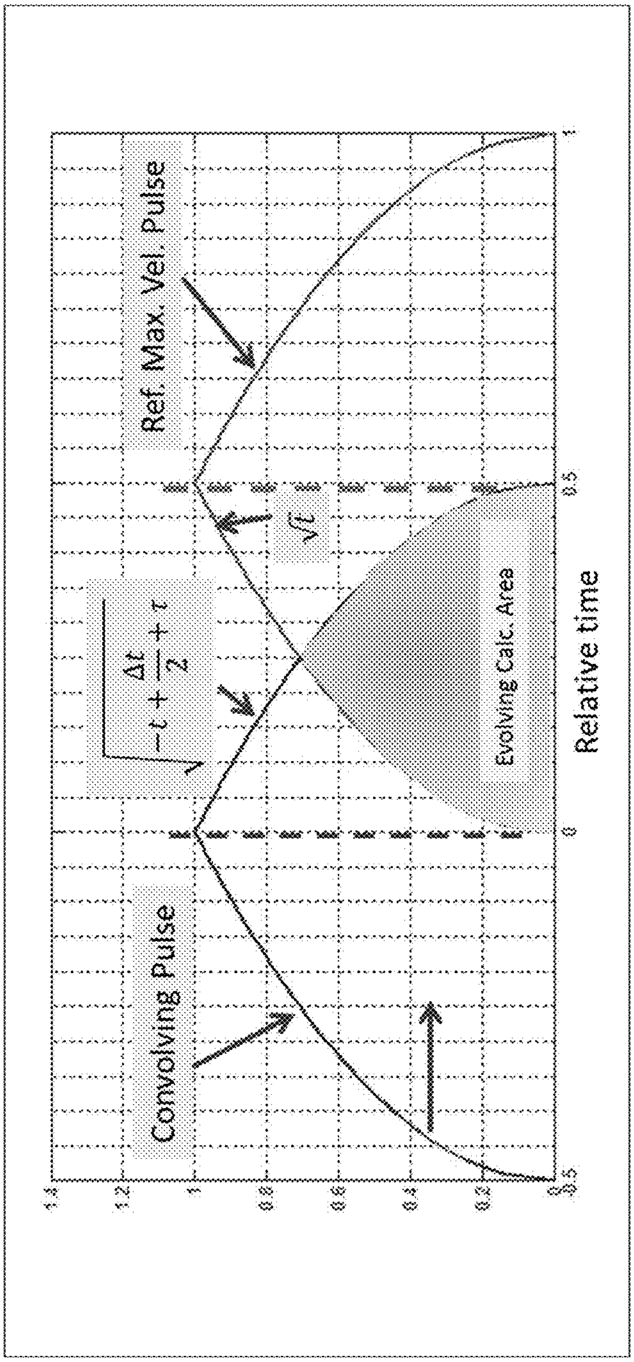
FIG. 94 is an illustration of a plot of a reference pulse and a replicated convolving pulse, in accordance with one or more embodiments.

FIG. 94 illustrates a plot 9400 of the reference pulse described by equations C1.1, C1.2, along with the replicated convolving pulse, in accordance with one or more embodiments. As the convolving pulse migrates through its various variable time domain positions equation C1.3 is recursively applied. The shaded area in the plot 9400 illustrates the evolving functional overlap in the domains of the two pulses. This is the domain of calculation.

For the first segment of the solution the two pulses overlap with their specific functional domains determined according to their relative variable time offsets. The reference pulse functional description of course does not change but the convolving pulse domain is dynamic.

The first solution then involves solving:

$$\mathfrak{R}_{v_a,v_a} = \int_0^{\frac{\Delta t}{2}+\tau} \sqrt{t}\sqrt{-t + \frac{\Delta t}{2} + \tau}\;dt = \int_0^{\frac{\Delta t}{2}+\tau} \left(-t^2 + t\left(\frac{\Delta t}{2} + \tau\right)\right)^{1/2} d\tau \qquad \text{Equation C1.4}$$

$$\mathfrak{R}_{v_a,v_a} = \left(\frac{t}{2} - \frac{\Delta t}{8} - \frac{\tau}{4}\right)\sqrt{-t^2 + t\left(\frac{\Delta t}{2} + \tau\right)}\;\Bigg|_0^{\frac{\Delta t}{2}+\tau} + \frac{\left(\frac{\Delta t}{2} + \tau\right)^2}{8}\left(-\sin\left(\frac{\frac{\Delta t}{2} + \tau - 2t}{\frac{\Delta t}{2} + \tau}\right)\right)\Bigg|_0^{\frac{\Delta t}{2}+\tau} \qquad \text{Equation C1.5}$$

$$\mathfrak{R}_{v_a,v_a} = \frac{\pi}{8}\left(\frac{\Delta t}{2} + \tau\right)^2 \quad -\Delta t \le \tau \le -\frac{\Delta t}{2} \qquad \text{Equation C1.6}$$

Figure 95:
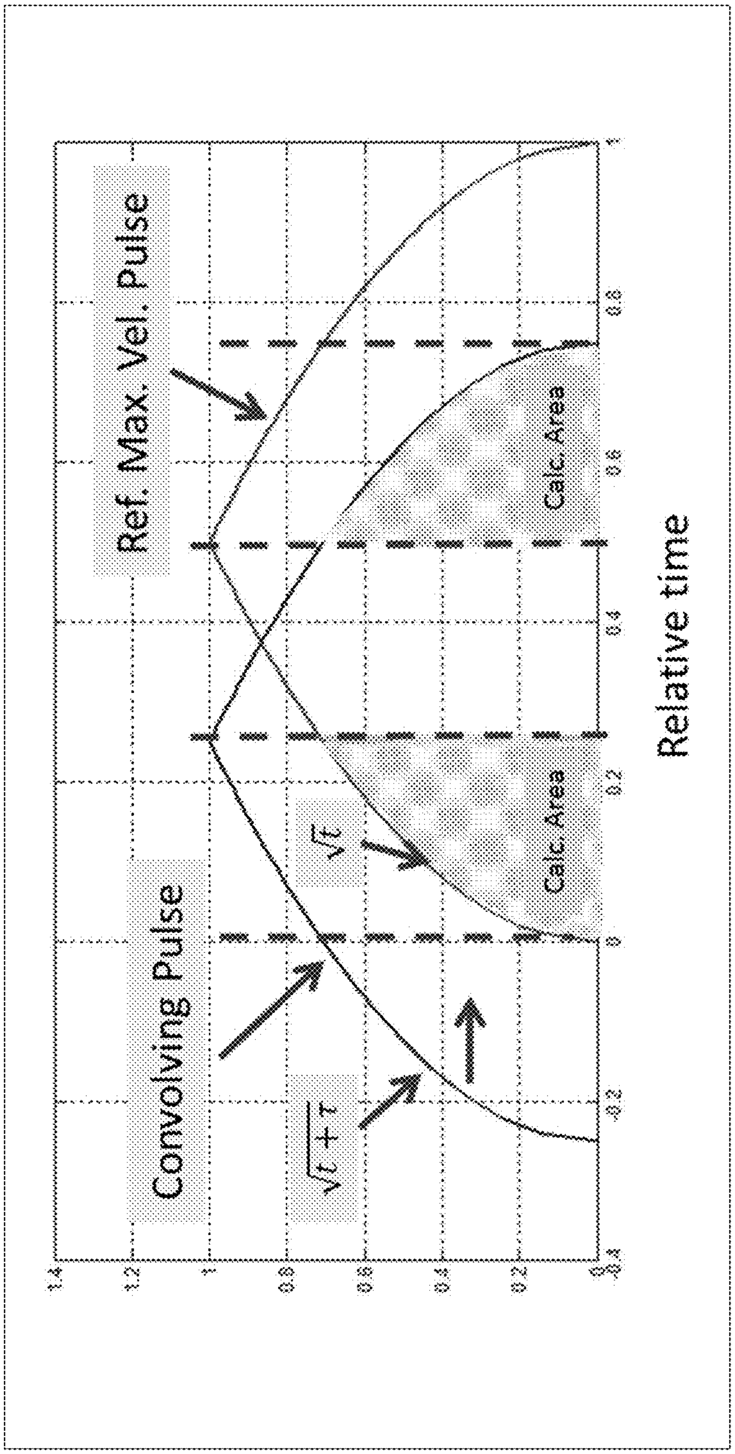
FIG. 95 is an illustration of a plot of a convolution calculation domain, in accordance with one or more embodiments.

The next segment for evaluation corresponds with the pulse overlap illustrated in plot 9500 of FIG. 95, in accordance with one or more embodiments.

The applicable equation to be solved is:

$$\int_0^{\frac{\Delta t}{2}+\tau} \sqrt{t}\sqrt{t-\tau}\,dt = \int_0^{\frac{\Delta t}{2}+\tau} \sqrt{t^2 - \tau t}\,dt \quad -\frac{\Delta t}{2} \le \tau \le 0 \qquad \text{Equation C1.7}$$

$$= \frac{2\pi - \tau}{4}\sqrt{t(t-\tau)}\;\Big|_0^{\frac{\Delta t}{2}+\tau} - \frac{\tau^2}{8}\left[\ln\left(2\sqrt{t(t-\tau)} + 2t - \tau\right)\right]_0^{\frac{\Delta t}{2}+\tau}$$

-continued $$\mathfrak{R}_{v_b,v_b} = \left(\frac{\Delta t + \tau}{4}\sqrt{\left(\frac{\Delta t}{2} + \tau\right)\frac{\Delta t}{2}}\right) \times 2 \quad -\frac{\Delta t}{2} \le \tau \le 0 \qquad \text{Equation C1.8}$$

$$\mathfrak{R}_{v_c,v_c} = \left(\frac{\tau^2}{8}\left[\ln\left(2\sqrt{\left(\frac{\Delta t}{2} + \tau\right)\left(\frac{\Delta t}{2}\right)} + \Delta t - \tau\right) - \ln(-\tau)\right]\right) \times 2 \quad -\frac{\Delta t}{2} \le \tau \le 0 \qquad \text{Equation C1.9}$$

Equations C1.8 and C1.9 have been multiplied by 2 to account for both regions of overlap in FIG. 95.

Figure 96:
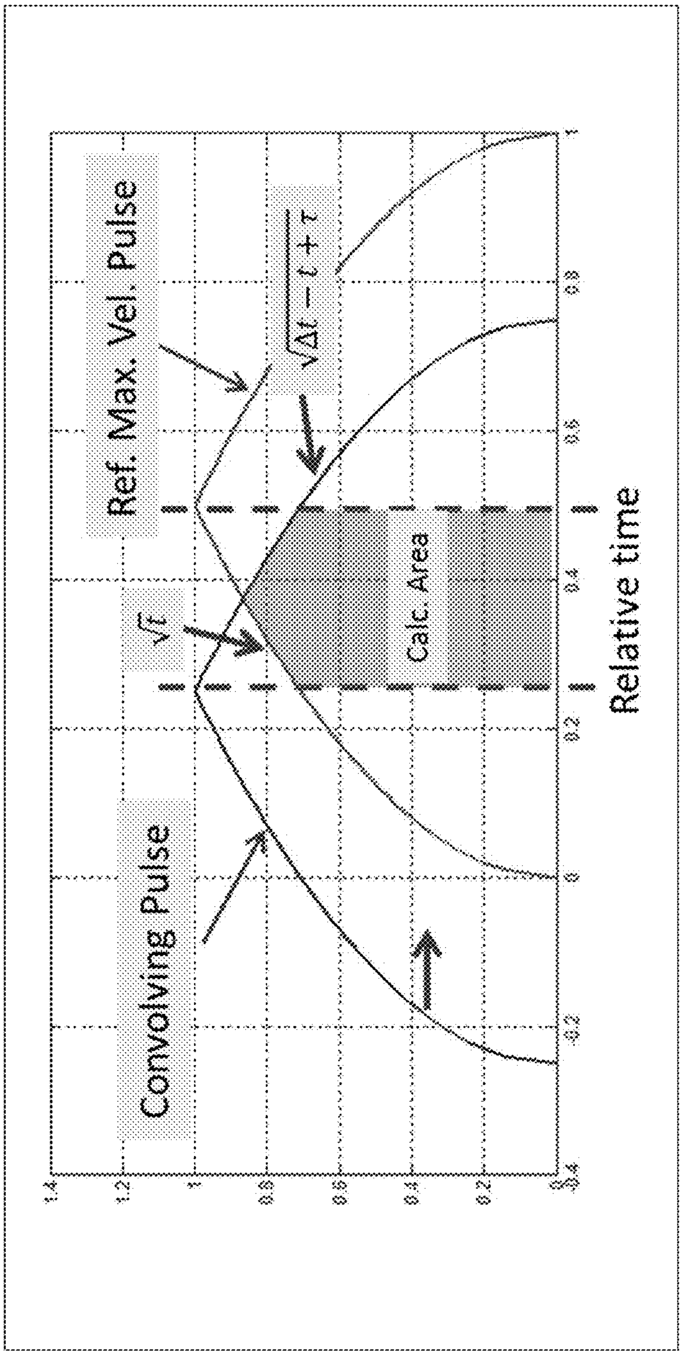
FIG. 96 is an illustration of a plot of a convolution calculation domain, in accordance with one or more embodiments.

The last segment of solution also yields two results. The overlap region is indicated in plot 9600 of FIG. 96, in accordance with one or more embodiments.

The applicable integral is:

$$\int_{\frac{\Delta t}{2}+\tau}^{\frac{\Delta t}{2}} \sqrt{t}\sqrt{\Delta t - t + \tau}\,dt = \int_{\frac{\Delta t}{2}+\tau}^{\frac{\Delta t}{2}} \sqrt{t(\Delta t + \tau)}\,dt \quad -\frac{\Delta t}{2} \le \tau < 0 \qquad \text{Equation C1.10}$$

$$\mathfrak{R}_{v_d,v_d} = \left(\frac{t}{2} + \frac{\Delta t + \tau}{-4}\right)\sqrt{t(\Delta t + \tau) - t^2}\;\Big|_{\frac{\Delta t}{2}+\tau}^{\frac{\Delta t}{2}} = \frac{\pi}{4}\sqrt{\frac{\Delta t}{2}(\Delta t + \tau) - \left(\frac{\Delta t}{2}\right)^2} - \frac{\tau}{4}\sqrt{\left(\frac{\Delta t}{2} + \tau\right)(\Delta t + \tau) - \left(\frac{\Delta t}{2} + \tau\right)^2} \quad -\frac{\Delta t}{2} \le \tau \le 0 \qquad \text{Equation C1.11}$$

$$\mathfrak{R}_{v_e,v_e} = \frac{(\Delta t + \tau)^2}{8}\left[-\sin^{-1}\left(\frac{-2t + \Delta t + \tau}{\Delta t + \tau}\right)\right]\Bigg|_{\frac{\Delta t}{2}+\tau}^{\frac{\Delta t}{2}} \qquad \text{Equation C1.12}$$

$$\mathfrak{R}_{v_e,v_e} = \frac{(\Delta t + \tau)^2}{8}\left[\begin{matrix} -\sin^{-1}\left(\frac{\tau}{\Delta t + \tau}\right) + \\ \sin^{-1}\left(-\frac{\tau}{\Delta t + \tau}\right) \end{matrix}\right]\Bigg|_{\frac{\Delta t}{2}+\tau}^{\frac{\Delta t}{2}} \quad -\frac{\Delta t}{2} \le \tau \le 0 \qquad \text{Equation C1.13}$$

The total solution is found from the sum of segmented solutions, Equations C1.6, C1.8, C1.9, C1.11, C1.13 combined with its mirror image in time, symmetric about the peak of the autocorrelation.

$$\mathfrak{R}_{v,v} = \mathfrak{R}_{v_a,v_a} + \mathfrak{R}_{v_b,v_b} + \mathfrak{R}_{v_c,v_c} + \mathfrak{R}_{v_d,v_d} + \mathfrak{R}_{v_e,v_e} \qquad \text{Equation C1.14}$$

Figure 97:
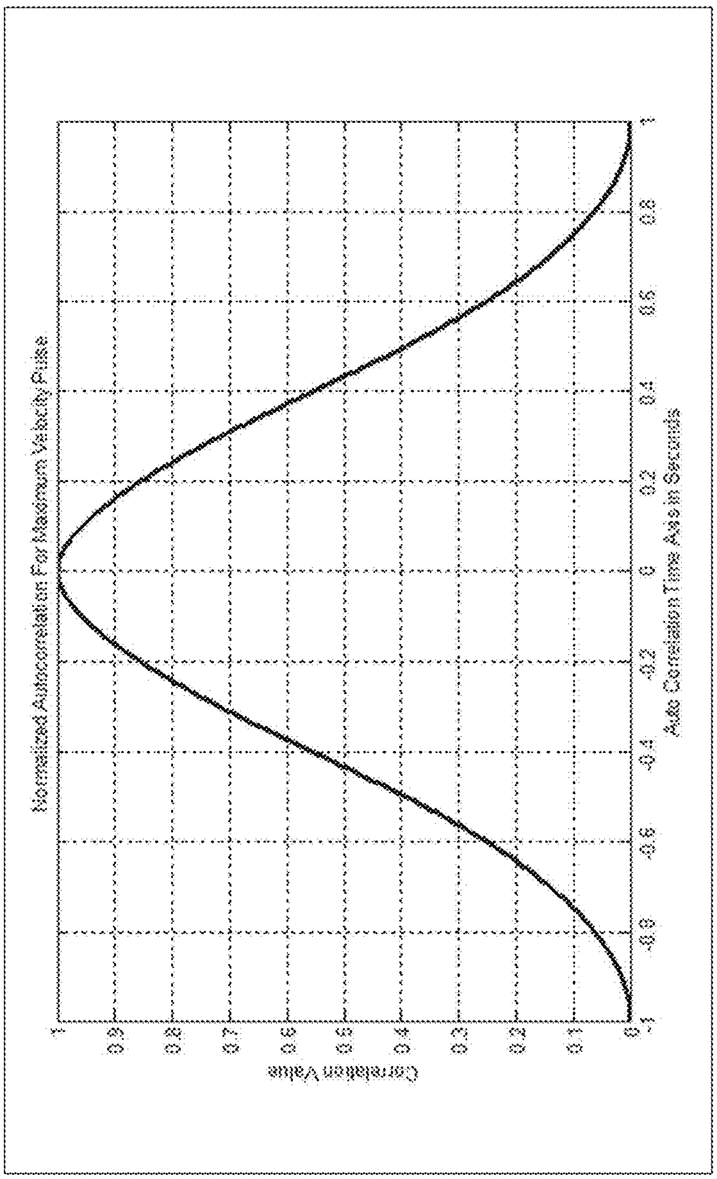
FIG. 97 is an illustration of a plot of a normalized autocorrelation for a maximum velocity pulse, in accordance with one or more embodiments.

The terms in C1.14 may therefore be scaled as required to normalize the peak of the auto correlation corresponding to the mean of the square for the pulse. For instance, the peak energy of the maximum velocity pulse corresponds to a value of $P_m/m$. Plot 9700 of FIG. 97 illustrates the result for $P_m/m=1$, in accordance with one or more embodiments.

10.4 Differential Entropy Calculation

Shannon's continuous entropy also known as differential entropy may be calculated for the Gaussian multi-variate. The Gaussian multi-variate for the velocity random variable is given as:

$$\rho(v) = \frac{1}{\sqrt{(2\pi)^D[\Lambda]}} e^{-\frac{1}{2}(v_\alpha - \bar{v}_\alpha)^T \Lambda^{-1}(v_\beta - \bar{v}_\beta)} \qquad \text{Equation D1.1}$$

D is the dimension of the multi-variate. $\alpha,\beta$ are enumerated from 1 to D and $\Lambda$ is a covariance matrix and $(\nu_\alpha-\bar{\nu}_\alpha)^t$ is the transpose of $(\nu_\beta-\bar{\nu}_\beta)$.

From Shannon's definition:

$$H[\rho(\nu)]=-\int_{-\infty}^{\infty}\rho(\nu)\ln(\rho(\nu))d(\nu) \quad \text{Equation D1.2}$$

It is noted that:

$$\ln\rho(\nu_\alpha) = -\frac{1}{2}(\nu_\alpha-\bar{\nu}_\alpha)^t\Lambda^{-1}(\nu_\beta-\bar{\nu}_\beta)\ln(e)-\ln(2\pi)^{D/2}|\Lambda|^{1/2}, \quad \alpha=1,2,\ldots D \quad \text{Equation D1.3}$$

Since there are D variables the entropy must be calculated with a D-tuple integral of the form:

$$H[\rho(\nu)]=-\int_{-\infty}^{\infty}\ldots\int_{-\infty}^{\infty}\rho(\nu)\ln(\rho(\nu))d(\rho(\nu))$$

$$\rho(\nu)=\rho(\nu_1,\nu_2,\ldots\nu_D) \quad \text{Equation D1.4}$$

The D=1 case is obtained in Section 10.10. Using the same approach we may extend the result over D dimensions:

$$H[\rho(\nu)] = \frac{1}{2}\int_{-\infty}^{\infty}\ldots\int_{-\infty}^{\infty}\ln((2\pi e)^D|\Lambda|)\rho(\nu)\,d\nu + \frac{1}{2}\int_{-\infty}^{\infty}\ldots\int_{-\infty}^{\infty}\rho(\nu_\alpha)(\nu_\alpha-\bar{\nu}_\alpha)\Lambda^{-1}(\nu_\beta-\bar{\nu}_\beta)d\nu \quad \text{Equation D1.5}$$

D1.5 can be rewritten with a change of variables for the second integral;

$$H[\rho(\nu)] = \frac{1}{2}\int_{-\infty}^{\infty}\ldots\int_{-\infty}^{\infty}\ln((2\pi e)^D|\Lambda|)\rho(\nu)d\nu + \int_{-\infty}^{\infty}\ldots\int_{-\infty}^{\infty}zf(z)dz \quad \text{Equation D1.6}$$

$$z_\alpha = \frac{1}{2}(\nu_\alpha-\bar{\nu}_\alpha)\Lambda^{-1}(\nu_\beta-\bar{\nu}_\beta)$$

The second integral then is simply the expected value for $Z_\alpha$ over the D-tuple which is equal to the dimension D divided by 2 for uncorrelated RVs:

$$E\{Z_\alpha\} = E\left\{\frac{1}{2}(\nu_\alpha-\bar{\nu}_\alpha)\Lambda^{-1}(\nu_\beta-\bar{\nu}_\beta)\right\} = \frac{D}{2} \quad \text{Equation D1.7}$$

The covariance matrix is given by:

$$[\Lambda] = \begin{bmatrix} \sigma_{\nu_1}^2 & \sigma_{12} & \ldots & \sigma_{1D} \\ \sigma_{21} & \sigma_{\nu_2}^2 & & \vdots \\ \vdots & & \ddots & \\ \sigma_{D_1} & \ldots & & \sigma_{\nu_D}^2 \end{bmatrix} \quad \text{Equation D1.8}$$

$$\sigma_{\alpha,\beta} = \sigma_\alpha\sigma_\beta\Gamma_{\alpha,\beta} \quad \text{Equation D1.9}$$

$\sigma^2$ is a variance of the random variable. $\Gamma_{\alpha,\beta}$ is a correlation coefficient. The covariance is defined by $$\sigma_{\alpha,\beta} = E\{(\nu_\alpha-\bar{\nu}_\alpha)(\nu_\beta-\bar{\nu}_\beta)\} = \text{cov}\{\nu_\alpha,\nu_\beta\} = \int\int_{-\infty}^{\infty}(\nu_\alpha-\bar{\nu}_\alpha)(\nu_\beta-\bar{\nu}_\beta)\rho(\nu_\alpha,\nu_\beta)d\nu_\alpha d\nu_\beta \quad \text{Equation D1.10}$$

In the case of uncorrelated zero mean Gaussian random variables $\sigma_{\alpha,\beta}=0$ for $\alpha\neq\beta$ and 1 otherwise. Thus only the diagonal of D1.8 survives in such a circumstance. The entropy can be streamlined in this particular case to:

$$H[\rho(\nu)] = \ln\left[e^{\frac{D}{2}}\right] + \frac{1}{2}\ln((2\pi e)^D|\Lambda|) \quad \text{Equation D1.11}$$

$$H[\rho(\nu)] = \frac{1}{2}\ln((2\pi e)^D|\Lambda|) \quad \text{Equation D1.12}$$

Equation D1.12 is the maximum entropy case for the Gaussian multi-variate.

In the case where $\nu_\alpha$ and $\nu_\beta$ are complex quantities, D1.10 will also spawn a complex covariance. In this case the elements of the covariance matrix become:

$$\tilde{\Lambda}=E\{(\nu_\alpha-\underline{\nu}_\alpha)(\nu_\beta-\underline{\nu}_\beta)^T\}+E\{(\tilde{\nu}_\alpha-\bar{\tilde{\nu}}_\alpha)(\tilde{\nu}_\beta-\bar{\tilde{\nu}}_\beta)^T\}+jE\{(\nu_\alpha-\bar{\nu}_\alpha)(\nu_\beta-\bar{\nu}_\beta)^T\}-jE\{(\nu_\alpha-\bar{\nu}_\alpha)(\tilde{\nu}_\beta-\bar{\tilde{\nu}}_\beta)^T\}$$

The complex covariance matrix can be used to double the dimensionality of the space because complex components of this vector representation are orthogonal. This form can be useful in the representation of band pass processes where a modulated carrier may be decomposed into sin(x) and cos(x) components.

Hence the uncertainty space can increase by a factor of 2 for the complex process if the variance in real and imaginary components are equal.

10.5 Minimum Mean Square Error (MMSE) and Correlation Function for Velocity Based on Sampled and Interpolated Values Let $\tilde{\nu}_\alpha(t)=\nu_\alpha(t)\delta(t-nT_s)*h_t$ be a discretely encoded approximation of a desired velocity for a dynamic particle. The input samples are zero mean Gaussian distributed and the input process possesses finite power. This is consistent with a maximum uncertainty signal. A focus is obtaining an expression for the MMSE associated with the reconstitution of $\nu_\alpha(t)$ from a discrete representation. From the MMSE expression one can also imply the form of an correlation function for the velocity. When $\tilde{\nu}_\alpha(t)$ is compared to $\nu_\alpha(t)$ the comparison metric is cross correlation and becomes autocorrelation for $\tilde{\nu}_\alpha(t)=\nu_\alpha(t)$. The inter sample interpolation trajectories will spawn from a linear time invariant (LTI) operator $*h_t$. With this background, a familiar error metric can be minimized to optimize the interpolation, where the energy of each sample is conserved:

$$\langle\nu_\varepsilon^2\rangle = \sigma_\varepsilon^2 = \left[\sum_n \nu_\alpha(t)-\nu_\alpha(t)\delta(t-nT_s)*h_t\right]^2 \quad \text{Equation E1.1}$$

Minimizing the error variance $\sigma_\varepsilon^2$ requires solution of:

$$\nu_\alpha(t)-\nu_\alpha(t)\delta(t-nT_s)*h_t=0 \quad \text{Equation E1.2}$$

Impulsive forces $\delta(t-nT_s)$ are naturally integrated through Newton's laws to obtain velocity pulses. That analysis may easily be extended to tailor the forces delivered to the particle via an LTI mechanism where $h_t$ disperses a sequence of forces in the preferable continuous manner. $h_t$ may be regarded as a filter impulse response where the integral of the time domain convolution operator is inherent in the laws of motion.

Figure 98:
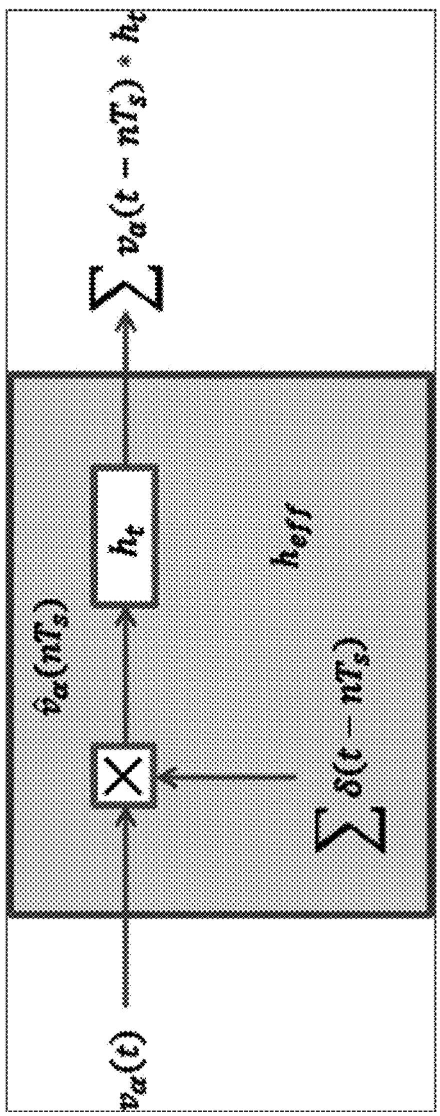
FIG. 98 is an illustration of a schematic of a LTI mechanism, in accordance with one or more embodiments.

FIG. 98 depicts a schematic 9800 of a LTI mechanism, in accordance with one or more embodiments. A schematic 9800 is a convenient way to capture the concept at a high level. The schematic 9800 illustrates the $\alpha^{th}$ dimension sampled velocity and its interpolation. Extension to D dimensions is straightforward.

It is evident that an effective LTI or linear shift invariant (LSI) impulse response $h_{eff}=1$ provides the solution which minimizes $\sigma_\varepsilon^2$.

The expanded error kernel may be compared to a cross correlation where $h_t$ is a portion of the correlation operation. The cross correlation characteristics are gleaned from the expanded error kernel and cross correlation definition:

$$\sigma_\varepsilon(\tau,nT_s)^2=\langle v_\alpha(t+\tau)^2-2v_\alpha(t+\tau)v_\alpha(t-nT_s)*h_t+(v_\alpha(t-nT_s)*h_t)^2\rangle \quad \text{Equation E1.3}$$

$$\sigma_\varepsilon(\tau,nT_s)^2=\langle v_\tau^2\rangle-2|\gamma_{\tau,nT_s}|\langle v_\tau v_{nT_s}\rangle+(\gamma_{\tau,nT_s}\langle v_{nT_s}\rangle)^2 \quad \text{Equation E1.4}$$

The notation has been streamlined, dropping the a subscript and adopting a two dimensional variation to allow for sample number and continuously variable time offset. The reference function $v_\alpha(t+\tau)$ is continuously variable over the domain while $v_\alpha(t-nT_s)*h_t$ is fixed. $\gamma_{\tau,nT_s}$ are cross correlation coefficients. These coefficients reflect how well the operator $*h_t$ accomplishes the reconstruction of particle velocity while simultaneously providing a means to analyze the dependence between input stimulus and output response at prescribed intervals of $T_s$. $|\gamma_{\tau,nT_s}|_{norm}\leq 1$ under all circumstances.

The power cross correlation function (m=1) is defined in the usual manner:

$$\Re_{\tau,nT_s}=\frac{1}{2}\langle v_\tau v_{nT_s}\rangle \quad \text{Equation E1.5}$$

Then $$\tilde{\sigma}_\epsilon^2=2\left[v_\tau^2-2|\gamma_{\tau,nT_s}|\Re_{\tau,nT_s}+(\gamma_{\tau,nT_s}\sigma_{nT_s})^2\right] \quad \text{Equation E1.6}$$

The extremes can be obtained by solving:

$$\frac{\partial\sigma_\epsilon^2}{\partial\gamma_{\tau,nT_s}}=-\Re_{\tau,nT_s}+|\gamma_{\tau,nT_s}|(\sigma_{nT_s})^2=0 \quad \text{Equation E1.7}$$

$$\Re_{\tau,nT_s}+|\gamma_{\tau,nT_s}|(\sigma_{nT_s})^2 \quad \text{Equation E1.8}$$

If the particle velocity is random and zero mean Gaussian and of finite power, then it is known that $\Re_{\tau,nT_s}$ cannot take the form of a delta function. Furthermore the correlation can possess only one maximum which occurs for $\Re_{\tau=0,nT_s=0}$. Whenever $\tau=nT_s\neq 0$, the magnitude of the correlation cannot be gleaned by Equation E1.7 unless the correlation coefficients may be obtained by some other means. They however cannot be 1 or −1, yet they can be zero.

Also, the correlation function may vary in the following manner:

$$\frac{\partial\Re_{\tau,nT_s}}{\partial\gamma_{\tau,nT_s}}=\pm\sigma_{nT_s}^2,\ @\tau=nT_s\neq 0 \quad \text{Equation E1.9}$$

Now this implies that the autocorrelation is zero for or $\tau=nT_s\neq 0$ because E1.7 permits only a max. or min. value for the magnitude of correlation coefficients. A local maximum would reflect a slope of zero not $\pm\sigma_{nT_s}^2$ as obtained in E.9. Thus, if the slope is either positive or negative at modulo $T_s$ offsets, the correlation is zero at those points and will oscillate between positive and negative values away from those points whenever the velocity variance is nonzero at $\tau=\pm nT_s$. This further implies that the correlation possesses crests and valleys between those correlation zeros. In addition, the correlation function must converge to zero at large offsets for $\tau=\pm nT_s$. This is consistent with a bandwidth limited process which insures finite power for the signal, a presumption of the analysis since the maximum power is specified as $P_m$. It is logical to suppose that a finite input power process to a passive LTI network, $h_t$, must also produce a finite output power. It is known that the input process is Gaussian so that the output process must also be Gaussian. For a MMSE condition, it follows that each sample on the input must equal each sample at the output, regardless of the sample time. The only solution possible is that $h_{eff}=1$.

One cannot further resolve the form of the correlation function which minimizes the MMSE without explicitly solving for $h_t$ or injecting additional criteria. This can be accomplished by setting $h_{eff}=1$ in figure E.1 and solving for $h_t$. When this additional step is accomplished the correlation function corresponding to the optimal impulse response LTI operator then takes on the form of the sinc function (see Section 3).

10.6 Max Cardinal Vs. Max NL. Velocity Pulse

Figure 99:
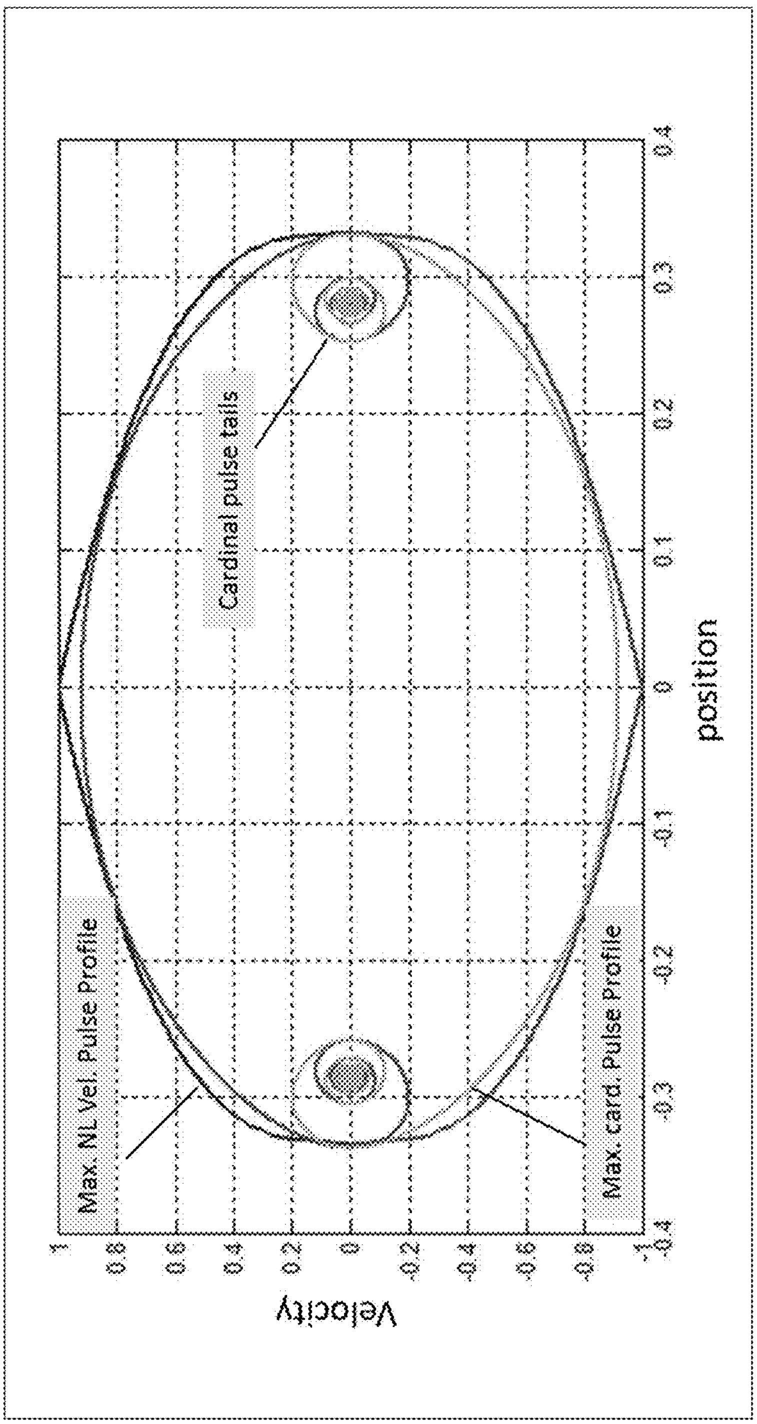
FIG. 99 is an illustration of a plot of the characteristic maximum non-linear and cardinal velocity pulse profiles, in accordance with one or more embodiments.

This Section provides some support calculations for the comparison of maximum nonlinear and cardinal pulse types. FIG. 99 illustrates a plot 9900 of the characteristic maximum non-linear and cardinal velocity pulse profiles in accordance with one or more embodiments. In this view, the maximum cardinal profile is subordinate to the maximum nonlinear velocity pulse profile boundary. This is a reference view which implies that the configuration space is preserved. The time to traverse this space for both cases cannot be discerned without further specification of the resources required in both cases. Notice the precursor and post cursor tails of the cardinal pulse. They exist because the extended cardinal pulse persists over the interval $-\infty\leq t\leq\infty$. The tails possess ~9.3% of the pulse energy.

Let the fundamental cardinal pulse be given by:

$$v_{p\_card}=v_{m\_card}\frac{\sin(\pi f_s t)}{\pi f_s t}$$

The energy of the pulse is proportional to (m=1 unless otherwise indicated):

$$\varepsilon_{k\_card}=\frac{v_{m\_card}^2}{2}\frac{\sin^2(\pi f_s t)}{(\pi f_s t)^2}$$

Then (for $v_{m\_card}=1$):

$$\frac{d\varepsilon_{k\_card}}{dt} = \frac{1}{2}\frac{\sin(\pi f_s t)}{(\pi f_s t)^3}[2\pi f_s(\pi f_s t cs(\pi f_s t)) - \sin(\pi f_s t)]$$

$P_{m\_card}$ is calculated from:

$$\max\left\{\frac{d\varepsilon_{k\_card}}{dt}\right\} = 0$$

Figure 100:
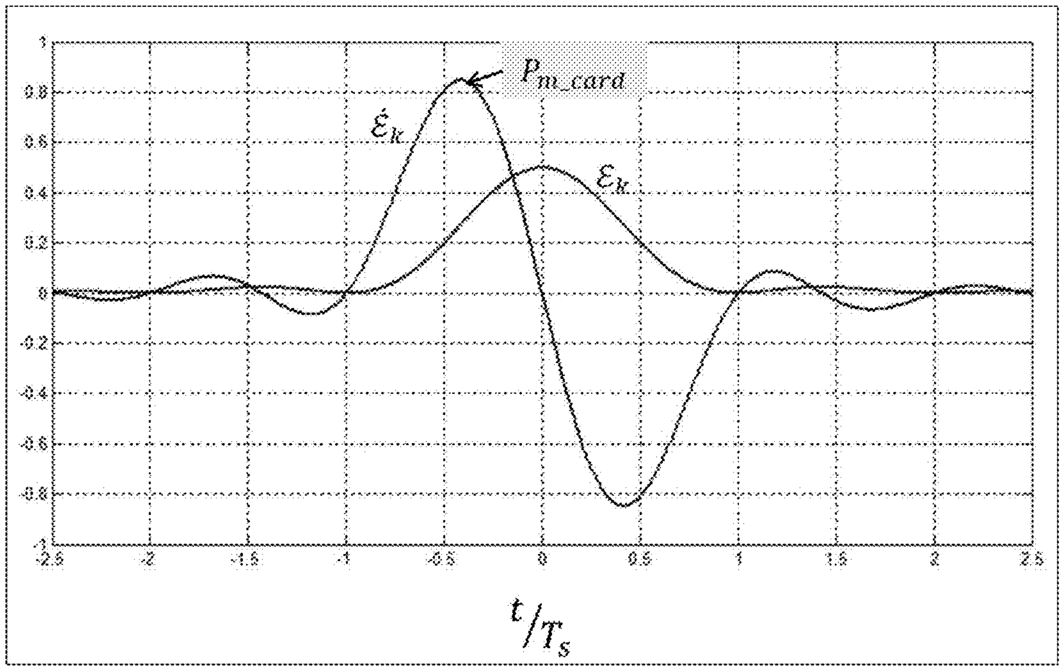
FIG. 100 is an illustration of a plot of the solution for $P_{m\_card}$, in accordance with one or more embodiments.

FIG. 100 illustrates a plot 10000 of the solution for $P_{m\_card}$, in accordance with one or more embodiments. In FIG. 100, the solution for $P_{m\_card}$ is approx. 0.843@ $(t/T_s)\approx-0.42$. $v_{max\_card}$ is unity for this case.

Now suppose that the prior case is compared to the maximum nonlinear velocity pulse case where $v_m=1$ and $T_s=1$. Then $P_{max}=0.5$ (see Section 10.2).

The ratio of the maximum power requirements is:

$$\frac{P_{m\_card}}{P_{max}} = 1.686$$

This is the ratio when the pulse amplitudes are identical for both cases at the time $t/T_s=0$. The total energy of the pulses are not equal and the distance a particle travels over a characteristic interval Δt is not the same for both cases. The information at the peak velocity is however equivalent. This circumstance may serve as a reference condition for other comparisons.

One can also calculate the required velocity in both cases for which the particle traverses the same distance in the same length of time $\Delta t=2T_s$. This is a conservation of configuration space comparison. The two distances are equated by:

$$2\int_0^{T_s} v_p dt = 2\int_0^{T_s} v_{p\_card} dt$$

The integral on the left is the distance for a nonlinear maximum velocity pulse case and the integral on the right is the maximum cardinal pulse case. Explicitly:

$$\int_0^{T_s}\sqrt{\frac{2P_m t}{m}}\,dt = \int_0^{T_s} v_{m\_card}\frac{\sin^2(\pi f_s t)}{(\pi f_s t)^2}dt$$

$v_{m\_card}$ is to be calculated.

$$\frac{2}{3}\sqrt{\frac{2P_m}{m}}\,T_s^{3/2} = v_{m\_card}\tilde{S}i(T_s)$$

$\tilde{S}i(T_s)$ is a function of the sine integral, integrated over the range $0\le t\le T_s$, where $T_s=1$.

$$Si(z) = \int_0^z \frac{\sin(t)}{t}\,dt$$

$$\tilde{S}i(T_s) = \frac{T_s}{\pi}\int_0^{T_s}\frac{\sin(t')}{t}\,dt'$$

-continued $$\therefore v_{m\_card} = \frac{2\pi}{3}\sqrt{\frac{2P_m}{m}}\sum_{n=0}^{\infty}\frac{(2n+1)(2n+1)!}{(-1)^n T_s^{(2n+1/2)}}$$

Figure 101:
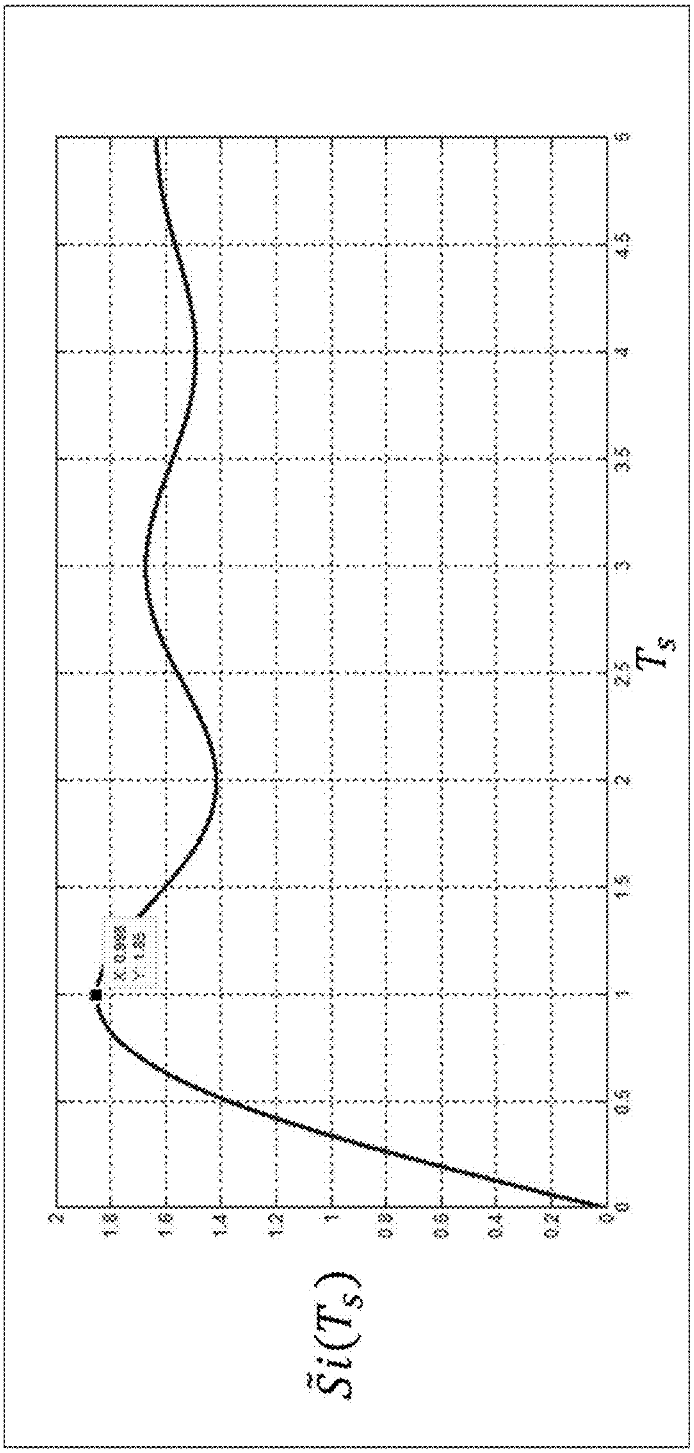
FIG. 101 is an illustration of a plot of a sine integral response, in accordance with one or more embodiments.

FIG. 101 illustrates a plot 10100 of a sine integral response, in accordance with one or more embodiments.

$$v_{m\_card} \cong \frac{2\pi}{3}\sqrt{\frac{2P_m}{m}}\frac{1}{1.85} \approx 1.6\sqrt{P_m};$$

for $$T_s = 1$$

In terms of $v_{max}$:

$$1.6\sqrt{P_m} = 1.6\, v_{max}\sqrt{\frac{m}{2T_s}} = 1.13\, v_{max}$$

The power increase at peak velocity for the cardinal pulse compared to the nonlinear maximum velocity pulse is:

$$\left(\frac{v_{m\_card}}{v_{max}}\right)^2 = 1.28$$

This represents an increase of ~1.07 dB at peak velocity.

The $P_m$ increase however is noticeably greater and may be calculated using ratios normalized to the reference case:

$$\frac{\varepsilon_{max\_card}}{\varepsilon_{max\_card\_ref}} = \frac{P_{max\_card}}{P_{max\_card\_ref}}$$

Therefore:

$$P_{max\_card} = \frac{\left(\frac{v_{m\_card}}{2}\right)^2}{\left(\frac{v_{max\_ref}}{2}\right)^2}(P_m)(P_{max\_card\_ref}) = \frac{(1.28)(.843)}{.5}P_m$$

And:

$$\frac{P_{max\_card}}{P_m} \cong 2.158$$

Figure 102:
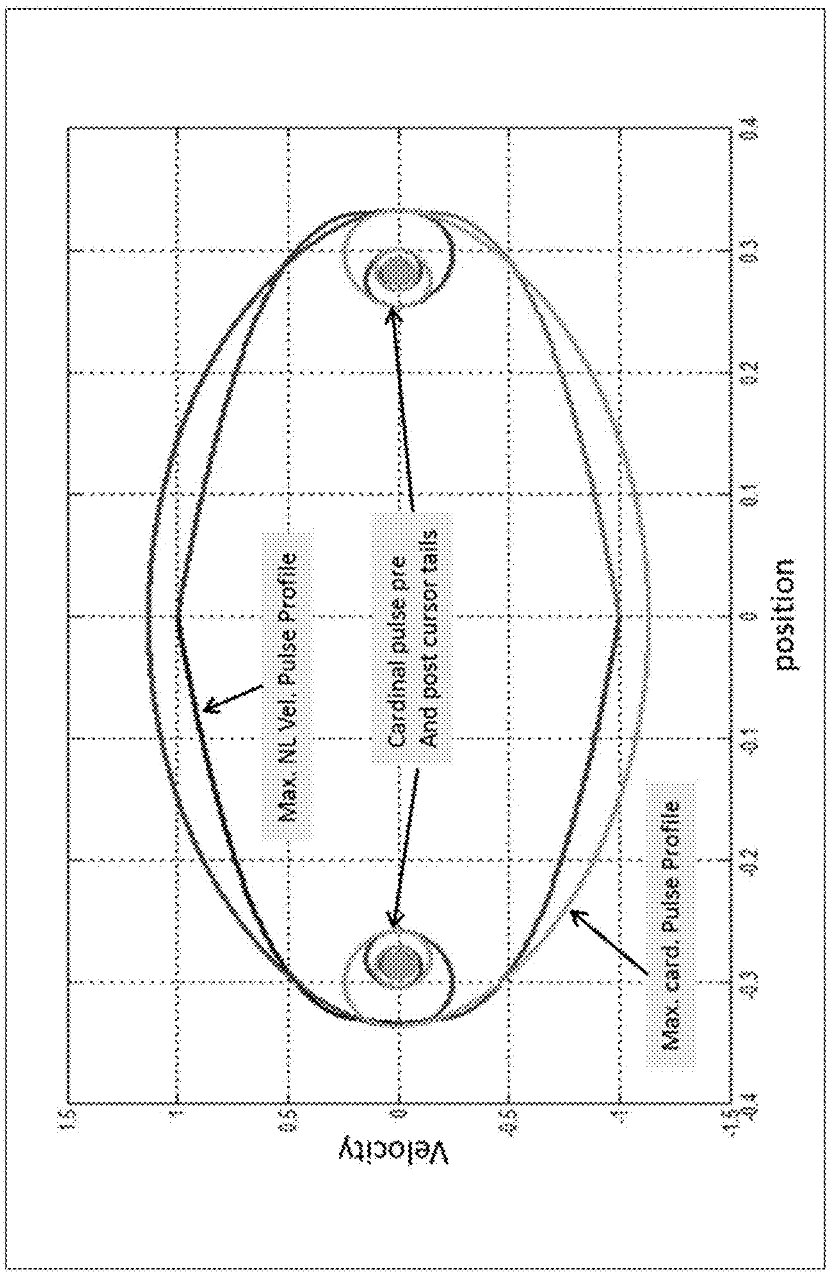
FIG. 102 is an illustration of a plot of maximum non-linear and cardinal pulse profiles, in accordance with one or more embodiments.

This represents an increase of approximately 3.34 dB required for the peak power source enhancement relative to the maximum nonlinear velocity pulse case, to permit a maximum cardinal pulse to span the same physical space in an equivalent time period Δt. FIG. 102 illustrates a plot 102000 of maximum non-linear and cardinal pulse profiles, in accordance with one or more embodiments. FIG. 102 illustrates the required resealing for this case.

It is possible to calculate the required sampled time $T_s$ for both pulse types in the case where the phase space is conserved for both scenarios and $P_{max\_card}=P_m=1$. The sample time is assigned the variable $T_{ref}$ for the maximum nonlinear pulse type.

$$\frac{2}{3}\sqrt{\frac{2P_m}{m}}\,T_{ref}^{3/2} = v_{m_{card}}\tilde{S}i(T_s)$$

$v_{m\_card}$ is first calculated from (refer to reference case):

$$P_{max\_card} \approx 1.28\varepsilon_{max\_card}$$

$$v_{m\_card} = \sqrt{2\frac{(P_{max\_card})}{1.28}} \approx 1.25$$

Therefore:

$$\left(\frac{T_s}{T_{ref}}\right)^{3/2} = \frac{2\pi}{3}\frac{1}{v_{m\_card}\tilde{S}i(T_s)}\sqrt{\frac{2P_m}{m}} \cong 1.289;$$

$$\text{for } T_{ref} = 1 \quad \therefore T_s = 1.179\ T_{ref}$$

This corresponds to a bandwidth which is $T_s^{-1}$ or ≈0.848 of the reference BW. Therefore, a lower instantaneous power can be considered as a trade for a reduction in bandwidth.

The characteristic radius of the cardinal pulse case is calculated from the integration of velocity over the interval $T_s$:

$$R_s = \frac{\pi}{T_s}\int_0^{T_s}(v_{max\_card})\frac{\sin(t)}{t}\,dt$$

For the normalized case of $T_s=\pi$, one obtains $$R_s=(1.85)(v_{max\_card})$$

10.7 Cardinal TE Relation

The TE relation is examined as it relates to a maximum cardinal pulse. Also, the two pulse energies are compared. Although the two structures are referred to as pulses, they are applied as profiles or boundaries in Section 3, restricting the trajectory of dynamic particles.

The general TE relation is given by:

$$\frac{1}{T_s} \geq \frac{\max\left\{\frac{d\varepsilon_k}{dt}\right\}}{k_p\langle\varepsilon_k\rangle(PAER)}$$

In the case of the most expedient velocity trajectory to span a space $k_p=1$. This bound results in a nonlinear equation of motion. Therefore, a physically analytic design will constrain motions to avoid the most extreme trajectory associated with a $k_p=1$ case or modify $k_p$.

The nature of the TE relation can be revealed in an alternate form:

$$P_{max} = \frac{k_p\varepsilon_{k\_max}}{T_s}$$

$P_{max}$ is defined as the maximum instantaneous power of a pulse $$\max\left\{\frac{d\varepsilon_k}{dt}\right\}$$

over the interval $T_s$. $\varepsilon_{k\_max}$ is the maximum kinetic energy over that same span of time. Then from appendix F the cardinal pulse will have the following values for $k_p$:

$$(\varepsilon_{k\_max\_card}/\varepsilon_{k\_max})=1,(T_{s\_max\_card}/T_{s\_max})=1,(R_{s\_max\_card}/R_{s\_max})=1 \qquad \text{Case 1:}$$

$$k_p = \frac{P_{max\_card}T_s}{\varepsilon_{k\_max\_card}} = 1.28$$

Case 2: $(P_{max\_card}/P_{max}) = 1$, $(R_{s\_max\_card}/R_{s\_max}) = 1$ $$k_p = \frac{P_{max\_card}T_s}{\varepsilon_{k\_max\_card}} = 1.179 \quad \text{(see Section 10.6)}$$

The subscript "max_card" refers to the maximum cardinal pulse type and the subscript "max" references the maximum nonlinear pulse type.

The total pulse energies for the 2 cases above are not equivalent. It should be noted that the energy average for the cardinal pulse is per unit time $T_s$. The total energy for both pulse types are given by:

$$\varepsilon_{k\_max\_tot} = T_sP_{max}$$

$$\varepsilon_{k\_max\_card\_tot} = \frac{m}{2}\int_{-\infty}^{+\infty}\left(v_{m\_card}\frac{\sin(\pi f_s t)}{\pi f_s t}\right)^2 dt = (\varepsilon_{k\_max\_card})\frac{T_s}{\pi}$$

If both energies are equated, then:

$$\frac{\varepsilon_{k\_max\_card\_tot}}{\varepsilon_{k\_max\_tot}} = \frac{\varepsilon_{k\_max\_card}}{\pi P_{max}} = 1$$

This reveals a static relation between the two pulse types whenever total energies are equal, which can be restated simply as:

$$\frac{P_{max\_card}}{P_{max}} = \pi(.843) \cong 2.648$$

10.8 Relation Between Instantaneous Efficiency and Thermodynamic Efficiency

In this Section, two approaches for efficiency calculations are compared to provide alternatives in algorithm development. Optimization procedures may favor an indirect approach to the maximization of thermodynamic efficiency. In such cases, an instantaneous efficiency metric may provide significant utility. This Section does not address those optimization algorithms.

Thermodynamic Efficiency possesses a very particular meaning, it is determined from the ratio of two random variable mean values.

$$\eta \equiv \frac{\langle P_{out}\rangle}{\langle P_{in}\rangle}$$

Calculation of this efficiency precludes reduction of the power ratio prior to calculating the average. This fact can complicate the calculations in some circumstances. In contrast, consider the case where the ratio of powers is given by:

$$\langle \eta_{inst} \rangle = \left\langle \frac{P_{out\_inst}}{P_{in\_inst}} \right\rangle$$

η and $\eta_{inst}$ do not possess the same meaning yet are correlated. It is often useful to reduce $\langle \eta_{inst} \rangle$ rather than η to obtain an optimization, the former implying the latter.

The proper thermodynamic calculation begins with the ratio of two differing RV's. The numerator is a non-central gamma or chi squared RV for the canonical case, which is obtained from:

$$\rho(X) = \frac{dV_L}{dX}\rho(V_L)$$

$\mathcal{X}$ is the variable $(\tilde{V}_L - \langle V_L \rangle)^2$ where $\tilde{V}_L$ is approximately Gaussian for $\sigma \ll V_s$. The completed transformation is given by:

$$\rho(\mathcal{X}) = \frac{1}{2\sqrt{\mathcal{X}}}\frac{1}{\sqrt{2\pi}\,\sigma}e^{-\frac{\left(\sqrt{\mathcal{X}} - \langle V_L \rangle\right)^2}{2\sigma^2}}$$

This can also be obtained from the more general non-central Gamma multivariable sum:

$$\rho(\mathcal{X}) = \frac{1}{2}\left(\frac{\mathcal{X}}{\sum_i^N \langle V_{L_i} \rangle}\right)^{[(N-2)/4]} e^{-\frac{(\mathcal{X} - \sum_i^N \langle V_{L_i} \rangle)}{2\sigma^2}} I_{[(N-2)/2]}\left(\frac{1}{2\sigma^2}\sqrt{\mathcal{X}\sum_i^N \langle V_{L_i} \rangle}\right); \quad \mathcal{X} \geq 0$$

where N=1 in the reduced form, $I_{[(N-2)/2]}$ is a modified Bessel function of the first kind, and $\sigma^2$ is the variance of the Gaussian RV. The more general result applies to an arbitrary sum of N Gaussian signals with corresponding non-zero means.

The denominator of the thermodynamic efficiency is obtained from the sum of two RV's. One is positive non central Gaussian and the other is identical to ρ(X).

Hence, the proper thermodynamic waveform efficiency is obtained from (where statistical and time averages are equated):

$$\eta = \frac{\int_{-\infty}^{\infty} \mathcal{X}\rho(\mathcal{X})d\mathcal{X}}{\int_{-\infty}^{\infty} P_{in}\rho(P_{in})dP_{in}}$$

One can work directly with this ratio or time averaged equivalents whenever the process is stationary in the wide sense. Sometimes the statistical ratio presents a formidable numerical challenge, particularly in cases of optimization where calculations must be obtained "on the fly."

On the other hand, the averaged instantaneous power ratio is (where statistical and time averages are equated):

$$\langle(\eta_{inst\_WF})\rangle = \int_{-\infty}^{\infty} \eta_{inst\_WF}\left[\frac{dV_L}{d\eta_{inst\_WF}}\rho(V_L)\right]d\eta_{inst\_WF}$$

$$\langle \eta_{inst\_WF} \rangle = \int_{-\infty}^{\infty} \eta_{inst\_WF}\left[\frac{V_s}{(1+\eta)^2}\frac{1}{\sqrt{2\pi\sigma^2}}e^{-\frac{\left(\eta\frac{V_s}{(1+\eta)} - \frac{V_s}{4}\right)^2}{2\sigma^2}}\right]d\eta_{inst\_WF}$$

Now η and $\eta_{inst\_WF}$ are always obtained from the same fundamental quantities $P_{out}$ and $P_{in}$ with similar ratios and therefore are correlated. In fact they are exactly equivalent prior to averaging.

The instantaneous waveform power ratio for a type one electronic information encoder or modulator is given by:

$$\eta_{inst\_WF} = \mathrm{Re}\left\{\frac{V_L^2}{(V_L V_s) - Z_r(V_L^2)}\right\}$$

where $Z_r$ is the ratio of power source impedance to load impedance. The meaning of this power ratio is an instantaneous measure of work rate at the system load vs. the instantaneous work rate referred to the modulator input. It is evident that the right hand side may reduce whenever the numerator and denominator terms are correlated. This reduction generally affords some numerical processing advantages.

One can verify that the thermodynamic waveform efficiency is always greater than or equal to the instantaneous waveform efficiency for the type 1 modulator.

$$\langle \eta_{inst\_WF} \rangle = \left\langle \frac{V_L^2}{V_s V_L - V_L^2} \right\rangle = \frac{1}{\frac{V_s}{\langle V_L \rangle} - 1}$$

Likewise:

$$\eta = \frac{\langle V_L^2 \rangle}{\langle V_s V_L - V_L^2 \rangle}$$

The numerator and denominator can be divided by the same constant.

$$\eta = \frac{\left\langle \frac{V_L^2}{\langle V_L \rangle^2} \right\rangle}{\left\langle \frac{V_s V_L}{\langle V_L \rangle^2} - \frac{V_L^2}{\langle V_L \rangle^2} \right\rangle} = \frac{\frac{\sigma^2 + \langle V_L \rangle^2}{\langle V_L \rangle^2}}{\frac{V_s}{\langle V_L \rangle} - \left(\frac{\sigma^2 + \langle V_L \rangle^2}{\langle V_L \rangle^2}\right)}$$

This result implies that:

$$\eta \geq \langle \eta_{inst_{WF}} \rangle$$

always, because:

$$\frac{\sigma^2 + \langle V_L \rangle^2}{\langle V_L \rangle^2} \geq 1$$

Whenever the signal component $\langle V_L^2 \rangle > 0$ then $\sigma^2 > 0$ and the thermodynamic efficiency is the greater of the two quantities.

Optimizing $\eta_{inst_{WF}}$ always optimizes $\eta$ for a given finite value of $\sigma$ in the Gaussian case. That is, in both circumstances an optimum depends on minimizing $$\frac{V_s}{\langle V_L \rangle}.$$

This optimization is not arbitrary however and must consider the uncertainty required for a prescribed information throughput which is determined by the uncertainty associated with the random signal.

$$\frac{V_s}{\langle V_L \rangle}$$

is therefore moderated by the quantity $\sigma^2$. As $\alpha^2$, the information signal variance, increases, the quantity $$\frac{V_s}{\langle V_L \rangle}$$

must adjust such that the dynamic range of available power resources is not depleted or characteristic pdf for the information otherwise altered. In all cases of interest the maximum dynamic range of available modulation change is allocated to the signal. For symmetric signals this implies that $$\frac{V_s}{\langle V_L \rangle} = 2$$

for maximum dynamic range and that the power source impedance is zero. Whenever the source impedance is not zero then the available signal dynamic range reduces along with efficiency.

Figure 103:
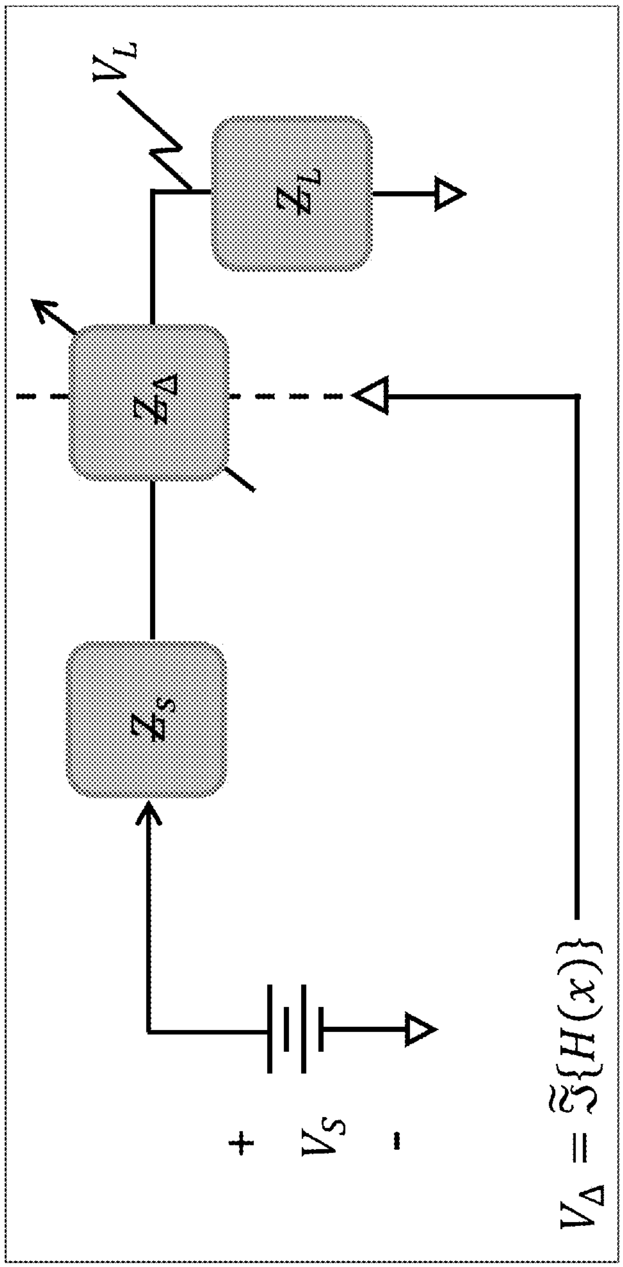
FIG. 103 is an illustration of a block diagram of a series type one encoder/modulator, in accordance with one or more embodiments.

An example illustrates the two efficiency calculations. FIG. 103 illustrates a block diagram of a series type one encoder/modulator 103000, in accordance with one or more embodiments. If the source and load impedances of encoder/modulator 10300 are real and equated, then the instantaneous efficiency is given by:

$$\eta_{inst\_WF} = \check{\eta} = \left\{ \frac{V_L^2}{(V_L V_s) - (V_L^2)} \right\}$$

The apparatus comprises the variable impedance, or in this case resistance, $R_e\{Z_\Delta\}$, and the load $Z_L$. One is concerned with the efficiency of this arrangement when the modulation is approximately Gaussian. $Z_s$ impacts the efficiency because it reduces the available input power to the modulator at $Z_\Delta$. $V_s$ is a measurable quantity whenever the apparatus is disconnected. Likewise, $\text{Re}\{Z_\Delta\}$ can be deduced from measurements in static conditions before and after the circuit is connected, provided $Z_L$, $Z_\Delta$, are known. The desired output voltage across the load is obtained by modulating $Z_\Delta$ with some function of the desired uncertainty H(x). The output $V_L$, is offset Gaussian for the case of interest and is given by:

$$\rho(V_L) = \frac{1}{\sqrt{2\pi}\,\sigma} e^{-\frac{(V_L - \langle V_s/4 \rangle)^2}{2\sigma^2}}$$

Figure 104:
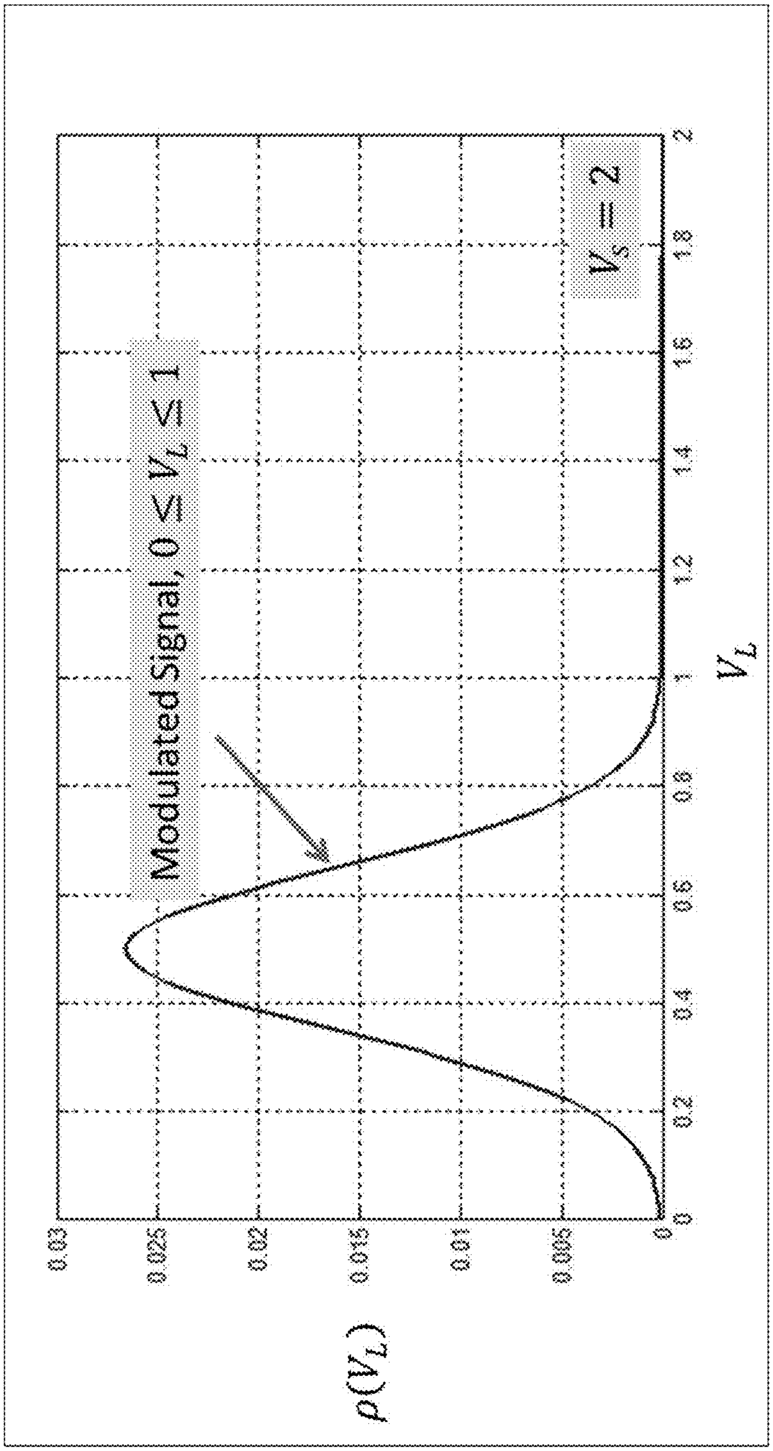
FIG. 104 is an illustration of a plot of a modulated information pdf at an offset, in accordance with one or more embodiments.

FIG. 104 illustrates a plot 10400 of a modulated information pdf at an offset where $V_s = 2$ vlts and $\sigma = 0.15$, in accordance with one or more embodiments.

Using the method of instantaneous efficiency, one obtains a continuous pdf for $\eta_{inst\_WF}$ $$\rho(\check{\eta}) = \frac{V_s}{(1+\check{\eta})^2} \frac{1}{\sqrt{2\pi\sigma^2}} e^{-\frac{\left(\eta \frac{V_s}{(1+\eta)} - \frac{V_s}{4}\right)^2}{2\sigma^2}}$$

Figure 105:
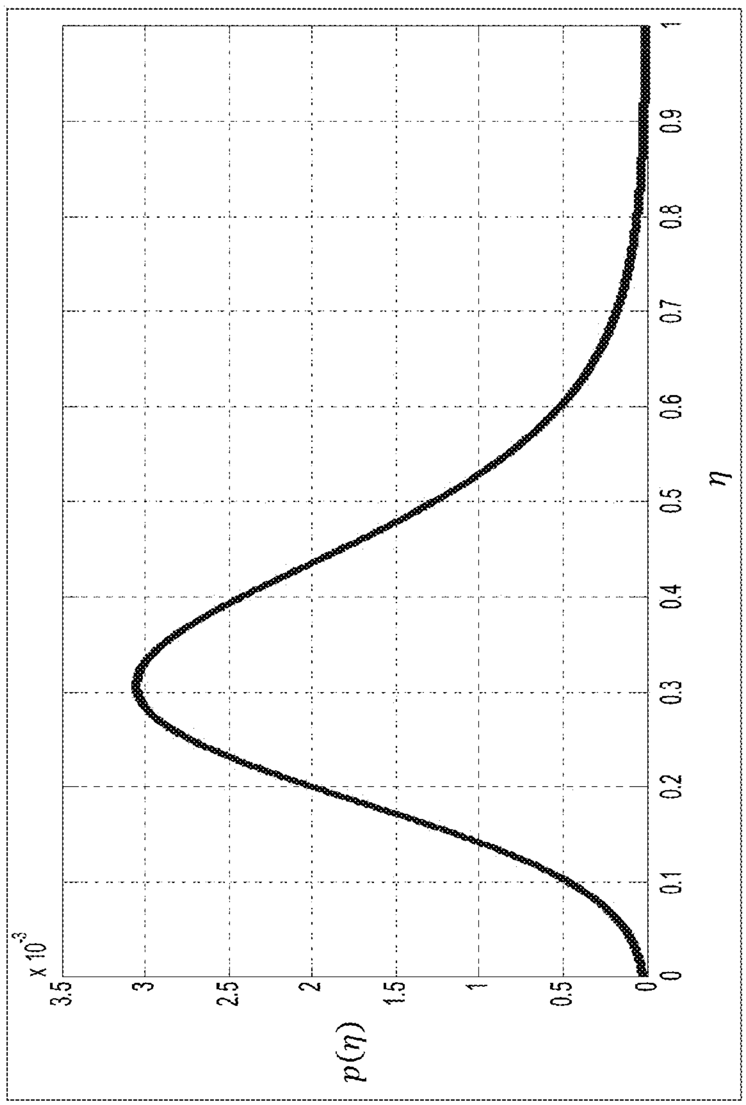
FIG. 105 is an illustration of a plot of a pdf of instantaneous efficiency, in accordance with one or more embodiments.

FIG. 105 illustrates a plot 10500 of a pdf of instantaneous efficiency, in accordance with one or more embodiments. The utility of this statistical form is primarily due to the reduction of the ratio to a single continuous RV rather than the ratio of two which must be separately analyzed prior to reduction. The average of the instantaneous efficiency is then calculated from:

$$\langle\langle \eta_{inst\_WF} \rangle\rangle = \int_{-\infty}^{\infty} \check{\eta} [\rho(\check{\eta})] d\check{\eta}$$

or $$\langle \bar{\check{\eta}} \rangle = \frac{1}{\frac{V_s}{\langle V_L \rangle} - 1} \approx .33$$

The thermodynamic waveform efficiency is found from:

$$\eta_{WF} = \frac{\sigma^2 + \langle V_L \rangle^2}{V_s \langle V_L \rangle - (\sigma^2 + \langle V_L \rangle^2)} = .375$$

Thus, the thermodynamic waveform efficiency is greater than the averaged instantaneous waveform efficiency in this example.

$\eta$ may also be obtained from the statistical ratio:

$$\eta = \frac{\int_{-\infty}^{\infty} X \rho(X) dX}{\int_{-\infty}^{\infty} P_{in} \rho(P_{in}) dP_{in}}$$

Figure 106:
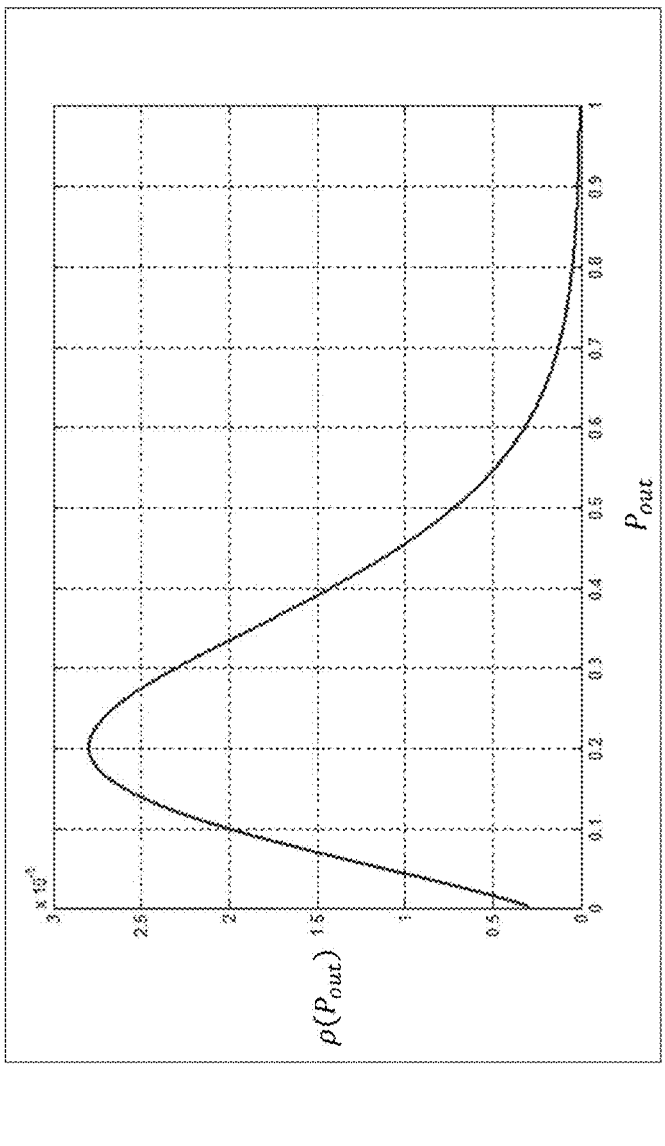
FIG. 106 is an illustration of a plot of a non-central gamma pdf, in accordance with one or more embodiments.

FIG. 106 illustrates a plot 10600 of a non-central gamma pdf, in accordance with one or more embodiments. FIG. 106 illustrates $\rho(X)$, which is a non-central gamma distribution with non-centrality parameter of $0.25 = \langle V_L \rangle^2$ and $\sigma^2 = 0.0225$. This pdf was verified by circuit simulation using a histogram to record the relative occurrence of output power values.

Figure 107:
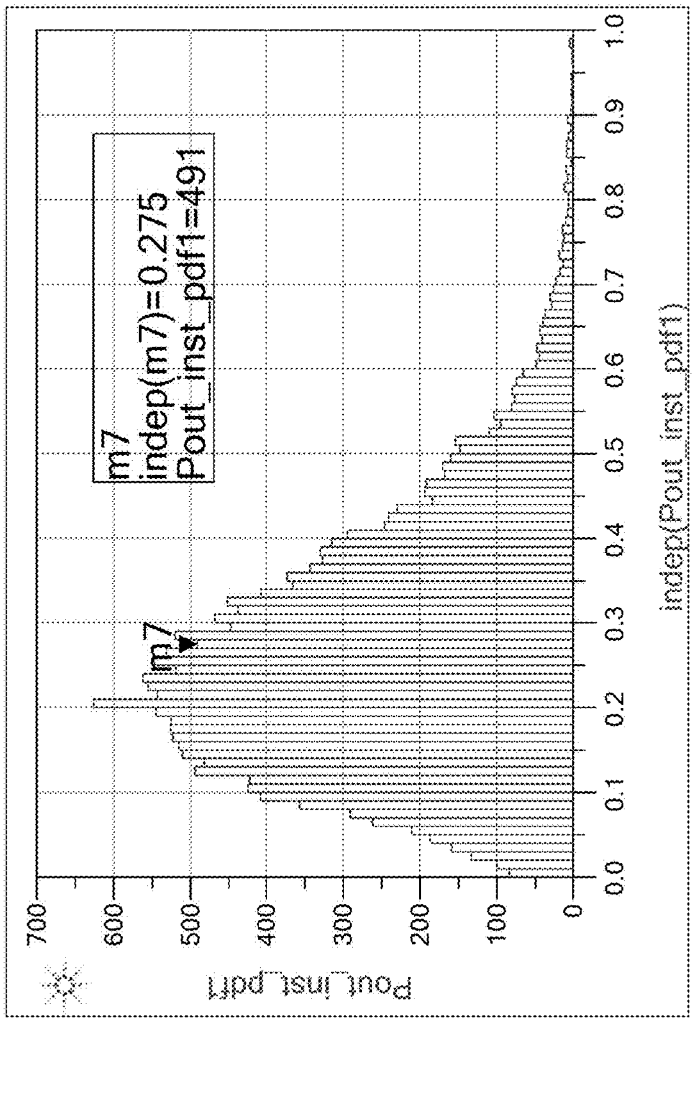
FIG. 107 is an illustration of a plot of a simulation of a type 1 modulator output power histogram, in accordance with one or more embodiments.

FIG. 107 illustrates a plot 10700 of a simulation of a type 1 modulator output power histogram, in accordance with one or more embodiments. In FIG. 107, the marker, m7 is near the theoretical mean of 0.2725.

Figure 108:
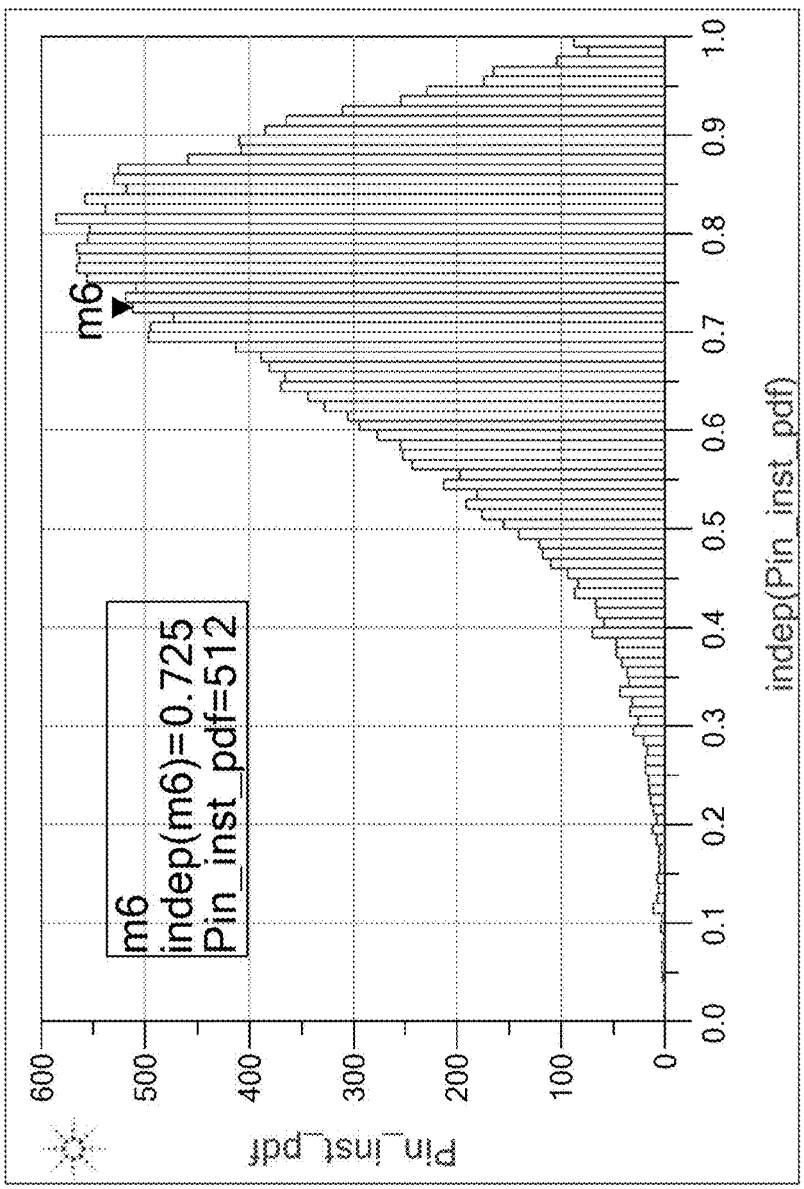
FIG. 108 is an illustration of a plot of a relative histogram of RV, in accordance with one or more embodiments.

The denominator pdf for Pin is the difference of the 1 W for Pout and the RV formed by the multiplication of $V_s V_L$ where $V_L$ is non-central Gaussian. The marker is near the theoretical mean of 0.2725. The relative histogram for this RV is shown in plot 10800 of FIG. 108, in accordance with one or more embodiments.

The marker m6 is near the theoretical mean of 0.7275. Calculating the means of these two distributions and taking their ratios yields the thermodynamic waveform efficiency. Proper thermodynamic efficiency must remove the effect of the offset term of the numerator, leaving a numerator dependent on the information bearing portion of the waveform only. Section 10.9 further explores the relationship between $\eta$ and $\check{\eta}$.

Certain procedures of optimization involving time averages can favor working with thermodynamic efficiency directly. However, if an optimization is based on statistical analysis, then instantaneous efficiency can be a preferable variable which in turn implies an optimized thermodynamic efficiency under certain conditions.

10.9 Relation Between Wave Form Efficiency and Thermodynamic or Signal Efficiency and Instantaneous Waveform Efficiency This Section provides several comparisons of waveform and signal efficiencies. The comparisons provide a means of conversion between the various forms which can provide some analysis utility.

First, the proper thermodynamic waveform and thermodynamic signal efficiencies are compared for a type one modulator where $Z_r=1$.

$$\eta_{WF} = \frac{\sigma^2 + \langle V_L \rangle^2}{V_s \langle V_L \rangle - (\sigma^2 + \langle V_L \rangle^2)}$$

$$\eta_{sig} = \tilde{\eta} = \frac{\sigma^2}{V_s \langle V_L \rangle - (\sigma^2 + \langle V_L \rangle^2)}$$

$\eta_{sig}$ considers only the signal power as a valid output. This is as it should be since DC offsets and other anomalies do not encode information and therefore do not contribute positively to the apparatus deliverable. However, $\eta_{WF}$ is related to $\eta_{sig}$ and therefore is useful even though it retains the offset. If the maximum available modulation dynamic range is used then maximization of $\eta_{WF}$ implies maximization of $\eta_{sig}$.

$\eta_{WF}$, $\eta_{sig}$ may also be expressed in terms of the PAPR metric.

$$\eta_{WF} = \frac{\sigma^2 + \frac{V_s^2}{16}}{\frac{V_s^2}{4} - \left(\sigma^2 + \frac{V_s^2}{16}\right)} = \frac{\sigma^2 + \frac{P_{m\_wf}}{4}}{P_{m\_wf} - \left(\sigma^2 + \frac{P_{m\_wf}}{4}\right)} = \frac{PAPR_{wf/sig} + 4}{3PAPR_{wf/sig} - 1}$$

$$\eta_{WF} = \frac{\sigma^2 + \frac{V_s^2}{16}}{\frac{V_s^2}{4} - \left(\sigma^2 + \frac{V_s^2}{16}\right)} = \frac{\langle P_{out\_wf} \rangle}{P_{m\_wf} - \langle P_{out\_wf} \rangle} = \frac{1}{PAPR_{wf} - 1};$$

$$\langle P_{out\_wf} \rangle \leq P_{m_{wf}} / 2$$

In the above equations $PAPR_{wf/sig}$ refers to the peak waveform to average signal power ratio and $PAPR_{wf}$ refers to the peak waveform to average waveform power ratio. These equations apply for $PAPR_{wf}>4$ when the peak to peak signal dynamic range spans the available modulation range between 0 volts and $V_s/2$ volts at the load, and $Z_r=1$. The dynamic range is determined by $Z_r$, the ratio of source to load impedance.

Signal based thermodynamic efficiency can be written as:

$$\tilde{\eta} = \frac{\sigma^2}{\frac{V_s^2}{4} - \left(\sigma^2 + \frac{V_s^2}{16}\right)} = \frac{1}{3PAPR_{sig} - 1} = \eta_{wf} - \frac{PAPR_{wf}}{6PAPR_{wf} - 4}$$

$$\tilde{\eta} \approx \eta_{wf} - \frac{1}{2}; \gg 1 \text{ for } PAPR_{wf} = 1$$

Therefore, if $\eta_{WF}$, and $PAPR_{wf}$ are known then $\tilde{\eta}$ may be calculated. Also, increasing $\eta_{WF}$, increases $\tilde{\eta}$. Under these circumstances, $\tilde{\eta} \leq 1/2$.

Figure 109:
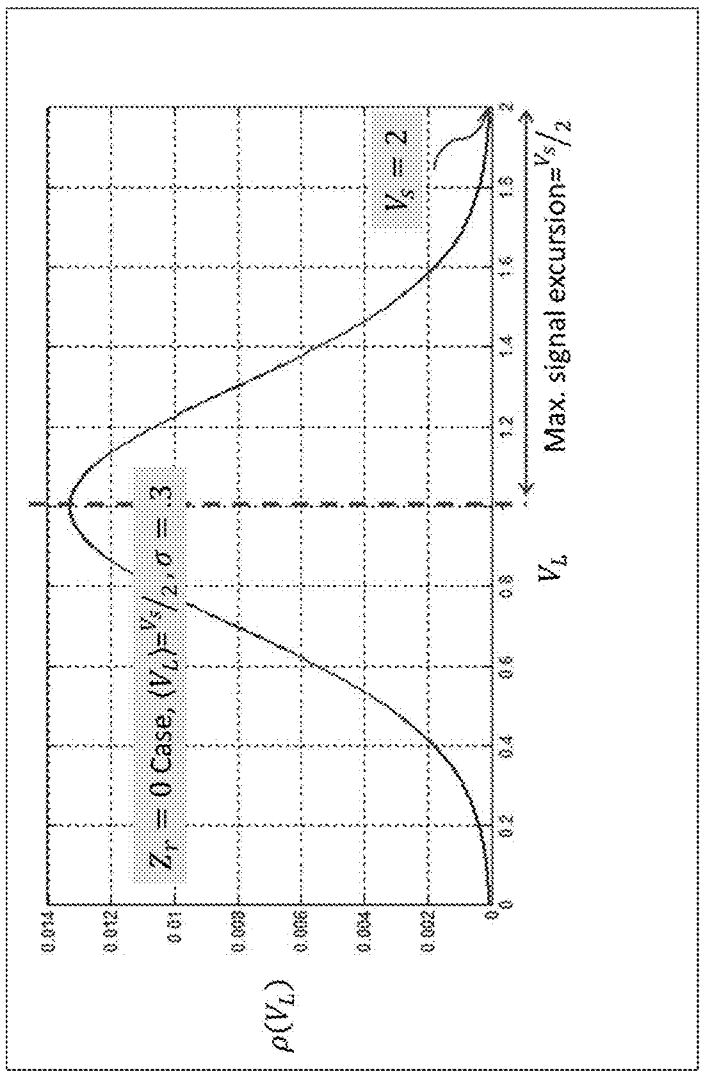
FIG. 109 is an illustration of a plot of the associated signal and waveform statistics of a pdf for an offset canonical case, in accordance with one or more embodiments.

Now suppose that $Z_r \approx 0$, corresponding to the most efficient canonical case for a type 1 modulator. In this case, the maximum waveform voltage equals the open circuit source voltage, $V_s$. FIG. 109 illustrates a plot 10900 of the associated signal and waveform statistics of a pdf for an offset canonical case, in accordance with one or more embodiments. The dynamic portion of the waveform spans the maximum possible modulation range, given $V_s$.

The relevant relationships follow:

$$\eta_{WF} = \frac{\sigma^2 + \frac{V_s^2}{4}}{\frac{V_s^2}{2}} = \frac{2}{PAPR_{wf}}$$

$$\tilde{\eta} = \frac{\sigma^2}{\frac{V_s^2}{2}} = \frac{1}{2PAPR_{sig}}$$

$$\frac{\eta_{WF}}{\tilde{\eta}} = 1 + PAPR_{sig} = 1 + \frac{PAPR_{wf/sig}}{4}$$

$\tilde{\eta}$ above is considered as a canonical case.

General cases where $Z_r \neq 0$ can be solved using the following equations:

$$Z_r = \frac{Z_s}{Z_L}$$

$$\eta_{WF} = \frac{\left\langle \left(\tilde{V}_L + \langle V_L \rangle\right)^2 \right\rangle}{\left\langle V_s\left(\tilde{V}_L + \langle V_L \rangle\right) - \mathrm{Re}\{Z_r\}\left(\tilde{V}_L + \langle V_L \rangle\right)^2 \right\rangle} = \frac{1}{\frac{\left\langle V_s\left(\tilde{V}_L + \langle V_L \rangle\right)\right\rangle}{\left\langle \left(\tilde{V}_L + \langle V_L \rangle\right)^2 \right\rangle} - \mathrm{Re}\{Z_r\}}$$

$$\langle V_L \rangle = \frac{Z_L V_s}{\langle V_L + V_s + Z_\Delta \rangle} = \frac{Z_L V_s}{2(Z_L + Z_s)} = (2 + 2Z_r)^{-1} V_s$$

$$V_{L\_max} = \frac{Z_L V_s}{Z_L + Z_s} = 2\langle V_L \rangle = \frac{V_s}{1 + Z_r}$$

$$\therefore \eta_{WF} = \frac{1}{\frac{V_s \langle V_L \rangle}{(1 + \mathrm{Re}\{Z_r\})\left\langle \left(\tilde{V}_L + \langle V_L \rangle\right)^2 \right\rangle} - \mathrm{Re}\{Z_r\}}$$

When $Z_r=1$ then, $$\eta_{WF}=\frac{1}{\frac{PAPR_{WF}}{4}-1}$$

When $Z_r=0$;

$$\eta_{WF}=\frac{2}{PAPR_{WF}}$$

$Z_\Delta$ is a variable impedance which implements the modulation. Its function is illustrated in Section 10.8.

Thermodynamic signal efficiency is similarly determined:

$$\eta_{sig}=\tilde{\eta}=\frac{\langle(\tilde{V}_L)^2\rangle}{\langle V_s(\tilde{V}_L+\langle V_L\rangle)-\mathrm{Re}\{Z_r\}(\tilde{V}_L+\langle V_L\rangle)^2\rangle}=\frac{1}{\left\langle\frac{V_s\langle V_L\rangle}{\sigma^2}-\mathrm{Re}\{Z_r\}\left(1+\frac{\langle V_L\rangle^2}{\sigma^2}\right)\right\rangle}$$

$$\tilde{\eta}=\frac{1}{\frac{V_s}{\langle V_L\rangle}PAPR_{sig}-\mathrm{Re}\{Z_r\}(1+PAPR_{sig})}$$

We can confirm the result by testing the cases $Z_r=0,1$.

$$\tilde{\eta}=\frac{1}{\left\langle\frac{V_s\langle V_L\rangle}{\sigma^2}\right\rangle}=\frac{1}{2PAPR_{sig}};\ Z_r=0$$

$$\tilde{\eta}=\frac{1}{\left\langle\frac{V_s\langle V_L\rangle}{\sigma^2}-\left(1+\frac{\langle V_L\rangle^2}{\sigma^2}\right)\right\rangle}=\frac{1}{3PAPR_{sig}-1};\ Z_r=1$$

Instantaneous Efficiency

In addition to proper thermodynamic efficiencies, it is possible to compare instantaneous waveform and thermodynamic signal efficiencies discussed in Section 10.8. The most general form of the instantaneous power ratio $$\eta_{inst\_WF/\sigma^2}=\left\langle\frac{P_{out}}{P_{in}}\right\rangle$$

is:

$$\eta_{inst\_WF/\sigma^2}=\check{\eta}=$$

$$\left\langle\frac{(\tilde{V}_L+\langle V_L\rangle)^2}{V_s(\tilde{V}_L+\langle V_L\rangle)-\mathrm{Re}\{Z_r\}(\tilde{V}_L+\langle V_L\rangle)^2}\right\rangle=\frac{1}{\frac{V_s}{\langle V_L\rangle}-\mathrm{Re}\{Z_r\}}=\lim_{\sigma\to0}\eta_{WF}e$$

This is the instantaneous waveform efficiency given a required signal variance. $\eta_{inst\_WF/\sigma^2}$ has been reduced taking advantage of the correlations between numerator and denominator terms where possible.

Although the calculation, $\eta_{inst\_WF/\sigma^2}$, is not directly affected by average signal power, it is stipulated that in any optimization procedure, the maximum dynamic range is preserved for and consumed by the signal. This requires a specific average value $\langle V_L\rangle$ and maximizes the uncertainty for a particular signal distribution. $\eta_{inst\_WF/\sigma^2}$ is dependent on $\langle V_L\rangle$. The maximum dynamic range caveat therefore limits a critical ratio as follows;

$$\langle V_L\rangle=\frac{V_s}{2(1+Z_r)}$$

It is desirable to minimize $Z_r$ to maximize efficiency. For the case of a single potential $V_s$, i.e. the case of a type one modulator, the maximum symmetric signal swing about the average output potential is always $\tilde{V}_m=V_{L\_max}/2=\langle V_L\rangle$. Increasing $Z_r$ above zero diminishes the signal dynamic range converting this loss to heat in the power source. The quantity $V_s/[2\ (1+Z_r)]$ is always considered as a necessary modulation overhead for a type 1 modulator.

Increasing $\langle V_L\rangle$ increases the peak signal swing $\tilde{V}_m$ and therefore always increases the signal variance for a specified PAPR. Hence, increasing $\eta_{inst\_WF/\sigma^2}$ also increases the thermodynamic efficiency. A more explicit illustration of this dependency is given in the following equation obtained from the prior $\tilde{\eta}$, $\check{\eta}=\eta_{inst\_WF/\sigma^2}$ derivations and their relationship to $\langle V_L\rangle$:

$$\tilde{\eta}=\frac{1}{\frac{V_s}{\langle V_L\rangle}PAPR_{sig}+1\left(\frac{1}{\check{\eta}}-\frac{V_s}{\langle V_L\rangle}\right)(PAPR_{sig}+1)}$$

$\langle V_L\rangle$ is defined in terms of impedances and $V_s$ above. From the definition $0\le\check{\eta}_{/\sigma^2}\le 1/2$. When $\check{\eta}_{/\sigma^2}=1/2$, is maximized. At the other extreme, when $\check{\eta}$ terms to zero, $$\frac{V_s}{\langle V_L\rangle}$$

tends to infinity and $\tilde{\eta}$ also tends to zero.

Although the prior discussions focus on symmetric signal distributions (for instance Gaussian-like), arbitrary distributions may be accommodated by suitable adjustment of the optimal operating mean $\infty V_L\Pi$. In all circumstances however, the available signal dynamic range must contemplate maximum use of the span $\{V_s,0\}$.

Source Potential Offset Considerations

The prior equations are based on circuits which return currents to a zero voltage ground potential. If this return potential is not zero then the formulas should be adjusted. In all prior equations, one can substitute $V_s=V_{s1}-V_{s2}$ where $V_{s1}$, $V_{s2}$ are the upper and return supply potentials, respectively. In such cases, the optimal $\langle V_L\rangle$ is the average of those supplies when the pdf of the signal is symmetric within the span $\{V_{s1},V_{s2}\}$. Otherwise, the optimal operational $\langle V_L\rangle$ is dependent on the mean of the signal pdf over the span $\{V_{s1}, V_{s2}\}$. The offset does not affect the maximum waveform power, $P_{m\_wf}$. However, the maximum signal power is dependent on the span $\{V_{s1},V_{s2}\}$ and the average $\langle V_L\rangle$. The signal power is dependent only on $\sigma$ and any additional requirement to preserve the integrity of the signal pdf.

10.10 Comparison of Gaussian and Continuous Uniform Densities

This Section provides a comparison of the differential entropies for the Gaussian and Uniform pdf s. The calculations reinforce the results from Section 10.1 where it is shown that the Gaussian pdf maximizes Shannon's entropy for a given variance $\sigma_G^2$. Also this Section confirms Section 10.4's calculations for the case D=1. There is a particular variance ratio $\sigma_u^2/\sigma_G^2$ for which, when exceeded, the uniform density possesses an entropy greater than that of the Gaussian. This ratio is calculated. Finally the PAPR is compared for both cases.

First, a calculation is presented of the Gaussian density in a single dimension D=1.

$$H_G = -\int_{-\infty}^{\infty} \frac{1}{\sqrt{2\pi\sigma_G}} e^{-\frac{x^2}{2\sigma_G^2}} \ln\left[\frac{1}{\sqrt{2\pi\sigma_G}} e^{-\frac{x^2}{2\sigma_G^2}}\right] dx$$

$$H_G = -\frac{1}{\sqrt{2\pi\sigma_G}}\left[\ln(e)\int_{-\infty}^{\infty} \frac{-x^2}{2\sigma_G^2} e^{-\frac{x^2}{2\sigma_G^2}} dx + \int_{-\infty}^{\infty} -\ln\left(\sqrt{2\pi\sigma_G}\right) e^{-\frac{x^2}{2\sigma_G^2}} dx\right]$$

Applying the following two definite integral formulas obtained from a CRC table of integrals yields:

$$\int_{-\infty}^{\infty} x^{2n} e^{-ax^2} dx = \frac{1\cdot 3\cdot 5\ \ldots\ (2n-1)}{2^{n+1}a^n}\sqrt{\frac{\pi}{a}}$$

$$\int_{-\infty}^{\infty} e^{-a^2x^2} dx = \frac{1}{2a}\Gamma\left(\frac{1}{2}\right) = \sqrt{\frac{\pi}{2a}},$$

$$a > 0$$

The final result is $$H_G = \frac{1}{2}\ln(e) + \ln\left(\sqrt{2\pi}\ \sigma_G\right) = \ln\left(\sqrt{2\pi e}\ \sigma_G\right)$$

Now the entropy $H_u$ is obtained.

$$H_u = -\int_{ll}^{ul} \frac{1}{ul - ll}\ln\left[\frac{1}{u - ll}\right] dxe$$

Let the uniform density possess symmetry with respect to x=0, the same axis of symmetry for a zero offset (zero mean) Gaussian density.

$$\therefore H_u = -\int_{-ul}^{ul} \frac{1}{2ul}\ln[2ul]\, dx = \ln[2ul]$$

The variance is obtained from:

$$\sigma_u^2 = \int_{-ul}^{ul} x^2 \frac{1}{2ul} dx = \frac{1}{3}x^3\frac{1}{2ul}\Big|_{-ul}^{+ul} = 1/3ul^2$$

Now one can begin the direct comparison between $H_G$ and $H_u$.

Let $\sigma_G^2=\sigma_u^2$. Then:

$$ul=\sqrt{3}\sigma_G \text{ for } \sigma_G^2=\sigma_u^2$$

Therefore:

$$H_G=\ln(\sqrt{2\pi e}\sigma_G)\cong\ln(4.1327\sigma_G)$$

$$H_u=\ln(2\sqrt{3}\sigma_G)\cong\ln(3.4641)$$

$H_G$ is always greater than $H_u$ for a given equivalent variance for the two respective densities.

Considering the circumstance where $H_u \geq H_G$ and $\sigma_u^2 \neq \sigma_G^2$:

$$\ln[2ul] \geq \ln\left[\sqrt{2\pi e}\ \ \sigma_G\right]$$

$$2ul \geq \sqrt{2\pi e}\ \ \sigma_G$$

$$ul \geq \frac{1}{2}\sqrt{2\pi e}\ \ \sigma_G$$

$$\frac{ul^2}{3} \geq \frac{\pi e \sigma_G^2}{6}$$

$$\frac{\sigma_u^2}{\sigma_G^2} \geq 1.423289$$

Therefore, the entropy of a uniformly distributed RV must possess a noticeable increase in variance over that of the Gaussian RV to encode an equivalent amount of information.

It is also instructive to obtain some estimate of the required PAPR for conveying the information in each case. In a strict sense, the Gaussian RV requires an infinite PAPR. However it is also known that a PAPR≥16 is sufficient for all practical communications applications. In the case of a continuously uniformly distributed RV:

$$PAPR_u = \frac{ul^2}{1/3ul^2} = 3$$

Suppose ul is calculated for the case where $H_u=H_G$. Let $\sigma_G^2=1$ for the comparison.

$$ul\cong 2.066$$

To obtain the entropy $H_G$ the upper limit, $ul_G$, for the Gaussian RV must be at least 4. This means that roughly 4 times the peak power is required to encode information in the Gaussian RV compared to the uniform RV, whenever $H_u=H_G$. Likewise, one can calculate $PAPR_G/PAPR_u\cong 5.\overline{3}$.

Figure 110:
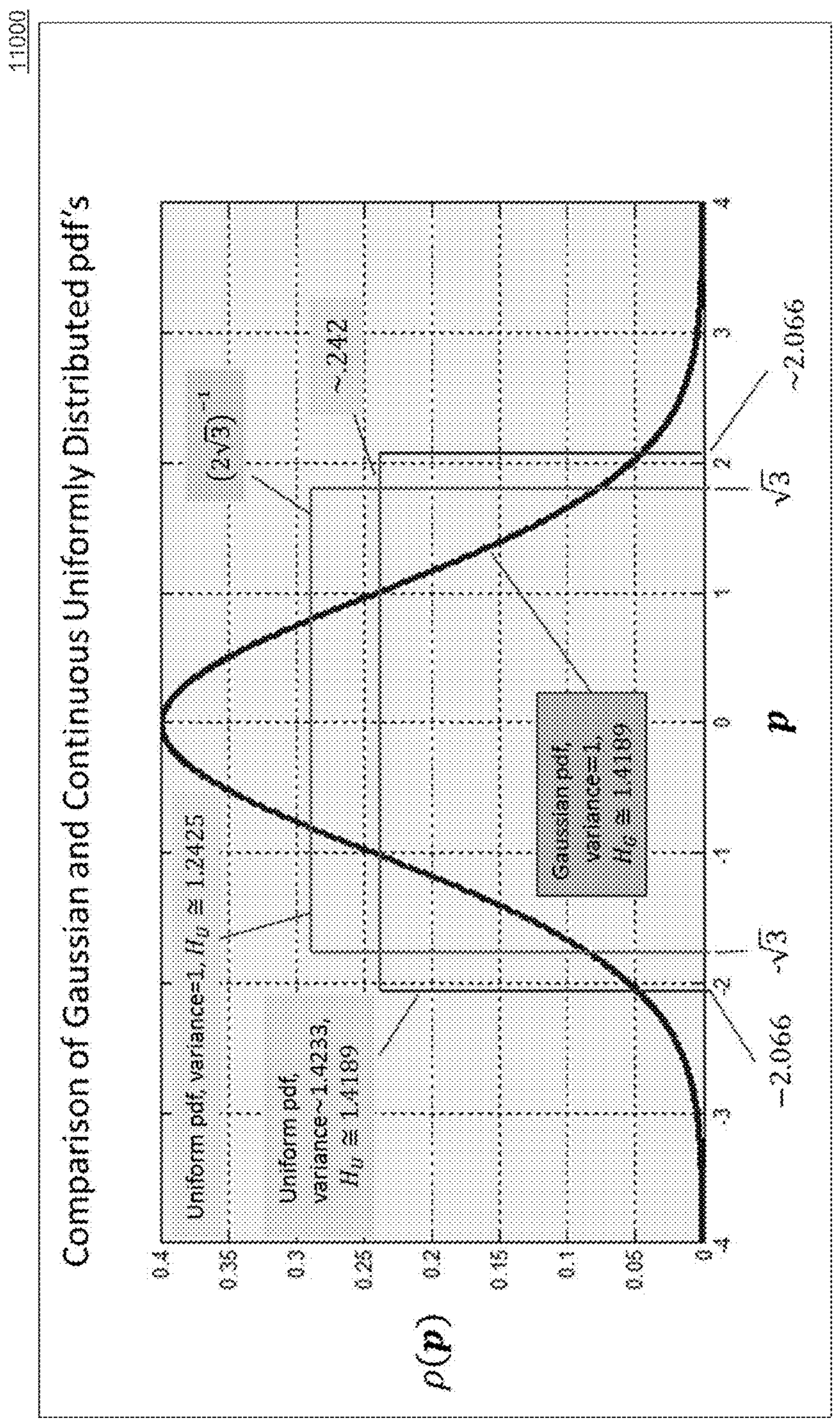
FIG. 110 is an illustration of a plot of a comparison of Gaussian and continuous uniformly distributed pdfs, in accordance with one or more embodiments.

FIG. 110 illustrates a plot 11000 of a comparison of Gaussian and continuous uniformly distributed pdfs, in accordance with one or more embodiments. FIG. 110 assists with the prior discussion.

10.11 Entropy Rate and Work Rate

The reader is referred to Sections 4, 10.1, and 10.4 to supplement the following analysis. Maximizing the transfer of physical forms of information entropy per unit time requires maximization of work. This can be demonstrated for a joint configuration and momentum phase space. The joint entropy is:

$$H = -\frac{1}{\hbar^D}\int_{-p}^{p}\ldots\int_{-R_s}^{R_s}\ldots\ \rho(q,p)_\Omega\ln[\rho(q,p)_\Omega]\,dq_1\,dp_1\ \ldots\ dq_D dp_D$$

Maximum entropy occurs when configuration and momentum are decoupled based on the joint pdf:

$$\rho(q,p)=\left(\frac{1}{\sqrt{(2\pi)^D[\Lambda_q]}}e^{-\frac{1}{2}(q_\alpha-\bar{q}_\alpha)^t\Lambda_q(q_\beta-\bar{q}_\beta)}\right)\left(\frac{1}{\sqrt{(2\pi)^D[\Lambda_p]}}e^{-\frac{1}{2}(p_\alpha-\bar{p}_\alpha)^t\Lambda_p^{-1}(p_\beta-\bar{p}_\beta)}\right)\quad\text{Equation K1.1}$$

It is apparent that the joint entropy is that of a scaled Gaussian multivariate and;

$$H=H_q+H_p\quad\text{Equation K1.2}$$

$H_q$,$H_p$ are the uncertainties due to independent configuration position and momentum respectively. If one wishes to maximize the information transfer per unit time, one needs to ensure the maximum rate of change in the information bearing coordinates {q,p}. When the particle possesses the greatest average kinetic energy it will traverse greater distances per unit time. Hence, one need only consider the momentum entropy to obtain the maximization sought.

$$H_p=\left(\ln\sqrt{2\pi e}\right)^{2D}+\ln(|\Lambda_p|^D)\quad\text{Equation K1.3}$$

$$[\Lambda_p]=\begin{bmatrix}\sigma_{p_1}^2 & 0 & \dots & 0\\ 0 & \sigma_{p_2}^2 & \dots & 0\\ 0 & 0 & \dots & \sigma_{p_D}^2\end{bmatrix}\quad\text{Equation K1.4}$$

Therefore maximizing K1.3 one can write:

$$\max\{e^{H_p}\}=\max\{(\sqrt{2\pi e})^{2D}+(|\Lambda_p|^D)\}\quad\text{Equation K1.5}$$

Recognizing that $(\sqrt{2\pi e})^{2D}$ is constant and that D is represented exponentially in the second term of K1.5, permits a simplification:

$$\max\{e^{H_p}\}=\max\{(|\Lambda_p|^D)\}\quad\text{Equation K1.6}$$

Suppose that we represent the covariance in terms of the time variant vector $\vec{p}$. K1.6 is further simplified:

$$\max\{|\langle\vec{p}\cdot\vec{p}\rangle|\}=\max\{(|\Lambda_p|^D)\}\quad\text{Equation K1.7}$$

We now take the maximization with respect to the equivalent energy and work form where mass is a constant:

$$\max\{\langle\dot{\vec{q}}\cdot\dot{\vec{p}}\rangle\}=\max\{\langle\dot{\varepsilon}_k\rangle\}\quad\text{Equation K1.8}$$

Equations K1.8 and K1.7 are equivalent maximizations when time averages are considered. Equation K1.8 converts the kinetic energy inherent in the covariance definition of $\Lambda_p$ to a power. It defines a rate of work which maximizes the rate of change of the information variables $\{\vec{q},\vec{p}\}$. This is confirmed by comparison with a form of the capacity equation given in Section 5:

$$C_\alpha=C_{q\_\alpha}+C_{p\_\alpha}\quad\text{Equation K1.9}$$

$$C_\alpha=\frac{P_{m_\alpha}}{2\langle\varepsilon_{k_\alpha}\rangle PAER_\alpha}\left(\ln\left[\frac{([\langle q_{x_\alpha}^2\rangle+\tilde{\sigma}_{q_{n_\alpha}}^2])}{\tilde{\sigma}_{q_{n_\alpha}}^2}\right]+\ln\left[\frac{([\langle(p_{x_\alpha})^2\rangle+\tilde{\sigma}_{p_{n_\alpha}}^2])}{\tilde{\sigma}_{p_{n_\alpha}}^2}\right]\right)$$

-continued $$C\le\sum_{\alpha=1}^{D}f_{s\_\alpha}\left(\ln\left[\frac{\left(m^2\langle\dot{\vec{p}}_\alpha\cdot\dot{\vec{q}}_\alpha\rangle_{eff\_\alpha}\right)}{\tilde{\sigma}_{p_{n_\alpha}}^2}+1\right]\right)\quad\text{Equation K1.10}$$

The variances of Equation K1.9 are per unit time and $\langle\dot{\vec{p}}_\alpha\cdot\dot{\vec{q}}_\alpha\rangle_{eff\_\alpha}$ in Equation K1.10, define an effective work rate in the $\alpha^{th}$ dimension for the encoded particle. Increasing $\langle\dot{\vec{p}}_\alpha\cdot\dot{\vec{q}}_\alpha\rangle_{eff\_\alpha}$ increases capacity. Although this argument is specific to the Gaussian RV case, it extends to any RV due to the arguments of Section 5 which establish pseudo capacity as a function of PAPR and entropy ratios compared to the Gaussian case. If one wishes to increase the entropy of any RV, one must increase $P_{max}$ for a given $\langle\dot{\vec{p}}_\alpha\cdot\dot{\vec{q}}_\alpha\rangle_{eff\_\alpha}$. Conversely, if a fixed PAPR is specified, increasing $\langle\dot{\vec{p}}_\alpha\cdot\dot{\vec{q}}_\alpha\rangle_{eff\_\alpha}$ increases $P_{max}$ by definition and phase space volume increases with a corresponding increase in uncertainty.

10.12 Optimized Efficiency for an 802.11a 16 QAM Case

Figure 111:
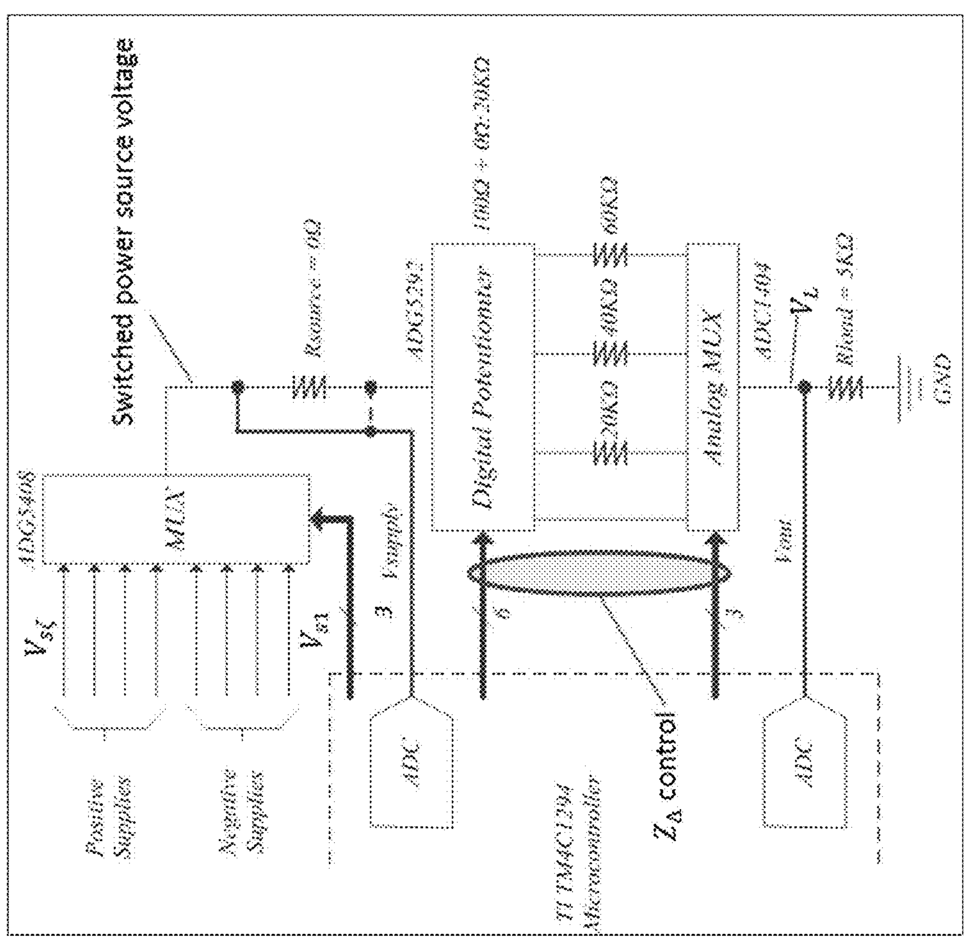
FIG. 111 is an illustration of a testing apparatus schematic, in accordance with one or more embodiments.

This Section highlights aspects of the calculations and measurements involved with the optimization of a zero offset implementation of an 802.11a signal possessing a PAPR~12 dB. A testing apparatus schematic 11100 is illustrated in FIG. 111, in accordance with one or more embodiments. FIG. 111 includes an analog multiplexer that selects up to 8 domains using a 3 bit domain control. Half of the domains are positive and half are negative for zero offset cases. A 9 bit modulation control maps the information into a resistance via the $Z_\Delta$ control. A variable voltage divider is formed using the source resistance, effective $Z_\Delta$ value and the load resistance. The 9 bit control $Z_\Delta$ interpolates desired modulation trajectories over a domain determined by the $i^{th}$ switched power source. The controller can be an ARM based processor from Texas Instruments and the other analog integrated circuits can be obtained from Analog Devices. Although a C++ program and MATLAB were used to calculate the important quantities and evaluate measurements, embodiments of the invention support using any combination of software or hardware for calculating the important quantities and evaluate measurements.

Figure 112:
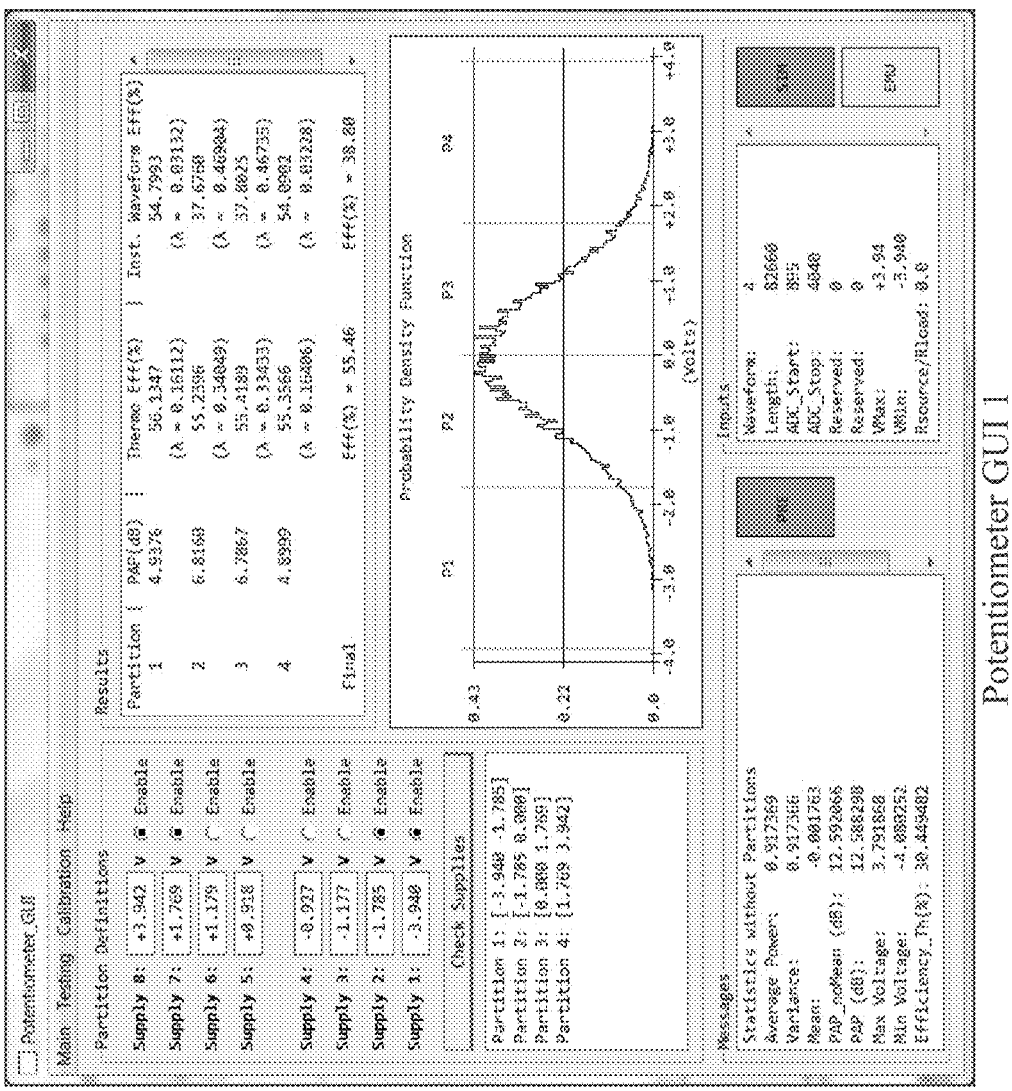
FIG. 112 is an illustration of a GUI, in accordance with one or more embodiments.
Figure 113:
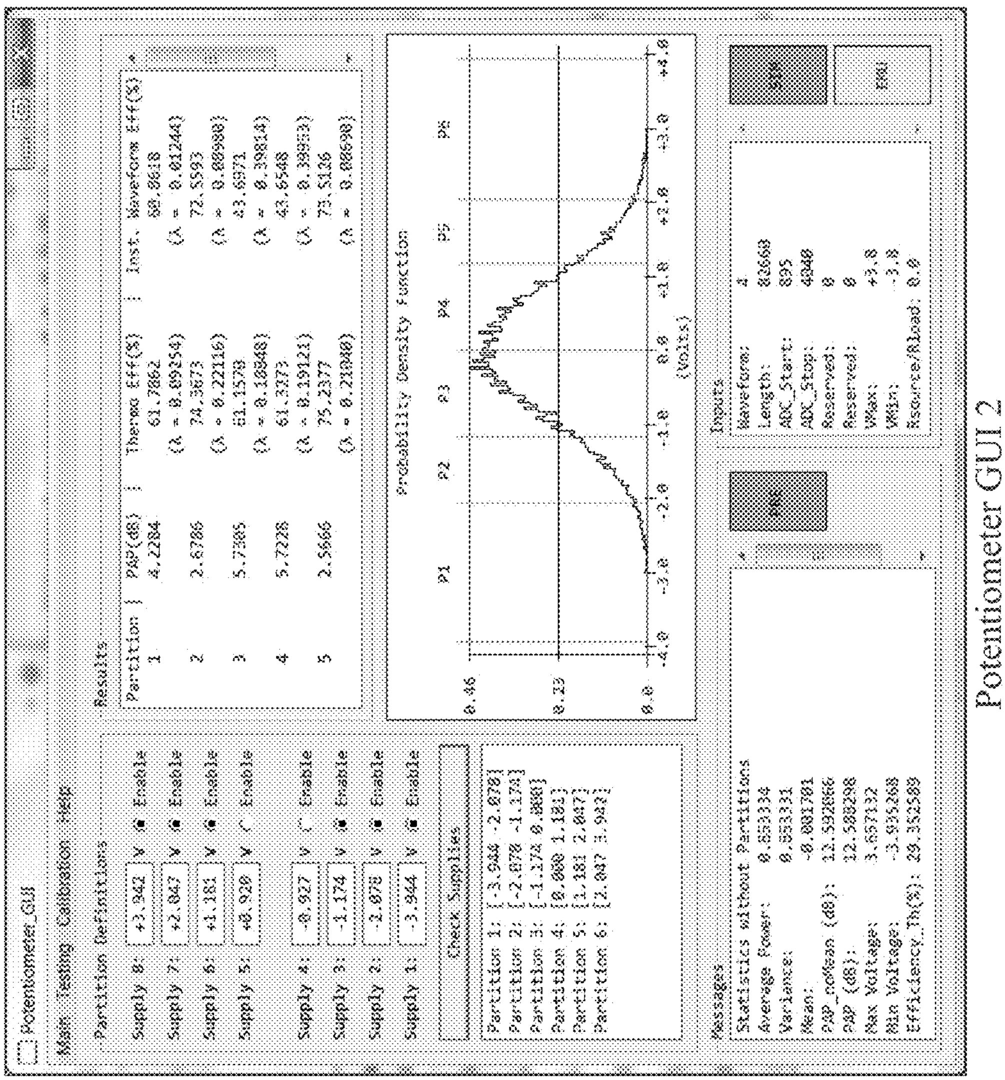
FIG. 113 is an illustration of a GUI, in accordance with one or more embodiments.
Figure 114:
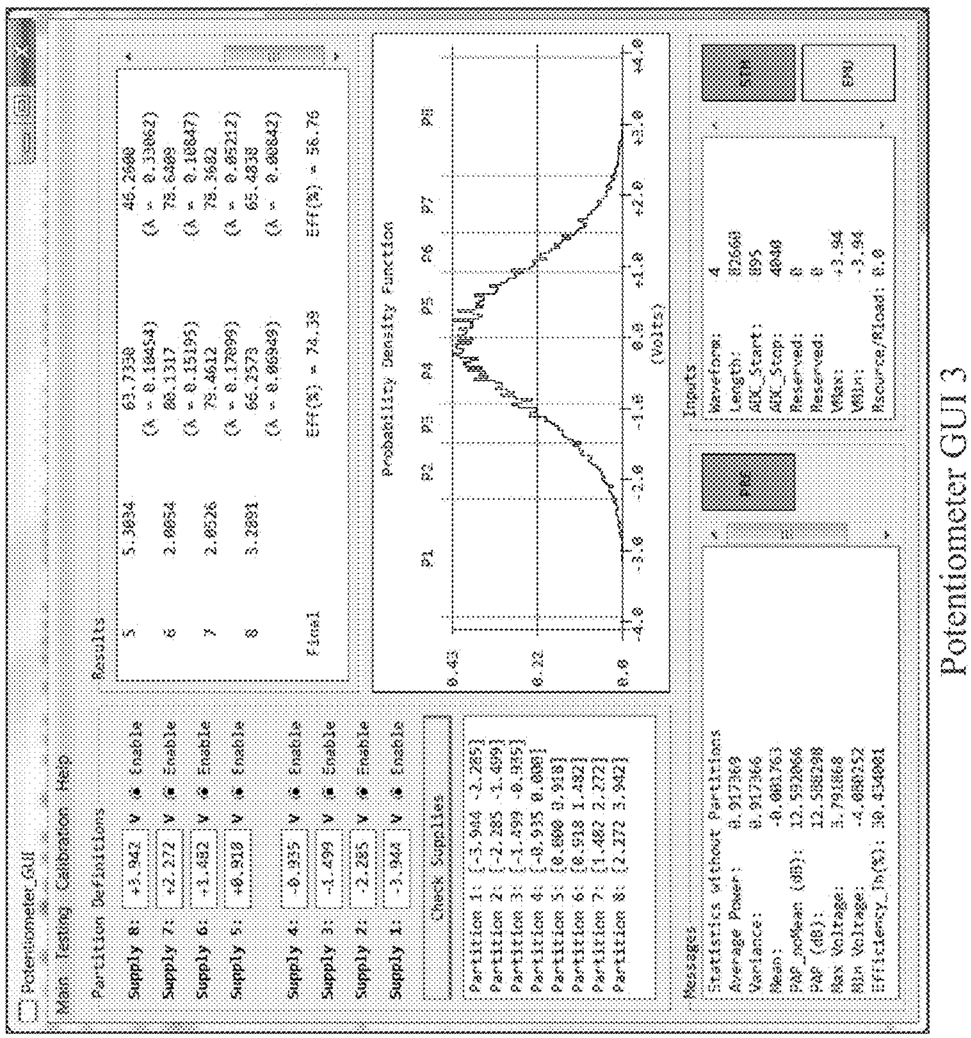
FIG. 114 is an illustration of a GUI, in accordance with one or more embodiments.

FIGS. 112-114 illustrate custom C++ GUIs 11200, 11300, and 11400 that indicate many of the metrics discussed in this disclosure and a table records efficiencies as well as weighting factors, in accordance with one or more embodiments. Results of calculations and measurements for 4,6,8 domain optimizations follow.

TABLE L-1

Thermodynamic Efficiency and λ per Domain (4 Domains)

| Domain | Optimized Efficiency | λ (optimized) | Measured Efficiency | λ (effective) |
|---|---|---|---|---|
| Domain 1 | 56.13% | 0.161 | 53.4% | 0.130 |
| Domain 2 | 55.23% | 0.340 | 50.78% | 0.373 |
| Domain 3 | 55.41% | 0.334 | 53.6% | 0.352 |
| Domain 4 | 55.35% | 0.164 | 53.63% | 0.143 |
| | 55.46% (total) | | 52.53% (total) | |

TABLE L-2

| Thermodynamic Efficiency and λ per Domain (6 Domains) | | | | |
|---|---|---|---|---|
| Domain | Optimized Efficiency | λ (optimized) | Measured Efficiency | λ (effective) |
| Domain 1 | 62.53% | 0.104 | 59.9% | 0.077 |
| Domain 2 | 74.88% | 0.222 | 73.2% | 0.210 |
| Domain 3 | 61.50% | 0.174 | 59.0% | 0.207 |
| Domain 4 | 61.72% | 0.177 | 60.1% | 0.196 |
| Domain 5 | 75.70% | 0.211 | 73.5% | 0.212 |
| Domain 6 | 61.30% | 0.109 | 59.4% | 0.096 |
| | 67.6% (total) | | 65.42% (total) | |

TABLE L-3

| Thermodynamic Efficiency and λ per Domain (8 Domains) Conclusion | | | | |
|---|---|---|---|---|
| Domain | Optimized Efficiency | λ (optimized) | Measured Efficiency | λ (effective) |
| Domain 1 | 66.93% | 0.072 | 64.5% | 0.047 |
| Domain 2 | 79.37% | 0.169 | 77.5% | 0.157 |
| Domain 3 | 80.10% | 0.152 | 79.1% | 0.153 |
| Domain 4 | 62.97% | 0.108 | 61.5% | 0.133 |
| Domain 5 | 63.73% | 0.104 | 61.38% | 0.116 |
| Domain 6 | 80.13% | 0.151 | 78.1% | 0.167 |
| Domain 7 | 79.46% | 0.170 | 77.2% | 0.165 |
| Domain 8 | 66.25% | 0.069 | 64.5% | 0.058 |
| | 74.39% | | 72.4% (total) | |

It is to be appreciated that the Detailed Description section, and not the Summary and Abstract sections, is intended to be used to interpret the claims. The Summary and Abstract sections can set forth one or more but not all example embodiments of the present invention as contemplated by the inventors, and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the relevant art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by a person skilled in the relevant art in light of the teachings and guidance.

The breadth and scope of the present invention should not be limited by any of the above-described example embodiments, but should be defined only in accordance with the following claims and their equivalents.

What is claimed is:

1. An apparatus comprising:

at least one of a single-ended encoding circuit or a differential encoding circuit; and a controller configured to control the at least one of the single-ended encoding circuit or the differential encoding circuit to encode a received signal into an encoded signal using momentum transfer encoding techniques.

* * * * *